US011753425B2

(12) United States Patent
Boudreault et al.

(10) Patent No.: US 11,753,425 B2
(45) Date of Patent: Sep. 12, 2023

(54) ORGANIC ELECTROLUMINESCENT MATERIALS AND DEVICES

(71) Applicant: UNIVERSAL DISPLAY CORPORATION, Ewing, NJ (US)

(72) Inventors: Pierre-Luc T. Boudreault, Pennington, NJ (US); Eric A. Margulies, Philadelphia, PA (US); Bert Alleyne, Newtown, PA (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 285 days.

(21) Appl. No.: 16/442,839

(22) Filed: Jun. 17, 2019

(65) Prior Publication Data

US 2020/0017536 A1 Jan. 16, 2020

Related U.S. Application Data

(60) Provisional application No. 62/696,383, filed on Jul. 11, 2018.

(51) Int. Cl.
*H01L 51/00* (2006.01)
*C07F 15/00* (2006.01)
(Continued)

(52) U.S. Cl.
CPC ...... *C07F 15/0033* (2013.01); *C07F 15/0086* (2013.01); *H10K 50/11* (2023.02);
(Continued)

(58) Field of Classification Search
CPC ............. C07F 15/0033; C07F 15/0086; H01L 51/0085; H01L 51/0087; H01L 51/0067;
(Continued)

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

EP 0650955 5/1995
EP 1725079 11/2006
(Continued)

OTHER PUBLICATIONS

Richard J. Lewis, Sr. "Hawley's Condensed Chemical Dictionary, 12th Edition", John Wiley & Sons, Inc., New York p. 796 (1993).*
(Continued)

*Primary Examiner* — Alexander C Kollias
(74) *Attorney, Agent, or Firm* — DUANE MORRIS LLP

(57) ABSTRACT

A compound is disclosed that includes a ligand $L_A$ of Formula I

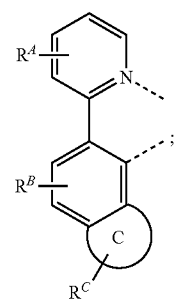

where ring C is a 5-membered or a 6-membered carbocyclic or heterocyclic ring; each $R^A$, $R^B$, and $R^C$ independently represents mono to the maximum allowable number of substitutions, or no substitution; $L_A$ is complexed to a metal
(Continued)

M; M is optionally coordinated to other ligands; the ligand $L_A$ is optionally linked with other ligands to comprise a tridentate, tetradentate, pentadentate, or hexadentate ligand; and any two substituents of $R^B$ and $R^C$ may be joined or fused together to form a ring.

12 Claims, 2 Drawing Sheets

(51) Int. Cl.
*H10K 50/11* (2023.01)
*H10K 85/30* (2023.01)
*H10K 85/60* (2023.01)

(52) U.S. Cl.
CPC ......... *H10K 85/342* (2023.02); *H10K 85/346* (2023.02); *H10K 85/622* (2023.02); *H10K 85/654* (2023.02); *H10K 85/6572* (2023.02); *H10K 85/6576* (2023.02)

(58) Field of Classification Search
CPC .............. H01L 51/0072; H10K 85/342; H10K 85/346; H10K 85/654; C09K 2211/185
See application file for complete search history.

(56) References Cited

U.S. PATENT DOCUMENTS

| | | | |
|---|---|---|---|
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 8,268,456 | B2 | 9/2012 | Koyama et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2004/0214038 | A1* | 10/2004 | Kwong .................. C09K 11/06 428/690 |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2012/0274201 | A1 | 11/2012 | Seo et al. |
| 2015/0053937 | A1* | 2/2015 | Kim .................. H01L 51/0072 257/40 |
| 2017/0365799 | A1 | 12/2017 | Ji |
| 2018/0097187 | A1 | 4/2018 | Boudreault et al. |
| 2019/0051844 | A1* | 2/2019 | Ji ........................ C07F 15/0033 |
| 2020/0212318 | A1* | 7/2020 | Kim .................. H01L 51/0085 |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2007266071 | 10/2007 |
| JP | 2008074939 | 4/2008 |
| KR | 20160109596 | 9/2016 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |

(56) References Cited

FOREIGN PATENT DOCUMENTS

| | | |
|---|---|---|
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2013094620 | 6/2013 |

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20(2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based On Silole Derivatives And Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91: 209-215 (1997).

Shirota, Yasuhiko et al., "Starburst Molecules Based on pi-Electron Systems as Materials for Organic Electroluminescent Devices," Journal of Luminescence, 72-74:985-991 (1997).

Sotoyama, Wataru et al., "Efficient Organic Llght-Emitting Diodes with Phosphorescent Platinum Complexes Containing N^C^N^-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

T. Östergård et al., "Langmuir-Blodgett Light-Emitting Diodes Of Poly(3-Hexylthiophene) Electro-Optical Characteristics Related to Structure," Synthetic Metals, 88:171-177 (1997).

Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).

Tang, C.W. and VanSlyke, S.A., "Organic Electroluminescent Diodes," Appl. Phys. Lett., 51(12):913-915 (1987).

(56) References Cited

OTHER PUBLICATIONS

Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 62/696,383, filed Jul. 11, 2018, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

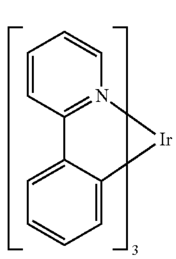

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

A series of new phosphorescent metal complexes based on ligands containing naphthalene-pyridine derivatives are disclosed. Further functionalization of these moieties allows fine tuning of the properties of the final complexes, such as color of the light emission, the light emitting efficiency and emission lifetime.

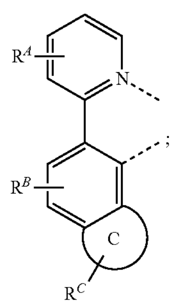

A compound is disclosed that comprises a ligand $L_A$ of Formula I where ring C is a 5-membered or a 6-membered carbocyclic or heterocyclic ring; each $R^A$, $R^B$, and $R^C$ independently represents mono to the maximum allowable number of substitutions, or no substitution; each $R^A$, $R^B$, and $R^C$ is independently a hydrogen or a substituent selected from the group consisting of the general substituents defined above; at least one $R^A$ has the formula —$CH_2R$ or —CHRR'; each R and R' is independently selected from the group consisting of halogen, alkyl, cycloalkyl, heteroalkyl, heterocycloalkyl, arylalkyl, alkoxy, aryloxy, amino, silyl, alkenyl, cycloalkenyl, heteroalkenyl, aryl, heteroaryl, and combinations thereof; $L_A$ is complexed to a metal M; M is optionally coordinated to other ligands; the ligand $L_A$ is optionally linked with other ligands to comprise a tridentate, tetradentate, pentadentate, or hexadentate ligand; and any two substituents of $R^B$ and $R^C$ may be joined or fused together to form a ring.

An OLED comprising the compound of the present disclosure in an organic layer therein is also disclosed.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
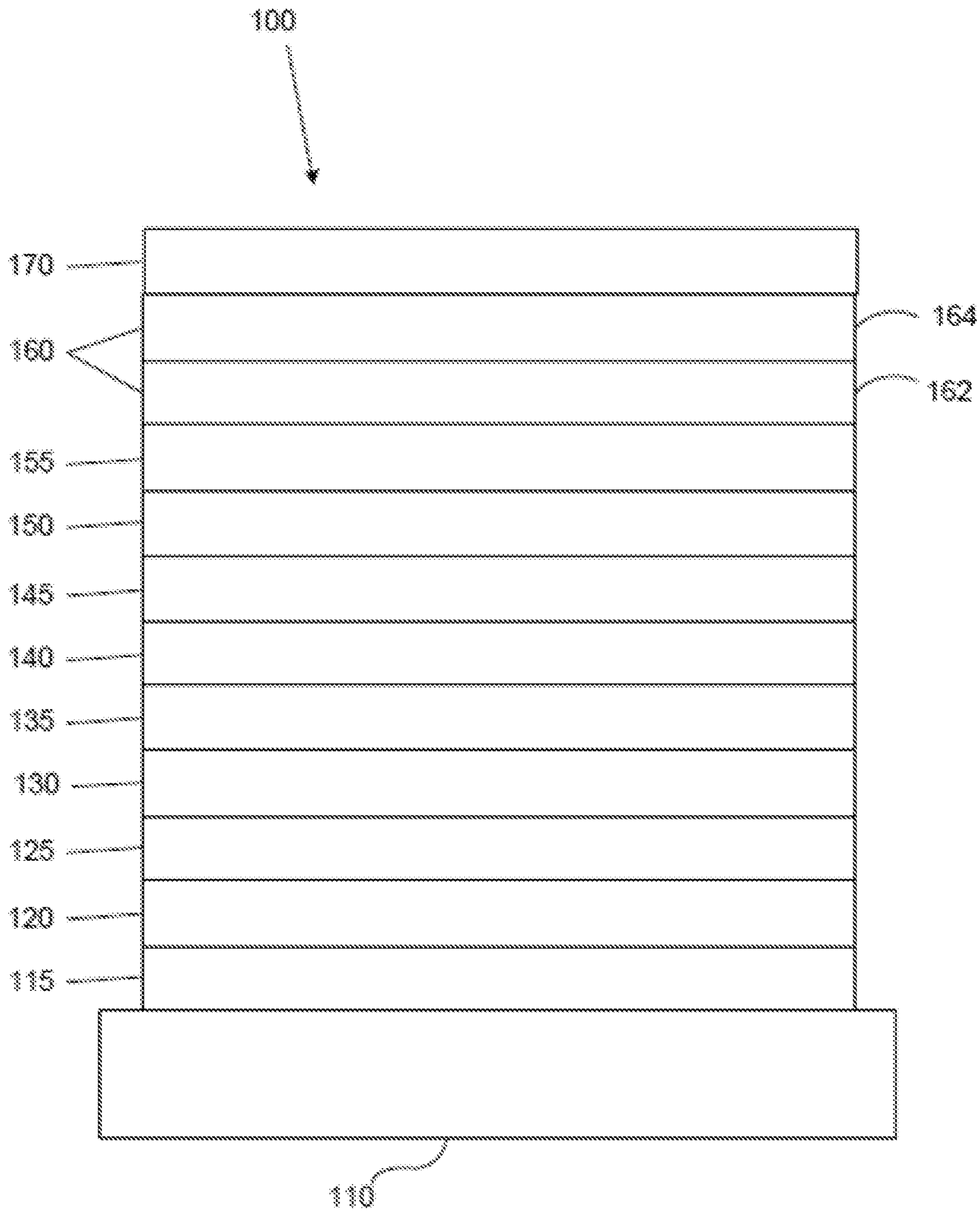
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
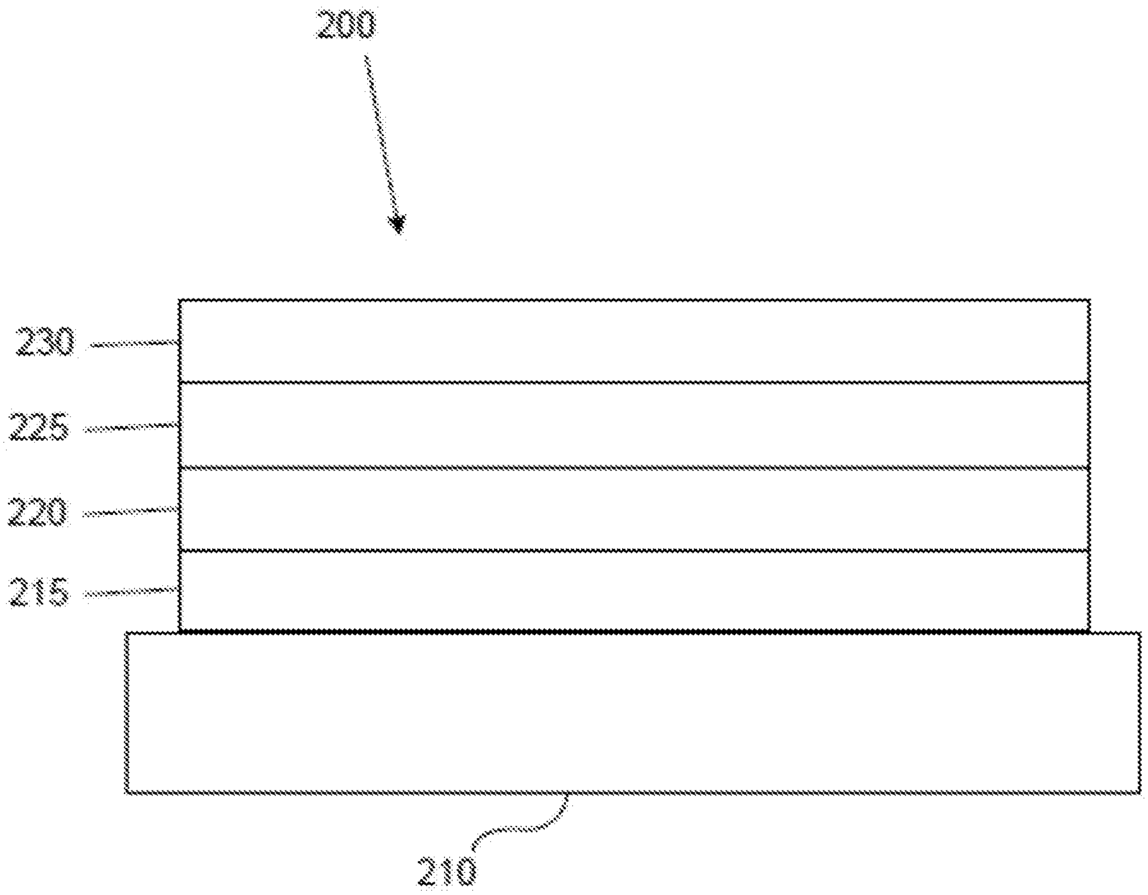
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical ($C(O)—R_s$).

The term "ester" refers to a substituted oxycarbonyl ($—O—C(O)—R_s$ or $—C(O)—O—R_s$) radical.

The term "ether" refers to an $—OR_s$ radical.

The terms "sulfanyl" or "thio-ether" are used interchangeably and refer to a $—SR_s$ radical.

The term "sulfinyl" refers to a $—S(O)—R_s$ radical.

The term "sulfonyl" refers to a $—SO_2—R_s$ radical.

The term "phosphino" refers to a $—P(R_s)_3$ radical, wherein each R can be same or different.

The term "silyl" refers to a $—Si(R_s)_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, 0, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when R' represents mono-substitution, then one R' must be other than H (i.e., a substitution) Similarly, when R' represents di-substitution, then two of R' must be other than H. Similarly, when R' represents no substitution, R', for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., Tetrahedron 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

A series of new phosphorescent metal complexes based on ligands containing naphthalene-pyridine derivatives are disclosed. Further functionalization of these moieties allows fine tuning of the properties of the final complexes, such as color of the light emission, the light emitting efficiency and emission lifetime.

The presence of the naphthalene moiety in the ligands allows bathochromic shift in the light emission by the phosphorescent metal complexes compared to the traditional phenyl-pyridine ligands. This shift enables tuning the emission peak wavelength, $\lambda_{MAX}$, of the metal complexes to be between yellow and red, i.e. amber/orange. The ligands have to contain substituents, $R_A$ and $R_B$, as aliphatic side chains or fluorinated aliphatic side chains. The side chains allow fine tuning of the color of the emission of the metal complexes and also increases their external quantum efficiencies (EQEs). The use of branched side chains can also lead to desired narrow emission line shape and improves the thermal properties of the final material by lowering the sublimation temperature.

There are significant challenges in developing amber/orange emitting metal complexes. For metal complexes containing diketone-based ancillary ligands, they are usually not stable enough to be commercially viable. For heteroleptic metal complexes, the emission is broad and their EQE are low. The novel ligands disclosed herein exhibit improvements in these categories making them attractive options for amber/orange emitting OLEDs.

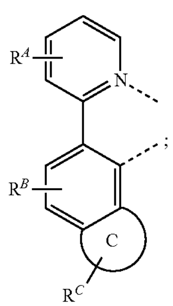

A compound is disclosed that comprises a ligand $L_A$ of Formula I where ring C is a 5-membered or a 6-membered carbocyclic or heterocyclic ring; each $R^A$, $R^B$, and $R^C$ independently represents mono to the maximum allowable number of substitutions, or no substitution; each $R^A$, $R^B$, and $R^C$ is independently a hydrogen or a substituent selected from the group consisting of the general substituents defined above; at least one $R^A$ has the formula —$CH_2R$ or —CHRR'; each R and R' is independently selected from the group consisting of halogen, alkyl, cycloalkyl, heteroalkyl, heterocycloalkyl, arylalkyl, alkoxy, aryloxy, amino, silyl, alkenyl, cycloalkenyl, heteroalkenyl, aryl, heteroaryl, and combinations thereof; $L_A$ is complexed to a metal M; M is optionally coordinated to other ligands; the ligand $L_A$ is optionally linked with other ligands to comprise a tridentate, tetradentate, pentadentate, or hexadentate ligand; and any two substituents of $R^B$ and $R^C$ may be joined or fused together to form a ring.

In some embodiments, R and R' is independently selected from the group consisting of alkyl, cycloalkyl, D variant, F variant, and combinations thereof.

In some embodiments of the compound, each $R^A$, $R^B$, and $R^C$ is independently a hydrogen or a substituent selected from the group consisting of the preferred general substituents defined above.

In some embodiments, M is selected from the group consisting of Os, Ir, Pd, Pt, Cu, and Au. In some embodiments, M is Ir or Pt. In some embodiments, M is Ir(III) or Pt(II).

In some embodiments, R is selected from the group consisting of alkyl, cycloalkyl, partially fluorinated variants thereof, partially or fully deuterated variants thereof, and combination thereof.

In some embodiments, the compound comprises a substituted or unsubstituted acetylacetone ligand.

In some embodiments, at least one $R^B$ comprises a cyclohexyl or tert-butyl group.

In some embodiments, ring C is selected from the group consisting of benzene, pyridine, pyrimidine, pyrazine, and pyridazine. In some embodiments, ring C is a furan or thiofuran ring.

In some embodiments of the compound, the ligand $L_A$ is selected from the group consisting of:

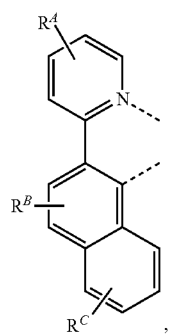,
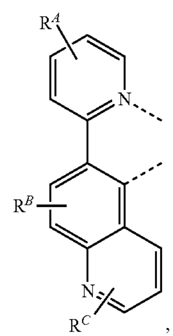,
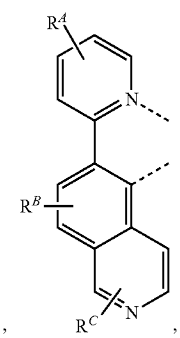,
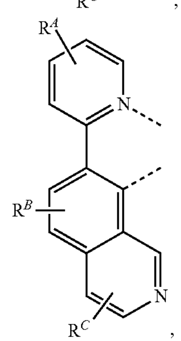,
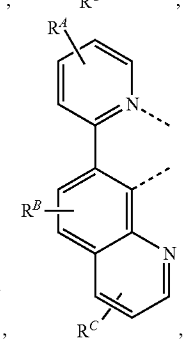,
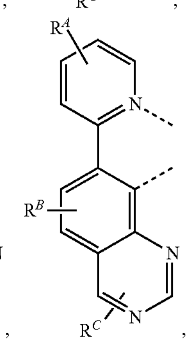,
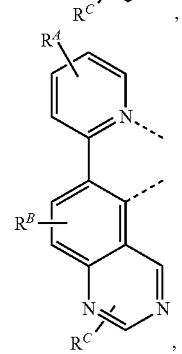,
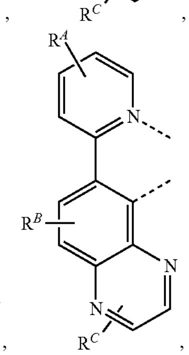,
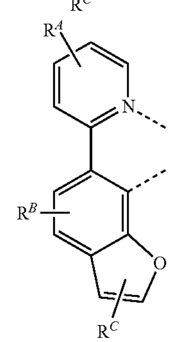, -continued

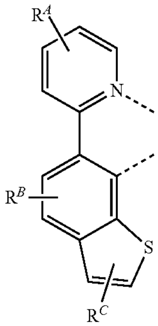
,
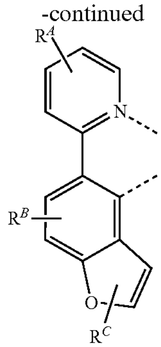
,
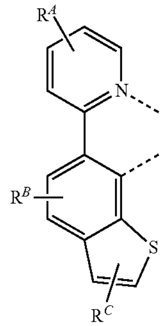
,
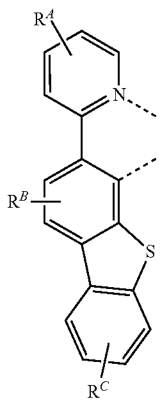
,
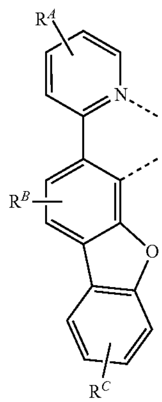
,
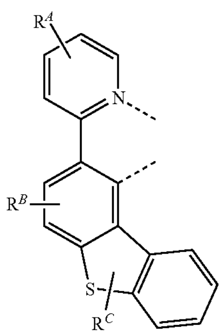
, and
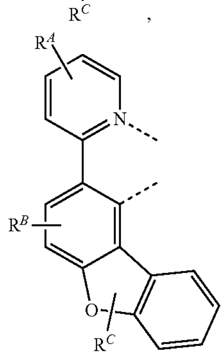
.

In some embodiments of the compound, the ligand $L_A$ is selected from the group consisting of: $L_{A1}$ through $L_{A448}$ based on the structure of Formula II

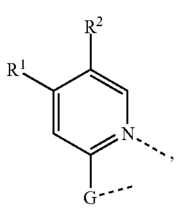

in which $R^1$, $R^2$, and G are defined as:

| Ligand | $R^1$ | $R^2$ | G |
|---|---|---|---|
| $L_{A1}$ | $R^{B3}$ | H | $R^{C2}$ |
| $L_{A2}$ | $R^{B4}$ | H | $R^{C2}$ |
| $L_{A3}$ | $R^{B5}$ | H | $R^{C2}$ |
| $L_{A4}$ | $R^{B18}$ | H | $R^{C2}$ |
| $L_{A5}$ | $R^{B43}$ | H | $R^{C2}$ |
| $L_{A6}$ | $R^{A3}$ | H | $R^{C2}$ |

-continued

| Ligand | $R^1$ | $R^2$ | G |
|---|---|---|---|
| $L_{A7}$ | $R^{A34}$ | H | $R^{C2}$ |
| $L_{A8}$ | $R^{A57}$ | H | $R^{C2}$ |
| $L_{A9}$ | $R^{B3}$ | F | $R^{C2}$ |
| $L_{A10}$ | $R^{B4}$ | F | $R^{C2}$ |
| $L_{A11}$ | $R^{B5}$ | F | $R^{C2}$ |
| $L_{A12}$ | $R^{B18}$ | F | $R^{C2}$ |
| $L_{A13}$ | $R^{B43}$ | F | $R^{C2}$ |
| $L_{A14}$ | $R^{A3}$ | F | $R^{C2}$ |
| $L_{A15}$ | $R^{A34}$ | F | $R^{C2}$ |
| $L_{A16}$ | $R^{A57}$ | F | $R^{C2}$ |
| $L_{A17}$ | $R^{B3}$ | $R^{B1}$ | $R^{C2}$ |
| $L_{A18}$ | $R^{B4}$ | $R^{B1}$ | $R^{C2}$ |
| $L_{A10}$ | $R^{B5}$ | $R^{B1}$ | $R^{C2}$ |
| $L_{A20}$ | $R^{B18}$ | $R^{B1}$ | $R^{C2}$ |
| $L_{A21}$ | $R^{B43}$ | $R^{B1}$ | $R^{C2}$ |
| $L_{A22}$ | $R^{A3}$ | $R^{B1}$ | $R^{C2}$ |
| $L_{A23}$ | $R^{A34}$ | $R^{B1}$ | $R^{C2}$ |
| $L_{A24}$ | $R^{A57}$ | $R^{B1}$ | $R^{C2}$ |
| $L_{A25}$ | $R^{B3}$ | $R^{A74}$ | $R^{C2}$ |
| $L_{A26}$ | $R^{B4}$ | $R^{A74}$ | $R^{C2}$ |
| $L_{A27}$ | $R^{B5}$ | $R^{A74}$ | $R^{C2}$ |
| $L_{A28}$ | $R^{B18}$ | $R^{A74}$ | $R^{C2}$ |
| $L_{A29}$ | $R^{B43}$ | $R^{A74}$ | $R^{C2}$ |
| $L_{A30}$ | $R^{A3}$ | $R^{A74}$ | $R^{C2}$ |
| $L_{A31}$ | $R^{A34}$ | $R^{A74}$ | $R^{C2}$ |
| $L_{A32}$ | $R^{A57}$ | $R^{A74}$ | $R^{C2}$ |
| $L_{A33}$ | $R^{B3}$ | H | $R^{C5}$ |
| $L_{A34}$ | $R^{B4}$ | H | $R^{C5}$ |
| $L_{A35}$ | $R^{B5}$ | H | $R^{C5}$ |
| $L_{A36}$ | $R^{B18}$ | H | $R^{C5}$ |
| $L_{A37}$ | $R^{B43}$ | H | $R^{C5}$ |
| $L_{A38}$ | $R^{A3}$ | H | $R^{C5}$ |
| $L_{A39}$ | $R^{A34}$ | H | $R^{C5}$ |
| $L_{A40}$ | $R^{A57}$ | H | $R^{C5}$ |
| $L_{A41}$ | $R^{B3}$ | F | $R^{C5}$ |
| $L_{A42}$ | $R^{B4}$ | F | $R^{C5}$ |
| $L_{A43}$ | $R^{B5}$ | F | $R^{C5}$ |
| $L_{A44}$ | $R^{B18}$ | F | $R^{C5}$ |
| $L_{A45}$ | $R^{B43}$ | F | $R^{C5}$ |
| $L_{A46}$ | $R^{A3}$ | F | $R^{C5}$ |
| $L_{A47}$ | $R^{A34}$ | F | $R^{C5}$ |
| $L_{A48}$ | $R^{A57}$ | F | $R^{C5}$ |
| $L_{A49}$ | $R^{B3}$ | $R^{B1}$ | $R^{C5}$ |
| $L_{A50}$ | $R^{B4}$ | $R^{B1}$ | $R^{C5}$ |
| $L_{A51}$ | $R^{B5}$ | $R^{B1}$ | $R^{C5}$ |
| $L_{A52}$ | $R^{B18}$ | $R^{B1}$ | $R^{C5}$ |
| $L_{A53}$ | $R^{B43}$ | $R^{B1}$ | $R^{C5}$ |
| $L_{A54}$ | $R^{A3}$ | $R^{B1}$ | $R^{C5}$ |
| $L_{A55}$ | $R^{A34}$ | $R^{B1}$ | $R^{C5}$ |
| $L_{A56}$ | $R^{A57}$ | $R^{B1}$ | $R^{C5}$ |
| $L_{A57}$ | $R^{B3}$ | $R^{A74}$ | $R^{C5}$ |
| $L_{A58}$ | $R^{B4}$ | $R^{A74}$ | $R^{C5}$ |
| $L_{A59}$ | $R^{B5}$ | $R^{A74}$ | $R^{C5}$ |
| $L_{A60}$ | $R^{B18}$ | $R^{A74}$ | $R^{C5}$ |
| $L_{A61}$ | $R^{B43}$ | $R^{A74}$ | $R^{C5}$ |
| $L_{A62}$ | $R^{A3}$ | $R^{A74}$ | $R^{C5}$ |
| $L_{A63}$ | $R^{A34}$ | $R^{A74}$ | $R^{C5}$ |
| $L_{A64}$ | $R^{A57}$ | $R^{A74}$ | $R^{C5}$ |
| $L_{A65}$ | $R^{B3}$ | H | $R^{C6}$ |
| $L_{A66}$ | $R^{B4}$ | H | $R^{C6}$ |
| $L_{A67}$ | $R^{B5}$ | H | $R^{C6}$ |
| $L_{A68}$ | $R^{B18}$ | H | $R^{C6}$ |
| $L_{A69}$ | $R^{B43}$ | H | $R^{C6}$ |
| $L_{A70}$ | $R^{A3}$ | H | $R^{C6}$ |
| $L_{A71}$ | $R^{A34}$ | H | $R^{C6}$ |
| $L_{A72}$ | $R^{A57}$ | H | $R^{C6}$ |
| $L_{A73}$ | $R^{B3}$ | F | $R^{C6}$ |
| $L_{A74}$ | $R^{B4}$ | F | $R^{C6}$ |
| $L_{A75}$ | $R^{B5}$ | F | $R^{C6}$ |
| $L_{A76}$ | $R^{B18}$ | F | $R^{C6}$ |
| $L_{A77}$ | $R^{B43}$ | F | $R^{C6}$ |
| $L_{A78}$ | $R^{A3}$ | F | $R^{C6}$ |
| $L_{A79}$ | $R^{A34}$ | F | $R^{C6}$ |
| $L_{A80}$ | $R^{A57}$ | F | $R^{C6}$ |
| $L_{A81}$ | $R^{B3}$ | $R^{B1}$ | $R^{C6}$ |
| $L_{A82}$ | $R^{B4}$ | $R^{B1}$ | $R^{C6}$ |
| $L_{A83}$ | $R^{B5}$ | $R^{B1}$ | $R^{C6}$ |

-continued

| Ligand | $R^1$ | $R^2$ | G |
|---|---|---|---|
| $L_{A84}$ | $R^{B18}$ | $R^{B1}$ | $R^{C6}$ |
| $L_{A85}$ | $R^{B43}$ | $R^{B1}$ | $R^{C6}$ |
| $L_{A86}$ | $R^{A3}$ | $R^{B1}$ | $R^{C6}$ |
| $L_{A87}$ | $R^{A34}$ | $R^{B1}$ | $R^{C6}$ |
| $L_{A88}$ | $R^{A57}$ | $R^{B1}$ | $R^{C6}$ |
| $L_{A89}$ | $R^{B3}$ | $R^{A74}$ | $R^{C6}$ |
| $L_{A90}$ | $R^{B4}$ | $R^{A74}$ | $R^{C6}$ |
| $L_{A91}$ | $R^{B5}$ | $R^{A74}$ | $R^{C6}$ |
| $L_{A92}$ | $R^{B18}$ | $R^{A74}$ | $R^{C6}$ |
| $L_{A93}$ | $R^{B43}$ | $R^{A74}$ | $R^{C6}$ |
| $L_{A94}$ | $R^{A3}$ | $R^{A74}$ | $R^{C6}$ |
| $L_{A95}$ | $R^{A34}$ | $R^{A74}$ | $R^{C6}$ |
| $L_{A96}$ | $R^{A57}$ | $R^{A74}$ | $R^{C6}$ |
| $L_{A97}$ | $R^{B3}$ | H | $R^{C7}$ |
| $L_{A98}$ | $R^{B4}$ | H | $R^{C7}$ |
| $L_{A99}$ | $R^{B5}$ | H | $R^{C7}$ |
| $L_{A100}$ | $R^{B18}$ | H | $R^{C7}$ |
| $L_{A101}$ | $R^{B43}$ | H | $R^{C7}$ |
| $L_{A102}$ | $R^{A3}$ | H | $R^{C7}$ |
| $L_{A103}$ | $R^{A34}$ | H | $R^{C7}$ |
| $L_{A104}$ | $R^{A57}$ | H | $R^{C7}$ |
| $L_{A105}$ | $R^{B3}$ | F | $R^{C7}$ |
| $L_{A106}$ | $R^{B4}$ | F | $R^{C7}$ |
| $L_{A107}$ | $R^{B5}$ | F | $R^{C7}$ |
| $L_{A108}$ | $R^{B18}$ | F | $R^{C7}$ |
| $L_{A109}$ | $R^{B43}$ | F | $R^{C7}$ |
| $L_{A110}$ | $R^{A3}$ | F | $R^{C7}$ |
| $L_{A111}$ | $R^{A34}$ | F | $R^{C7}$ |
| $L_{A112}$ | $R^{A57}$ | F | $R^{C7}$ |
| $L_{A113}$ | $R^{B3}$ | $R^{B1}$ | $R^{C7}$ |
| $L_{A114}$ | $R^{B4}$ | $R^{B1}$ | $R^{C7}$ |
| $L_{A115}$ | $R^{B5}$ | $R^{B1}$ | $R^{C7}$ |
| $L_{A116}$ | $R^{B18}$ | $R^{B1}$ | $R^{C7}$ |
| $L_{A117}$ | $R^{B43}$ | $R^{B1}$ | $R^{C7}$ |
| $L_{A118}$ | $R^{A3}$ | $R^{B1}$ | $R^{C7}$ |
| $L_{A119}$ | $R^{A34}$ | $R^{B1}$ | $R^{C7}$ |
| $L_{A120}$ | $R^{A57}$ | $R^{B1}$ | $R^{C7}$ |
| $L_{A121}$ | $R^{B3}$ | $R^{A74}$ | $R^{C7}$ |
| $L_{A122}$ | $R^{B4}$ | $R^{A74}$ | $R^{C7}$ |
| $L_{A123}$ | $R^{B5}$ | $R^{A74}$ | $R^{C7}$ |
| $L_{A124}$ | $R^{B18}$ | $R^{A74}$ | $R^{C7}$ |
| $L_{A125}$ | $R^{B43}$ | $R^{A74}$ | $R^{C7}$ |
| $L_{A126}$ | $R^{A3}$ | $R^{A74}$ | $R^{C7}$ |
| $L_{A127}$ | $R^{A34}$ | $R^{A74}$ | $R^{C7}$ |
| $L_{A128}$ | $R^{A57}$ | $R^{A74}$ | $R^{C7}$ |
| $L_{A129}$ | $R^{B3}$ | H | $R^{C10}$ |
| $L_{A130}$ | $R^{B4}$ | H | $R^{C10}$ |
| $L_{A131}$ | $R^{B5}$ | H | $R^{C10}$ |
| $L_{A132}$ | $R^{B18}$ | H | $R^{C10}$ |
| $L_{A133}$ | $R^{B43}$ | H | $R^{C10}$ |
| $L_{A134}$ | $R^{A3}$ | H | $R^{C10}$ |
| $L_{A135}$ | $R^{A34}$ | H | $R^{C10}$ |
| $L_{A136}$ | $R^{A57}$ | H | $R^{C10}$ |
| $L_{A137}$ | $R^{B3}$ | F | $R^{C10}$ |
| $L_{A138}$ | $R^{B4}$ | F | $R^{C10}$ |
| $L_{A139}$ | $R^{B5}$ | F | $R^{C10}$ |
| $L_{A140}$ | $R^{B18}$ | F | $R^{C10}$ |
| $L_{A141}$ | $R^{B43}$ | F | $R^{C10}$ |
| $L_{A142}$ | $R^{A3}$ | F | $R^{C10}$ |
| $L_{A143}$ | $R^{A34}$ | F | $R^{C10}$ |
| $L_{A144}$ | $R^{A57}$ | F | $R^{C10}$ |
| $L_{A145}$ | $R^{B3}$ | $R^{B1}$ | $R^{C10}$ |
| $L_{A146}$ | $R^{B4}$ | $R^{B1}$ | $R^{C10}$ |
| $L_{A147}$ | $R^{B5}$ | $R^{B1}$ | $R^{C10}$ |
| $L_{A148}$ | $R^{B18}$ | $R^{B1}$ | $R^{C10}$ |
| $L_{A149}$ | $R^{B43}$ | $R^{B1}$ | $R^{C10}$ |
| $L_{A150}$ | $R^{A3}$ | $R^{B1}$ | $R^{C10}$ |
| $L_{A151}$ | $R^{A34}$ | $R^{B1}$ | $R^{C10}$ |
| $L_{A152}$ | $R^{A57}$ | $R^{B1}$ | $R^{C10}$ |
| $L_{A153}$ | $R^{B3}$ | $R^{A74}$ | $R^{C10}$ |
| $L_{A154}$ | $R^{B4}$ | $R^{A74}$ | $R^{C10}$ |
| $L_{A155}$ | $R^{B5}$ | $R^{A74}$ | $R^{C10}$ |
| $L_{A156}$ | $R^{B18}$ | $R^{A74}$ | $R^{C10}$ |
| $L_{A157}$ | $R^{B43}$ | $R^{A74}$ | $R^{C10}$ |
| $L_{A158}$ | $R^{A3}$ | $R^{A74}$ | $R^{C10}$ |
| $L_{A159}$ | $R^{A34}$ | $R^{A74}$ | $R^{C10}$ |
| $L_{A160}$ | $R^{A57}$ | $R^{A74}$ | $R^{C10}$ |

-continued

| Ligand | $R^1$ | $R^2$ | G |
|---|---|---|---|
| $L_{A161}$ | $R^{B3}$ | H | $R^{C11}$ |
| $L_{A162}$ | $R^{B4}$ | H | $R^{C11}$ |
| $L_{A163}$ | $R^{B5}$ | H | $R^{C11}$ |
| $L_{A164}$ | $R^{B18}$ | H | $R^{C11}$ |
| $L_{A165}$ | $R^{B43}$ | H | $R^{C11}$ |
| $L_{A166}$ | $R^{A3}$ | H | $R^{C11}$ |
| $L_{A167}$ | $R^{A34}$ | H | $R^{C11}$ |
| $L_{A168}$ | $R^{A57}$ | H | $R^{C11}$ |
| $L_{A169}$ | $R^{B3}$ | F | $R^{C11}$ |
| $L_{A170}$ | $R^{B4}$ | F | $R^{C11}$ |
| $L_{A171}$ | $R^{B5}$ | F | $R^{C11}$ |
| $L_{A172}$ | $R^{B18}$ | F | $R^{C11}$ |
| $L_{A173}$ | $R^{B43}$ | F | $R^{C11}$ |
| $L_{A174}$ | $R^{A3}$ | F | $R^{C11}$ |
| $L_{A175}$ | $R^{A34}$ | F | $R^{C11}$ |
| $L_{A176}$ | $R^{A57}$ | F | $R^{C11}$ |
| $L_{A177}$ | $R^{B3}$ | $R^{B1}$ | $R^{C11}$ |
| $L_{A178}$ | $R^{B4}$ | $R^{B1}$ | $R^{C11}$ |
| $L_{A179}$ | $R^{B5}$ | $R^{B1}$ | $R^{C11}$ |
| $L_{A180}$ | $R^{B18}$ | $R^{B1}$ | $R^{C11}$ |
| $L_{A181}$ | $R^{B43}$ | $R^{B1}$ | $R^{C11}$ |
| $L_{A182}$ | $R^{A3}$ | $R^{B1}$ | $R^{C11}$ |
| $L_{A183}$ | $R^{A34}$ | $R^{B1}$ | $R^{C11}$ |
| $L_{A184}$ | $R^{A57}$ | $R^{B1}$ | $R^{C11}$ |
| $L_{A185}$ | $R^{B3}$ | $R^{A74}$ | $R^{C11}$ |
| $L_{A186}$ | $R^{B4}$ | $R^{A74}$ | $R^{C11}$ |
| $L_{A187}$ | $R^{B5}$ | $R^{A74}$ | $R^{C11}$ |
| $L_{A188}$ | $R^{B18}$ | $R^{A74}$ | $R^{C11}$ |
| $L_{A189}$ | $R^{B43}$ | $R^{A74}$ | $R^{C11}$ |
| $L_{A190}$ | $R^{A3}$ | $R^{A74}$ | $R^{C11}$ |
| $L_{A191}$ | $R^{A34}$ | $R^{A74}$ | $R^{C11}$ |
| $L_{A192}$ | $R^{A57}$ | $R^{A74}$ | $R^{C11}$ |
| $L_{A193}$ | $R^{B3}$ | H | $R^{C13}$ |
| $L_{A194}$ | $R^{B4}$ | H | $R^{C13}$ |
| $L_{A195}$ | $R^{B5}$ | H | $R^{C13}$ |
| $L_{A196}$ | $R^{B18}$ | H | $R^{C13}$ |
| $L_{A197}$ | $R^{B43}$ | H | $R^{C13}$ |
| $L_{A198}$ | $R^{A3}$ | H | $R^{C13}$ |
| $L_{A199}$ | $R^{A34}$ | H | $R^{C13}$ |
| $L_{A200}$ | $R^{A57}$ | H | $R^{C13}$ |
| $L_{A201}$ | $R^{B3}$ | F | $R^{C13}$ |
| $L_{A202}$ | $R^{B4}$ | F | $R^{C13}$ |
| $L_{A203}$ | $R^{B5}$ | F | $R^{C13}$ |
| $L_{A204}$ | $R^{B18}$ | F | $R^{C13}$ |
| $L_{A205}$ | $R^{B43}$ | F | $R^{C13}$ |
| $L_{A206}$ | $R^{A3}$ | F | $R^{C13}$ |
| $L_{A207}$ | $R^{A34}$ | F | $R^{C13}$ |
| $L_{A208}$ | $R^{A57}$ | F | $R^{C13}$ |
| $L_{A209}$ | $R^{B3}$ | $R^{B1}$ | $R^{C13}$ |
| $L_{A210}$ | $R^{B4}$ | $R^{B1}$ | $R^{C13}$ |
| $L_{A211}$ | $R^{B5}$ | $R^{B1}$ | $R^{C13}$ |
| $L_{A212}$ | $R^{B18}$ | $R^{B1}$ | $R^{C13}$ |
| $L_{A213}$ | $R^{B43}$ | $R^{B1}$ | $R^{C13}$ |
| $L_{A214}$ | $R^{A3}$ | $R^{B1}$ | $R^{C13}$ |
| $L_{A215}$ | $R^{A34}$ | $R^{B1}$ | $R^{C13}$ |
| $L_{A216}$ | $R^{A57}$ | $R^{B1}$ | $R^{C13}$ |
| $L_{A217}$ | $R^{B3}$ | $R^{A74}$ | $R^{C13}$ |
| $L_{A218}$ | $R^{B4}$ | $R^{A74}$ | $R^{C13}$ |
| $L_{A219}$ | $R^{B5}$ | $R^{A74}$ | $R^{C13}$ |
| $L_{A220}$ | $R^{B18}$ | $R^{A74}$ | $R^{C13}$ |
| $L_{A221}$ | $R^{B43}$ | $R^{A74}$ | $R^{C13}$ |
| $L_{A222}$ | $R^{A3}$ | $R^{A74}$ | $R^{C13}$ |
| $L_{A223}$ | $R^{A34}$ | $R^{A74}$ | $R^{C13}$ |
| $L_{A224}$ | $R^{A57}$ | $R^{A74}$ | $R^{C13}$ |
| $L_{A225}$ | $R^{B3}$ | H | $R^{C17}$ |
| $L_{A226}$ | $R^{B4}$ | H | $R^{C17}$ |
| $L_{A227}$ | $R^{B5}$ | H | $R^{C17}$ |
| $L_{A228}$ | $R^{B18}$ | H | $R^{C17}$ |
| $L_{A229}$ | $R^{B43}$ | H | $R^{C17}$ |
| $L_{A230}$ | $R^{A3}$ | H | $R^{C17}$ |
| $L_{A231}$ | $R^{A34}$ | H | $R^{C17}$ |
| $L_{A232}$ | $R^{A57}$ | H | $R^{C17}$ |
| $L_{A233}$ | $R^{B3}$ | F | $R^{C17}$ |
| $L_{A234}$ | $R^{B4}$ | F | $R^{C17}$ |
| $L_{A235}$ | $R^{B5}$ | F | $R^{C17}$ |
| $L_{A236}$ | $R^{B18}$ | F | $R^{C17}$ |
| $L_{A237}$ | $R^{B43}$ | F | $R^{C17}$ |

-continued

| Ligand | $R^1$ | $R^2$ | G |
|---|---|---|---|
| $L_{A238}$ | $R^{A3}$ | F | $R^{C17}$ |
| $L_{A239}$ | $R^{A34}$ | F | $R^{C17}$ |
| $L_{A240}$ | $R^{A57}$ | F | $R^{C17}$ |
| $L_{A241}$ | $R^{B3}$ | $R^{B1}$ | $R^{C17}$ |
| $L_{A242}$ | $R^{B4}$ | $R^{B1}$ | $R^{C17}$ |
| $L_{A243}$ | $R^{B5}$ | $R^{B1}$ | $R^{C17}$ |
| $L_{A244}$ | $R^{B18}$ | $R^{B1}$ | $R^{C17}$ |
| $L_{A245}$ | $R^{B43}$ | $R^{B1}$ | $R^{C17}$ |
| $L_{A246}$ | $R^{A3}$ | $R^{B1}$ | $R^{C17}$ |
| $L_{A247}$ | $R^{A34}$ | $R^{B1}$ | $R^{C17}$ |
| $L_{A248}$ | $R^{A57}$ | $R^{B1}$ | $R^{C17}$ |
| $L_{A249}$ | $R^{B3}$ | $R^{A74}$ | $R^{C17}$ |
| $L_{A250}$ | $R^{B4}$ | $R^{A74}$ | $R^{C17}$ |
| $L_{A251}$ | $R^{B5}$ | $R^{A74}$ | $R^{C17}$ |
| $L_{A252}$ | $R^{B18}$ | $R^{A74}$ | $R^{C17}$ |
| $L_{A253}$ | $R^{B43}$ | $R^{A74}$ | $R^{C17}$ |
| $L_{A254}$ | $R^{A3}$ | $R^{A74}$ | $R^{C17}$ |
| $L_{A255}$ | $R^{A34}$ | $R^{A74}$ | $R^{C17}$ |
| $L_{A256}$ | $R^{A57}$ | $R^{A74}$ | $R^{C17}$ |
| $L_{A257}$ | $R^{B3}$ | H | $R^{C20}$ |
| $L_{A258}$ | $R^{B4}$ | H | $R^{C20}$ |
| $L_{A259}$ | $R^{B5}$ | H | $R^{C20}$ |
| $L_{A260}$ | $R^{B18}$ | H | $R^{C20}$ |
| $L_{A261}$ | $R^{B43}$ | H | $R^{C20}$ |
| $L_{A262}$ | $R^{A3}$ | H | $R^{C20}$ |
| $L_{A263}$ | $R^{A34}$ | H | $R^{C20}$ |
| $L_{A264}$ | $R^{A57}$ | H | $R^{C20}$ |
| $L_{A265}$ | $R^{B3}$ | F | $R^{C20}$ |
| $L_{A266}$ | $R^{B4}$ | F | $R^{C20}$ |
| $L_{A267}$ | $R^{B5}$ | F | $R^{C20}$ |
| $L_{A268}$ | $R^{B18}$ | F | $R^{C20}$ |
| $L_{A269}$ | $R^{B43}$ | F | $R^{C20}$ |
| $L_{A270}$ | $R^{A3}$ | F | $R^{C20}$ |
| $L_{A271}$ | $R^{A34}$ | F | $R^{C20}$ |
| $L_{A272}$ | $R^{A57}$ | F | $R^{C20}$ |
| $L_{A273}$ | $R^{B3}$ | $R^{B1}$ | $R^{C20}$ |
| $L_{A274}$ | $R^{B4}$ | $R^{B1}$ | $R^{C20}$ |
| $L_{A275}$ | $R^{B5}$ | $R^{B1}$ | $R^{C20}$ |
| $L_{A276}$ | $R^{B18}$ | $R^{B1}$ | $R^{C20}$ |
| $L_{A277}$ | $R^{B43}$ | $R^{B1}$ | $R^{C20}$ |
| $L_{A278}$ | $R^{A3}$ | $R^{B1}$ | $R^{C20}$ |
| $L_{A279}$ | $R^{A34}$ | $R^{B1}$ | $R^{C20}$ |
| $L_{A280}$ | $R^{A57}$ | $R^{B1}$ | $R^{C20}$ |
| $L_{A281}$ | $R^{B3}$ | $R^{A74}$ | $R^{C20}$ |
| $L_{A282}$ | $R^{B4}$ | $R^{A74}$ | $R^{C20}$ |
| $L_{A283}$ | $R^{B5}$ | $R^{A74}$ | $R^{C20}$ |
| $L_{A284}$ | $R^{B18}$ | $R^{A74}$ | $R^{C20}$ |
| $L_{A285}$ | $R^{B43}$ | $R^{A74}$ | $R^{C20}$ |
| $L_{A286}$ | $R^{A3}$ | $R^{A74}$ | $R^{C20}$ |
| $L_{A287}$ | $R^{A34}$ | $R^{A74}$ | $R^{C20}$ |
| $L_{A288}$ | $R^{A57}$ | $R^{A74}$ | $R^{C20}$ |
| $L_{A289}$ | $R^{B3}$ | H | $R^{C24}$ |
| $L_{A290}$ | $R^{B4}$ | H | $R^{C24}$ |
| $L_{A291}$ | $R^{B5}$ | H | $R^{C24}$ |
| $L_{A292}$ | $R^{B18}$ | H | $R^{C24}$ |
| $L_{A293}$ | $R^{B43}$ | H | $R^{C24}$ |
| $L_{A294}$ | $R^{A3}$ | H | $R^{C24}$ |
| $L_{A295}$ | $R^{A34}$ | H | $R^{C24}$ |
| $L_{A296}$ | $R^{A57}$ | H | $R^{C24}$ |
| $L_{A297}$ | $R^{B3}$ | F | $R^{C24}$ |
| $L_{A298}$ | $R^{B4}$ | F | $R^{C24}$ |
| $L_{A299}$ | $R^{B5}$ | F | $R^{C24}$ |
| $L_{A300}$ | $R^{B18}$ | F | $R^{C24}$ |
| $L_{A301}$ | $R^{B43}$ | F | $R^{C24}$ |
| $L_{A302}$ | $R^{A3}$ | F | $R^{C24}$ |
| $L_{A303}$ | $R^{A34}$ | F | $R^{C24}$ |
| $L_{A304}$ | $R^{A57}$ | F | $R^{C24}$ |
| $L_{A305}$ | $R^{B3}$ | $R^{B1}$ | $R^{C24}$ |
| $L_{A306}$ | $R^{B4}$ | $R^{B1}$ | $R^{C24}$ |
| $L_{A307}$ | $R^{B5}$ | $R^{B1}$ | $R^{C24}$ |
| $L_{A308}$ | $R^{B18}$ | $R^{B1}$ | $R^{C24}$ |
| $L_{A309}$ | $R^{B43}$ | $R^{B1}$ | $R^{C24}$ |
| $L_{A310}$ | $R^{A3}$ | $R^{B1}$ | $R^{C24}$ |
| $L_{A311}$ | $R^{A34}$ | $R^{B1}$ | $R^{C24}$ |
| $L_{A312}$ | $R^{A57}$ | $R^{B1}$ | $R^{C24}$ |
| $L_{A313}$ | $R^{B3}$ | $R^{A74}$ | $R^{C24}$ |
| $L_{A314}$ | $R^{B4}$ | $R^{A74}$ | $R^{C24}$ |
| $L_{A315}$ | $R^{B5}$ | $R^{A74}$ | $R^{C24}$ |
| $L_{A316}$ | $R^{B18}$ | $R^{A74}$ | $R^{C24}$ |
| $L_{A317}$ | $R^{B43}$ | $R^{A74}$ | $R^{C24}$ |
| $L_{A318}$ | $R^{A3}$ | $R^{A74}$ | $R^{C24}$ |
| $L_{A319}$ | $R^{A34}$ | $R^{A74}$ | $R^{C24}$ |
| $L_{A320}$ | $R^{A57}$ | $R^{A74}$ | $R^{C24}$ |
| $L_{A321}$ | $R^{B3}$ | H | $R^{C27}$ |
| $L_{A322}$ | $R^{B4}$ | H | $R^{C27}$ |
| $L_{A323}$ | $R^{B5}$ | H | $R^{C27}$ |
| $L_{A324}$ | $R^{B18}$ | H | $R^{C27}$ |
| $L_{A325}$ | $R^{B43}$ | H | $R^{C27}$ |
| $L_{A326}$ | $R^{A3}$ | H | $R^{C27}$ |
| $L_{A327}$ | $R^{A34}$ | H | $R^{C27}$ |
| $L_{A328}$ | $R^{A57}$ | H | $R^{C27}$ |
| $L_{A329}$ | $R^{B3}$ | F | $R^{C27}$ |
| $L_{A330}$ | $R^{B4}$ | F | $R^{C27}$ |
| $L_{A331}$ | $R^{B5}$ | F | $R^{C27}$ |
| $L_{A332}$ | $R^{B18}$ | F | $R^{C27}$ |
| $L_{A333}$ | $R^{B43}$ | F | $R^{C27}$ |
| $L_{A334}$ | $R^{A3}$ | F | $R^{C27}$ |
| $L_{A335}$ | $R^{A34}$ | F | $R^{C27}$ |
| $L_{A336}$ | $R^{A57}$ | F | $R^{C27}$ |
| $L_{A337}$ | $R^{B3}$ | $R^{B1}$ | $R^{C27}$ |
| $L_{A338}$ | $R^{B4}$ | $R^{B1}$ | $R^{C27}$ |
| $L_{A339}$ | $R^{B5}$ | $R^{B1}$ | $R^{C27}$ |
| $L_{A340}$ | $R^{B18}$ | $R^{B1}$ | $R^{C27}$ |
| $L_{A341}$ | $R^{B43}$ | $R^{B1}$ | $R^{C27}$ |
| $L_{A342}$ | $R^{A3}$ | $R^{B1}$ | $R^{C27}$ |
| $L_{A343}$ | $R^{A34}$ | $R^{B1}$ | $R^{C27}$ |
| $L_{A344}$ | $R^{A57}$ | $R^{B1}$ | $R^{C27}$ |
| $L_{A345}$ | $R^{B3}$ | $R^{A74}$ | $R^{C27}$ |
| $L_{A346}$ | $R^{B4}$ | $R^{A74}$ | $R^{C27}$ |
| $L_{A347}$ | $R^{B5}$ | $R^{A74}$ | $R^{C27}$ |
| $L_{A348}$ | $R^{B18}$ | $R^{A74}$ | $R^{C27}$ |
| $L_{A349}$ | $R^{B43}$ | $R^{A74}$ | $R^{C27}$ |
| $L_{A350}$ | $R^{A3}$ | $R^{A74}$ | $R^{C27}$ |
| $L_{A351}$ | $R^{A34}$ | $R^{A74}$ | $R^{C27}$ |
| $L_{A352}$ | $R^{A57}$ | $R^{A74}$ | $R^{C27}$ |
| $L_{A353}$ | $R^{B3}$ | H | $R^{C31}$ |
| $L_{A354}$ | $R^{B4}$ | H | $R^{C31}$ |
| $L_{A355}$ | $R^{B5}$ | H | $R^{C31}$ |
| $L_{A356}$ | $R^{B18}$ | H | $R^{C31}$ |
| $L_{A357}$ | $R^{B43}$ | H | $R^{C31}$ |
| $L_{A358}$ | $R^{A3}$ | H | $R^{C31}$ |
| $L_{A359}$ | $R^{A34}$ | H | $R^{C31}$ |
| $L_{A360}$ | $R^{A57}$ | H | $R^{C31}$ |
| $L_{A361}$ | $R^{B3}$ | F | $R^{C31}$ |
| $L_{A362}$ | $R^{B4}$ | F | $R^{C31}$ |
| $L_{A363}$ | $R^{B5}$ | F | $R^{C31}$ |
| $L_{A364}$ | $R^{B18}$ | F | $R^{C31}$ |
| $L_{A365}$ | $R^{B43}$ | F | $R^{C31}$ |
| $L_{A366}$ | $R^{A3}$ | F | $R^{C31}$ |
| $L_{A367}$ | $R^{A34}$ | F | $R^{C31}$ |
| $L_{A368}$ | $R^{A57}$ | F | $R^{C31}$ |
| $L_{A369}$ | $R^{B3}$ | $R^{B1}$ | $R^{C31}$ |
| $L_{A370}$ | $R^{B4}$ | $R^{B1}$ | $R^{C31}$ |
| $L_{A371}$ | $R^{B5}$ | $R^{B1}$ | $R^{C31}$ |
| $L_{A372}$ | $R^{B18}$ | $R^{B1}$ | $R^{C31}$ |
| $L_{A373}$ | $R^{B43}$ | $R^{B1}$ | $R^{C31}$ |
| $L_{A374}$ | $R^{A3}$ | $R^{B1}$ | $R^{C31}$ |
| $L_{A375}$ | $R^{A34}$ | $R^{B1}$ | $R^{C31}$ |
| $L_{A376}$ | $R^{A57}$ | $R^{B1}$ | $R^{C31}$ |
| $L_{A377}$ | $R^{B3}$ | $R^{A74}$ | $R^{C31}$ |
| $L_{A378}$ | $R^{B4}$ | $R^{A74}$ | $R^{C31}$ |
| $L_{A379}$ | $R^{B5}$ | $R^{A74}$ | $R^{C31}$ |
| $L_{A380}$ | $R^{B18}$ | $R^{A74}$ | $R^{C31}$ |
| $L_{A381}$ | $R^{B43}$ | $R^{A74}$ | $R^{C31}$ |
| $L_{A382}$ | $R^{A3}$ | $R^{A74}$ | $R^{C31}$ |
| $L_{A383}$ | $R^{A34}$ | $R^{A74}$ | $R^{C31}$ |
| $L_{A384}$ | $R^{A57}$ | $R^{A74}$ | $R^{C31}$ |
| $L_{A385}$ | $R^{B3}$ | H | $R^{C34}$ |
| $L_{A386}$ | $R^{B4}$ | H | $R^{C34}$ |
| $L_{A387}$ | $R^{B5}$ | H | $R^{C34}$ |
| $L_{A388}$ | $R^{B18}$ | H | $R^{C34}$ |
| $L_{A389}$ | $R^{B43}$ | H | $R^{C34}$ |
| $L_{A390}$ | $R^{A3}$ | H | $R^{C34}$ |
| $L_{A391}$ | $R^{A34}$ | H | $R^{C34}$ |

-continued

| Ligand | $R^1$ | $R^2$ | G |
|---|---|---|---|
| $L_{A4392}$ | $R^{A57}$ | H | $R^{C34}$ |
| $L_{A4393}$ | $R^{B3}$ | F | $R^{C34}$ |
| $L_{A4394}$ | $R^{B4}$ | F | $R^{C34}$ |
| $L_{A4395}$ | $R^{B5}$ | F | $R^{C34}$ |
| $L_{A4396}$ | $R^{B18}$ | F | $R^{C34}$ |
| $L_{A4397}$ | $R^{B43}$ | F | $R^{C34}$ |
| $L_{A4398}$ | $R^{A3}$ | F | $R^{C34}$ |
| $L_{A4399}$ | $R^{A34}$ | F | $R^{C34}$ |
| $L_{A4400}$ | $R^{A57}$ | F | $R^{C34}$ |
| $L_{A4401}$ | $R^{B3}$ | $R^{B1}$ | $R^{C34}$ |
| $L_{A4402}$ | $R^{B4}$ | $R^{B1}$ | $R^{C34}$ |
| $L_{A4403}$ | $R^{B5}$ | $R^{B1}$ | $R^{C34}$ |
| $L_{A4404}$ | $R^{B18}$ | $R^{B1}$ | $R^{C34}$ |
| $L_{A4405}$ | $R^{B43}$ | $R^{B1}$ | $R^{C34}$ |
| $L_{A4406}$ | $R^{A3}$ | $R^{B1}$ | $R^{C34}$ |
| $L_{A4407}$ | $R^{A34}$ | $R^{B1}$ | $R^{C34}$ |
| $L_{A4408}$ | $R^{A57}$ | $R^{B1}$ | $R^{C34}$ |
| $L_{A4409}$ | $R^{B3}$ | $R^{A74}$ | $R^{C34}$ |
| $L_{A4410}$ | $R^{B4}$ | $R^{A74}$ | $R^{C34}$ |
| $L_{A4411}$ | $R^{B5}$ | $R^{A74}$ | $R^{C34}$ |
| $L_{A4412}$ | $R^{B18}$ | $R^{A74}$ | $R^{C34}$ |
| $L_{A4413}$ | $R^{B43}$ | $R^{A74}$ | $R^{C34}$ |
| $L_{A4414}$ | $R^{A3}$ | $R^{A74}$ | $R^{C34}$ |
| $L_{A4415}$ | $R^{A34}$ | $R^{A74}$ | $R^{C34}$ |
| $L_{A4416}$ | $R^{A57}$ | $R^{A74}$ | $R^{C34}$ |
| $L_{A4417}$ | $R^{B3}$ | H | $R^{C38}$ |
| $L_{A4418}$ | $R^{B4}$ | H | $R^{C38}$ |
| $L_{A4419}$ | $R^{B5}$ | H | $R^{C38}$ |
| $L_{A4420}$ | $R^{B18}$ | H | $R^{C38}$ |
| $L_{A4421}$ | $R^{B43}$ | H | $R^{C38}$ |
| $L_{A4422}$ | $R^{A3}$ | H | $R^{C38}$ |
| $L_{A4423}$ | $R^{A34}$ | H | $R^{C38}$ |
| $L_{A4424}$ | $R^{A57}$ | H | $R^{C38}$ |
| $L_{A4425}$ | $R^{B3}$ | F | $R^{C38}$ |
| $L_{A4426}$ | $R^{B4}$ | F | $R^{C38}$ |
| $L_{A4427}$ | $R^{B5}$ | F | $R^{C38}$ |
| $L_{A4428}$ | $R^{B18}$ | F | $R^{C38}$ |
| $L_{A4429}$ | $R^{B43}$ | F | $R^{C38}$ |
| $L_{A4430}$ | $R^{A3}$ | F | $R^{C38}$ |
| $L_{A4431}$ | $R^{A34}$ | F | $R^{C38}$ |
| $L_{A4432}$ | $R^{A57}$ | F | $R^{C38}$ |
| $L_{A4433}$ | $R^{B3}$ | $R^{B1}$ | $R^{C38}$ |
| $L_{A4434}$ | $R^{B4}$ | $R^{B1}$ | $R^{C38}$ |
| $L_{A4435}$ | $R^{B5}$ | $R^{B1}$ | $R^{C38}$ |
| $L_{A4436}$ | $R^{B18}$ | $R^{B1}$ | $R^{C38}$ |
| $L_{A4437}$ | $R^{B43}$ | $R^{B1}$ | $R^{C38}$ |
| $L_{A4438}$ | $R^{A3}$ | $R^{B1}$ | $R^{C38}$ |
| $L_{A4439}$ | $R^{A34}$ | $R^{B1}$ | $R^{C38}$ |
| $L_{A4440}$ | $R^{A57}$ | $R^{B1}$ | $R^{C38}$ |
| $L_{A4441}$ | $R^{B3}$ | $R^{A74}$ | $R^{C38}$ |
| $L_{A4442}$ | $R^{B4}$ | $R^{A74}$ | $R^{C38}$ |
| $L_{A4443}$ | $R^{B5}$ | $R^{A74}$ | $R^{C38}$ |
| $L_{A4444}$ | $R^{B18}$ | $R^{A74}$ | $R^{C38}$ |
| $L_{A4445}$ | $R^{B43}$ | $R^{A74}$ | $R^{C38}$ |
| $L_{A4446}$ | $R^{A3}$ | $R^{A74}$ | $R^{C38}$ |
| $L_{A4447}$ | $R^{A34}$ | $R^{A74}$ | $R^{C38}$ |
| $L_{A4448}$ | $R^{A57}$ | $R^{A74}$ | $R^{C38}$, |

$L_{A4449}$ through $L_{A4896}$ based on a structure of Formula II

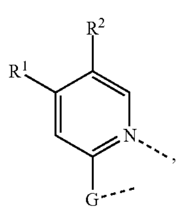

in which $R^1$, $R^2$, and G are defined as:

| Ligand | $R^1$ | $R^2$ | G |
|---|---|---|---|
| $L_{A4449}$ | H | $R^{B3}$ | $R^{C2}$ |
| $L_{A4450}$ | H | $R^{B4}$ | $R^{C2}$ |
| $L_{A4451}$ | H | $R^{B5}$ | $R^{C2}$ |
| $L_{A4452}$ | H | $R^{B18}$ | $R^{C2}$ |
| $L_{A4453}$ | H | $R^{B43}$ | $R^{C2}$ |
| $L_{A4454}$ | H | $R^{A3}$ | $R^{C2}$ |
| $L_{A4455}$ | H | $R^{A34}$ | $R^{C2}$ |
| $L_{A4456}$ | H | $R^{A57}$ | $R^{C2}$ |
| $L_{A4457}$ | F | $R^{B3}$ | $R^{C2}$ |
| $L_{A4458}$ | F | $R^{B4}$ | $R^{C2}$ |
| $L_{A4459}$ | F | $R^{B5}$ | $R^{C2}$ |
| $L_{A4460}$ | F | $R^{B18}$ | $R^{C2}$ |
| $L_{A4461}$ | F | $R^{B43}$ | $R^{C2}$ |
| $L_{A4462}$ | F | $R^{A3}$ | $R^{C2}$ |
| $L_{A4463}$ | F | $R^{A34}$ | $R^{C2}$ |
| $L_{A4464}$ | F | $R^{A57}$ | $R^{C2}$ |
| $L_{A4465}$ | $R^{B1}$ | $R^{B3}$ | $R^{C2}$ |
| $L_{A4466}$ | $R^{B1}$ | $R^{B4}$ | $R^{C2}$ |
| $L_{A4467}$ | $R^{B1}$ | $R^{B5}$ | $R^{C2}$ |
| $L_{A4468}$ | $R^{B1}$ | $R^{B18}$ | $R^{C2}$ |
| $L_{A4469}$ | $R^{B1}$ | $R^{B43}$ | $R^{C2}$ |
| $L_{A4470}$ | $R^{B1}$ | $R^{A3}$ | $R^{C2}$ |
| $L_{A4471}$ | $R^{B1}$ | $R^{A34}$ | $R^{C2}$ |
| $L_{A4472}$ | $R^{B1}$ | $R^{A57}$ | $R^{C2}$ |
| $L_{A4473}$ | $R^{A74}$ | $R^{B3}$ | $R^{C2}$ |
| $L_{A4474}$ | $R^{A74}$ | $R^{B4}$ | $R^{C2}$ |
| $L_{A4475}$ | $R^{A74}$ | $R^{B5}$ | $R^{C2}$ |
| $L_{A4476}$ | $R^{A74}$ | $R^{B18}$ | $R^{C2}$ |
| $L_{A4477}$ | $R^{A74}$ | $R^{B43}$ | $R^{C2}$ |
| $L_{A4478}$ | $R^{A74}$ | $R^{A3}$ | $R^{C2}$ |
| $L_{A4479}$ | $R^{A74}$ | $R^{A34}$ | $R^{C2}$ |
| $L_{A4480}$ | $R^{A74}$ | $R^{A57}$ | $R^{C2}$ |
| $L_{A4481}$ | H | $R^{B3}$ | $R^{C5}$ |
| $L_{A4482}$ | H | $R^{B4}$ | $R^{C5}$ |
| $L_{A4483}$ | H | $R^{B5}$ | $R^{C5}$ |
| $L_{A4484}$ | H | $R^{B18}$ | $R^{C5}$ |
| $L_{A4485}$ | H | $R^{B43}$ | $R^{C5}$ |
| $L_{A4486}$ | H | $R^{A3}$ | $R^{C5}$ |
| $L_{A4487}$ | H | $R^{A34}$ | $R^{C5}$ |
| $L_{A4488}$ | H | $R^{A57}$ | $R^{C5}$ |
| $L_{A4489}$ | F | $R^{B3}$ | $R^{C5}$ |
| $L_{A4490}$ | F | $R^{B4}$ | $R^{C5}$ |
| $L_{A4491}$ | F | $R^{B5}$ | $R^{C5}$ |
| $L_{A4492}$ | F | $R^{B18}$ | $R^{C5}$ |
| $L_{A4493}$ | F | $R^{B43}$ | $R^{C5}$ |
| $L_{A4494}$ | F | $R^{A3}$ | $R^{C5}$ |
| $L_{A4495}$ | F | $R^{A34}$ | $R^{C5}$ |
| $L_{A4496}$ | F | $R^{A57}$ | $R^{C5}$ |
| $L_{A4497}$ | $R^{B1}$ | $R^{B3}$ | $R^{C5}$ |
| $L_{A4498}$ | $R^{B1}$ | $R^{B4}$ | $R^{C5}$ |
| $L_{A4499}$ | $R^{B1}$ | $R^{B5}$ | $R^{C5}$ |
| $L_{A4500}$ | $R^{B1}$ | $R^{B18}$ | $R^{C5}$ |
| $L_{A4501}$ | $R^{B1}$ | $R^{B43}$ | $R^{C5}$ |
| $L_{A4502}$ | $R^{B1}$ | $R^{A3}$ | $R^{C5}$ |
| $L_{A4503}$ | $R^{B1}$ | $R^{A34}$ | $R^{C5}$ |
| $L_{A4504}$ | $R^{B1}$ | $R^{A57}$ | $R^{C5}$ |
| $L_{A4505}$ | $R^{A74}$ | $R^{B3}$ | $R^{C5}$ |
| $L_{A4506}$ | $R^{A74}$ | $R^{B4}$ | $R^{C5}$ |
| $L_{A4507}$ | $R^{A74}$ | $R^{B5}$ | $R^{C5}$ |
| $L_{A4508}$ | $R^{A74}$ | $R^{B18}$ | $R^{C5}$ |
| $L_{A4509}$ | $R^{A74}$ | $R^{B43}$ | $R^{C5}$ |
| $L_{A4510}$ | $R^{A74}$ | $R^{A3}$ | $R^{C5}$ |
| $L_{A4511}$ | $R^{A74}$ | $R^{A34}$ | $R^{C5}$ |
| $L_{A4512}$ | $R^{A74}$ | $R^{A57}$ | $R^{C5}$ |
| $L_{A4513}$ | H | $R^{B3}$ | $R^{C6}$ |
| $L_{A4514}$ | H | $R^{B4}$ | $R^{C6}$ |
| $L_{A4515}$ | H | $R^{B5}$ | $R^{C6}$ |
| $L_{A4516}$ | H | $R^{B18}$ | $R^{C6}$ |
| $L_{A4517}$ | H | $R^{B43}$ | $R^{C6}$ |
| $L_{A4518}$ | H | $R^{A3}$ | $R^{C6}$ |
| $L_{A4519}$ | H | $R^{A34}$ | $R^{C6}$ |
| $L_{A4520}$ | H | $R^{A57}$ | $R^{C6}$ |
| $L_{A4521}$ | F | $R^{B3}$ | $R^{C6}$ |
| $L_{A4522}$ | F | $R^{B4}$ | $R^{C6}$ |
| $L_{A4523}$ | F | $R^{B5}$ | $R^{C6}$ |
| $L_{A4524}$ | F | $R^{B18}$ | $R^{C6}$ |

-continued

| Ligand | $R^1$ | $R^2$ | G |
|---|---|---|---|
| $L_{A4525}$ | F | $R^{B43}$ | $R^{C6}$ |
| $L_{A4526}$ | F | $R^{A3}$ | $R^{C6}$ |
| $L_{A4527}$ | F | $R^{A34}$ | $R^{C6}$ |
| $L_{A4528}$ | F | $R^{A57}$ | $R^{C6}$ |
| $L_{A4529}$ | $R^{B1}$ | $R^{B3}$ | $R^{C6}$ |
| $L_{A4530}$ | $R^{B1}$ | $R^{B4}$ | $R^{C6}$ |
| $L_{A4531}$ | $R^{B1}$ | $R^{B5}$ | $R^{C6}$ |
| $L_{A4532}$ | $R^{B1}$ | $R^{B18}$ | $R^{C6}$ |
| $L_{A4533}$ | $R^{B1}$ | $R^{B43}$ | $R^{C6}$ |
| $L_{A4534}$ | $R^{B1}$ | $R^{A3}$ | $R^{C6}$ |
| $L_{A4535}$ | $R^{B1}$ | $R^{A34}$ | $R^{C6}$ |
| $L_{A4536}$ | $R^{B1}$ | $R^{A57}$ | $R^{C6}$ |
| $L_{A4537}$ | $R^{A74}$ | $R^{B3}$ | $R^{C6}$ |
| $L_{A4538}$ | $R^{A74}$ | $R^{B4}$ | $R^{C6}$ |
| $L_{A4539}$ | $R^{A74}$ | $R^{B5}$ | $R^{C6}$ |
| $L_{A4540}$ | $R^{A74}$ | $R^{B18}$ | $R^{C6}$ |
| $L_{A4541}$ | $R^{A74}$ | $R^{B43}$ | $R^{C6}$ |
| $L_{A4542}$ | $R^{A74}$ | $R^{A3}$ | $R^{C6}$ |
| $L_{A4543}$ | $R^{A74}$ | $R^{A34}$ | $R^{C6}$ |
| $L_{A4544}$ | $R^{A74}$ | $R^{A57}$ | $R^{C6}$ |
| $L_{A4545}$ | H | $R^{B3}$ | $R^{C7}$ |
| $L_{A4546}$ | H | $R^{B4}$ | $R^{C7}$ |
| $L_{A4547}$ | H | $R^{B5}$ | $R^{C7}$ |
| $L_{A4548}$ | H | $R^{B18}$ | $R^{C7}$ |
| $L_{A4549}$ | H | $R^{B43}$ | $R^{C7}$ |
| $L_{A4550}$ | H | $R^{A3}$ | $R^{C7}$ |
| $L_{A4551}$ | H | $R^{A34}$ | $R^{C7}$ |
| $L_{A4552}$ | H | $R^{A57}$ | $R^{C7}$ |
| $L_{A4553}$ | F | $R^{B3}$ | $R^{C7}$ |
| $L_{A4554}$ | F | $R^{B4}$ | $R^{C7}$ |
| $L_{A4555}$ | F | $R^{B5}$ | $R^{C7}$ |
| $L_{A4556}$ | F | $R^{B18}$ | $R^{C7}$ |
| $L_{A4557}$ | F | $R^{B43}$ | $R^{C7}$ |
| $L_{A4558}$ | F | $R^{A3}$ | $R^{C7}$ |
| $L_{A4559}$ | F | $R^{A34}$ | $R^{C7}$ |
| $L_{A4560}$ | F | $R^{A57}$ | $R^{C7}$ |
| $L_{A4561}$ | $R^{B1}$ | $R^{B3}$ | $R^{C7}$ |
| $L_{A4562}$ | $R^{B1}$ | $R^{B4}$ | $R^{C7}$ |
| $L_{A4563}$ | $R^{B1}$ | $R^{B5}$ | $R^{C7}$ |
| $L_{A4564}$ | $R^{B1}$ | $R^{B18}$ | $R^{C7}$ |
| $L_{A4565}$ | $R^{B1}$ | $R^{B43}$ | $R^{C7}$ |
| $L_{A4566}$ | $R^{B1}$ | $R^{A3}$ | $R^{C7}$ |
| $L_{A4567}$ | $R^{B1}$ | $R^{A34}$ | $R^{C7}$ |
| $L_{A4568}$ | $R^{B1}$ | $R^{A57}$ | $R^{C7}$ |
| $L_{A4569}$ | $R^{A74}$ | $R^{B3}$ | $R^{C7}$ |
| $L_{A4570}$ | $R^{A74}$ | $R^{B4}$ | $R^{C7}$ |
| $L_{A4571}$ | $R^{A74}$ | $R^{B5}$ | $R^{C7}$ |
| $L_{A4572}$ | $R^{A74}$ | $R^{B18}$ | $R^{C7}$ |
| $L_{A4573}$ | $R^{A74}$ | $R^{B43}$ | $R^{C7}$ |
| $L_{A4574}$ | $R^{A74}$ | $R^{A3}$ | $R^{C7}$ |
| $L_{A4575}$ | $R^{A74}$ | $R^{A34}$ | $R^{C7}$ |
| $L_{A4576}$ | $R^{A74}$ | $R^{A57}$ | $R^{C7}$ |
| $L_{A4577}$ | H | $R^{B3}$ | $R^{C10}$ |
| $L_{A4578}$ | H | $R^{B4}$ | $R^{C10}$ |
| $L_{A4579}$ | H | $R^{B5}$ | $R^{C10}$ |
| $L_{A4580}$ | H | $R^{B18}$ | $R^{C10}$ |
| $L_{A4581}$ | H | $R^{B43}$ | $R^{C10}$ |
| $L_{A4582}$ | H | $R^{A3}$ | $R^{C10}$ |
| $L_{A4583}$ | H | $R^{A34}$ | $R^{C10}$ |
| $L_{A4584}$ | H | $R^{A57}$ | $R^{C10}$ |
| $L_{A4585}$ | F | $R^{B3}$ | $R^{C10}$ |
| $L_{A4586}$ | F | $R^{B4}$ | $R^{C10}$ |
| $L_{A4587}$ | F | $R^{B5}$ | $R^{C10}$ |
| $L_{A4588}$ | F | $R^{B18}$ | $R^{C10}$ |
| $L_{A4589}$ | F | $R^{B43}$ | $R^{C10}$ |
| $L_{A4590}$ | F | $R^{A3}$ | $R^{C10}$ |
| $L_{A4591}$ | F | $R^{A34}$ | $R^{C10}$ |
| $L_{A4592}$ | F | $R^{A57}$ | $R^{C10}$ |
| $L_{A4593}$ | $R^{B1}$ | $R^{B3}$ | $R^{C10}$ |
| $L_{A4594}$ | $R^{B1}$ | $R^{B4}$ | $R^{C10}$ |
| $L_{A4595}$ | $R^{B1}$ | $R^{B5}$ | $R^{C10}$ |
| $L_{A4596}$ | $R^{B1}$ | $R^{B18}$ | $R^{C10}$ |
| $L_{A4597}$ | $R^{B1}$ | $R^{B43}$ | $R^{C10}$ |
| $L_{A4598}$ | $R^{B1}$ | $R^{A3}$ | $R^{C10}$ |
| $L_{A4599}$ | $R^{B1}$ | $R^{A34}$ | $R^{C10}$ |
| $L_{A4600}$ | $R^{B1}$ | $R^{A57}$ | $R^{C10}$ |
| $L_{A4601}$ | $R^{A74}$ | $R^{B3}$ | $R^{C10}$ |
| $L_{A4602}$ | $R^{A74}$ | $R^{B4}$ | $R^{C10}$ |
| $L_{A4603}$ | $R^{A74}$ | $R^{B5}$ | $R^{C10}$ |
| $L_{A4604}$ | $R^{A74}$ | $R^{B18}$ | $R^{C10}$ |
| $L_{A4605}$ | $R^{A74}$ | $R^{B43}$ | $R^{C10}$ |
| $L_{A4606}$ | $R^{A74}$ | $R^{A3}$ | $R^{C10}$ |
| $L_{A4607}$ | $R^{A74}$ | $R^{A34}$ | $R^{C10}$ |
| $L_{A4608}$ | $R^{A74}$ | $R^{A57}$ | $R^{C10}$ |
| $L_{A4609}$ | H | $R^{B3}$ | $R^{C11}$ |
| $L_{A4610}$ | H | $R^{B4}$ | $R^{C11}$ |
| $L_{A4611}$ | H | $R^{B5}$ | $R^{C11}$ |
| $L_{A4612}$ | H | $R^{B18}$ | $R^{C11}$ |
| $L_{A4613}$ | H | $R^{B43}$ | $R^{C11}$ |
| $L_{A4614}$ | H | $R^{A3}$ | $R^{C11}$ |
| $L_{A4615}$ | H | $R^{A34}$ | $R^{C11}$ |
| $L_{A4616}$ | H | $R^{A57}$ | $R^{C11}$ |
| $L_{A4617}$ | F | $R^{B3}$ | $R^{C11}$ |
| $L_{A4618}$ | F | $R^{B4}$ | $R^{C11}$ |
| $L_{A4619}$ | F | $R^{B5}$ | $R^{C11}$ |
| $L_{A4620}$ | F | $R^{B18}$ | $R^{C11}$ |
| $L_{A4621}$ | F | $R^{B43}$ | $R^{C11}$ |
| $L_{A4622}$ | F | $R^{A3}$ | $R^{C11}$ |
| $L_{A4623}$ | F | $R^{A34}$ | $R^{C11}$ |
| $L_{A4624}$ | F | $R^{A57}$ | $R^{C11}$ |
| $L_{A4625}$ | $R^{B1}$ | $R^{B3}$ | $R^{C11}$ |
| $L_{A4626}$ | $R^{B1}$ | $R^{B4}$ | $R^{C11}$ |
| $L_{A4627}$ | $R^{B1}$ | $R^{B5}$ | $R^{C11}$ |
| $L_{A4628}$ | $R^{B1}$ | $R^{B18}$ | $R^{C11}$ |
| $L_{A4629}$ | $R^{B1}$ | $R^{B43}$ | $R^{C11}$ |
| $L_{A4630}$ | $R^{B1}$ | $R^{A3}$ | $R^{C11}$ |
| $L_{A4631}$ | $R^{B1}$ | $R^{A34}$ | $R^{C11}$ |
| $L_{A4632}$ | $R^{B1}$ | $R^{A57}$ | $R^{C11}$ |
| $L_{A4633}$ | $R^{A74}$ | $R^{B3}$ | $R^{C11}$ |
| $L_{A4634}$ | $R^{A74}$ | $R^{B4}$ | $R^{C11}$ |
| $L_{A4635}$ | $R^{A74}$ | $R^{B5}$ | $R^{C11}$ |
| $L_{A4636}$ | $R^{A74}$ | $R^{B18}$ | $R^{C11}$ |
| $L_{A4637}$ | $R^{A74}$ | $R^{B43}$ | $R^{C11}$ |
| $L_{A4638}$ | $R^{A74}$ | $R^{A3}$ | $R^{C11}$ |
| $L_{A4639}$ | $R^{A74}$ | $R^{A34}$ | $R^{C11}$ |
| $L_{A4640}$ | $R^{A74}$ | $R^{A57}$ | $R^{C11}$ |
| $L_{A4641}$ | H | $R^{B3}$ | $R^{C13}$ |
| $L_{A4642}$ | H | $R^{B4}$ | $R^{C13}$ |
| $L_{A4643}$ | H | $R^{B5}$ | $R^{C13}$ |
| $L_{A4644}$ | H | $R^{B18}$ | $R^{C13}$ |
| $L_{A4645}$ | H | $R^{B43}$ | $R^{C13}$ |
| $L_{A4646}$ | H | $R^{A3}$ | $R^{C13}$ |
| $L_{A4647}$ | H | $R^{A34}$ | $R^{C13}$ |
| $L_{A4648}$ | H | $R^{A57}$ | $R^{C13}$ |
| $L_{A4649}$ | F | $R^{B3}$ | $R^{C13}$ |
| $L_{A4650}$ | F | $R^{B4}$ | $R^{C13}$ |
| $L_{A4651}$ | F | $R^{B5}$ | $R^{C13}$ |
| $L_{A4652}$ | F | $R^{B18}$ | $R^{C13}$ |
| $L_{A4653}$ | F | $R^{B43}$ | $R^{C13}$ |
| $L_{A4654}$ | F | $R^{A3}$ | $R^{C13}$ |
| $L_{A4655}$ | F | $R^{A34}$ | $R^{C13}$ |
| $L_{A4656}$ | F | $R^{A57}$ | $R^{C13}$ |
| $L_{A4657}$ | $R^{B1}$ | $R^{B3}$ | $R^{C13}$ |
| $L_{A4658}$ | $R^{B1}$ | $R^{B4}$ | $R^{C13}$ |
| $L_{A4659}$ | $R^{B1}$ | $R^{B5}$ | $R^{C13}$ |
| $L_{A4660}$ | $R^{B1}$ | $R^{B18}$ | $R^{C13}$ |
| $L_{A4661}$ | $R^{B1}$ | $R^{B43}$ | $R^{C13}$ |
| $L_{A4662}$ | $R^{B1}$ | $R^{A3}$ | $R^{C13}$ |
| $L_{A4663}$ | $R^{B1}$ | $R^{A34}$ | $R^{C13}$ |
| $L_{A4664}$ | $R^{B1}$ | $R^{A57}$ | $R^{C13}$ |
| $L_{A4665}$ | $R^{A74}$ | $R^{B3}$ | $R^{C13}$ |
| $L_{A4666}$ | $R^{A74}$ | $R^{B4}$ | $R^{C13}$ |
| $L_{A4667}$ | $R^{A74}$ | $R^{B5}$ | $R^{C13}$ |
| $L_{A4668}$ | $R^{A74}$ | $R^{B18}$ | $R^{C13}$ |
| $L_{A4669}$ | $R^{A74}$ | $R^{B43}$ | $R^{C13}$ |
| $L_{A4670}$ | $R^{A74}$ | $R^{A3}$ | $R^{C13}$ |
| $L_{A4671}$ | $R^{A74}$ | $R^{A34}$ | $R^{C13}$ |
| $L_{A4672}$ | $R^{A74}$ | $R^{A57}$ | $R^{C13}$ |
| $L_{A4673}$ | H | $R^{B3}$ | $R^{C17}$ |
| $L_{A4674}$ | H | $R^{B4}$ | $R^{C17}$ |
| $L_{A4675}$ | H | $R^{B5}$ | $R^{C17}$ |
| $L_{A4676}$ | H | $R^{B18}$ | $R^{C17}$ |
| $L_{A4677}$ | H | $R^{B43}$ | $R^{C17}$ |
| $L_{A4678}$ | H | $R^{A3}$ | $R^{C17}$ |

-continued

| Ligand | $R^1$ | $R^2$ | G |
|---|---|---|---|
| $L_{A679}$ | H | $R^{A34}$ | $R^{C17}$ |
| $L_{A680}$ | H | $R^{A57}$ | $R^{C17}$ |
| $L_{A681}$ | F | $R^{B3}$ | $R^{C17}$ |
| $L_{A682}$ | F | $R^{B4}$ | $R^{C17}$ |
| $L_{A683}$ | F | $R^{B5}$ | $R^{C17}$ |
| $L_{A684}$ | F | $R^{B18}$ | $R^{C17}$ |
| $L_{A685}$ | F | $R^{B43}$ | $R^{C17}$ |
| $L_{A686}$ | F | $R^{A3}$ | $R^{C17}$ |
| $L_{A687}$ | F | $R^{A34}$ | $R^{C17}$ |
| $L_{A688}$ | F | $R^{A57}$ | $R^{C17}$ |
| $L_{A689}$ | $R^{B1}$ | $R^{B3}$ | $R^{C17}$ |
| $L_{A690}$ | $R^{B1}$ | $R^{B4}$ | $R^{C17}$ |
| $L_{A691}$ | $R^{B1}$ | $R^{B5}$ | $R^{C17}$ |
| $L_{A692}$ | $R^{B1}$ | $R^{B18}$ | $R^{C17}$ |
| $L_{A693}$ | $R^{B1}$ | $R^{B43}$ | $R^{C17}$ |
| $L_{A694}$ | $R^{B1}$ | $R^{A3}$ | $R^{C17}$ |
| $L_{A695}$ | $R^{B1}$ | $R^{A34}$ | $R^{C17}$ |
| $L_{A696}$ | $R^{B1}$ | $R^{A57}$ | $R^{C17}$ |
| $L_{A697}$ | $R^{A74}$ | $R^{B3}$ | $R^{C17}$ |
| $L_{A698}$ | $R^{A74}$ | $R^{B4}$ | $R^{C17}$ |
| $L_{A699}$ | $R^{A74}$ | $R^{B5}$ | $R^{C17}$ |
| $L_{A700}$ | $R^{A74}$ | $R^{B18}$ | $R^{C17}$ |
| $L_{A701}$ | $R^{A74}$ | $R^{B43}$ | $R^{C17}$ |
| $L_{A702}$ | $R^{A74}$ | $R^{A3}$ | $R^{C17}$ |
| $L_{A703}$ | $R^{A74}$ | $R^{A34}$ | $R^{C17}$ |
| $L_{A704}$ | $R^{A74}$ | $R^{A57}$ | $R^{C17}$ |
| $L_{A705}$ | H | $R^{B3}$ | $R^{C20}$ |
| $L_{A706}$ | H | $R^{B4}$ | $R^{C20}$ |
| $L_{A707}$ | H | $R^{B5}$ | $R^{C20}$ |
| $L_{A708}$ | H | $R^{B18}$ | $R^{C20}$ |
| $L_{A709}$ | H | $R^{B43}$ | $R^{C20}$ |
| $L_{A710}$ | H | $R^{A3}$ | $R^{C20}$ |
| $L_{A711}$ | H | $R^{A34}$ | $R^{C20}$ |
| $L_{A712}$ | H | $R^{A57}$ | $R^{C20}$ |
| $L_{A713}$ | F | $R^{B3}$ | $R^{C20}$ |
| $L_{A714}$ | F | $R^{B4}$ | $R^{C20}$ |
| $L_{A715}$ | F | $R^{B5}$ | $R^{C20}$ |
| $L_{A716}$ | F | $R^{B18}$ | $R^{C20}$ |
| $L_{A717}$ | F | $R^{B43}$ | $R^{C20}$ |
| $L_{A718}$ | F | $R^{A3}$ | $R^{C20}$ |
| $L_{A719}$ | F | $R^{A34}$ | $R^{C20}$ |
| $L_{A720}$ | F | $R^{A57}$ | $R^{C20}$ |
| $L_{A721}$ | $R^{B1}$ | $R^{B3}$ | $R^{C20}$ |
| $L_{A722}$ | $R^{B1}$ | $R^{B4}$ | $R^{C20}$ |
| $L_{A723}$ | $R^{B1}$ | $R^{B5}$ | $R^{C20}$ |
| $L_{A724}$ | $R^{B1}$ | $R^{B18}$ | $R^{C20}$ |
| $L_{A725}$ | $R^{B1}$ | $R^{B43}$ | $R^{C20}$ |
| $L_{A726}$ | $R^{B1}$ | $R^{A3}$ | $R^{C20}$ |
| $L_{A727}$ | $R^{B1}$ | $R^{A34}$ | $R^{C20}$ |
| $L_{A728}$ | $R^{B1}$ | $R^{A57}$ | $R^{C20}$ |
| $L_{A729}$ | $R^{A74}$ | $R^{B3}$ | $R^{C20}$ |
| $L_{A730}$ | $R^{A74}$ | $R^{B4}$ | $R^{C20}$ |
| $L_{A731}$ | $R^{A74}$ | $R^{B5}$ | $R^{C20}$ |
| $L_{A732}$ | $R^{A74}$ | $R^{B18}$ | $R^{C20}$ |
| $L_{A733}$ | $R^{A74}$ | $R^{B43}$ | $R^{C20}$ |
| $L_{A734}$ | $R^{A74}$ | $R^{A3}$ | $R^{C20}$ |
| $L_{A735}$ | $R^{A74}$ | $R^{A34}$ | $R^{C20}$ |
| $L_{A736}$ | $R^{A74}$ | $R^{A57}$ | $R^{C20}$ |
| $L_{A737}$ | H | $R^{B3}$ | $R^{C24}$ |
| $L_{A738}$ | H | $R^{B4}$ | $R^{C24}$ |
| $L_{A739}$ | H | $R^{B5}$ | $R^{C24}$ |
| $L_{A740}$ | H | $R^{B18}$ | $R^{C24}$ |
| $L_{A741}$ | H | $R^{B43}$ | $R^{C24}$ |
| $L_{A742}$ | H | $R^{A3}$ | $R^{C24}$ |
| $L_{A743}$ | H | $R^{A34}$ | $R^{C24}$ |
| $L_{A744}$ | H | $R^{A57}$ | $R^{C24}$ |
| $L_{A745}$ | F | $R^{B3}$ | $R^{C24}$ |
| $L_{A746}$ | F | $R^{B4}$ | $R^{C24}$ |
| $L_{A747}$ | F | $R^{B5}$ | $R^{C24}$ |
| $L_{A748}$ | F | $R^{B18}$ | $R^{C24}$ |
| $L_{A749}$ | F | $R^{B43}$ | $R^{C24}$ |
| $L_{A750}$ | F | $R^{A3}$ | $R^{C24}$ |
| $L_{A751}$ | F | $R^{A34}$ | $R^{C24}$ |
| $L_{A752}$ | F | $R^{A57}$ | $R^{C24}$ |
| $L_{A753}$ | $R^{B1}$ | $R^{B3}$ | $R^{C24}$ |
| $L_{A754}$ | $R^{B1}$ | $R^{B4}$ | $R^{C24}$ |
| $L_{A755}$ | $R^{B1}$ | $R^{B5}$ | $R^{C24}$ |

-continued

| Ligand | $R^1$ | $R^2$ | G |
|---|---|---|---|
| $L_{A756}$ | $R^{B1}$ | $R^{B18}$ | $R^{C24}$ |
| $L_{A757}$ | $R^{B1}$ | $R^{B43}$ | $R^{C24}$ |
| $L_{A758}$ | $R^{B1}$ | $R^{A3}$ | $R^{C24}$ |
| $L_{A759}$ | $R^{B1}$ | $R^{A34}$ | $R^{C24}$ |
| $L_{A760}$ | $R^{B1}$ | $R^{A57}$ | $R^{C24}$ |
| $L_{A761}$ | $R^{A74}$ | $R^{B3}$ | $R^{C24}$ |
| $L_{A762}$ | $R^{A74}$ | $R^{B4}$ | $R^{C24}$ |
| $L_{A763}$ | $R^{A74}$ | $R^{B5}$ | $R^{C24}$ |
| $L_{A764}$ | $R^{A74}$ | $R^{B18}$ | $R^{C24}$ |
| $L_{A765}$ | $R^{A74}$ | $R^{B43}$ | $R^{C24}$ |
| $L_{A766}$ | $R^{A74}$ | $R^{A3}$ | $R^{C24}$ |
| $L_{A767}$ | $R^{A74}$ | $R^{A34}$ | $R^{C24}$ |
| $L_{A768}$ | $R^{A74}$ | $R^{A57}$ | $R^{C24}$ |
| $L_{A769}$ | H | $R^{B3}$ | $R^{C27}$ |
| $L_{A770}$ | H | $R^{B4}$ | $R^{C27}$ |
| $L_{A771}$ | H | $R^{B5}$ | $R^{C27}$ |
| $L_{A772}$ | H | $R^{B18}$ | $R^{C27}$ |
| $L_{A773}$ | H | $R^{B43}$ | $R^{C27}$ |
| $L_{A774}$ | H | $R^{A3}$ | $R^{C27}$ |
| $L_{A775}$ | H | $R^{A34}$ | $R^{C27}$ |
| $L_{A776}$ | H | $R^{A57}$ | $R^{C27}$ |
| $L_{A777}$ | F | $R^{B3}$ | $R^{C27}$ |
| $L_{A778}$ | F | $R^{B4}$ | $R^{C27}$ |
| $L_{A779}$ | F | $R^{B5}$ | $R^{C27}$ |
| $L_{A780}$ | F | $R^{B18}$ | $R^{C27}$ |
| $L_{A781}$ | F | $R^{B43}$ | $R^{C27}$ |
| $L_{A782}$ | F | $R^{A3}$ | $R^{C27}$ |
| $L_{A783}$ | F | $R^{A34}$ | $R^{C27}$ |
| $L_{A784}$ | F | $R^{A57}$ | $R^{C27}$ |
| $L_{A785}$ | $R^{B1}$ | $R^{B3}$ | $R^{C27}$ |
| $L_{A786}$ | $R^{B1}$ | $R^{B4}$ | $R^{C27}$ |
| $L_{A787}$ | $R^{B1}$ | $R^{B5}$ | $R^{C27}$ |
| $L_{A788}$ | $R^{B1}$ | $R^{B18}$ | $R^{C27}$ |
| $L_{A789}$ | $R^{B1}$ | $R^{B43}$ | $R^{C27}$ |
| $L_{A790}$ | $R^{B1}$ | $R^{A3}$ | $R^{C27}$ |
| $L_{A791}$ | $R^{B1}$ | $R^{A34}$ | $R^{C27}$ |
| $L_{A792}$ | $R^{B1}$ | $R^{A57}$ | $R^{C27}$ |
| $L_{A793}$ | $R^{A74}$ | $R^{B3}$ | $R^{C27}$ |
| $L_{A794}$ | $R^{A74}$ | $R^{B4}$ | $R^{C27}$ |
| $L_{A795}$ | $R^{A74}$ | $R^{B5}$ | $R^{C27}$ |
| $L_{A796}$ | $R^{A74}$ | $R^{B18}$ | $R^{C27}$ |
| $L_{A797}$ | $R^{A74}$ | $R^{B43}$ | $R^{C27}$ |
| $L_{A798}$ | $R^{A74}$ | $R^{A3}$ | $R^{C27}$ |
| $L_{A799}$ | $R^{A74}$ | $R^{A34}$ | $R^{C27}$ |
| $L_{A800}$ | $R^{A74}$ | $R^{A57}$ | $R^{C27}$ |
| $L_{A801}$ | H | $R^{B3}$ | $R^{C31}$ |
| $L_{A802}$ | H | $R^{B4}$ | $R^{C31}$ |
| $L_{A803}$ | H | $R^{B5}$ | $R^{C31}$ |
| $L_{A804}$ | H | $R^{B18}$ | $R^{C31}$ |
| $L_{A805}$ | H | $R^{B43}$ | $R^{C31}$ |
| $L_{A806}$ | H | $R^{A3}$ | $R^{C31}$ |
| $L_{A807}$ | H | $R^{A34}$ | $R^{C31}$ |
| $L_{A808}$ | H | $R^{A57}$ | $R^{C31}$ |
| $L_{A809}$ | F | $R^{B3}$ | $R^{C31}$ |
| $L_{A810}$ | F | $R^{B4}$ | $R^{C31}$ |
| $L_{A811}$ | F | $R^{B5}$ | $R^{C31}$ |
| $L_{A812}$ | F | $R^{B18}$ | $R^{C31}$ |
| $L_{A813}$ | F | $R^{B43}$ | $R^{C31}$ |
| $L_{A814}$ | F | $R^{A3}$ | $R^{C31}$ |
| $L_{A815}$ | F | $R^{A34}$ | $R^{C31}$ |
| $L_{A816}$ | F | $R^{A57}$ | $R^{C31}$ |
| $L_{A817}$ | $R^{B1}$ | $R^{B3}$ | $R^{C31}$ |
| $L_{A818}$ | $R^{B1}$ | $R^{B4}$ | $R^{C31}$ |
| $L_{A819}$ | $R^{B1}$ | $R^{B5}$ | $R^{C31}$ |
| $L_{A820}$ | $R^{B1}$ | $R^{B18}$ | $R^{C31}$ |
| $L_{A821}$ | $R^{B1}$ | $R^{B43}$ | $R^{C31}$ |
| $L_{A822}$ | $R^{B1}$ | $R^{A3}$ | $R^{C31}$ |
| $L_{A823}$ | $R^{B1}$ | $R^{A34}$ | $R^{C31}$ |
| $L_{A824}$ | $R^{B1}$ | $R^{A57}$ | $R^{C31}$ |
| $L_{A825}$ | $R^{A74}$ | $R^{B3}$ | $R^{C31}$ |
| $L_{A826}$ | $R^{A74}$ | $R^{B4}$ | $R^{C31}$ |
| $L_{A827}$ | $R^{A74}$ | $R^{B5}$ | $R^{C31}$ |
| $L_{A828}$ | $R^{A74}$ | $R^{B18}$ | $R^{C31}$ |
| $L_{A829}$ | $R^{A74}$ | $R^{B43}$ | $R^{C31}$ |
| $L_{A830}$ | $R^{A74}$ | $R^{A3}$ | $R^{C31}$ |
| $L_{A831}$ | $R^{A74}$ | $R^{A34}$ | $R^{C31}$ |
| $L_{A832}$ | $R^{A74}$ | $R^{A57}$ | $R^{C31}$ |

-continued

| Ligand | $R^1$ | $R^2$ | G |
|---|---|---|---|
| $L_{A833}$ | H | $R^{B3}$ | $R^{C34}$ |
| $L_{A834}$ | H | $R^{B4}$ | $R^{C34}$ |
| $L_{A835}$ | H | $R^{B5}$ | $R^{C34}$ |
| $L_{A836}$ | H | $R^{B18}$ | $R^{C34}$ |
| $L_{A837}$ | H | $R^{B43}$ | $R^{C34}$ |
| $L_{A838}$ | H | $R^{A3}$ | $R^{C34}$ |
| $L_{A839}$ | H | $R^{A34}$ | $R^{C34}$ |
| $L_{A840}$ | H | $R^{A57}$ | $R^{C34}$ |
| $L_{A841}$ | F | $R^{B3}$ | $R^{C34}$ |
| $L_{A842}$ | F | $R^{B4}$ | $R^{C34}$ |
| $L_{A843}$ | F | $R^{B5}$ | $R^{C34}$ |
| $L_{A844}$ | F | $R^{B18}$ | $R^{C34}$ |
| $L_{A845}$ | F | $R^{B43}$ | $R^{C34}$ |
| $L_{A846}$ | F | $R^{A3}$ | $R^{C34}$ |
| $L_{A847}$ | F | $R^{A34}$ | $R^{C34}$ |
| $L_{A848}$ | F | $R^{A57}$ | $R^{C34}$ |
| $L_{A849}$ | $R^{B1}$ | $R^{B3}$ | $R^{C34}$ |
| $L_{A850}$ | $R^{B1}$ | $R^{B4}$ | $R^{C34}$ |
| $L_{A851}$ | $R^{B1}$ | $R^{B5}$ | $R^{C34}$ |
| $L_{A852}$ | $R^{B1}$ | $R^{B18}$ | $R^{C34}$ |
| $L_{A853}$ | $R^{B1}$ | $R^{B43}$ | $R^{C34}$ |
| $L_{A854}$ | $R^{B1}$ | $R^{A3}$ | $R^{C34}$ |
| $L_{A855}$ | $R^{B1}$ | $R^{A34}$ | $R^{C34}$ |
| $L_{A856}$ | $R^{B1}$ | $R^{A57}$ | $R^{C34}$ |
| $L_{A857}$ | $R^{A74}$ | $R^{B3}$ | $R^{C34}$ |
| $L_{A858}$ | $R^{A74}$ | $R^{B4}$ | $R^{C34}$ |
| $L_{A859}$ | $R^{A74}$ | $R^{B5}$ | $R^{C34}$ |
| $L_{A860}$ | $R^{A74}$ | $R^{B18}$ | $R^{C34}$ |
| $L_{A861}$ | $R^{A74}$ | $R^{B43}$ | $R^{C34}$ |
| $L_{A862}$ | $R^{A74}$ | $R^{A3}$ | $R^{C34}$ |
| $L_{A863}$ | $R^{A74}$ | $R^{A34}$ | $R^{C34}$ |
| $L_{A864}$ | $R^{A74}$ | $R^{A57}$ | $R^{C34}$ |
| $L_{A865}$ | H | $R^{B3}$ | $R^{C38}$ |
| $L_{A866}$ | H | $R^{B4}$ | $R^{C38}$ |
| $L_{A867}$ | H | $R^{B5}$ | $R^{C38}$ |
| $L_{A868}$ | H | $R^{B18}$ | $R^{C38}$ |
| $L_{A869}$ | H | $R^{B43}$ | $R^{C38}$ |
| $L_{A870}$ | H | $R^{A3}$ | $R^{C38}$ |
| $L_{A871}$ | H | $R^{A34}$ | $R^{C38}$ |
| $L_{A872}$ | H | $R^{A57}$ | $R^{C38}$ |
| $L_{A873}$ | F | $R^{B3}$ | $R^{C38}$ |
| $L_{A874}$ | F | $R^{B4}$ | $R^{C38}$ |
| $L_{A875}$ | F | $R^{B5}$ | $R^{C38}$ |
| $L_{A876}$ | F | $R^{B18}$ | $R^{C38}$ |
| $L_{A877}$ | F | $R^{B43}$ | $R^{C38}$ |
| $L_{A878}$ | F | $R^{A3}$ | $R^{C38}$ |
| $L_{A879}$ | F | $R^{A34}$ | $R^{C38}$ |
| $L_{A880}$ | F | $R^{A57}$ | $R^{C38}$ |
| $L_{A881}$ | $R^{B1}$ | $R^{B3}$ | $R^{C38}$ |
| $L_{A882}$ | $R^{B1}$ | $R^{B4}$ | $R^{C38}$ |
| $L_{A883}$ | $R^{B1}$ | $R^{B5}$ | $R^{C38}$ |
| $L_{A884}$ | $R^{B1}$ | $R^{B18}$ | $R^{C38}$ |
| $L_{A885}$ | $R^{B1}$ | $R^{B43}$ | $R^{C38}$ |
| $L_{A886}$ | $R^{B1}$ | $R^{A3}$ | $R^{C38}$ |
| $L_{A887}$ | $R^{B1}$ | $R^{A34}$ | $R^{C38}$ |
| $L_{A888}$ | $R^{B1}$ | $R^{A57}$ | $R^{C38}$ |
| $L_{A889}$ | $R^{A74}$ | $R^{B3}$ | $R^{C38}$ |
| $L_{A890}$ | $R^{A74}$ | $R^{B4}$ | $R^{C38}$ |
| $L_{A891}$ | $R^{A74}$ | $R^{B5}$ | $R^{C38}$ |
| $L_{A892}$ | $R^{A74}$ | $R^{B18}$ | $R^{C38}$ |
| $L_{A893}$ | $R^{A74}$ | $R^{B43}$ | $R^{C38}$ |
| $L_{A894}$ | $R^{A74}$ | $R^{A3}$ | $R^{C38}$ |
| $L_{A895}$ | $R^{A74}$ | $R^{A34}$ | $R^{C38}$ |
| $L_{A896}$ | $R^{A74}$ | $R^{A57}$ | $R^{C38}$, |

$L_{A897}$ through $L_{A1344}$ based on a structure of Formula II

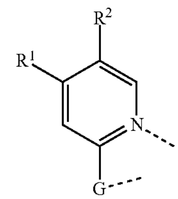

in which $R^1$, $R^2$, and G are defined as:

| Ligand | $R^1$ | $R^2$ | G |
|---|---|---|---|
| $L_{A897}$ | $R^{B3}$ | $R^{B3}$ | $R^{C2}$ |
| $L_{A898}$ | $R^{B4}$ | $R^{B4}$ | $R^{C2}$ |
| $L_{A899}$ | $R^{B5}$ | $R^{B5}$ | $R^{C2}$ |
| $L_{A900}$ | $R^{B18}$ | $R^{B18}$ | $R^{C2}$ |
| $L_{A901}$ | $R^{B43}$ | $R^{B43}$ | $R^{C2}$ |
| $L_{A902}$ | $R^{A3}$ | $R^{A3}$ | $R^{C2}$ |
| $L_{A903}$ | $R^{A34}$ | $R^{A34}$ | $R^{C2}$ |
| $L_{A904}$ | $R^{A57}$ | $R^{A57}$ | $R^{C2}$ |
| $L_{A905}$ | $R^{B3}$ | $R^{B7}$ | $R^{C2}$ |
| $L_{A906}$ | $R^{B4}$ | $R^{B7}$ | $R^{C2}$ |
| $L_{A907}$ | $R^{B5}$ | $R^{B7}$ | $R^{C2}$ |
| $L_{A908}$ | $R^{B18}$ | $R^{B7}$ | $R^{C2}$ |
| $L_{A909}$ | $R^{B43}$ | $R^{B7}$ | $R^{C2}$ |
| $L_{A910}$ | $R^{A3}$ | $R^{B7}$ | $R^{C2}$ |
| $L_{A911}$ | $R^{A34}$ | $R^{B7}$ | $R^{C2}$ |
| $L_{A912}$ | $R^{A57}$ | $R^{B7}$ | $R^{C2}$ |
| $L_{A913}$ | $R^{B3}$ | $R^{A3}$ | $R^{C2}$ |
| $L_{A914}$ | $R^{B4}$ | $R^{A3}$ | $R^{C2}$ |
| $L_{A915}$ | $R^{B5}$ | $R^{A3}$ | $R^{C2}$ |
| $L_{A916}$ | $R^{B18}$ | $R^{A3}$ | $R^{C2}$ |
| $L_{A917}$ | $R^{B43}$ | $R^{A3}$ | $R^{C2}$ |
| $L_{A918}$ | $R^{A3}$ | $R^{A3}$ | $R^{C2}$ |
| $L_{A919}$ | $R^{A34}$ | $R^{A3}$ | $R^{C2}$ |
| $L_{A920}$ | $R^{A57}$ | $R^{A3}$ | $R^{C2}$ |
| $L_{A921}$ | $R^{B3}$ | $R^{A34}$ | $R^{C2}$ |
| $L_{A922}$ | $R^{B4}$ | $R^{A34}$ | $R^{C2}$ |
| $L_{A923}$ | $R^{B5}$ | $R^{A34}$ | $R^{C2}$ |
| $L_{A924}$ | $R^{B18}$ | $R^{A34}$ | $R^{C2}$ |
| $L_{A925}$ | $R^{B43}$ | $R^{A34}$ | $R^{C2}$ |
| $L_{A926}$ | $R^{A3}$ | $R^{A34}$ | $R^{C2}$ |
| $L_{A927}$ | $R^{A34}$ | $R^{A34}$ | $R^{C2}$ |
| $L_{A928}$ | $R^{A57}$ | $R^{A34}$ | $R^{C2}$ |
| $L_{A929}$ | $R^{B3}$ | $R^{B3}$ | $R^{C5}$ |
| $L_{A930}$ | $R^{B4}$ | $R^{B4}$ | $R^{C5}$ |
| $L_{A931}$ | $R^{B5}$ | $R^{B5}$ | $R^{C5}$ |
| $L_{A932}$ | $R^{B18}$ | $R^{B18}$ | $R^{C5}$ |
| $L_{A933}$ | $R^{B43}$ | $R^{B43}$ | $R^{C5}$ |
| $L_{A934}$ | $R^{A3}$ | $R^{A3}$ | $R^{C5}$ |
| $L_{A935}$ | $R^{A34}$ | $R^{A34}$ | $R^{C5}$ |
| $L_{A936}$ | $R^{A57}$ | $R^{A57}$ | $R^{C5}$ |
| $L_{A937}$ | $R^{B3}$ | $R^{B7}$ | $R^{C5}$ |
| $L_{A938}$ | $R^{B4}$ | $R^{B7}$ | $R^{C5}$ |
| $L_{A939}$ | $R^{B5}$ | $R^{B7}$ | $R^{C5}$ |
| $L_{A940}$ | $R^{B18}$ | $R^{B7}$ | $R^{C5}$ |
| $L_{A941}$ | $R^{B43}$ | $R^{B7}$ | $R^{C5}$ |
| $L_{A942}$ | $R^{A3}$ | $R^{B7}$ | $R^{C5}$ |
| $L_{A943}$ | $R^{A34}$ | $R^{B7}$ | $R^{C5}$ |
| $L_{A944}$ | $R^{A57}$ | $R^{B7}$ | $R^{C5}$ |
| $L_{A945}$ | $R^{B3}$ | $R^{A3}$ | $R^{C5}$ |
| $L_{A946}$ | $R^{B4}$ | $R^{A3}$ | $R^{C5}$ |
| $L_{A947}$ | $R^{B5}$ | $R^{A3}$ | $R^{C5}$ |
| $L_{A948}$ | $R^{B18}$ | $R^{A3}$ | $R^{C5}$ |
| $L_{A949}$ | $R^{B43}$ | $R^{A3}$ | $R^{C5}$ |
| $L_{A950}$ | $R^{A3}$ | $R^{A3}$ | $R^{C5}$ |
| $L_{A951}$ | $R^{A34}$ | $R^{A3}$ | $R^{C5}$ |
| $L_{A952}$ | $R^{A57}$ | $R^{A3}$ | $R^{C5}$ |
| $L_{A953}$ | $R^{B3}$ | $R^{A34}$ | $R^{C5}$ |
| $L_{A954}$ | $R^{B4}$ | $R^{A34}$ | $R^{C5}$ |
| $L_{A955}$ | $R^{B5}$ | $R^{A34}$ | $R^{C5}$ |
| $L_{A956}$ | $R^{B18}$ | $R^{A34}$ | $R^{C5}$ |
| $L_{A957}$ | $R^{B43}$ | $R^{A34}$ | $R^{C5}$ |
| $L_{A958}$ | $R^{A3}$ | $R^{A34}$ | $R^{C5}$ |

-continued

| Ligand | $R^1$ | $R^2$ | G |
|---|---|---|---|
| $L_{A959}$ | $R^{A34}$ | $R^{A34}$ | $R^{C5}$ |
| $L_{A960}$ | $R^{A57}$ | $R^{A34}$ | $R^{C5}$ |
| $L_{A961}$ | $R^{B3}$ | $R^{B3}$ | $R^{C6}$ |
| $L_{A962}$ | $R^{B4}$ | $R^{B4}$ | $R^{C6}$ |
| $L_{A963}$ | $R^{B5}$ | $R^{B5}$ | $R^{C6}$ |
| $L_{A964}$ | $R^{B18}$ | $R^{B18}$ | $R^{C6}$ |
| $L_{A965}$ | $R^{B43}$ | $R^{B43}$ | $R^{C6}$ |
| $L_{A966}$ | $R^{A3}$ | $R^{A3}$ | $R^{C6}$ |
| $L_{A967}$ | $R^{A34}$ | $R^{A34}$ | $R^{C6}$ |
| $L_{A968}$ | $R^{A57}$ | $R^{A57}$ | $R^{C6}$ |
| $L_{A969}$ | $R^{B3}$ | $R^{B7}$ | $R^{C6}$ |
| $L_{A970}$ | $R^{B4}$ | $R^{B7}$ | $R^{C6}$ |
| $L_{A971}$ | $R^{B5}$ | $R^{B7}$ | $R^{C6}$ |
| $L_{A972}$ | $R^{B18}$ | $R^{B7}$ | $R^{C6}$ |
| $L_{A973}$ | $R^{B43}$ | $R^{B7}$ | $R^{C6}$ |
| $L_{A974}$ | $R^{A3}$ | $R^{B7}$ | $R^{C6}$ |
| $L_{A975}$ | $R^{A34}$ | $R^{B7}$ | $R^{C6}$ |
| $L_{A976}$ | $R^{A57}$ | $R^{B7}$ | $R^{C6}$ |
| $L_{A977}$ | $R^{B3}$ | $R^{A3}$ | $R^{C6}$ |
| $L_{A978}$ | $R^{B4}$ | $R^{A3}$ | $R^{C6}$ |
| $L_{A979}$ | $R^{B5}$ | $R^{A3}$ | $R^{C6}$ |
| $L_{A980}$ | $R^{B18}$ | $R^{A3}$ | $R^{C6}$ |
| $L_{A981}$ | $R^{B43}$ | $R^{A3}$ | $R^{C6}$ |
| $L_{A982}$ | $R^{A3}$ | $R^{A3}$ | $R^{C6}$ |
| $L_{A983}$ | $R^{A34}$ | $R^{A3}$ | $R^{C6}$ |
| $L_{A984}$ | $R^{A57}$ | $R^{A3}$ | $R^{C6}$ |
| $L_{A985}$ | $R^{B3}$ | $R^{A34}$ | $R^{C6}$ |
| $L_{A986}$ | $R^{B4}$ | $R^{A34}$ | $R^{C6}$ |
| $L_{A987}$ | $R^{B5}$ | $R^{A34}$ | $R^{C6}$ |
| $L_{A988}$ | $R^{B18}$ | $R^{A34}$ | $R^{C6}$ |
| $L_{A989}$ | $R^{B43}$ | $R^{A34}$ | $R^{C6}$ |
| $L_{A990}$ | $R^{A3}$ | $R^{A34}$ | $R^{C6}$ |
| $L_{A991}$ | $R^{A34}$ | $R^{A34}$ | $R^{C6}$ |
| $L_{A992}$ | $R^{A57}$ | $R^{A34}$ | $R^{C6}$ |
| $L_{A993}$ | $R^{B3}$ | $R^{B3}$ | $R^{C7}$ |
| $L_{A994}$ | $R^{B4}$ | $R^{B4}$ | $R^{C7}$ |
| $L_{A995}$ | $R^{B5}$ | $R^{B5}$ | $R^{C7}$ |
| $L_{A996}$ | $R^{B18}$ | $R^{B18}$ | $R^{C7}$ |
| $L_{A997}$ | $R^{B43}$ | $R^{B43}$ | $R^{C7}$ |
| $L_{A998}$ | $R^{A3}$ | $R^{A3}$ | $R^{C7}$ |
| $L_{A999}$ | $R^{A34}$ | $R^{A34}$ | $R^{C7}$ |
| $L_{A1000}$ | $R^{A57}$ | $R^{A57}$ | $R^{C7}$ |
| $L_{A1001}$ | $R^{B3}$ | $R^{B7}$ | $R^{C7}$ |
| $L_{A1002}$ | $R^{B4}$ | $R^{B7}$ | $R^{C7}$ |
| $L_{A1003}$ | $R^{B5}$ | $R^{B7}$ | $R^{C7}$ |
| $L_{A1004}$ | $R^{B18}$ | $R^{B7}$ | $R^{C7}$ |
| $L_{A1005}$ | $R^{B43}$ | $R^{B7}$ | $R^{C7}$ |
| $L_{A1006}$ | $R^{A3}$ | $R^{B7}$ | $R^{C7}$ |
| $L_{A1007}$ | $R^{A34}$ | $R^{B7}$ | $R^{C7}$ |
| $L_{A1008}$ | $R^{A57}$ | $R^{B7}$ | $R^{C7}$ |
| $L_{A1009}$ | $R^{B3}$ | $R^{A3}$ | $R^{C7}$ |
| $L_{A1010}$ | $R^{B4}$ | $R^{A3}$ | $R^{C7}$ |
| $L_{A1011}$ | $R^{B5}$ | $R^{A3}$ | $R^{C7}$ |
| $L_{A1012}$ | $R^{B18}$ | $R^{A3}$ | $R^{C7}$ |
| $L_{A1013}$ | $R^{B43}$ | $R^{A3}$ | $R^{C7}$ |
| $L_{A1014}$ | $R^{A3}$ | $R^{A3}$ | $R^{C7}$ |
| $L_{A1015}$ | $R^{A34}$ | $R^{A3}$ | $R^{C7}$ |
| $L_{A1016}$ | $R^{A57}$ | $R^{A3}$ | $R^{C7}$ |
| $L_{A1017}$ | $R^{B3}$ | $R^{A34}$ | $R^{C7}$ |
| $L_{A1018}$ | $R^{B4}$ | $R^{A34}$ | $R^{C7}$ |
| $L_{A1019}$ | $R^{B5}$ | $R^{A34}$ | $R^{C7}$ |
| $L_{A1020}$ | $R^{B18}$ | $R^{A34}$ | $R^{C7}$ |
| $L_{A1021}$ | $R^{B43}$ | $R^{A34}$ | $R^{C7}$ |
| $L_{A1022}$ | $R^{A3}$ | $R^{A34}$ | $R^{C7}$ |
| $L_{A1023}$ | $R^{A34}$ | $R^{A34}$ | $R^{C7}$ |
| $L_{A1024}$ | $R^{A57}$ | $R^{A34}$ | $R^{C7}$ |
| $L_{A1025}$ | $R^{B3}$ | $R^{B3}$ | $R^{C10}$ |
| $L_{A1026}$ | $R^{B4}$ | $R^{B4}$ | $R^{C10}$ |
| $L_{A1027}$ | $R^{B5}$ | $R^{B5}$ | $R^{C10}$ |
| $L_{A1028}$ | $R^{B18}$ | $R^{B18}$ | $R^{C10}$ |
| $L_{A1029}$ | $R^{B43}$ | $R^{B43}$ | $R^{C10}$ |
| $L_{A1030}$ | $R^{A3}$ | $R^{A3}$ | $R^{C10}$ |
| $L_{A1031}$ | $R^{A34}$ | $R^{A34}$ | $R^{C10}$ |
| $L_{A1032}$ | $R^{A57}$ | $R^{A57}$ | $R^{C10}$ |
| $L_{A1033}$ | $R^{B3}$ | $R^{B7}$ | $R^{C10}$ |
| $L_{A1034}$ | $R^{B4}$ | $R^{B7}$ | $R^{C10}$ |
| $L_{A1035}$ | $R^{B5}$ | $R^{B7}$ | $R^{C10}$ |

-continued

| Ligand | $R^1$ | $R^2$ | G |
|---|---|---|---|
| $L_{A1036}$ | $R^{B18}$ | $R^{B7}$ | $R^{C10}$ |
| $L_{A1037}$ | $R^{B43}$ | $R^{B7}$ | $R^{C10}$ |
| $L_{A1038}$ | $R^{A3}$ | $R^{B7}$ | $R^{C10}$ |
| $L_{A1039}$ | $R^{A34}$ | $R^{B7}$ | $R^{C10}$ |
| $L_{A1040}$ | $R^{A57}$ | $R^{B7}$ | $R^{C10}$ |
| $L_{A1041}$ | $R^{B3}$ | $R^{A3}$ | $R^{C10}$ |
| $L_{A1042}$ | $R^{B4}$ | $R^{A3}$ | $R^{C10}$ |
| $L_{A1043}$ | $R^{B5}$ | $R^{A3}$ | $R^{C10}$ |
| $L_{A1044}$ | $R^{B18}$ | $R^{A3}$ | $R^{C10}$ |
| $L_{A1045}$ | $R^{B43}$ | $R^{A3}$ | $R^{C10}$ |
| $L_{A1046}$ | $R^{A3}$ | $R^{A3}$ | $R^{C10}$ |
| $L_{A1047}$ | $R^{A34}$ | $R^{A3}$ | $R^{C10}$ |
| $L_{A1048}$ | $R^{A57}$ | $R^{A3}$ | $R^{C10}$ |
| $L_{A1049}$ | $R^{B3}$ | $R^{A34}$ | $R^{C10}$ |
| $L_{A1050}$ | $R^{B4}$ | $R^{A34}$ | $R^{C10}$ |
| $L_{A1051}$ | $R^{B5}$ | $R^{A34}$ | $R^{C10}$ |
| $L_{A1052}$ | $R^{B18}$ | $R^{A34}$ | $R^{C10}$ |
| $L_{A1053}$ | $R^{B43}$ | $R^{A34}$ | $R^{C10}$ |
| $L_{A1054}$ | $R^{A3}$ | $R^{A34}$ | $R^{C10}$ |
| $L_{A1055}$ | $R^{A34}$ | $R^{A34}$ | $R^{C10}$ |
| $L_{A1056}$ | $R^{A57}$ | $R^{A34}$ | $R^{C10}$ |
| $L_{A1057}$ | $R^{B3}$ | $R^{B3}$ | $R^{C11}$ |
| $L_{A1058}$ | $R^{B4}$ | $R^{B4}$ | $R^{C11}$ |
| $L_{A1059}$ | $R^{B5}$ | $R^{B5}$ | $R^{C11}$ |
| $L_{A1060}$ | $R^{B18}$ | $R^{B18}$ | $R^{C11}$ |
| $L_{A1061}$ | $R^{B43}$ | $R^{B43}$ | $R^{C11}$ |
| $L_{A1062}$ | $R^{A3}$ | $R^{A3}$ | $R^{C11}$ |
| $L_{A1063}$ | $R^{A34}$ | $R^{A34}$ | $R^{C11}$ |
| $L_{A1064}$ | $R^{A57}$ | $R^{A57}$ | $R^{C11}$ |
| $L_{A1065}$ | $R^{B3}$ | $R^{B7}$ | $R^{C11}$ |
| $L_{A1066}$ | $R^{B4}$ | $R^{B7}$ | $R^{C11}$ |
| $L_{A1067}$ | $R^{B5}$ | $R^{B7}$ | $R^{C11}$ |
| $L_{A1068}$ | $R^{B18}$ | $R^{B7}$ | $R^{C11}$ |
| $L_{A1069}$ | $R^{B43}$ | $R^{B7}$ | $R^{C11}$ |
| $L_{A1070}$ | $R^{A3}$ | $R^{B7}$ | $R^{C11}$ |
| $L_{A1071}$ | $R^{A34}$ | $R^{B7}$ | $R^{C11}$ |
| $L_{A1072}$ | $R^{A57}$ | $R^{B7}$ | $R^{C11}$ |
| $L_{A1073}$ | $R^{B3}$ | $R^{A3}$ | $R^{C11}$ |
| $L_{A1074}$ | $R^{B4}$ | $R^{A3}$ | $R^{C11}$ |
| $L_{A1075}$ | $R^{B5}$ | $R^{A3}$ | $R^{C11}$ |
| $L_{A1076}$ | $R^{B18}$ | $R^{A3}$ | $R^{C11}$ |
| $L_{A1077}$ | $R^{B43}$ | $R^{A3}$ | $R^{C11}$ |
| $L_{A1078}$ | $R^{A3}$ | $R^{A3}$ | $R^{C11}$ |
| $L_{A1079}$ | $R^{A34}$ | $R^{A3}$ | $R^{C11}$ |
| $L_{A1080}$ | $R^{A57}$ | $R^{A3}$ | $R^{C11}$ |
| $L_{A1081}$ | $R^{B3}$ | $R^{A34}$ | $R^{C11}$ |
| $L_{A1082}$ | $R^{B4}$ | $R^{A34}$ | $R^{C11}$ |
| $L_{A1083}$ | $R^{B5}$ | $R^{A34}$ | $R^{C11}$ |
| $L_{A1084}$ | $R^{B18}$ | $R^{A34}$ | $R^{C11}$ |
| $L_{A1085}$ | $R^{B43}$ | $R^{A34}$ | $R^{C11}$ |
| $L_{A1086}$ | $R^{A3}$ | $R^{A34}$ | $R^{C11}$ |
| $L_{A1087}$ | $R^{A34}$ | $R^{A34}$ | $R^{C11}$ |
| $L_{A1088}$ | $R^{A57}$ | $R^{A34}$ | $R^{C11}$ |
| $L_{A1089}$ | $R^{B3}$ | $R^{B3}$ | $R^{C13}$ |
| $L_{A1090}$ | $R^{B4}$ | $R^{B4}$ | $R^{C13}$ |
| $L_{A1091}$ | $R^{B5}$ | $R^{B5}$ | $R^{C13}$ |
| $L_{A1092}$ | $R^{B18}$ | $R^{B18}$ | $R^{C13}$ |
| $L_{A1093}$ | $R^{B43}$ | $R^{B43}$ | $R^{C13}$ |
| $L_{A1094}$ | $R^{A3}$ | $R^{A3}$ | $R^{C13}$ |
| $L_{A1095}$ | $R^{A34}$ | $R^{A34}$ | $R^{C13}$ |
| $L_{A1096}$ | $R^{A57}$ | $R^{A57}$ | $R^{C13}$ |
| $L_{A1097}$ | $R^{B3}$ | $R^{B7}$ | $R^{C13}$ |
| $L_{A1098}$ | $R^{B4}$ | $R^{B7}$ | $R^{C13}$ |
| $L_{A1099}$ | $R^{B5}$ | $R^{B7}$ | $R^{C13}$ |
| $L_{A1100}$ | $R^{B18}$ | $R^{B7}$ | $R^{C13}$ |
| $L_{A1101}$ | $R^{B43}$ | $R^{B7}$ | $R^{C13}$ |
| $L_{A1102}$ | $R^{A3}$ | $R^{B7}$ | $R^{C13}$ |
| $L_{A1103}$ | $R^{A34}$ | $R^{B7}$ | $R^{C13}$ |
| $L_{A1104}$ | $R^{A57}$ | $R^{B7}$ | $R^{C13}$ |
| $L_{A1105}$ | $R^{B3}$ | $R^{A3}$ | $R^{C13}$ |
| $L_{A1106}$ | $R^{B4}$ | $R^{A3}$ | $R^{C13}$ |
| $L_{A1107}$ | $R^{B5}$ | $R^{A3}$ | $R^{C13}$ |
| $L_{A1108}$ | $R^{B18}$ | $R^{A3}$ | $R^{C13}$ |
| $L_{A1109}$ | $R^{B43}$ | $R^{A3}$ | $R^{C13}$ |
| $L_{A1110}$ | $R^{A3}$ | $R^{A3}$ | $R^{C13}$ |
| $L_{A1111}$ | $R^{A34}$ | $R^{A3}$ | $R^{C13}$ |
| $L_{A1112}$ | $R^{A57}$ | $R^{A3}$ | $R^{C13}$ |

-continued

| Ligand | $R^1$ | $R^2$ | G |
|---|---|---|---|
| $L_{A1113}$ | $R^{B3}$ | $R^{A34}$ | $R^{C13}$ |
| $L_{A1114}$ | $R^{B4}$ | $R^{A34}$ | $R^{C13}$ |
| $L_{A1115}$ | $R^{B5}$ | $R^{A34}$ | $R^{C13}$ |
| $L_{A1116}$ | $R^{B18}$ | $R^{A34}$ | $R^{C13}$ |
| $L_{A1117}$ | $R^{B43}$ | $R^{A34}$ | $R^{C13}$ |
| $L_{A1118}$ | $R^{A3}$ | $R^{A34}$ | $R^{C13}$ |
| $L_{A1119}$ | $R^{A34}$ | $R^{A34}$ | $R^{C13}$ |
| $L_{A1120}$ | $R^{A57}$ | $R^{A34}$ | $R^{C13}$ |
| $L_{A1121}$ | $R^{B3}$ | $R^{B3}$ | $R^{C17}$ |
| $L_{A1122}$ | $R^{B4}$ | $R^{B4}$ | $R^{C17}$ |
| $L_{A1123}$ | $R^{B5}$ | $R^{B5}$ | $R^{C17}$ |
| $L_{A1124}$ | $R^{B18}$ | $R^{B18}$ | $R^{C17}$ |
| $L_{A1125}$ | $R^{B43}$ | $R^{B43}$ | $R^{C17}$ |
| $L_{A1126}$ | $R^{A3}$ | $R^{A3}$ | $R^{C17}$ |
| $L_{A1127}$ | $R^{A34}$ | $R^{A34}$ | $R^{C17}$ |
| $L_{A1128}$ | $R^{A57}$ | $R^{A57}$ | $R^{C17}$ |
| $L_{A1129}$ | $R^{B3}$ | $R^{B7}$ | $R^{C17}$ |
| $L_{A1130}$ | $R^{B4}$ | $R^{B7}$ | $R^{C17}$ |
| $L_{A1131}$ | $R^{B5}$ | $R^{B7}$ | $R^{C17}$ |
| $L_{A1132}$ | $R^{B18}$ | $R^{B7}$ | $R^{C17}$ |
| $L_{A1133}$ | $R^{B43}$ | $R^{B7}$ | $R^{C17}$ |
| $L_{A1134}$ | $R^{A3}$ | $R^{B7}$ | $R^{C17}$ |
| $L_{A1135}$ | $R^{A34}$ | $R^{B7}$ | $R^{C17}$ |
| $L_{A1136}$ | $R^{A57}$ | $R^{B7}$ | $R^{C17}$ |
| $L_{A1137}$ | $R^{B3}$ | $R^{A3}$ | $R^{C17}$ |
| $L_{A1138}$ | $R^{B4}$ | $R^{A3}$ | $R^{C17}$ |
| $L_{A1139}$ | $R^{B5}$ | $R^{A3}$ | $R^{C17}$ |
| $L_{A1140}$ | $R^{B18}$ | $R^{A3}$ | $R^{C17}$ |
| $L_{A1141}$ | $R^{B43}$ | $R^{A3}$ | $R^{C17}$ |
| $L_{A1142}$ | $R^{A3}$ | $R^{A3}$ | $R^{C17}$ |
| $L_{A1143}$ | $R^{A34}$ | $R^{A3}$ | $R^{C17}$ |
| $L_{A1144}$ | $R^{A57}$ | $R^{A3}$ | $R^{C17}$ |
| $L_{A1145}$ | $R^{B3}$ | $R^{A34}$ | $R^{C17}$ |
| $L_{A1146}$ | $R^{B4}$ | $R^{A34}$ | $R^{C17}$ |
| $L_{A1147}$ | $R^{B5}$ | $R^{A34}$ | $R^{C17}$ |
| $L_{A1148}$ | $R^{B18}$ | $R^{A34}$ | $R^{C17}$ |
| $L_{A1149}$ | $R^{B43}$ | $R^{A34}$ | $R^{C17}$ |
| $L_{A1150}$ | $R^{A3}$ | $R^{A34}$ | $R^{C17}$ |
| $L_{A1151}$ | $R^{A34}$ | $R^{A34}$ | $R^{C17}$ |
| $L_{A1152}$ | $R^{A57}$ | $R^{A34}$ | $R^{C17}$ |
| $L_{A1153}$ | $R^{B3}$ | $R^{B3}$ | $R^{C20}$ |
| $L_{A1154}$ | $R^{B4}$ | $R^{B4}$ | $R^{C20}$ |
| $L_{A1155}$ | $R^{B5}$ | $R^{B5}$ | $R^{C20}$ |
| $L_{A1156}$ | $R^{B18}$ | $R^{B18}$ | $R^{C20}$ |
| $L_{A1157}$ | $R^{B43}$ | $R^{B43}$ | $R^{C20}$ |
| $L_{A1158}$ | $R^{A3}$ | $R^{A3}$ | $R^{C20}$ |
| $L_{A1159}$ | $R^{A34}$ | $R^{A34}$ | $R^{C20}$ |
| $L_{A1160}$ | $R^{A57}$ | $R^{A57}$ | $R^{C20}$ |
| $L_{A1161}$ | $R^{B3}$ | $R^{B7}$ | $R^{C20}$ |
| $L_{A1162}$ | $R^{B4}$ | $R^{B7}$ | $R^{C20}$ |
| $L_{A1163}$ | $R^{B5}$ | $R^{B7}$ | $R^{C20}$ |
| $L_{A1164}$ | $R^{B18}$ | $R^{B7}$ | $R^{C20}$ |
| $L_{A1165}$ | $R^{B43}$ | $R^{B7}$ | $R^{C20}$ |
| $L_{A1166}$ | $R^{A3}$ | $R^{B7}$ | $R^{C20}$ |
| $L_{A1167}$ | $R^{A34}$ | $R^{B7}$ | $R^{C20}$ |
| $L_{A1168}$ | $R^{A57}$ | $R^{B7}$ | $R^{C20}$ |
| $L_{A1169}$ | $R^{B3}$ | $R^{A3}$ | $R^{C20}$ |
| $L_{A1170}$ | $R^{B4}$ | $R^{A3}$ | $R^{C20}$ |
| $L_{A1171}$ | $R^{B5}$ | $R^{A3}$ | $R^{C20}$ |
| $L_{A1172}$ | $R^{B18}$ | $R^{A3}$ | $R^{C20}$ |
| $L_{A1173}$ | $R^{B43}$ | $R^{A3}$ | $R^{C20}$ |
| $L_{A1174}$ | $R^{A3}$ | $R^{A3}$ | $R^{C20}$ |
| $L_{A1175}$ | $R^{A34}$ | $R^{A3}$ | $R^{C20}$ |
| $L_{A1176}$ | $R^{A57}$ | $R^{A3}$ | $R^{C20}$ |
| $L_{A1177}$ | $R^{B3}$ | $R^{A34}$ | $R^{C20}$ |
| $L_{A1178}$ | $R^{B4}$ | $R^{A34}$ | $R^{C20}$ |
| $L_{A1179}$ | $R^{B5}$ | $R^{A34}$ | $R^{C20}$ |
| $L_{A1180}$ | $R^{B18}$ | $R^{A34}$ | $R^{C20}$ |
| $L_{A1181}$ | $R^{B43}$ | $R^{A34}$ | $R^{C20}$ |
| $L_{A1182}$ | $R^{A3}$ | $R^{A34}$ | $R^{C20}$ |
| $L_{A1183}$ | $R^{A34}$ | $R^{A34}$ | $R^{C20}$ |
| $L_{A1184}$ | $R^{A57}$ | $R^{A34}$ | $R^{C20}$ |
| $L_{A1185}$ | $R^{B3}$ | $R^{B3}$ | $R^{C24}$ |
| $L_{A1186}$ | $R^{B4}$ | $R^{B4}$ | $R^{C24}$ |
| $L_{A1187}$ | $R^{B5}$ | $R^{B5}$ | $R^{C24}$ |
| $L_{A1188}$ | $R^{B18}$ | $R^{B18}$ | $R^{C24}$ |
| $L_{A1189}$ | $R^{B43}$ | $R^{B43}$ | $R^{C24}$ |

-continued

| Ligand | $R^1$ | $R^2$ | G |
|---|---|---|---|
| $L_{A1190}$ | $R^{A3}$ | $R^{A3}$ | $R^{C24}$ |
| $L_{A1191}$ | $R^{A34}$ | $R^{A34}$ | $R^{C24}$ |
| $L_{A1192}$ | $R^{A57}$ | $R^{A57}$ | $R^{C24}$ |
| $L_{A1193}$ | $R^{B3}$ | $R^{B7}$ | $R^{C24}$ |
| $L_{A1194}$ | $R^{B4}$ | $R^{B7}$ | $R^{C24}$ |
| $L_{A1195}$ | $R^{B5}$ | $R^{B7}$ | $R^{C24}$ |
| $L_{A1196}$ | $R^{B18}$ | $R^{B7}$ | $R^{C24}$ |
| $L_{A1197}$ | $R^{B43}$ | $R^{B7}$ | $R^{C24}$ |
| $L_{A1198}$ | $R^{A3}$ | $R^{B7}$ | $R^{C24}$ |
| $L_{A1199}$ | $R^{A34}$ | $R^{B7}$ | $R^{C24}$ |
| $L_{A1200}$ | $R^{A57}$ | $R^{B7}$ | $R^{C24}$ |
| $L_{A1201}$ | $R^{B3}$ | $R^{A3}$ | $R^{C24}$ |
| $L_{A1202}$ | $R^{B4}$ | $R^{A3}$ | $R^{C24}$ |
| $L_{A1203}$ | $R^{B5}$ | $R^{A3}$ | $R^{C24}$ |
| $L_{A1204}$ | $R^{B18}$ | $R^{A3}$ | $R^{C24}$ |
| $L_{A1205}$ | $R^{B43}$ | $R^{A3}$ | $R^{C24}$ |
| $L_{A1206}$ | $R^{A3}$ | $R^{A3}$ | $R^{C24}$ |
| $L_{A1207}$ | $R^{A34}$ | $R^{A3}$ | $R^{C24}$ |
| $L_{A1208}$ | $R^{A57}$ | $R^{A3}$ | $R^{C24}$ |
| $L_{A1209}$ | $R^{B3}$ | $R^{A34}$ | $R^{C24}$ |
| $L_{A1210}$ | $R^{B4}$ | $R^{A34}$ | $R^{C24}$ |
| $L_{A1211}$ | $R^{B5}$ | $R^{A34}$ | $R^{C24}$ |
| $L_{A1212}$ | $R^{B18}$ | $R^{A34}$ | $R^{C24}$ |
| $L_{A1213}$ | $R^{B43}$ | $R^{A34}$ | $R^{C24}$ |
| $L_{A1214}$ | $R^{A3}$ | $R^{A34}$ | $R^{C24}$ |
| $L_{A1215}$ | $R^{A34}$ | $R^{A34}$ | $R^{C24}$ |
| $L_{A1216}$ | $R^{A57}$ | $R^{A34}$ | $R^{C24}$ |
| $L_{A1217}$ | $R^{B3}$ | $R^{B3}$ | $R^{C27}$ |
| $L_{A1218}$ | $R^{B4}$ | $R^{B4}$ | $R^{C27}$ |
| $L_{A1219}$ | $R^{B5}$ | $R^{B5}$ | $R^{C27}$ |
| $L_{A1220}$ | $R^{B18}$ | $R^{B18}$ | $R^{C27}$ |
| $L_{A1221}$ | $R^{B43}$ | $R^{B43}$ | $R^{C27}$ |
| $L_{A1222}$ | $R^{A3}$ | $R^{A3}$ | $R^{C27}$ |
| $L_{A1223}$ | $R^{A34}$ | $R^{A34}$ | $R^{C27}$ |
| $L_{A1224}$ | $R^{A57}$ | $R^{A57}$ | $R^{C27}$ |
| $L_{A1225}$ | $R^{B3}$ | $R^{B7}$ | $R^{C27}$ |
| $L_{A1226}$ | $R^{B4}$ | $R^{B7}$ | $R^{C27}$ |
| $L_{A1227}$ | $R^{B5}$ | $R^{B7}$ | $R^{C27}$ |
| $L_{A1228}$ | $R^{B18}$ | $R^{B7}$ | $R^{C27}$ |
| $L_{A1229}$ | $R^{B43}$ | $R^{B7}$ | $R^{C27}$ |
| $L_{A1230}$ | $R^{A3}$ | $R^{B7}$ | $R^{C27}$ |
| $L_{A1231}$ | $R^{A34}$ | $R^{B7}$ | $R^{C27}$ |
| $L_{A1232}$ | $R^{A57}$ | $R^{B7}$ | $R^{C27}$ |
| $L_{A1233}$ | $R^{B3}$ | $R^{A3}$ | $R^{C27}$ |
| $L_{A1234}$ | $R^{B4}$ | $R^{A3}$ | $R^{C27}$ |
| $L_{A1235}$ | $R^{B5}$ | $R^{A3}$ | $R^{C27}$ |
| $L_{A1236}$ | $R^{B18}$ | $R^{A3}$ | $R^{C27}$ |
| $L_{A1237}$ | $R^{B43}$ | $R^{A3}$ | $R^{C27}$ |
| $L_{A1238}$ | $R^{A3}$ | $R^{A3}$ | $R^{C27}$ |
| $L_{A1239}$ | $R^{A34}$ | $R^{A3}$ | $R^{C27}$ |
| $L_{A1240}$ | $R^{A57}$ | $R^{A3}$ | $R^{C27}$ |
| $L_{A1241}$ | $R^{B3}$ | $R^{A34}$ | $R^{C27}$ |
| $L_{A1242}$ | $R^{B4}$ | $R^{A34}$ | $R^{C27}$ |
| $L_{A1243}$ | $R^{B5}$ | $R^{A34}$ | $R^{C27}$ |
| $L_{A1244}$ | $R^{B18}$ | $R^{A34}$ | $R^{C27}$ |
| $L_{A1245}$ | $R^{B43}$ | $R^{A34}$ | $R^{C27}$ |
| $L_{A1246}$ | $R^{A3}$ | $R^{A34}$ | $R^{C27}$ |
| $L_{A1247}$ | $R^{A34}$ | $R^{A34}$ | $R^{C27}$ |
| $L_{A1248}$ | $R^{A57}$ | $R^{A34}$ | $R^{C27}$ |
| $L_{A1249}$ | $R^{B3}$ | $R^{B3}$ | $R^{C31}$ |
| $L_{A1250}$ | $R^{B4}$ | $R^{B4}$ | $R^{C31}$ |
| $L_{A1251}$ | $R^{B5}$ | $R^{B5}$ | $R^{C31}$ |
| $L_{A1252}$ | $R^{B18}$ | $R^{B18}$ | $R^{C31}$ |
| $L_{A1253}$ | $R^{B43}$ | $R^{B43}$ | $R^{C31}$ |
| $L_{A1254}$ | $R^{A3}$ | $R^{A3}$ | $R^{C31}$ |
| $L_{A1255}$ | $R^{A34}$ | $R^{A34}$ | $R^{C31}$ |
| $L_{A1256}$ | $R^{A57}$ | $R^{A57}$ | $R^{C31}$ |
| $L_{A1257}$ | $R^{B3}$ | $R^{B7}$ | $R^{C31}$ |
| $L_{A1258}$ | $R^{B4}$ | $R^{B7}$ | $R^{C31}$ |
| $L_{A1259}$ | $R^{B5}$ | $R^{B7}$ | $R^{C31}$ |
| $L_{A1260}$ | $R^{B18}$ | $R^{B7}$ | $R^{C31}$ |
| $L_{A1261}$ | $R^{B43}$ | $R^{B7}$ | $R^{C31}$ |
| $L_{A1262}$ | $R^{A3}$ | $R^{B7}$ | $R^{C31}$ |
| $L_{A1263}$ | $R^{A34}$ | $R^{B7}$ | $R^{C31}$ |
| $L_{A1264}$ | $R^{A57}$ | $R^{B7}$ | $R^{C31}$ |
| $L_{A1265}$ | $R^{B3}$ | $R^{A3}$ | $R^{C31}$ |
| $L_{A1266}$ | $R^{B4}$ | $R^{A3}$ | $R^{C31}$ |

-continued

| Ligand | $R^1$ | $R^2$ | G |
| --- | --- | --- | --- |
| $L_{A1267}$ | $R^{B5}$ | $R^{A3}$ | $R^{C31}$ |
| $L_{A1268}$ | $R^{B18}$ | $R^{A3}$ | $R^{C31}$ |
| $L_{A1269}$ | $R^{B43}$ | $R^{A3}$ | $R^{C31}$ |
| $L_{A1270}$ | $R^{A3}$ | $R^{A3}$ | $R^{C31}$ |
| $L_{A1271}$ | $R^{A34}$ | $R^{A3}$ | $R^{C31}$ |
| $L_{A1272}$ | $R^{A57}$ | $R^{A3}$ | $R^{C31}$ |
| $L_{A1273}$ | $R^{B3}$ | $R^{A34}$ | $R^{C31}$ |
| $L_{A1274}$ | $R^{B4}$ | $R^{A34}$ | $R^{C31}$ |
| $L_{A1275}$ | $R^{B5}$ | $R^{A34}$ | $R^{C31}$ |
| $L_{A1276}$ | $R^{B18}$ | $R^{A34}$ | $R^{C31}$ |
| $L_{A1277}$ | $R^{B43}$ | $R^{A34}$ | $R^{C31}$ |
| $L_{A1278}$ | $R^{A3}$ | $R^{A34}$ | $R^{C31}$ |
| $L_{A1279}$ | $R^{A34}$ | $R^{A34}$ | $R^{C31}$ |
| $L_{A1280}$ | $R^{A57}$ | $R^{A34}$ | $R^{C31}$ |
| $L_{A1281}$ | $R^{B3}$ | $R^{B3}$ | $R^{C34}$ |
| $L_{A1282}$ | $R^{B4}$ | $R^{B4}$ | $R^{C34}$ |
| $L_{A1283}$ | $R^{B5}$ | $R^{B5}$ | $R^{C34}$ |
| $L_{A1284}$ | $R^{B18}$ | $R^{B18}$ | $R^{C34}$ |
| $L_{A1285}$ | $R^{B43}$ | $R^{B43}$ | $R^{C34}$ |
| $L_{A1286}$ | $R^{A3}$ | $R^{A3}$ | $R^{C34}$ |
| $L_{A1287}$ | $R^{A34}$ | $R^{A34}$ | $R^{C34}$ |
| $L_{A1288}$ | $R^{A57}$ | $R^{A57}$ | $R^{C34}$ |
| $L_{A1289}$ | $R^{B3}$ | $R^{B7}$ | $R^{C34}$ |
| $L_{A1290}$ | $R^{B4}$ | $R^{B7}$ | $R^{C34}$ |
| $L_{A1291}$ | $R^{B5}$ | $R^{B7}$ | $R^{C34}$ |
| $L_{A1292}$ | $R^{B18}$ | $R^{B7}$ | $R^{C34}$ |
| $L_{A1293}$ | $R^{B43}$ | $R^{B7}$ | $R^{C34}$ |
| $L_{A1294}$ | $R^{A3}$ | $R^{B7}$ | $R^{C34}$ |
| $L_{A1295}$ | $R^{A34}$ | $R^{B7}$ | $R^{C34}$ |
| $L_{A1296}$ | $R^{A57}$ | $R^{B7}$ | $R^{C34}$ |
| $L_{A1297}$ | $R^{B3}$ | $R^{A3}$ | $R^{C34}$ |
| $L_{A1298}$ | $R^{B4}$ | $R^{A3}$ | $R^{C34}$ |
| $L_{A1299}$ | $R^{B5}$ | $R^{A3}$ | $R^{C34}$ |
| $L_{A1300}$ | $R^{B18}$ | $R^{A3}$ | $R^{C34}$ |
| $L_{A1301}$ | $R^{B43}$ | $R^{A3}$ | $R^{C34}$ |
| $L_{A1302}$ | $R^{A3}$ | $R^{A3}$ | $R^{C34}$ |
| $L_{A1303}$ | $R^{A34}$ | $R^{A3}$ | $R^{C34}$ |
| $L_{A1304}$ | $R^{A57}$ | $R^{A3}$ | $R^{C34}$ |
| $L_{A1305}$ | $R^{B3}$ | $R^{A34}$ | $R^{C34}$ |
| $L_{A1306}$ | $R^{B4}$ | $R^{A34}$ | $R^{C34}$ |
| $L_{A1307}$ | $R^{B5}$ | $R^{A34}$ | $R^{C34}$ |
| $L_{A1308}$ | $R^{B7}$ | $R^{A34}$ | $R^{C34}$ |
| $L_{A1309}$ | $R^{B13}$ | $R^{A34}$ | $R^{C34}$ |
| $L_{A1310}$ | $R^{A3}$ | $R^{A34}$ | $R^{C34}$ |
| $L_{A1311}$ | $R^{A34}$ | $R^{A34}$ | $R^{C34}$ |
| $L_{A1312}$ | $R^{A57}$ | $R^{A34}$ | $R^{C34}$ |
| $L_{A1313}$ | $R^{B3}$ | $R^{B3}$ | $R^{C38}$ |
| $L_{A1314}$ | $R^{B4}$ | $R^{B4}$ | $R^{C38}$ |
| $L_{A1315}$ | $R^{B5}$ | $R^{B5}$ | $R^{C38}$ |
| $L_{A1316}$ | $R^{B18}$ | $R^{B18}$ | $R^{C38}$ |
| $L_{A1317}$ | $R^{B43}$ | $R^{B43}$ | $R^{C38}$ |
| $L_{A1318}$ | $R^{A3}$ | $R^{A3}$ | $R^{C38}$ |
| $L_{A1319}$ | $R^{A34}$ | $R^{A34}$ | $R^{C38}$ |
| $L_{A1320}$ | $R^{A57}$ | $R^{A57}$ | $R^{C38}$ |
| $L_{A1321}$ | $R^{B3}$ | $R^{B7}$ | $R^{C38}$ |
| $L_{A1322}$ | $R^{B4}$ | $R^{B7}$ | $R^{C38}$ |
| $L_{A1323}$ | $R^{B5}$ | $R^{B7}$ | $R^{C38}$ |
| $L_{A1324}$ | $R^{B18}$ | $R^{B7}$ | $R^{C38}$ |
| $L_{A1325}$ | $R^{B43}$ | $R^{B7}$ | $R^{C38}$ |
| $L_{A1326}$ | $R^{A3}$ | $R^{B7}$ | $R^{C38}$ |
| $L_{A1327}$ | $R^{A34}$ | $R^{B7}$ | $R^{C38}$ |
| $L_{A1328}$ | $R^{A57}$ | $R^{B7}$ | $R^{C38}$ |
| $L_{A1329}$ | $R^{B3}$ | $R^{A3}$ | $R^{C38}$ |
| $L_{A1330}$ | $R^{B4}$ | $R^{A3}$ | $R^{C38}$ |
| $L_{A1331}$ | $R^{B5}$ | $R^{A3}$ | $R^{C38}$ |
| $L_{A1332}$ | $R^{B18}$ | $R^{A3}$ | $R^{C38}$ |
| $L_{A1333}$ | $R^{B43}$ | $R^{A3}$ | $R^{C38}$ |
| $L_{A1334}$ | $R^{A3}$ | $R^{A3}$ | $R^{C38}$ |
| $L_{A1335}$ | $R^{A34}$ | $R^{A3}$ | $R^{C38}$ |
| $L_{A1336}$ | $R^{A57}$ | $R^{A3}$ | $R^{C38}$ |
| $L_{A1337}$ | $R^{B3}$ | $R^{A34}$ | $R^{C38}$ |
| $L_{A1338}$ | $R^{B4}$ | $R^{A34}$ | $R^{C38}$ |
| $L_{A1339}$ | $R^{B5}$ | $R^{A34}$ | $R^{C38}$ |
| $L_{A1340}$ | $R^{B18}$ | $R^{A34}$ | $R^{C38}$ |
| $L_{A1341}$ | $R^{B43}$ | $R^{A34}$ | $R^{C38}$ |
| $L_{A1342}$ | $R^{A3}$ | $R^{A34}$ | $R^{C38}$ |

-continued

| Ligand | $R^1$ | $R^2$ | G |
| --- | --- | --- | --- |
| $L_{A1343}$ | $R^{A34}$ | $R^{A34}$ | $R^{C38}$ |
| $L_{A1344}$ | $R^{A57}$ | $R^{A34}$ | $R^{C38}$, |

$L_{A1345}$ through $L^{A1792}$ based on a structure of Formula II

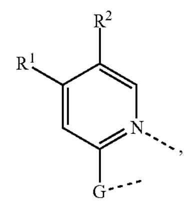

in which $R^1$, $R^2$, and G are defined as:

| Ligand | $R^1$ | $R^2$ | G |
| --- | --- | --- | --- |
| $L_{A1345}$ | $R^{B13}$ | $R^{B3}$ | $R^{C2}$ |
| $L_{A1346}$ | $R^{B13}$ | $R^{B4}$ | $R^{C2}$ |
| $L_{A1347}$ | $R^{B13}$ | $R^{B5}$ | $R^{C2}$ |
| $L_{A1348}$ | $R^{B13}$ | $R^{B18}$ | $R^{C2}$ |
| $L_{A1349}$ | $R^{B13}$ | $R^{B43}$ | $R^{C2}$ |
| $L_{A1350}$ | $R^{B13}$ | $R^{A3}$ | $R^{C2}$ |
| $L_{A1351}$ | $R^{B13}$ | $R^{A34}$ | $R^{C2}$ |
| $L_{A1352}$ | $R^{B13}$ | $R^{A57}$ | $R^{C2}$ |
| $L_{A1353}$ | $R^{B7}$ | $R^{B3}$ | $R^{C2}$ |
| $L_{A1354}$ | $R^{B7}$ | $R^{B4}$ | $R^{C2}$ |
| $L_{A1355}$ | $R^{B7}$ | $R^{B5}$ | $R^{C2}$ |
| $L_{A1356}$ | $R^{B7}$ | $R^{B18}$ | $R^{C2}$ |
| $L_{A1357}$ | $R^{B7}$ | $R^{B43}$ | $R^{C2}$ |
| $L_{A1358}$ | $R^{B7}$ | $R^{A3}$ | $R^{C2}$ |
| $L_{A1359}$ | $R^{B7}$ | $R^{A34}$ | $R^{C2}$ |
| $L_{A1360}$ | $R^{B7}$ | $R^{A57}$ | $R^{C2}$ |
| $L_{A1361}$ | $R^{A3}$ | $R^{B3}$ | $R^{C2}$ |
| $L_{A1362}$ | $R^{A3}$ | $R^{B4}$ | $R^{C2}$ |
| $L_{A1363}$ | $R^{A3}$ | $R^{B5}$ | $R^{C2}$ |
| $L_{A1364}$ | $R^{A3}$ | $R^{B18}$ | $R^{C2}$ |
| $L_{A1365}$ | $R^{A3}$ | $R^{B43}$ | $R^{C2}$ |
| $L_{A1366}$ | $R^{A3}$ | $R^{A3}$ | $R^{C2}$ |
| $L_{A1367}$ | $R^{A3}$ | $R^{A34}$ | $R^{C2}$ |
| $L_{A1368}$ | $R^{A3}$ | $R^{A57}$ | $R^{C2}$ |
| $L_{A1369}$ | $R^{A34}$ | $R^{B3}$ | $R^{C2}$ |
| $L_{A1370}$ | $R^{A34}$ | $R^{B4}$ | $R^{C2}$ |
| $L_{A1371}$ | $R^{A34}$ | $R^{B5}$ | $R^{C2}$ |
| $L_{A1372}$ | $R^{A34}$ | $R^{B18}$ | $R^{C2}$ |
| $L_{A1373}$ | $R^{A34}$ | $R^{B43}$ | $R^{C2}$ |
| $L_{A1374}$ | $R^{A34}$ | $R^{A3}$ | $R^{C2}$ |
| $L_{A1375}$ | $R^{A34}$ | $R^{A34}$ | $R^{C2}$ |
| $L_{A1376}$ | $R^{A34}$ | $R^{A57}$ | $R^{C2}$ |
| $L_{A1377}$ | $R^{B13}$ | $R^{B3}$ | $R^{C5}$ |
| $L_{A1378}$ | $R^{B13}$ | $R^{B4}$ | $R^{C5}$ |
| $L_{A1379}$ | $R^{B13}$ | $R^{B5}$ | $R^{C5}$ |
| $L_{A1380}$ | $R^{B13}$ | $R^{B18}$ | $R^{C5}$ |
| $L_{A1381}$ | $R^{B13}$ | $R^{B43}$ | $R^{C5}$ |
| $L_{A1382}$ | $R^{B13}$ | $R^{A3}$ | $R^{C5}$ |
| $L_{A1383}$ | $R^{B13}$ | $R^{A34}$ | $R^{C5}$ |
| $L_{A1384}$ | $R^{B13}$ | $R^{A57}$ | $R^{C5}$ |
| $L_{A1385}$ | $R^{B7}$ | $R^{B3}$ | $R^{C5}$ |
| $L_{A1386}$ | $R^{B7}$ | $R^{B4}$ | $R^{C5}$ |
| $L_{A1387}$ | $R^{B7}$ | $R^{B5}$ | $R^{C5}$ |
| $L_{A1388}$ | $R^{B7}$ | $R^{B18}$ | $R^{C5}$ |
| $L_{A1389}$ | $R^{B7}$ | $R^{B43}$ | $R^{C5}$ |
| $L_{A1390}$ | $R^{B7}$ | $R^{A3}$ | $R^{C5}$ |
| $L_{A1391}$ | $R^{B7}$ | $R^{A34}$ | $R^{C5}$ |
| $L_{A1392}$ | $R^{B7}$ | $R^{A57}$ | $R^{C5}$ |
| $L_{A1393}$ | $R^{A3}$ | $R^{B3}$ | $R^{C5}$ |
| $L_{A1394}$ | $R^{A3}$ | $R^{B4}$ | $R^{C5}$ |
| $L_{A1395}$ | $R^{A3}$ | $R^{B5}$ | $R^{C5}$ |
| $L_{A1396}$ | $R^{A3}$ | $R^{B18}$ | $R^{C5}$ |
| $L_{A1397}$ | $R^{A3}$ | $R^{B43}$ | $R^{C5}$ |

-continued

| Ligand | $R^1$ | $R^2$ | G |
|---|---|---|---|
| $L_{A1398}$ | $R^{A3}$ | $R^{A3}$ | $R^{C5}$ |
| $L_{A1399}$ | $R^{A3}$ | $R^{A34}$ | $R^{C5}$ |
| $L_{A1400}$ | $R^{A3}$ | $R^{A57}$ | $R^{C5}$ |
| $L_{A1401}$ | $R^{A34}$ | $R^{B3}$ | $R^{C5}$ |
| $L_{A1402}$ | $R^{A34}$ | $R^{B4}$ | $R^{C5}$ |
| $L_{A1403}$ | $R^{A34}$ | $R^{B5}$ | $R^{C5}$ |
| $L_{A1404}$ | $R^{A34}$ | $R^{B18}$ | $R^{C5}$ |
| $L_{A1405}$ | $R^{A34}$ | $R^{B43}$ | $R^{C5}$ |
| $L_{A1406}$ | $R^{A34}$ | $R^{A3}$ | $R^{C5}$ |
| $L_{A1407}$ | $R^{A34}$ | $R^{A34}$ | $R^{C5}$ |
| $L_{A1408}$ | $R^{A34}$ | $R^{A57}$ | $R^{C5}$ |
| $L_{A1409}$ | $R^{B13}$ | $R^{B3}$ | $R^{C6}$ |
| $L_{A1410}$ | $R^{B13}$ | $R^{B4}$ | $R^{C6}$ |
| $L_{A1411}$ | $R^{B13}$ | $R^{B5}$ | $R^{C6}$ |
| $L_{A1412}$ | $R^{B13}$ | $R^{B18}$ | $R^{C6}$ |
| $L_{A1413}$ | $R^{B13}$ | $R^{B43}$ | $R^{C6}$ |
| $L_{A1414}$ | $R^{B13}$ | $R^{A3}$ | $R^{C6}$ |
| $L_{A1415}$ | $R^{B13}$ | $R^{A34}$ | $R^{C6}$ |
| $L_{A1416}$ | $R^{B13}$ | $R^{A57}$ | $R^{C6}$ |
| $L_{A1417}$ | $R^{B7}$ | $R^{B3}$ | $R^{C6}$ |
| $L_{A1418}$ | $R^{B7}$ | $R^{B4}$ | $R^{C6}$ |
| $L_{A1419}$ | $R^{B7}$ | $R^{B5}$ | $R^{C6}$ |
| $L_{A1420}$ | $R^{B7}$ | $R^{B18}$ | $R^{C6}$ |
| $L_{A1421}$ | $R^{B7}$ | $R^{B43}$ | $R^{C6}$ |
| $L_{A1422}$ | $R^{B7}$ | $R^{A3}$ | $R^{C6}$ |
| $L_{A1423}$ | $R^{B7}$ | $R^{A34}$ | $R^{C6}$ |
| $L_{A1424}$ | $R^{B7}$ | $R^{A57}$ | $R^{C6}$ |
| $L_{A1425}$ | $R^{A3}$ | $R^{B3}$ | $R^{C6}$ |
| $L_{A1426}$ | $R^{A3}$ | $R^{B4}$ | $R^{C6}$ |
| $L_{A1427}$ | $R^{A3}$ | $R^{B5}$ | $R^{C6}$ |
| $L_{A1428}$ | $R^{A3}$ | $R^{B18}$ | $R^{C6}$ |
| $L_{A1429}$ | $R^{A3}$ | $R^{B43}$ | $R^{C6}$ |
| $L_{A1430}$ | $R^{A3}$ | $R^{A3}$ | $R^{C6}$ |
| $L_{A1431}$ | $R^{A3}$ | $R^{A34}$ | $R^{C6}$ |
| $L_{A1432}$ | $R^{A3}$ | $R^{A57}$ | $R^{C6}$ |
| $L_{A1433}$ | $R^{A34}$ | $R^{B3}$ | $R^{C6}$ |
| $L_{A1434}$ | $R^{A34}$ | $R^{B4}$ | $R^{C6}$ |
| $L_{A1435}$ | $R^{A34}$ | $R^{B5}$ | $R^{C6}$ |
| $L_{A1436}$ | $R^{A34}$ | $R^{B18}$ | $R^{C6}$ |
| $L_{A1437}$ | $R^{A34}$ | $R^{B43}$ | $R^{C6}$ |
| $L_{A1438}$ | $R^{A34}$ | $R^{A3}$ | $R^{C6}$ |
| $L_{A1439}$ | $R^{A34}$ | $R^{A34}$ | $R^{C6}$ |
| $L_{A1440}$ | $R^{A34}$ | $R^{A57}$ | $R^{C6}$ |
| $L_{A1441}$ | $R^{B13}$ | $R^{B3}$ | $R^{C7}$ |
| $L_{A1442}$ | $R^{B13}$ | $R^{B4}$ | $R^{C7}$ |
| $L_{A1443}$ | $R^{B13}$ | $R^{B5}$ | $R^{C7}$ |
| $L_{A1444}$ | $R^{B13}$ | $R^{B18}$ | $R^{C7}$ |
| $L_{A1445}$ | $R^{B13}$ | $R^{B43}$ | $R^{C7}$ |
| $L_{A1446}$ | $R^{B13}$ | $R^{A3}$ | $R^{C7}$ |
| $L_{A1447}$ | $R^{B13}$ | $R^{A34}$ | $R^{C7}$ |
| $L_{A1448}$ | $R^{B13}$ | $R^{A57}$ | $R^{C7}$ |
| $L_{A1449}$ | $R^{B7}$ | $R^{B3}$ | $R^{C7}$ |
| $L_{A1450}$ | $R^{B7}$ | $R^{B4}$ | $R^{C7}$ |
| $L_{A1451}$ | $R^{B7}$ | $R^{B5}$ | $R^{C7}$ |
| $L_{A1452}$ | $R^{B7}$ | $R^{B18}$ | $R^{C7}$ |
| $L_{A1453}$ | $R^{B7}$ | $R^{B43}$ | $R^{C7}$ |
| $L_{A1454}$ | $R^{B7}$ | $R^{A3}$ | $R^{C7}$ |
| $L_{A1455}$ | $R^{B7}$ | $R^{A34}$ | $R^{C7}$ |
| $L_{A1456}$ | $R^{B7}$ | $R^{A57}$ | $R^{C7}$ |
| $L_{A1457}$ | $R^{A3}$ | $R^{B3}$ | $R^{C7}$ |
| $L_{A1458}$ | $R^{A3}$ | $R^{B4}$ | $R^{C7}$ |
| $L_{A1459}$ | $R^{A3}$ | $R^{B5}$ | $R^{C7}$ |
| $L_{A1460}$ | $R^{A3}$ | $R^{B18}$ | $R^{C7}$ |
| $L_{A1461}$ | $R^{A3}$ | $R^{B43}$ | $R^{C7}$ |
| $L_{A1462}$ | $R^{A3}$ | $R^{A3}$ | $R^{C7}$ |
| $L_{A1463}$ | $R^{A3}$ | $R^{A34}$ | $R^{C7}$ |
| $L_{A1464}$ | $R^{A3}$ | $R^{A57}$ | $R^{C7}$ |
| $L_{A1465}$ | $R^{A34}$ | $R^{B3}$ | $R^{C7}$ |
| $L_{A1466}$ | $R^{A34}$ | $R^{B4}$ | $R^{C7}$ |
| $L_{A1467}$ | $R^{A34}$ | $R^{B5}$ | $R^{C7}$ |
| $L_{A1468}$ | $R^{A34}$ | $R^{B18}$ | $R^{C7}$ |
| $L_{A1469}$ | $R^{A34}$ | $R^{B43}$ | $R^{C7}$ |
| $L_{A1470}$ | $R^{A34}$ | $R^{A3}$ | $R^{C7}$ |
| $L_{A1471}$ | $R^{A34}$ | $R^{A34}$ | $R^{C7}$ |
| $L_{A1472}$ | $R^{A34}$ | $R^{A57}$ | $R^{C7}$ |
| $L_{A1473}$ | $R^{B13}$ | $R^{B3}$ | $R^{C10}$ |
| $L_{A1474}$ | $R^{B13}$ | $R^{B4}$ | $R^{C10}$ |

-continued

| Ligand | $R^1$ | $R^2$ | G |
|---|---|---|---|
| $L_{A1475}$ | $R^{B13}$ | $R^{B5}$ | $R^{C10}$ |
| $L_{A1476}$ | $R^{B13}$ | $R^{B18}$ | $R^{C10}$ |
| $L_{A1477}$ | $R^{B13}$ | $R^{B43}$ | $R^{C10}$ |
| $L_{A1478}$ | $R^{B13}$ | $R^{A3}$ | $R^{C10}$ |
| $L_{A1479}$ | $R^{B13}$ | $R^{A34}$ | $R^{C10}$ |
| $L_{A1480}$ | $R^{B13}$ | $R^{A57}$ | $R^{C10}$ |
| $L_{A1481}$ | $R^{B7}$ | $R^{B3}$ | $R^{C10}$ |
| $L_{A1482}$ | $R^{B7}$ | $R^{B4}$ | $R^{C10}$ |
| $L_{A1483}$ | $R^{B7}$ | $R^{B5}$ | $R^{C10}$ |
| $L_{A1484}$ | $R^{B7}$ | $R^{B18}$ | $R^{C10}$ |
| $L_{A1485}$ | $R^{B7}$ | $R^{B43}$ | $R^{C10}$ |
| $L_{A1486}$ | $R^{B7}$ | $R^{A3}$ | $R^{C10}$ |
| $L_{A1487}$ | $R^{B7}$ | $R^{A34}$ | $R^{C10}$ |
| $L_{A1488}$ | $R^{B7}$ | $R^{A57}$ | $R^{C10}$ |
| $L_{A1489}$ | $R^{A3}$ | $R^{B3}$ | $R^{C10}$ |
| $L_{A1490}$ | $R^{A3}$ | $R^{B4}$ | $R^{C10}$ |
| $L_{A1491}$ | $R^{A3}$ | $R^{B5}$ | $R^{C10}$ |
| $L_{A1492}$ | $R^{A3}$ | $R^{B18}$ | $R^{C10}$ |
| $L_{A1493}$ | $R^{A3}$ | $R^{B43}$ | $R^{C10}$ |
| $L_{A1494}$ | $R^{A3}$ | $R^{A3}$ | $R^{C10}$ |
| $L_{A1495}$ | $R^{A3}$ | $R^{A34}$ | $R^{C10}$ |
| $L_{A1496}$ | $R^{A3}$ | $R^{A57}$ | $R^{C10}$ |
| $L_{A1497}$ | $R^{A34}$ | $R^{B3}$ | $R^{C10}$ |
| $L_{A1498}$ | $R^{A34}$ | $R^{B4}$ | $R^{C10}$ |
| $L_{A1499}$ | $R^{A34}$ | $R^{B5}$ | $R^{C10}$ |
| $L_{A1500}$ | $R^{A34}$ | $R^{B18}$ | $R^{C10}$ |
| $L_{A1501}$ | $R^{A34}$ | $R^{B43}$ | $R^{C10}$ |
| $L_{A1502}$ | $R^{A34}$ | $R^{A3}$ | $R^{C10}$ |
| $L_{A1503}$ | $R^{A34}$ | $R^{A34}$ | $R^{C10}$ |
| $L_{A1504}$ | $R^{A34}$ | $R^{A57}$ | $R^{C10}$ |
| $L_{A1505}$ | $R^{B13}$ | $R^{B3}$ | $R^{C11}$ |
| $L_{A1506}$ | $R^{B13}$ | $R^{B4}$ | $R^{C11}$ |
| $L_{A1507}$ | $R^{B13}$ | $R^{B5}$ | $R^{C11}$ |
| $L_{A1508}$ | $R^{B13}$ | $R^{B18}$ | $R^{C11}$ |
| $L_{A1509}$ | $R^{B13}$ | $R^{B43}$ | $R^{C11}$ |
| $L_{A1510}$ | $R^{B13}$ | $R^{A3}$ | $R^{C11}$ |
| $L_{A1511}$ | $R^{B3}$ | $R^{A34}$ | $R^{C11}$ |
| $L_{A1512}$ | $R^{B13}$ | $R^{A57}$ | $R^{C11}$ |
| $L_{A1513}$ | $R^{B7}$ | $R^{B3}$ | $R^{C11}$ |
| $L_{A1514}$ | $R^{B7}$ | $R^{B4}$ | $R^{C11}$ |
| $L_{A1515}$ | $R^{B7}$ | $R^{B5}$ | $R^{C11}$ |
| $L_{A1516}$ | $R^{B7}$ | $R^{B18}$ | $R^{C11}$ |
| $L_{A1517}$ | $R^{B7}$ | $R^{B43}$ | $R^{C11}$ |
| $L_{A1518}$ | $R^{B7}$ | $R^{A3}$ | $R^{C11}$ |
| $L_{A1519}$ | $R^{B7}$ | $R^{A34}$ | $R^{C11}$ |
| $L_{A1520}$ | $R^{B7}$ | $R^{A57}$ | $R^{C11}$ |
| $L_{A1521}$ | $R^{A3}$ | $R^{B3}$ | $R^{C11}$ |
| $L_{A1522}$ | $R^{A3}$ | $R^{B4}$ | $R^{C11}$ |
| $L_{A1523}$ | $R^{A3}$ | $R^{B5}$ | $R^{C11}$ |
| $L_{A1524}$ | $R^{A3}$ | $R^{B18}$ | $R^{C11}$ |
| $L_{A1525}$ | $R^{A3}$ | $R^{B43}$ | $R^{C11}$ |
| $L_{A1526}$ | $R^{A3}$ | $R^{A3}$ | $R^{C11}$ |
| $L_{A1527}$ | $R^{A3}$ | $R^{A34}$ | $R^{C11}$ |
| $L_{A1528}$ | $R^{A3}$ | $R^{A57}$ | $R^{C11}$ |
| $L_{A1529}$ | $R^{A34}$ | $R^{B3}$ | $R^{C11}$ |
| $L_{A1530}$ | $R^{A34}$ | $R^{B4}$ | $R^{C11}$ |
| $L_{A1531}$ | $R^{A34}$ | $R^{B5}$ | $R^{C11}$ |
| $L_{A1532}$ | $R^{A34}$ | $R^{B18}$ | $R^{C11}$ |
| $L_{A1533}$ | $R^{A34}$ | $R^{B43}$ | $R^{C11}$ |
| $L_{A1534}$ | $R^{A34}$ | $R^{A3}$ | $R^{C11}$ |
| $L_{A1535}$ | $R^{A34}$ | $R^{A34}$ | $R^{C11}$ |
| $L_{A1536}$ | $R^{A34}$ | $R^{A57}$ | $R^{C11}$ |
| $L_{A1537}$ | $R^{B13}$ | $R^{B3}$ | $R^{C13}$ |
| $L_{A1538}$ | $R^{B13}$ | $R^{B4}$ | $R^{C13}$ |
| $L_{A1539}$ | $R^{B13}$ | $R^{B5}$ | $R^{C13}$ |
| $L_{A1540}$ | $R^{B13}$ | $R^{B18}$ | $R^{C13}$ |
| $L_{A1541}$ | $R^{B13}$ | $R^{B43}$ | $R^{C13}$ |
| $L_{A1542}$ | $R^{B13}$ | $R^{A3}$ | $R^{C13}$ |
| $L_{A1543}$ | $R^{B13}$ | $R^{A34}$ | $R^{C13}$ |
| $L_{A1544}$ | $R^{B13}$ | $R^{A57}$ | $R^{C13}$ |
| $L_{A1545}$ | $R^{B7}$ | $R^{B3}$ | $R^{C13}$ |
| $L_{A1546}$ | $R^{B7}$ | $R^{B4}$ | $R^{C13}$ |
| $L_{A1547}$ | $R^{B7}$ | $R^{B5}$ | $R^{C13}$ |
| $L_{A1548}$ | $R^{B7}$ | $R^{B18}$ | $R^{C13}$ |
| $L_{A1549}$ | $R^{B7}$ | $R^{B43}$ | $R^{C13}$ |
| $L_{A1550}$ | $R^{B7}$ | $R^{A3}$ | $R^{C13}$ |
| $L_{A1551}$ | $R^{B7}$ | $R^{A34}$ | $R^{C13}$ |

-continued

| Ligand | $R^1$ | $R^2$ | G |
|---|---|---|---|
| $L_{A1552}$ | $R^{B7}$ | $R^{A57}$ | $R^{C13}$ |
| $L_{A1553}$ | $R^{A3}$ | $R^{B3}$ | $R^{C13}$ |
| $L_{A1554}$ | $R^{A3}$ | $R^{B4}$ | $R^{C13}$ |
| $L_{A1555}$ | $R^{A3}$ | $R^{B5}$ | $R^{C13}$ |
| $L_{A1556}$ | $R^{A3}$ | $R^{B18}$ | $R^{C13}$ |
| $L_{A1557}$ | $R^{A3}$ | $R^{B43}$ | $R^{C13}$ |
| $L_{A1558}$ | $R^{A3}$ | $R^{A3}$ | $R^{C13}$ |
| $L_{A1559}$ | $R^{A3}$ | $R^{A34}$ | $R^{C13}$ |
| $L_{A1560}$ | $R^{A3}$ | $R^{A57}$ | $R^{C13}$ |
| $L_{A1561}$ | $R^{A34}$ | $R^{B3}$ | $R^{C13}$ |
| $L_{A1562}$ | $R^{A34}$ | $R^{B4}$ | $R^{C13}$ |
| $L_{A1563}$ | $R^{A34}$ | $R^{B5}$ | $R^{C13}$ |
| $L_{A1564}$ | $R^{A34}$ | $R^{B18}$ | $R^{C13}$ |
| $L_{A1565}$ | $R^{A34}$ | $R^{B43}$ | $R^{C13}$ |
| $L_{A1566}$ | $R^{A34}$ | $R^{A3}$ | $R^{C13}$ |
| $L_{A1567}$ | $R^{A34}$ | $R^{A34}$ | $R^{C13}$ |
| $L_{A1568}$ | $R^{A34}$ | $R^{A57}$ | $R^{C13}$ |
| $L_{A1569}$ | $R^{B13}$ | $R^{B3}$ | $R^{C17}$ |
| $L_{A1570}$ | $R^{B13}$ | $R^{B4}$ | $R^{C17}$ |
| $L_{A1571}$ | $R^{B13}$ | $R^{B5}$ | $R^{C17}$ |
| $L_{A1572}$ | $R^{B13}$ | $R^{B18}$ | $R^{C17}$ |
| $L_{A1573}$ | $R^{B13}$ | $R^{B43}$ | $R^{C17}$ |
| $L_{A1574}$ | $R^{B13}$ | $R^{A3}$ | $R^{C17}$ |
| $L_{A1575}$ | $R^{B13}$ | $R^{A34}$ | $R^{C17}$ |
| $L_{A1576}$ | $R^{B13}$ | $R^{A57}$ | $R^{C17}$ |
| $L_{A1577}$ | $R^{B7}$ | $R^{B3}$ | $R^{C17}$ |
| $L_{A1578}$ | $R^{B7}$ | $R^{B4}$ | $R^{C17}$ |
| $L_{A1579}$ | $R^{B7}$ | $R^{B5}$ | $R^{C17}$ |
| $L_{A1580}$ | $R^{B7}$ | $R^{B18}$ | $R^{C17}$ |
| $L_{A1581}$ | $R^{B7}$ | $R^{B43}$ | $R^{C17}$ |
| $L_{A1582}$ | $R^{B7}$ | $R^{A3}$ | $R^{C17}$ |
| $L_{A1583}$ | $R^{B7}$ | $R^{A34}$ | $R^{C17}$ |
| $L_{A1584}$ | $R^{B7}$ | $R^{A57}$ | $R^{C17}$ |
| $L_{A1585}$ | $R^{A3}$ | $R^{B3}$ | $R^{C17}$ |
| $L_{A1586}$ | $R^{A3}$ | $R^{B4}$ | $R^{C17}$ |
| $L_{A1587}$ | $R^{A3}$ | $R^{B5}$ | $R^{C17}$ |
| $L_{A1588}$ | $R^{A3}$ | $R^{B18}$ | $R^{C17}$ |
| $L_{A1589}$ | $R^{A3}$ | $R^{B43}$ | $R^{C17}$ |
| $L_{A1590}$ | $R^{A3}$ | $R^{A3}$ | $R^{C17}$ |
| $L_{A1591}$ | $R^{A3}$ | $R^{A34}$ | $R^{C17}$ |
| $L_{A1592}$ | $R^{A3}$ | $R^{A57}$ | $R^{C17}$ |
| $L_{A1593}$ | $R^{A34}$ | $R^{B3}$ | $R^{C17}$ |
| $L_{A1594}$ | $R^{A34}$ | $R^{B4}$ | $R^{C17}$ |
| $L_{A1595}$ | $R^{A34}$ | $R^{B5}$ | $R^{C17}$ |
| $L_{A1596}$ | $R^{A34}$ | $R^{B18}$ | $R^{C17}$ |
| $L_{A1597}$ | $R^{A34}$ | $R^{B43}$ | $R^{C17}$ |
| $L_{A1598}$ | $R^{A34}$ | $R^{A3}$ | $R^{C17}$ |
| $L_{A1599}$ | $R^{A34}$ | $R^{A34}$ | $R^{C17}$ |
| $L_{A1600}$ | $R^{A34}$ | $R^{A57}$ | $R^{C17}$ |
| $L_{A1601}$ | $R^{B13}$ | $R^{B3}$ | $R^{C20}$ |
| $L_{A1602}$ | $R^{B13}$ | $R^{B4}$ | $R^{C20}$ |
| $L_{A1603}$ | $R^{B13}$ | $R^{B5}$ | $R^{C20}$ |
| $L_{A1604}$ | $R^{B13}$ | $R^{B18}$ | $R^{C20}$ |
| $L_{A1605}$ | $R^{B13}$ | $R^{B43}$ | $R^{C20}$ |
| $L_{A1606}$ | $R^{B13}$ | $R^{A3}$ | $R^{C20}$ |
| $L_{A1607}$ | $R^{B13}$ | $R^{A34}$ | $R^{C20}$ |
| $L_{A1608}$ | $R^{B13}$ | $R^{A57}$ | $R^{C20}$ |
| $L_{A1609}$ | $R^{B7}$ | $R^{B3}$ | $R^{C20}$ |
| $L_{A1610}$ | $R^{B7}$ | $R^{B4}$ | $R^{C20}$ |
| $L_{A1611}$ | $R^{B7}$ | $R^{B5}$ | $R^{C20}$ |
| $L_{A1612}$ | $R^{B7}$ | $R^{B18}$ | $R^{C20}$ |
| $L_{A1613}$ | $R^{B7}$ | $R^{B43}$ | $R^{C20}$ |
| $L_{A1614}$ | $R^{B7}$ | $R^{A3}$ | $R^{C20}$ |
| $L_{A1615}$ | $R^{B7}$ | $R^{A34}$ | $R^{C20}$ |
| $L_{A1616}$ | $R^{B7}$ | $R^{A57}$ | $R^{C20}$ |
| $L_{A1617}$ | $R^{A3}$ | $R^{B3}$ | $R^{C20}$ |
| $L_{A1618}$ | $R^{A3}$ | $R^{B4}$ | $R^{C20}$ |
| $L_{A1619}$ | $R^{A3}$ | $R^{B5}$ | $R^{C20}$ |
| $L_{A1620}$ | $R^{A3}$ | $R^{B18}$ | $R^{C20}$ |
| $L_{A1621}$ | $R^{A3}$ | $R^{B43}$ | $R^{C20}$ |
| $L_{A1622}$ | $R^{A3}$ | $R^{A3}$ | $R^{C20}$ |
| $L_{A1623}$ | $R^{A3}$ | $R^{A34}$ | $R^{C20}$ |
| $L_{A1624}$ | $R^{A3}$ | $R^{A57}$ | $R^{C20}$ |
| $L_{A1625}$ | $R^{A34}$ | $R^{B3}$ | $R^{C20}$ |
| $L_{A1626}$ | $R^{A34}$ | $R^{B4}$ | $R^{C20}$ |
| $L_{A1627}$ | $R^{A34}$ | $R^{B5}$ | $R^{C20}$ |
| $L_{A1628}$ | $R^{A34}$ | $R^{B18}$ | $R^{C20}$ |
| $L_{A1629}$ | $R^{A34}$ | $R^{B43}$ | $R^{C20}$ |
| $L_{A1630}$ | $R^{A34}$ | $R^{A3}$ | $R^{C20}$ |
| $L_{A1631}$ | $R^{A34}$ | $R^{A34}$ | $R^{C20}$ |
| $L_{A1632}$ | $R^{A34}$ | $R^{A57}$ | $R^{C20}$ |
| $L_{A1633}$ | $R^{B13}$ | $R^{B3}$ | $R^{C24}$ |
| $L_{A1634}$ | $R^{B13}$ | $R^{B4}$ | $R^{C24}$ |
| $L_{A1635}$ | $R^{B13}$ | $R^{B5}$ | $R^{C24}$ |
| $L_{A1636}$ | $R^{B13}$ | $R^{B18}$ | $R^{C24}$ |
| $L_{A1637}$ | $R^{B13}$ | $R^{B43}$ | $R^{C24}$ |
| $L_{A1638}$ | $R^{B13}$ | $R^{A3}$ | $R^{C24}$ |
| $L_{A1639}$ | $R^{B13}$ | $R^{A34}$ | $R^{C24}$ |
| $L_{A1640}$ | $R^{B13}$ | $R^{A57}$ | $R^{C24}$ |
| $L_{A1641}$ | $R^{B7}$ | $R^{B3}$ | $R^{C24}$ |
| $L_{A1642}$ | $R^{B7}$ | $R^{B4}$ | $R^{C24}$ |
| $L_{A1643}$ | $R^{B7}$ | $R^{B5}$ | $R^{C24}$ |
| $L_{A1644}$ | $R^{B7}$ | $R^{B18}$ | $R^{C24}$ |
| $L_{A1645}$ | $R^{B7}$ | $R^{B43}$ | $R^{C24}$ |
| $L_{A1646}$ | $R^{B7}$ | $R^{A3}$ | $R^{C24}$ |
| $L_{A1647}$ | $R^{B7}$ | $R^{A34}$ | $R^{C24}$ |
| $L_{A1648}$ | $R^{B7}$ | $R^{A57}$ | $R^{C24}$ |
| $L_{A1649}$ | $R^{A3}$ | $R^{B3}$ | $R^{C24}$ |
| $L_{A1650}$ | $R^{A3}$ | $R^{B4}$ | $R^{C24}$ |
| $L_{A1651}$ | $R^{A3}$ | $R^{B5}$ | $R^{C24}$ |
| $L_{A1652}$ | $R^{A3}$ | $R^{B18}$ | $R^{C24}$ |
| $L_{A1653}$ | $R^{A3}$ | $R^{B43}$ | $R^{C24}$ |
| $L_{A1654}$ | $R^{A3}$ | $R^{A3}$ | $R^{C24}$ |
| $L_{A1655}$ | $R^{A3}$ | $R^{A34}$ | $R^{C24}$ |
| $L_{A1656}$ | $R^{A3}$ | $R^{A57}$ | $R^{C24}$ |
| $L_{A1657}$ | $R^{A34}$ | $R^{B3}$ | $R^{C24}$ |
| $L_{A1658}$ | $R^{A34}$ | $R^{B4}$ | $R^{C24}$ |
| $L_{A1659}$ | $R^{A34}$ | $R^{B5}$ | $R^{C24}$ |
| $L_{A1660}$ | $R^{A34}$ | $R^{B18}$ | $R^{C24}$ |
| $L_{A1661}$ | $R^{A34}$ | $R^{B43}$ | $R^{C24}$ |
| $L_{A1662}$ | $R^{A34}$ | $R^{A3}$ | $R^{C24}$ |
| $L_{A1663}$ | $R^{A34}$ | $R^{A34}$ | $R^{C24}$ |
| $L_{A1664}$ | $R^{A34}$ | $R^{A57}$ | $R^{C24}$ |
| $L_{A1665}$ | $R^{B13}$ | $R^{B3}$ | $R^{C27}$ |
| $L_{A1666}$ | $R^{B13}$ | $R^{B4}$ | $R^{C27}$ |
| $L_{A1667}$ | $R^{B13}$ | $R^{B5}$ | $R^{C27}$ |
| $L_{A1668}$ | $R^{B13}$ | $R^{B18}$ | $R^{C27}$ |
| $L_{A1669}$ | $R^{B13}$ | $R^{B43}$ | $R^{C27}$ |
| $L_{A1670}$ | $R^{B13}$ | $R^{A3}$ | $R^{C27}$ |
| $L_{A1671}$ | $R^{B13}$ | $R^{A34}$ | $R^{C27}$ |
| $L_{A1672}$ | $R^{B13}$ | $R^{A57}$ | $R^{C27}$ |
| $L_{A1673}$ | $R^{B7}$ | $R^{B3}$ | $R^{C27}$ |
| $L_{A1674}$ | $R^{B7}$ | $R^{B4}$ | $R^{C27}$ |
| $L_{A1675}$ | $R^{B7}$ | $R^{B5}$ | $R^{C27}$ |
| $L_{A1676}$ | $R^{B7}$ | $R^{B18}$ | $R^{C27}$ |
| $L_{A1677}$ | $R^{B7}$ | $R^{B43}$ | $R^{C27}$ |
| $L_{A1678}$ | $R^{B7}$ | $R^{A3}$ | $R^{C27}$ |
| $L_{A1679}$ | $R^{B7}$ | $R^{A34}$ | $R^{C27}$ |
| $L_{A1680}$ | $R^{B7}$ | $R^{A57}$ | $R^{C27}$ |
| $L_{A1681}$ | $R^{A3}$ | $R^{B3}$ | $R^{C27}$ |
| $L_{A1682}$ | $R^{A3}$ | $R^{B4}$ | $R^{C27}$ |
| $L_{A1683}$ | $R^{A3}$ | $R^{B5}$ | $R^{C27}$ |
| $L_{A1684}$ | $R^{A3}$ | $R^{B18}$ | $R^{C27}$ |
| $L_{A1685}$ | $R^{A3}$ | $R^{B43}$ | $R^{C27}$ |
| $L_{A1686}$ | $R^{A3}$ | $R^{A3}$ | $R^{C27}$ |
| $L_{A1687}$ | $R^{A3}$ | $R^{A34}$ | $R^{C27}$ |
| $L_{A1688}$ | $R^{A3}$ | $R^{A57}$ | $R^{C27}$ |
| $L_{A1689}$ | $R^{A34}$ | $R^{B3}$ | $R^{C27}$ |
| $L_{A1690}$ | $R^{A34}$ | $R^{B4}$ | $R^{C27}$ |
| $L_{A1691}$ | $R^{A34}$ | $R^{B5}$ | $R^{C27}$ |
| $L_{A1692}$ | $R^{A34}$ | $R^{B18}$ | $R^{C27}$ |
| $L_{A1693}$ | $R^{A34}$ | $R^{B43}$ | $R^{C27}$ |
| $L_{A1694}$ | $R^{A34}$ | $R^{A3}$ | $R^{C27}$ |
| $L_{A1695}$ | $R^{A34}$ | $R^{A34}$ | $R^{C27}$ |
| $L_{A1696}$ | $R^{A34}$ | $R^{A57}$ | $R^{C27}$ |
| $L_{A1697}$ | $R^{B13}$ | $R^{B3}$ | $R^{C31}$ |
| $L_{A1698}$ | $R^{B13}$ | $R^{B4}$ | $R^{C31}$ |
| $L_{A1699}$ | $R^{B13}$ | $R^{B5}$ | $R^{C31}$ |
| $L_{A1700}$ | $R^{B13}$ | $R^{B18}$ | $R^{C31}$ |
| $L_{A1701}$ | $R^{B13}$ | $R^{B43}$ | $R^{C31}$ |
| $L_{A1702}$ | $R^{B13}$ | $R^{A3}$ | $R^{C31}$ |
| $L_{A1703}$ | $R^{B13}$ | $R^{A34}$ | $R^{C31}$ |
| $L_{A1704}$ | $R^{B13}$ | $R^{A57}$ | $R^{C31}$ |
| $L_{A1705}$ | $R^{B7}$ | $R^{B3}$ | $R^{C31}$ |

-continued

| Ligand | $R^1$ | $R^2$ | G |
|---|---|---|---|
| $L_{A1706}$ | $R^{B7}$ | $R^{B4}$ | $R^{C31}$ |
| $L_{A1707}$ | $R^{B7}$ | $R^{B5}$ | $R^{C31}$ |
| $L_{A1708}$ | $R^{B7}$ | $R^{B18}$ | $R^{C31}$ |
| $L_{A1709}$ | $R^{B7}$ | $R^{B43}$ | $R^{C31}$ |
| $L_{A1710}$ | $R^{B7}$ | $R^{A3}$ | $R^{C31}$ |
| $L_{A1711}$ | $R^{B7}$ | $R^{A34}$ | $R^{C31}$ |
| $L_{A1712}$ | $R^{B7}$ | $R^{A57}$ | $R^{C31}$ |
| $L_{A1713}$ | $R^{A3}$ | $R^{B3}$ | $R^{C31}$ |
| $L_{A1714}$ | $R^{A3}$ | $R^{B4}$ | $R^{C31}$ |
| $L_{A1715}$ | $R^{A3}$ | $R^{B5}$ | $R^{C31}$ |
| $L_{A1716}$ | $R^{A3}$ | $R^{B18}$ | $R^{C31}$ |
| $L_{A1717}$ | $R^{A3}$ | $R^{B43}$ | $R^{C31}$ |
| $L_{A1718}$ | $R^{A3}$ | $R^{A3}$ | $R^{C31}$ |
| $L_{A1719}$ | $R^{A3}$ | $R^{A34}$ | $R^{C31}$ |
| $L_{A1720}$ | $R^{A3}$ | $R^{A57}$ | $R^{C31}$ |
| $L_{A1721}$ | $R^{A34}$ | $R^{B3}$ | $R^{C31}$ |
| $L_{A1722}$ | $R^{A34}$ | $R^{B4}$ | $R^{C31}$ |
| $L_{A1723}$ | $R^{A34}$ | $R^{B5}$ | $R^{C31}$ |
| $L_{A1724}$ | $R^{A34}$ | $R^{B18}$ | $R^{C31}$ |
| $L_{A1725}$ | $R^{A34}$ | $R^{B43}$ | $R^{C31}$ |
| $L_{A1726}$ | $R^{A34}$ | $R^{A3}$ | $R^{C31}$ |
| $L_{A1727}$ | $R^{A34}$ | $R^{A34}$ | $R^{C31}$ |
| $L_{A1728}$ | $R^{A34}$ | $R^{A57}$ | $R^{C31}$ |
| $L_{A1729}$ | $R^{B13}$ | $R^{B3}$ | $R^{C34}$ |
| $L_{A1730}$ | $R^{B13}$ | $R^{B4}$ | $R^{C34}$ |
| $L_{A1731}$ | $R^{B13}$ | $R^{B5}$ | $R^{C34}$ |
| $L_{A1732}$ | $R^{B13}$ | $R^{B18}$ | $R^{C34}$ |
| $L_{A1733}$ | $R^{B13}$ | $R^{B43}$ | $R^{C34}$ |
| $L_{A1734}$ | $R^{B13}$ | $R^{A3}$ | $R^{C34}$ |
| $L_{A1735}$ | $R^{B13}$ | $R^{A34}$ | $R^{C34}$ |
| $L_{A1736}$ | $R^{B13}$ | $R^{A57}$ | $R^{C34}$ |
| $L_{A1737}$ | $R^{B7}$ | $R^{B3}$ | $R^{C34}$ |
| $L_{A1738}$ | $R^{B7}$ | $R^{B4}$ | $R^{C34}$ |
| $L_{A1739}$ | $R^{B7}$ | $R^{B5}$ | R34 |
| $L_{A1740}$ | $R^{B7}$ | $R^{B18}$ | $R^{C34}$ |
| $L_{A1741}$ | $R^{B7}$ | $R^{B43}$ | $R^{C34}$ |
| $L_{A1742}$ | $R^{B7}$ | $R^{A3}$ | $R^{C34}$ |
| $L_{A1743}$ | $R^{B7}$ | $R^{A34}$ | $R^{C34}$ |
| $L_{A1744}$ | $R^{B7}$ | $R^{A57}$ | $R^{C34}$ |
| $L_{A1745}$ | $R^{A3}$ | $R^{B3}$ | $R^{C34}$ |
| $L_{A1746}$ | $R^{A3}$ | $R^{B4}$ | $R^{C34}$ |
| $L_{A1747}$ | $R^{A3}$ | $R^{B5}$ | $R^{C34}$ |
| $L_{A1748}$ | $R^{A3}$ | $R^{B18}$ | $R^{C34}$ |
| $L_{A1749}$ | $R^{A3}$ | $R^{B43}$ | $R^{C34}$ |
| $L_{A1750}$ | $R^{A3}$ | $R^{A3}$ | $R^{C34}$ |
| $L_{A1751}$ | $R^{A3}$ | $R^{A34}$ | $R^{C34}$ |
| $L_{A1752}$ | $R^{A3}$ | $R^{A57}$ | $R^{C34}$ |
| $L_{A1753}$ | $R^{A34}$ | $R^{B3}$ | $R^{C34}$ |
| $L_{A1754}$ | $R^{A34}$ | $R^{B4}$ | $R^{C34}$ |
| $L_{A1755}$ | $R^{A34}$ | $R^{B5}$ | $R^{C34}$ |
| $L_{A1756}$ | $R^{A34}$ | $R^{B7}$ | $R^{C34}$ |
| $L_{A1757}$ | $R^{A34}$ | $R^{B13}$ | $R^{C34}$ |
| $L_{A1758}$ | $R^{A34}$ | $R^{A3}$ | $R^{C34}$ |
| $L_{A1759}$ | $R^{A34}$ | $R^{A34}$ | $R^{C34}$ |
| $L_{A1760}$ | $R^{A34}$ | $R^{A57}$ | $R^{C34}$ |
| $L_{A1761}$ | $R^{B13}$ | $R^{B3}$ | $R^{C38}$ |
| $L_{A1762}$ | $R^{B13}$ | $R^{B4}$ | $R^{C38}$ |
| $L_{A1763}$ | $R^{B13}$ | $R^{B5}$ | $R^{C38}$ |
| $L_{A1764}$ | $R^{B3}$ | $R^{B18}$ | $R^{C38}$ |
| $L_{A1765}$ | $R^{B13}$ | $R^{B43}$ | $R^{C38}$ |
| $L_{A1766}$ | $R^{B13}$ | $R^{A3}$ | $R^{C38}$ |
| $L_{A1767}$ | $R^{B13}$ | $R^{A34}$ | $R^{C38}$ |
| $L_{A1768}$ | $R^{B13}$ | $R^{A57}$ | $R^{C38}$ |
| $L_{A1769}$ | $R^{B7}$ | $R^{B3}$ | $R^{C38}$ |
| $L_{A1770}$ | $R^{B7}$ | $R^{B4}$ | $R^{C38}$ |
| $L_{A1771}$ | $R^{B7}$ | $R^{B5}$ | $R^{C38}$ |
| $L_{A1772}$ | $R^{B7}$ | $R^{B18}$ | $R^{C38}$ |
| $L_{A1773}$ | $R^{B7}$ | $R^{B43}$ | $R^{C38}$ |
| $L_{A1774}$ | $R^{B7}$ | $R^{A3}$ | $R^{C38}$ |
| $L_{A1775}$ | $R^{B7}$ | $R^{A34}$ | $R^{C38}$ |
| $L_{A1776}$ | $R^{B7}$ | $R^{A57}$ | $R^{C38}$ |
| $L_{A1777}$ | $R^{A3}$ | $R^{B3}$ | $R^{C38}$ |
| $L_{A1778}$ | $R^{A3}$ | $R^{B4}$ | $R^{C38}$ |
| $L_{A1779}$ | $R^{A3}$ | $R^{B5}$ | $R^{C38}$ |
| $L_{A1780}$ | $R^{A3}$ | $R^{B18}$ | $R^{C38}$ |
| $L_{A1781}$ | $R^{A3}$ | $R^{B43}$ | $R^{C38}$ |
| $L_{A1782}$ | $R^{A3}$ | $R^{A3}$ | $R^{C38}$ |

-continued

| Ligand | $R^1$ | $R^2$ | G |
|---|---|---|---|
| $L_{A1783}$ | $R^{A3}$ | $R^{A34}$ | $R^{C38}$ |
| $L_{A1784}$ | $R^{A3}$ | $R^{A57}$ | $R^{C38}$ |
| $L_{A1785}$ | $R^{A34}$ | $R^{B3}$ | $R^{C38}$ |
| $L_{A1786}$ | $R^{A34}$ | $R^{B4}$ | $R^{C38}$ |
| $L_{A1787}$ | $R^{A34}$ | $R^{B5}$ | $R^{C38}$ |
| $L_{A1788}$ | $R^{A34}$ | $R^{B18}$ | $R^{C38}$ |
| $L_{A1789}$ | $R^{A34}$ | $R^{B43}$ | $R^{C38}$ |
| $L_{A1790}$ | $R^{A34}$ | $R^{A3}$ | $R^{C38}$ |
| $L_{A1791}$ | $R^{A34}$ | $R^{A34}$ | $R^{C38}$ |
| $L_{A1792}$ | $R^{A34}$ | $R^{A57}$ | $R^{C38}$, |

wherein $R^{A1}$ to $R^{A74}$ have the following structures:

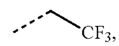

$R^{A1}$

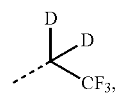

$R^{A2}$

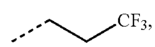

$R^{A3}$

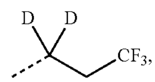

$R^{A4}$

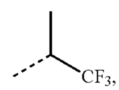

$R^{A5}$

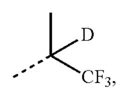

$R^{A6}$

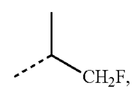

$R^{A7}$

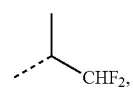

$R^{A8}$

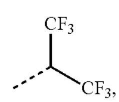

$R^{A9}$

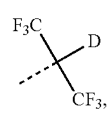

$R^{A10}$

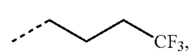

$R^{A11}$

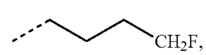

$R^{A12}$

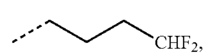

$R^{A13}$

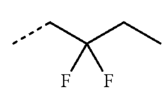

$R^{A14}$

-continued
$R^{A15}$
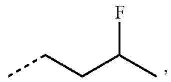
$R^{A16}$
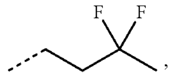
$R^{A17}$
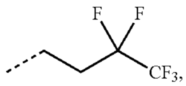
$R^{A18}$
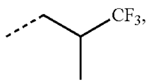
$R^{A19}$
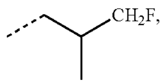
$R^{A20}$
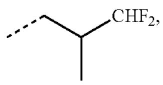
$R^{A21}$
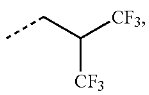
$R^{A22}$
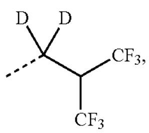
$R^{A23}$
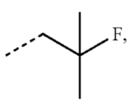
$R^{A24}$
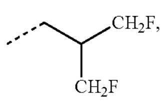
$R^{A25}$
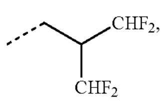
$R^{A26}$
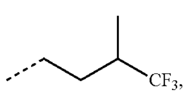
$R^{A27}$
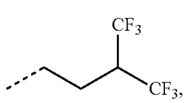
$R^{A28}$
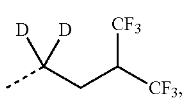
$R^{A29}$
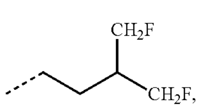
-continued
$R^{A30}$
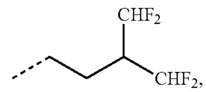
$R^{A31}$
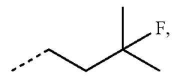
$R^{A32}$
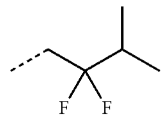
$R^{A33}$
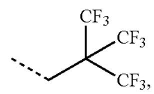
$R^{A34}$
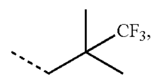
$R^{A35}$
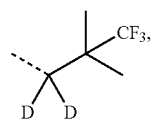
$R^{A36}$
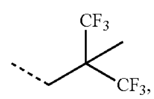
$R^{A37}$
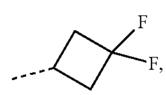
$R^{A38}$
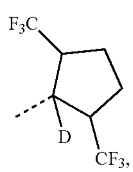
$R^{A39}$
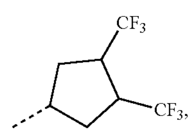
$R^{A40}$
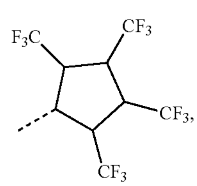
$R^{A41}$
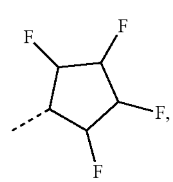

-continued
$R^{A42}$
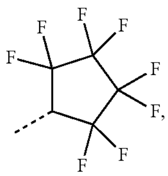
$R^{A43}$
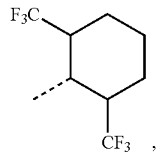
$R^{A44}$
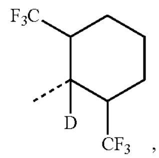
$R^{A45}$
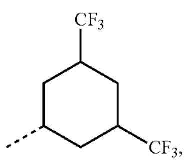
$R^{A46}$
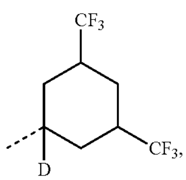
$R^{A47}$
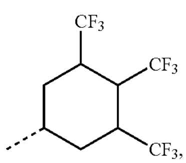
$R^{A48}$
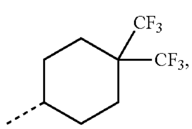
$R^{A49}$
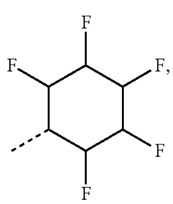
$R^{A50}$
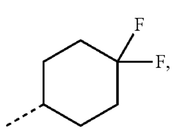
$R^{A51}$
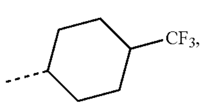
-continued
$R^{A52}$
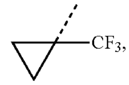
$R^{A53}$
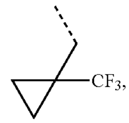
$R^{A54}$
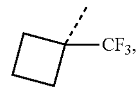
$R^{A55}$
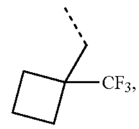
$R^{A56}$
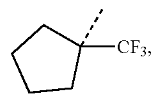
$R^{A57}$
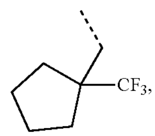
$R^{A58}$
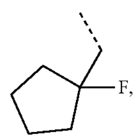
$R^{A59}$
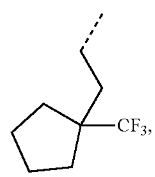
$R^{A60}$
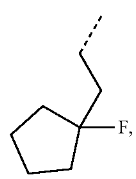
$R^{A61}$
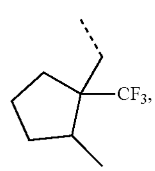

-continued
$R^{A62}$
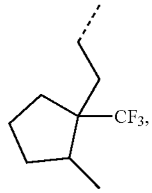
$R^{A63}$
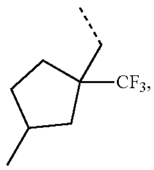
$R^{A64}$
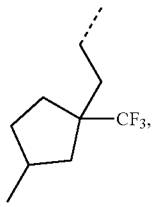
$R^{A65}$
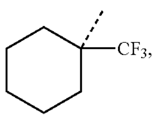
$R^{A66}$
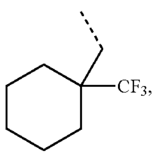
$R^{A67}$
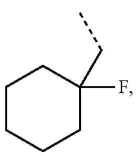
$R^{A68}$
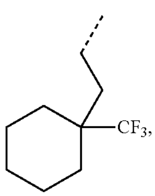
$R^{A69}$
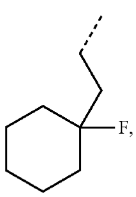
$R^{A70}$
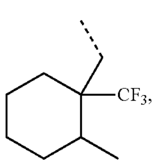
-continued
$R^{A71}$
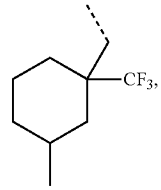
$R^{A72}$
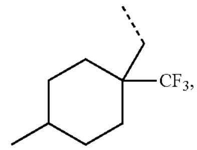
$R^{A73}$
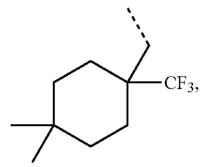
and
$R^{A74}$
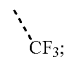
wherein $R^{B1}$ to $R^{B42}$ have the following structures:
$R^{B1}$
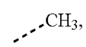
$R^{B2}$
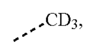
$R^{B3}$
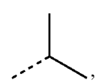
$R^{B4}$
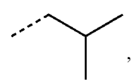
$R^{B5}$
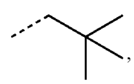
$R^{B6}$
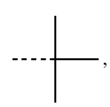
$R^{B7}$
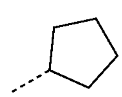
$R^{B8}$
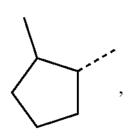
$R^{B9}$
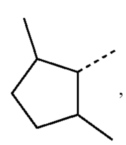

-continued
$R^{B10}$
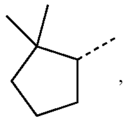
$R^{B11}$
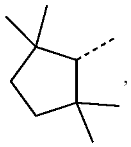
$R^{B12}$
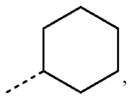
$R^{B13}$
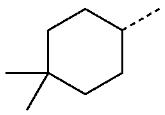
$R^{B14}$
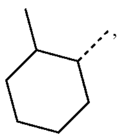
$R^{B15}$
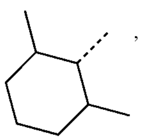
$R^{B16}$
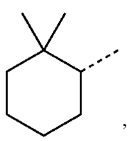
$R^{B17}$
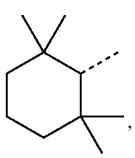
$R^{B18}$
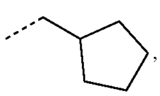
$R^{B19}$
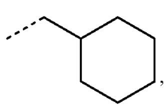
$R^{B20}$
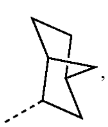
-continued
$R^{B21}$
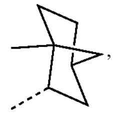
$R^{B22}$
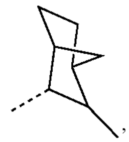
$R^{B23}$
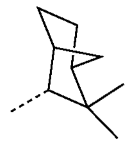
$R^{B24}$
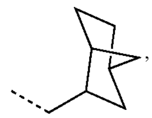
$R^{B25}$
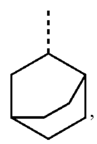
$R^{B26}$
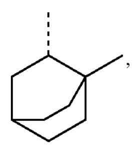
$R^{B27}$
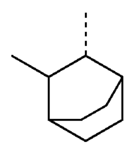
$R^{B28}$
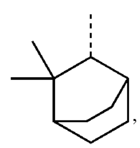
$R^{B29}$
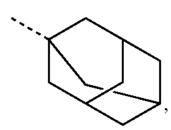
$R^{B30}$
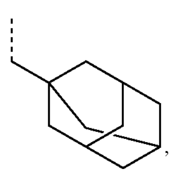

-continued
$R^{B31}$
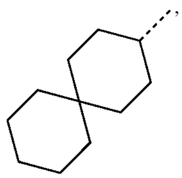
$R^{B32}$
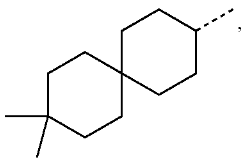
$R^{B33}$
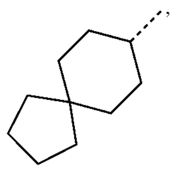
$R^{B34}$
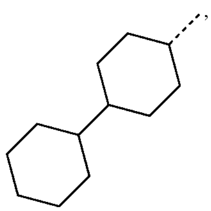
$R^{B35}$
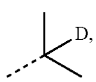
$R^{B36}$
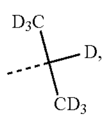
$R^{B37}$
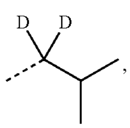
$R^{B38}$
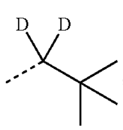
$R^{B39}$
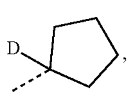
$R^{B40}$
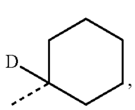
$R^{B41}$
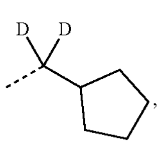
-continued
$R^{B42}$
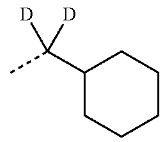
and
$R^{B43}$
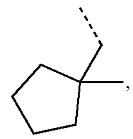
wherein $R^{C1}$ to $R^{C42}$ have the following structures:
$R^{C1}$
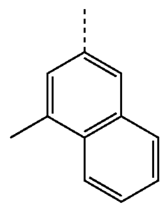
$R^{C2}$
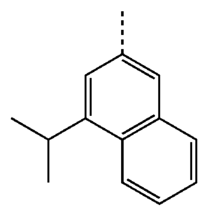
$R^{C3}$
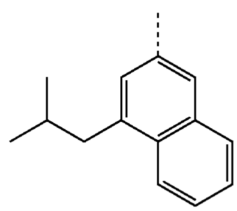
$R^{C4}$
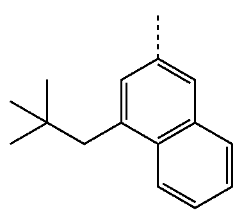
$R^{C5}$
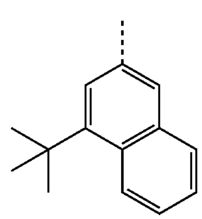

-continued
$R^{C6}$
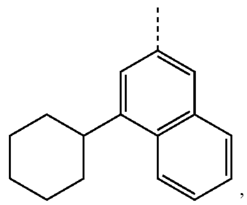
$R^{C7}$
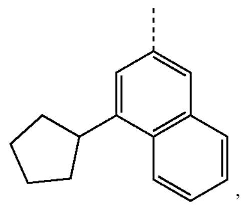
$R^{C8}$
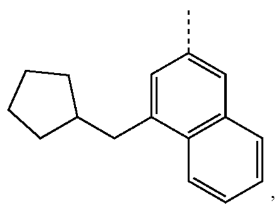
$R^{C9}$
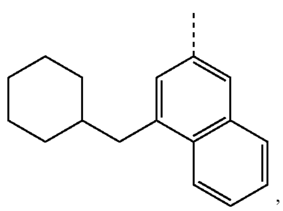
$R^{C10}$
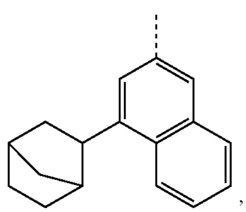
$R^{C11}$
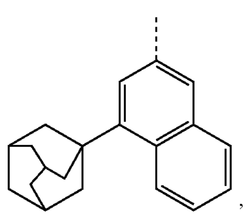
$R^{C12}$
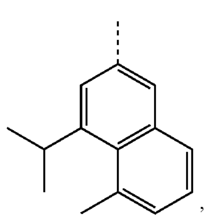
-continued
$R^{C13}$
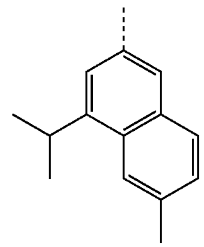
$R^{C14}$
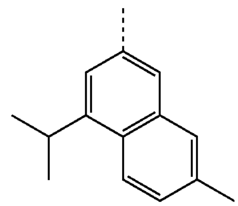
$R^{C15}$
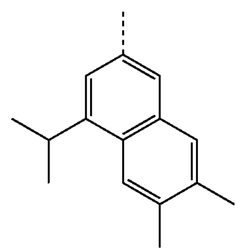
$R^{C16}$
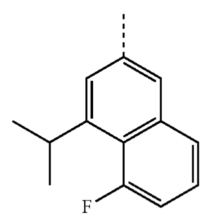
$R^{C17}$
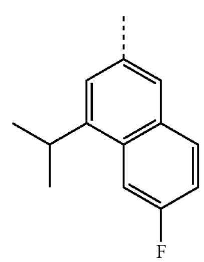
$R^{C18}$
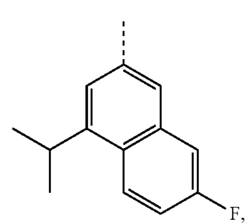

-continued
$R^{C19}$
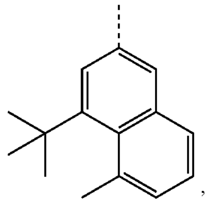
$R^{C20}$
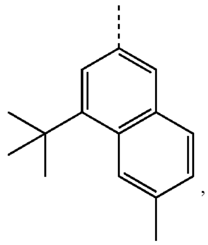
$R^{C21}$
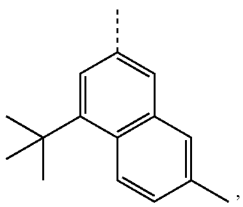
$R^{C22}$
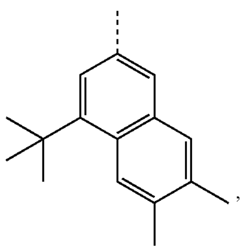
$R^{C23}$
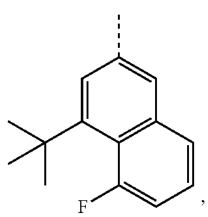
$R^{C24}$
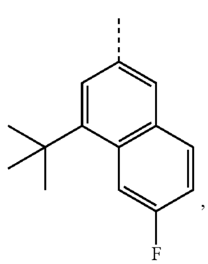
-continued
$R^{C25}$
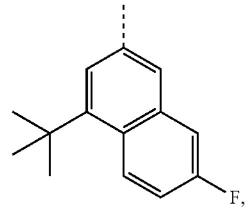
$R^{C26}$
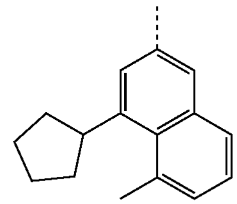
$R^{C27}$
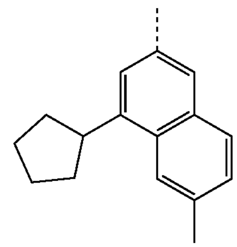
$R^{C28}$
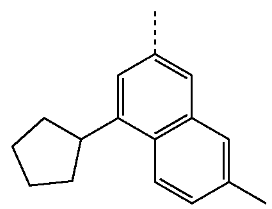
$R^{C29}$
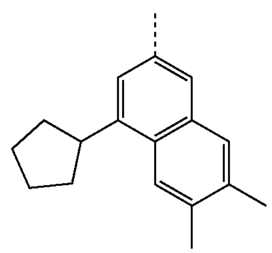
$R^{C30}$
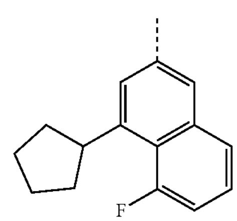

-continued
$R^{C31}$
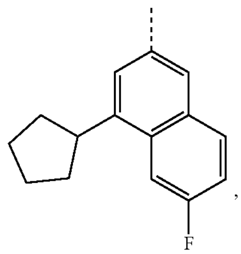
$R^{C32}$
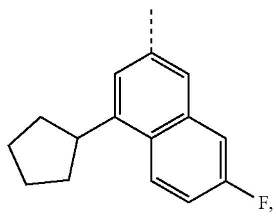
$R^{C33}$
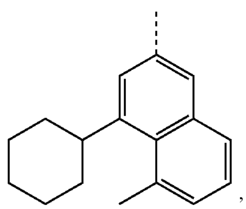
$R^{C34}$
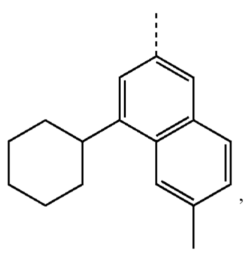
$R^{C35}$
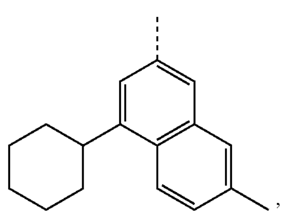
$R^{C36}$
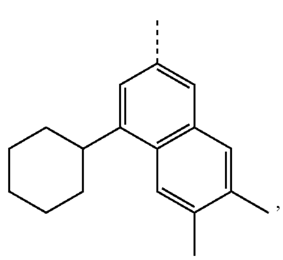
-continued
$R^{C37}$
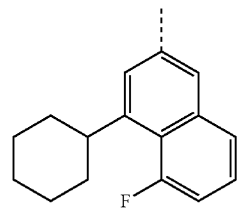
$R^{C38}$
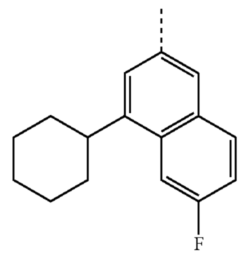
$R^{C39}$
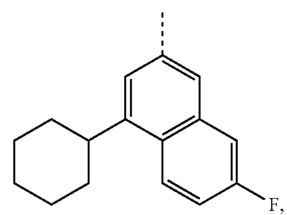
$R^{C40}$
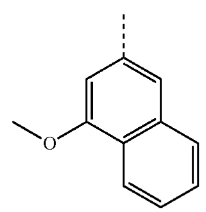
$R^{C41}$
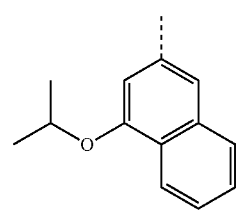
$R^{C42}$
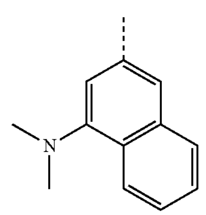
$R^{C43}$
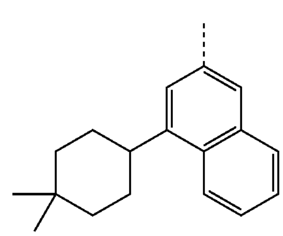

-continued

RC44

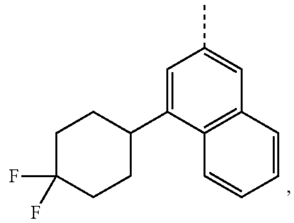

RC45

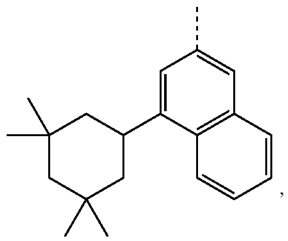

RC46

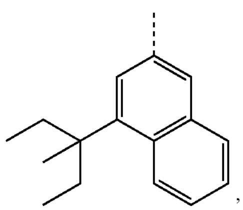

RC47

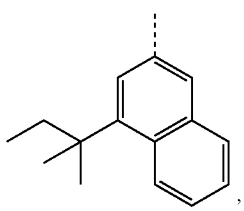

and

RC48

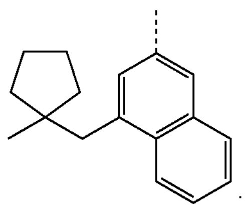

In some embodiments, the compound has a formula of $M(L_A)_x(L_B)_y(L_C)_z$, wherein $L_A$ is selected from the group consisting of $L_{A1}$ to $L_{A1792}$, and $L_B$ and $L_C$ are each a bidentate ligand; and x is 1, 2, or 3; y is 0, 1, or 2; z is 0, 1, or 2; and x+y+z is the oxidation state of the metal M. In some embodiments, the compound has a formula selected from the group consisting of $Ir(L_A)_3$, $Ir(L_A)(L^B)_2$, $Ir(L_A)_2(L^B)$, $Ir(L_A)_2(L_C)$, and $I_r(L_A)(L_B)(L_C)$, wherein $L_A$, $L_B$, and $L_C$ are as defined above; and wherein $L_A$, $L_B$, and $L_C$ are different from each other. In some embodiments, the compound has a formula of $Pt(L_A)(L^B)$; wherein $L_A$, $L_B$, and $L_C$ are as defined above, and wherein $L_A$ and $L_B$ can be same or different. In some embodiments of the compound having the formula $Pt(L_A)(L^B)$, the $L_A$ and $L_B$ are connected to form a tetradentate ligand.

In some embodiments, the compound having the formula of $M(L_A)_x(L^B)_y(L_C)_z$ defined above, $L_B$ and $L_C$ are each independently selected from the group consisting of:

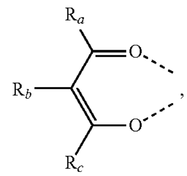

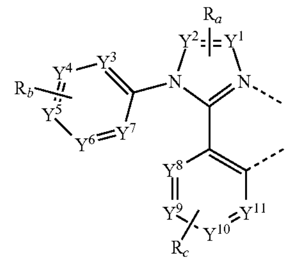

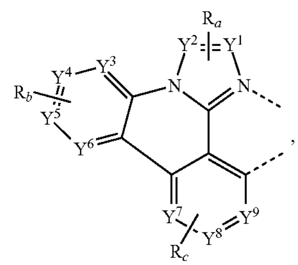

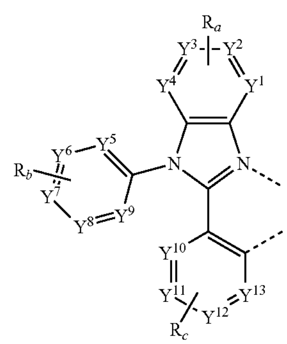

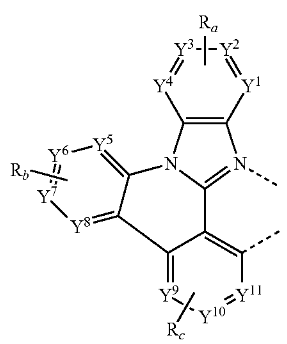

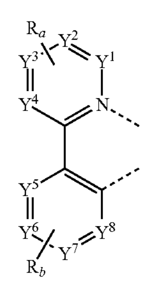

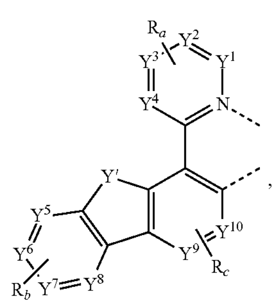

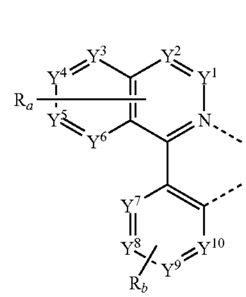

-continued

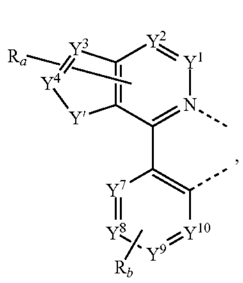

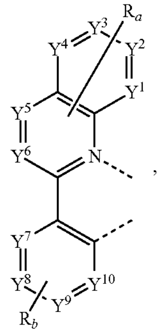

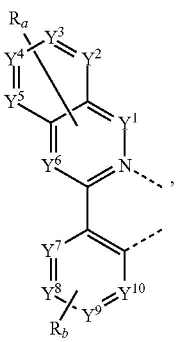

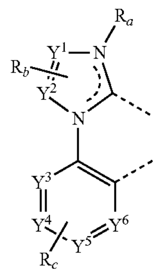

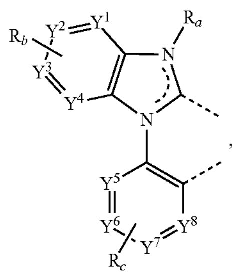

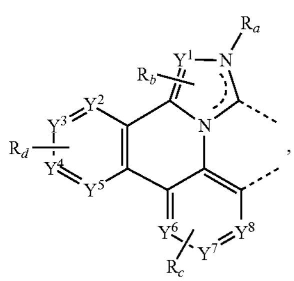

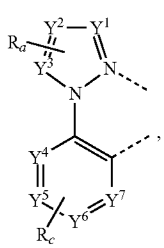

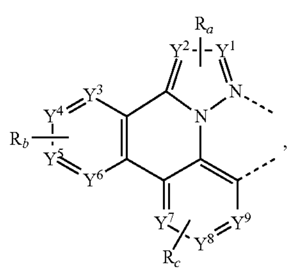

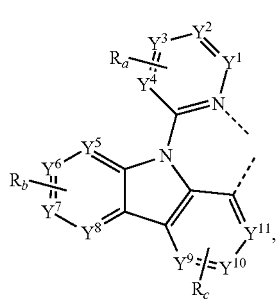

-continued

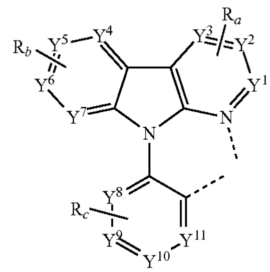

, and

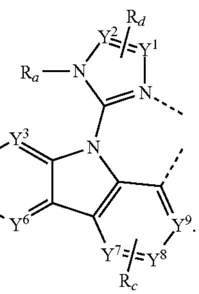

where each $Y^1$ to $Y^{13}$ are independently selected from the group consisting of carbon and nitrogen; Y' is selected from the group consisting of B $R_e$, N $R_e$, P $R_e$, O, S, Se, C═O, S═O, $SO_2$, $CR_eR_f$, $SiR_eR_f$, and $GeR_eR_f$; $R_e$ and $R_f$ are optionally fused or joined to form a ring; each $R_a$, $R_b$, $R_c$, and $R_d$ may independently represent from mono substitution to the maximum possible number of substitutions, or no substitution; each $R_a$, $R_b$, $R_c$, $R_d$, $R_e$ and $R_f$ is independently a hydrogen or a substituent selected from the group consisting of the general substituents defined above; and any two adjacent substituents of $R_a$, $R_b$, $R_c$, and $R_d$ are optionally fused or joined to form a ring or form a multidentate ligand.

In some embodiments, the compound having the formula of $M(L_A)_x(L^B)_y(L_C)_z$ defined above, $L_B$ and $L_C$ are each independently selected from the group consisting of:

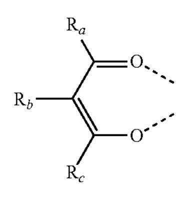

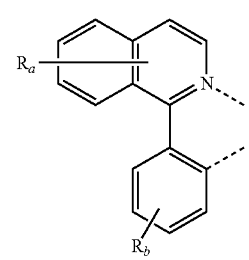

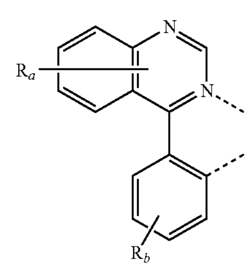

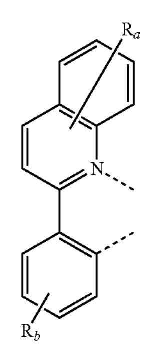

-continued
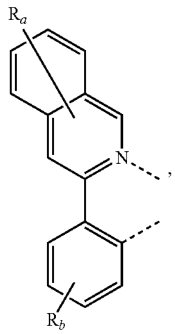
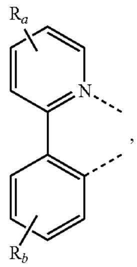
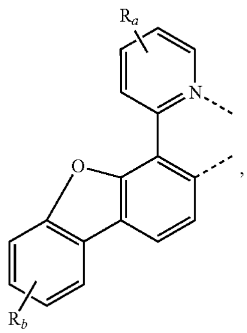
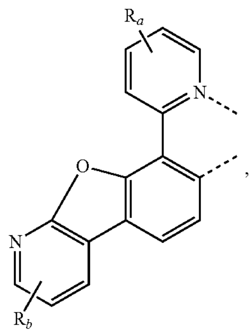
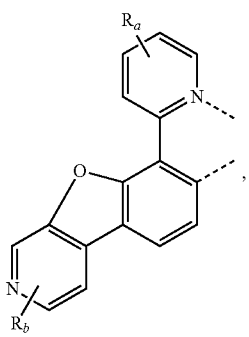
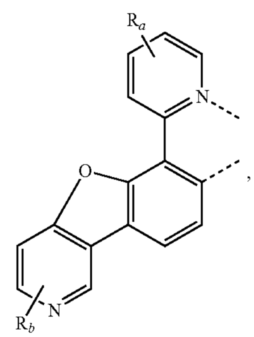
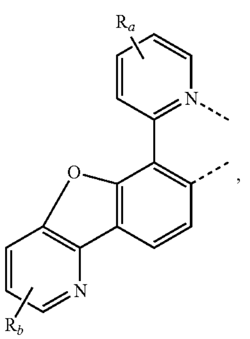
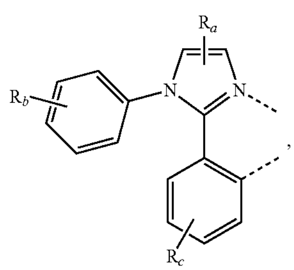
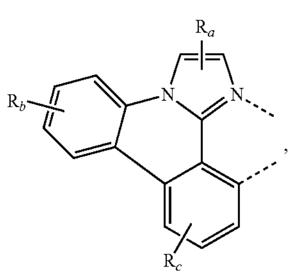
-continued
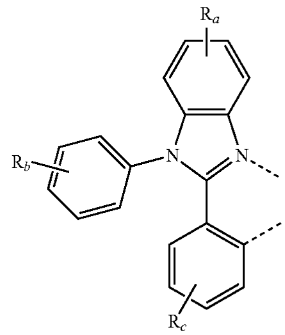
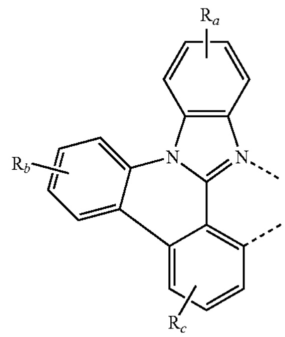
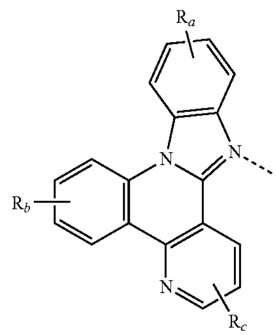
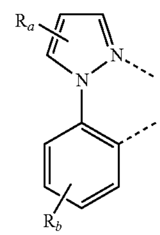
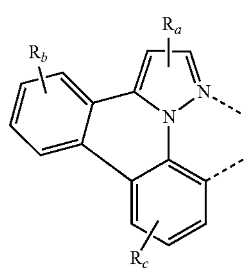
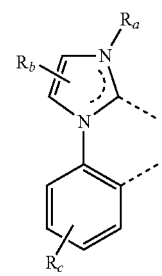
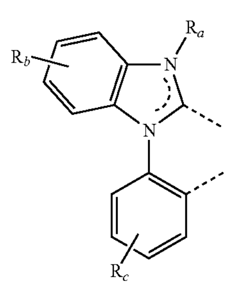
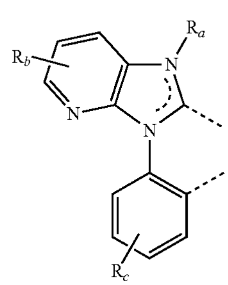

-continued

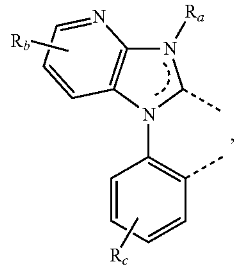

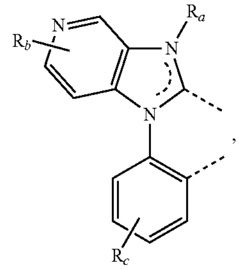

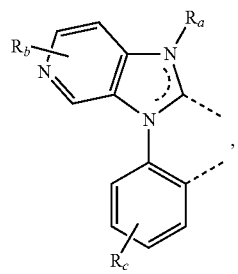

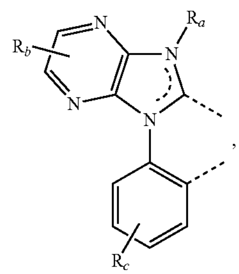

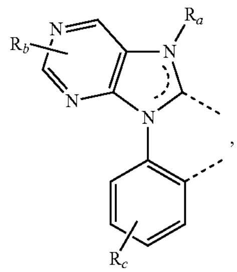

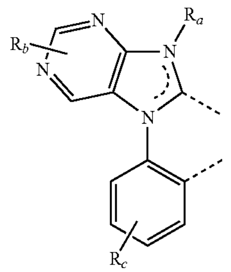

and

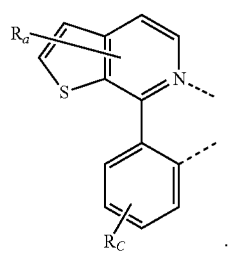

In some embodiments of the compound having a formula selected from the group consisting of $Ir(L_A)_3$, $Ir(L_A)(L^B)_2$, $Ir(L_A)_2(L^B)$, $Ir(L_A)_2(L_C)$, and $Ir(L_A)(L_B)(L_C)$; and wherein $L_A$, $L_B$, and $L_C$ are different from each other, the compound is Compound Ax having the formula $Ir(L_A)_3$, the Compound By having the formula $Ir(L_A)(L^B)_2$, or the Compound Cz having the formula $Ir(L_A)_2(L_C)$;

where $L_A$ is selected from the group consisting of $L_{Ai}$, where i is an integer from 1 to 1792;

where $L_B$ is selected from the group consisting of $L_{Bk}$, where k is an integer from 1 to 468;

where $L_C$ is selected from the group consisting of $L_{Ci}$, where j is an integer from 1 to 1260;

where x=i, y=468i+k−468, and z=12601+j−1260;

where each $L_{Bk}$ has the following structure:

$L_{B1}$

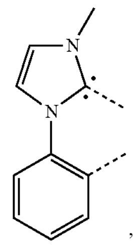

$L_{B2}$

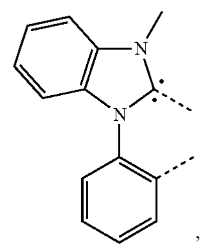

$L_{B3}$

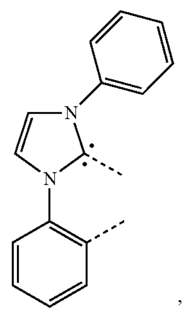

$L_{B4}$

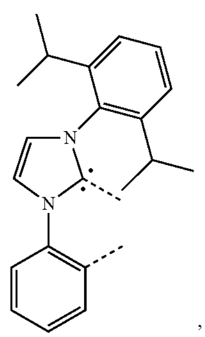

$L_{B5}$

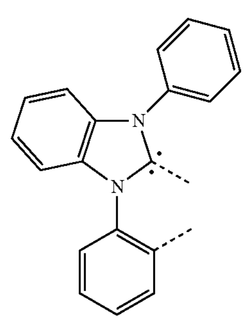

-continued
$L_{B6}$
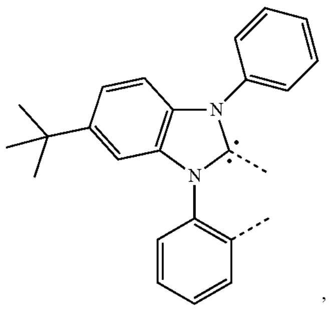
$L_{B7}$
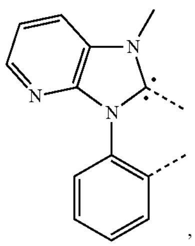
$L_{B8}$
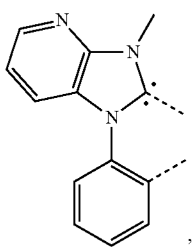
$L_{B9}$
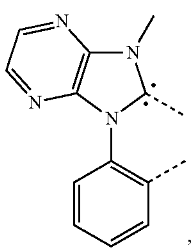
$L_{B10}$
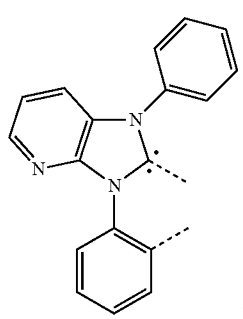
-continued
$L_{B11}$
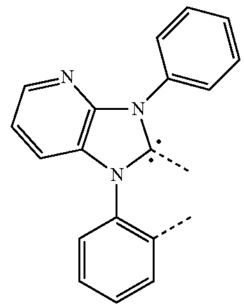
$L_{B12}$
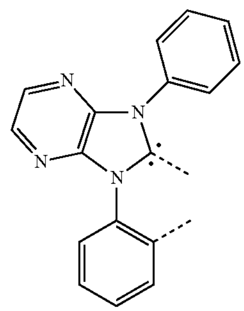
$L_{B13}$
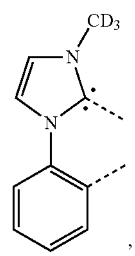
$L_{B14}$
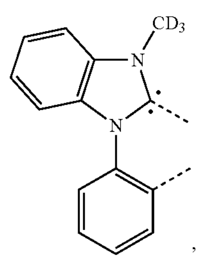
$L_{B15}$
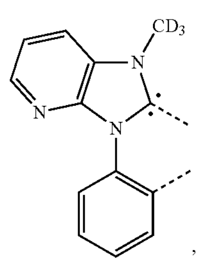

-continued
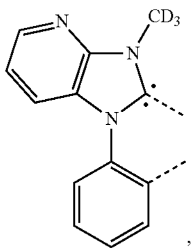
$L_{B16}$
,
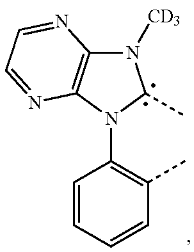
$L_{B17}$
,
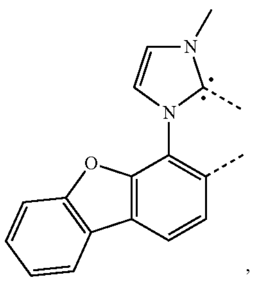
$L_{B18}$
,
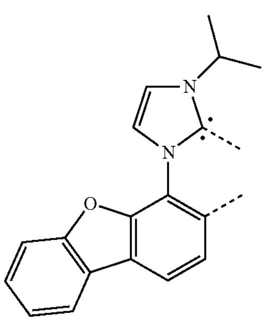
$L_{B19}$
,
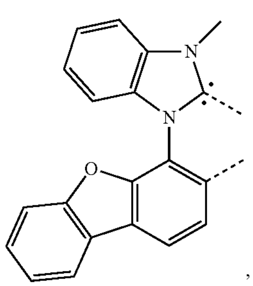
$L_{B20}$
,
-continued
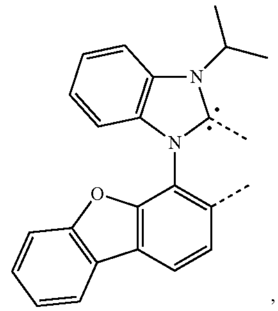
$L_{B21}$
,
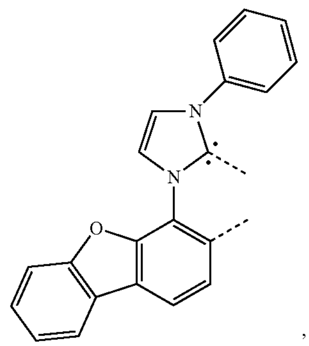
$L_{B22}$
,
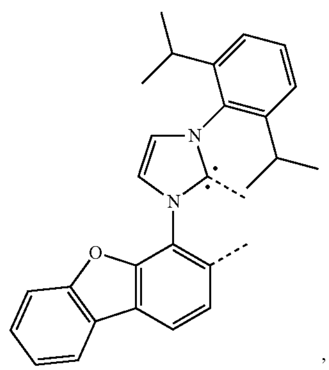
$L_{B23}$
,
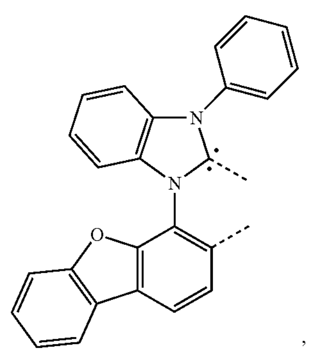
$L_{B24}$
, -continued
$L_{B25}$
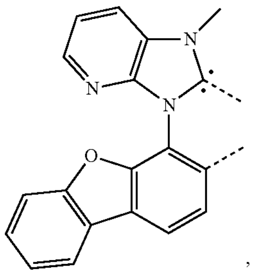
,
$L_{B26}$
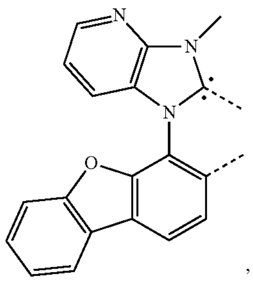
,
$L_{B27}$
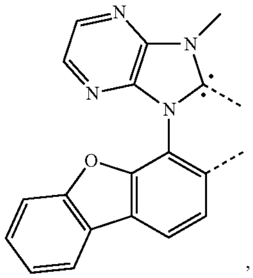
,
$L_{B28}$
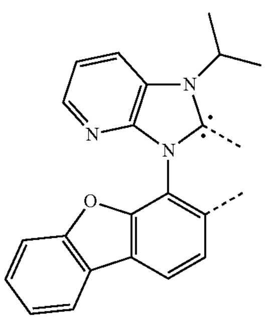
,
$L_{B29}$
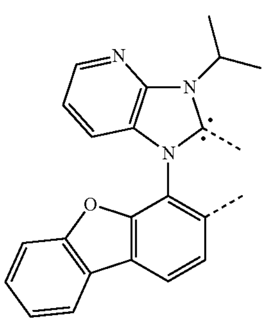
,
-continued
$L_{B30}$
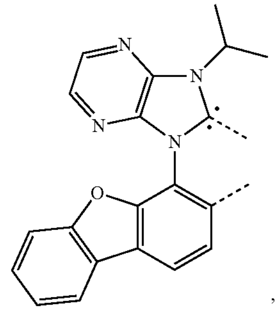
,
$L_{B31}$
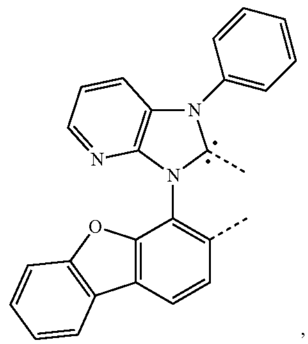
,
$L_{B32}$
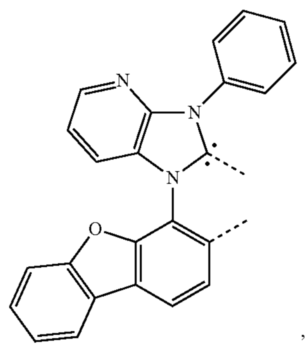
,
$L_{B33}$
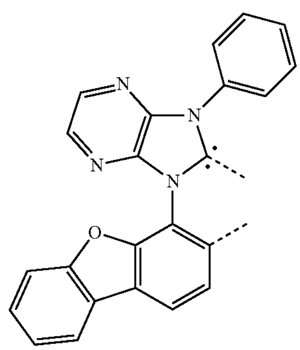
,
$L_{B34}$
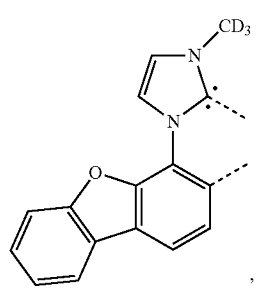
, -continued
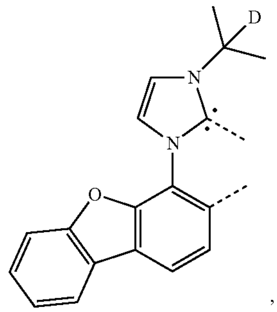
$L_{B35}$
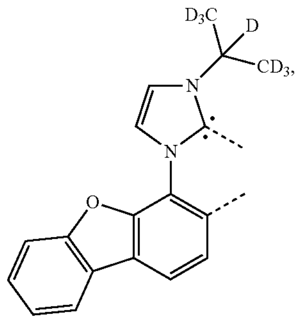
$L_{B36}$
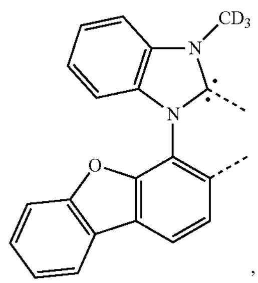
$L_{B37}$
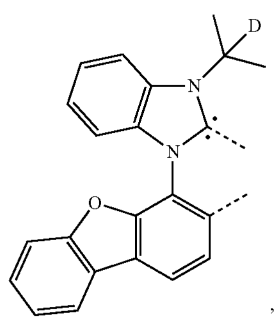
$L_{B38}$
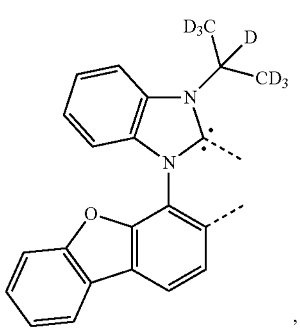
$L_{B39}$
-continued
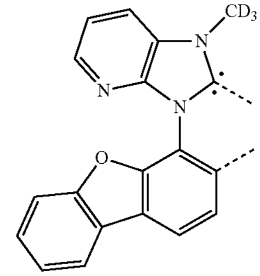
$L_{B40}$
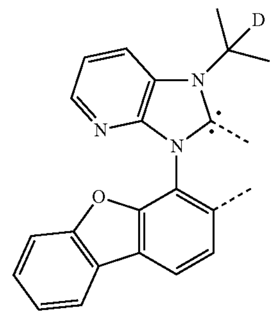
$L_{B41}$
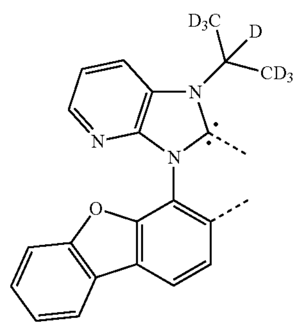
$L_{B42}$
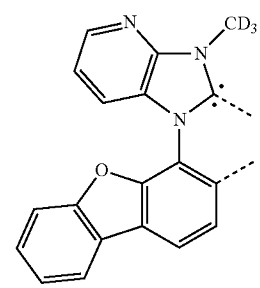
$L_{B43}$
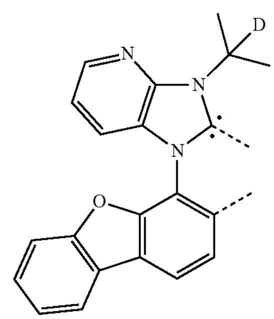
$L_{B44}$ -continued
$L_{B45}$
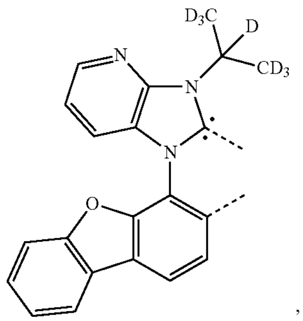
$L_{B46}$
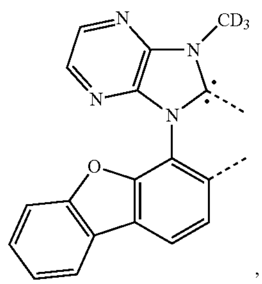
$L_{B47}$
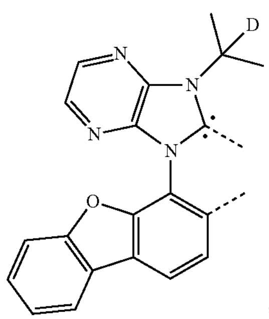
$L_{B48}$
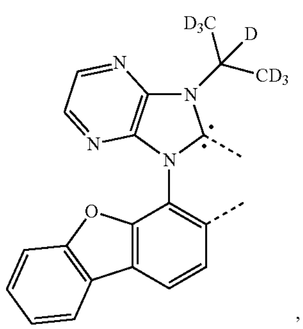
$L_{B49}$
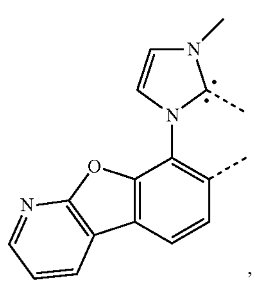
-continued
$L_{B50}$
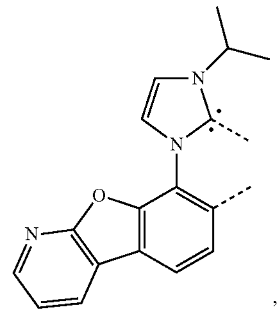
$L_{B51}$
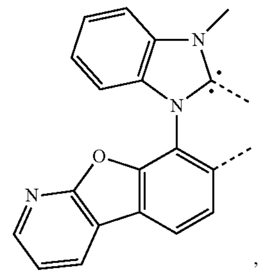
$L_{B52}$
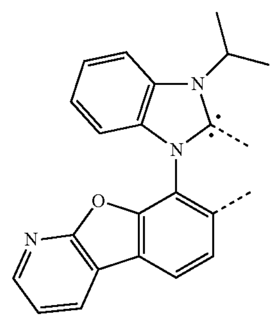
$L_{B53}$
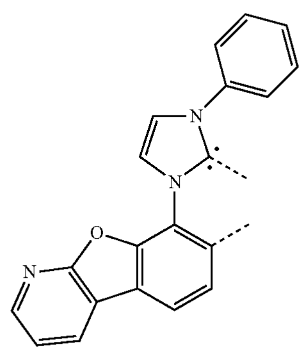
$L_{B54}$
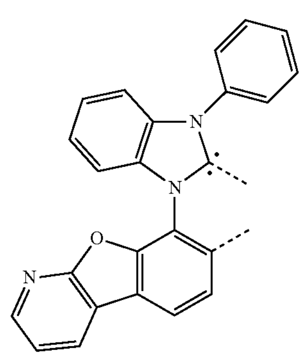

$L_{B55}$
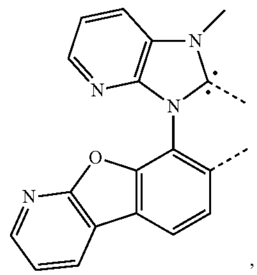
$L_{B56}$
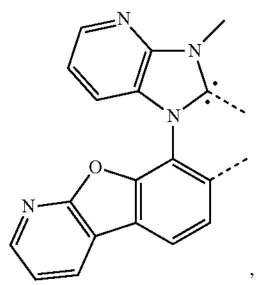
$L_{B57}$
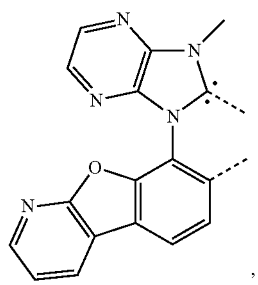
$L_{B58}$
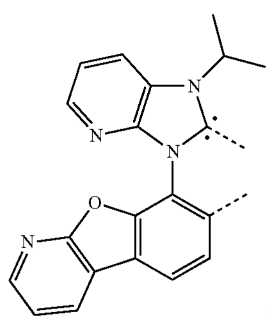
$L_{B59}$
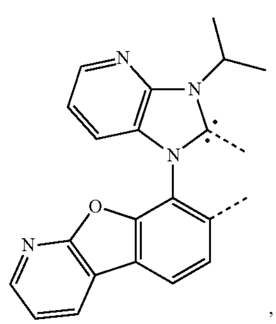
$L_{B60}$
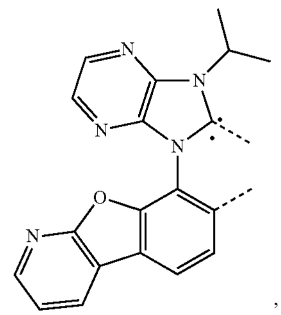
$L_{B61}$
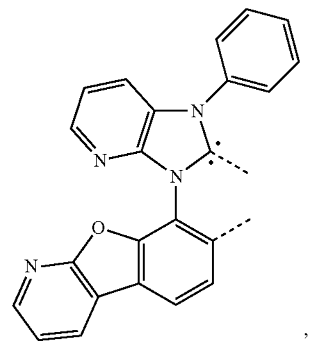
$L_{B62}$
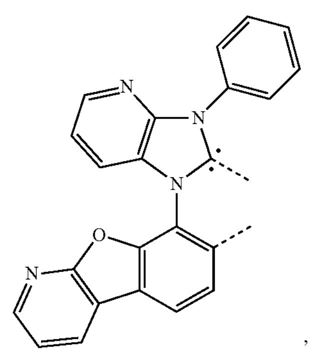
$L_{B63}$
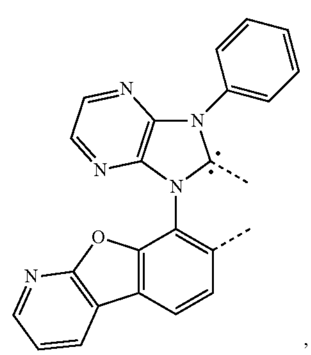

-continued
$L_{B64}$
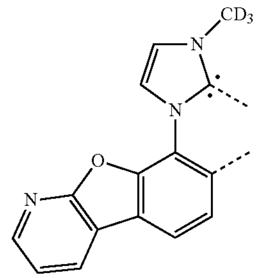
,
$L_{B65}$
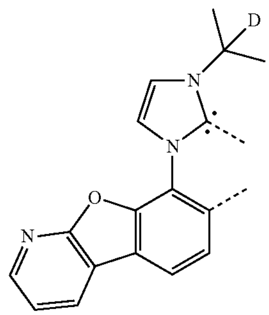
,
$L_{B66}$
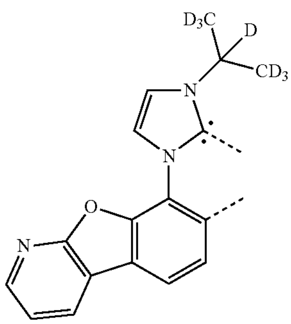
,
$L_{B67}$
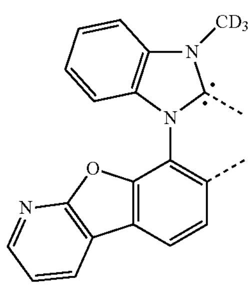
,
$L_{B68}$
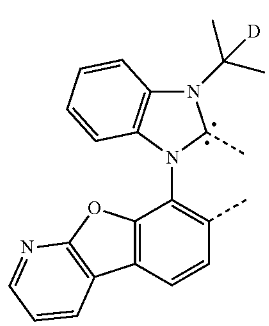
,
-continued
$L_{B69}$
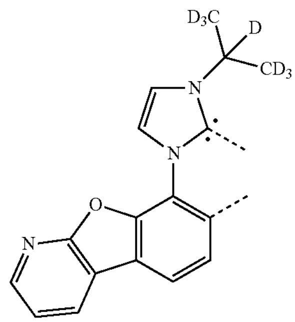
,
$L_{B70}$
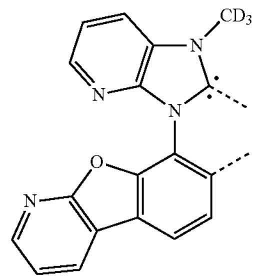
,
$L_{B71}$
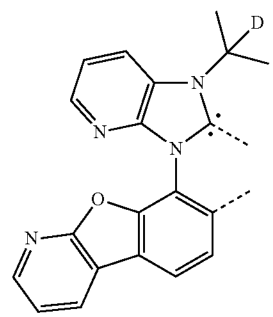
,
$L_{B72}$
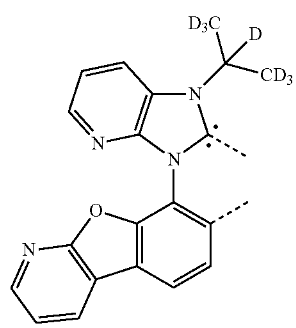
,
$L_{B73}$
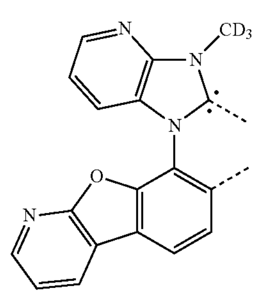
, -continued
$L_{B74}$
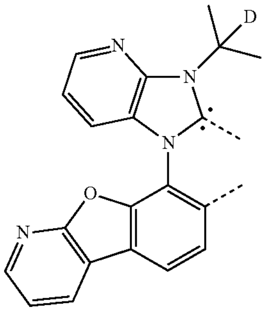
,
$L_{B75}$
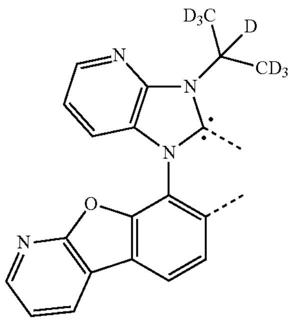
,
$L_{B76}$
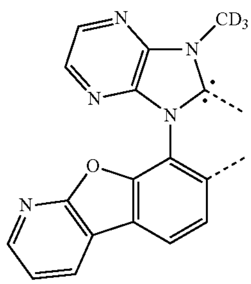
,
$L_{B77}$
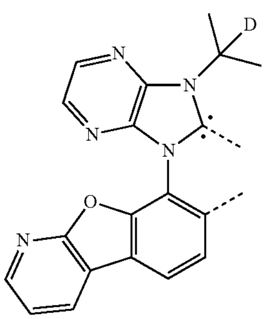
,
$L_{B78}$
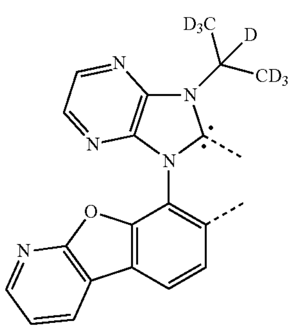
,
-continued
$L_{B79}$
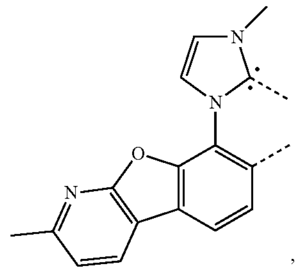
,
$L_{B80}$
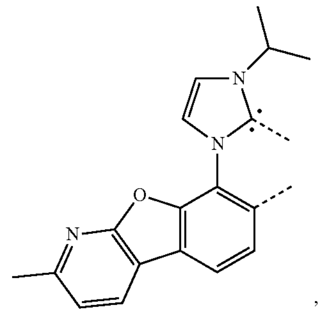
,
$L_{B81}$
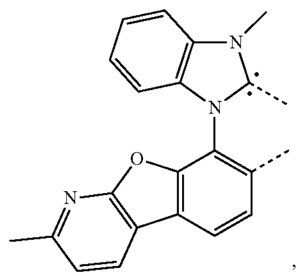
,
$L_{B82}$
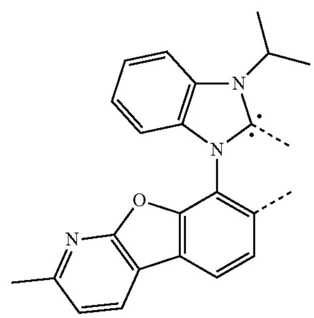
,
$L_{B83}$
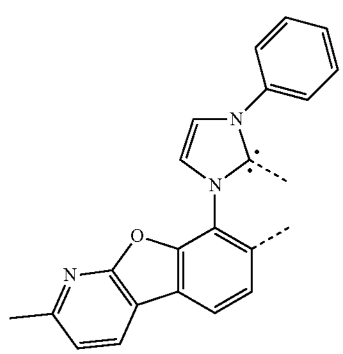
, -continued
$L_{B84}$
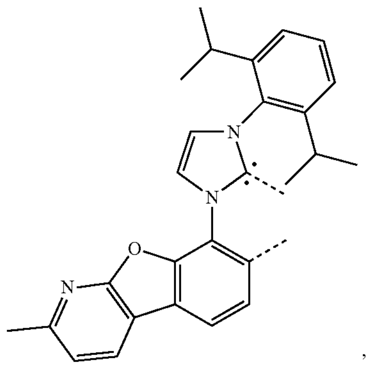
,
$L_{B85}$
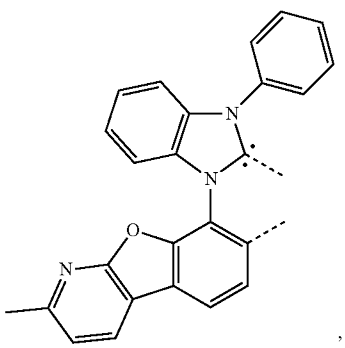
,
$L_{B86}$
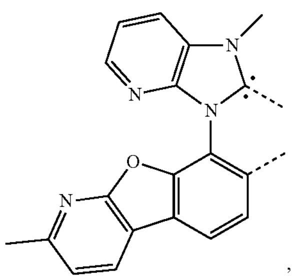
,
$L_{B87}$
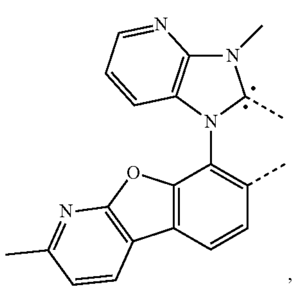
,
$L_{B88}$
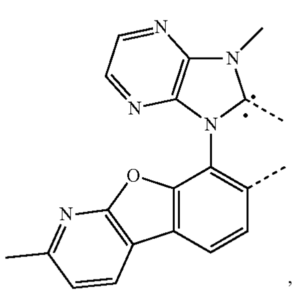
,
-continued
$L_{B89}$
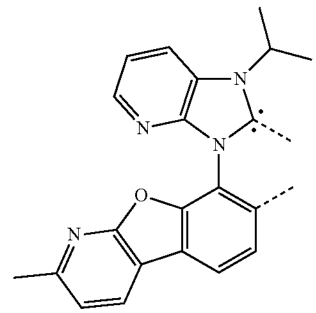
,
$L_{B90}$
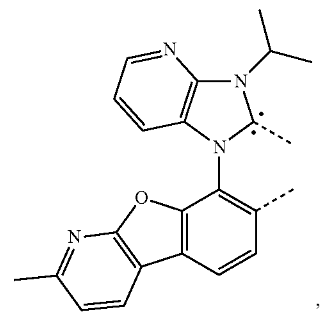
,
$L_{B91}$
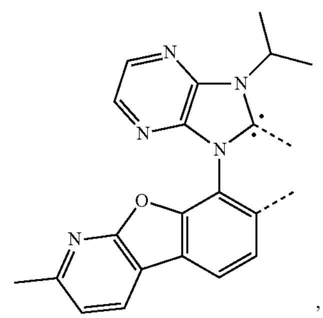
,
$L_{B92}$
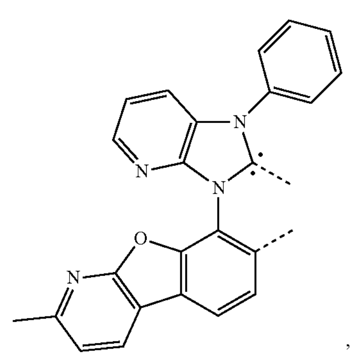
, -continued
$L_{B93}$
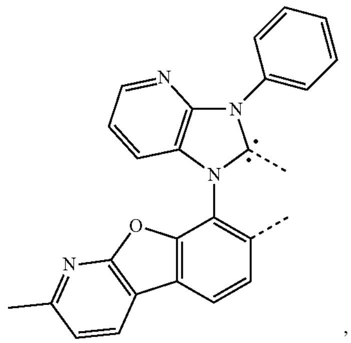
$L_{B94}$
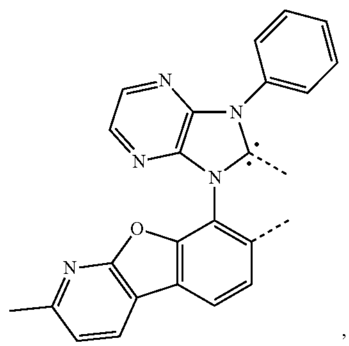
$L_{B95}$
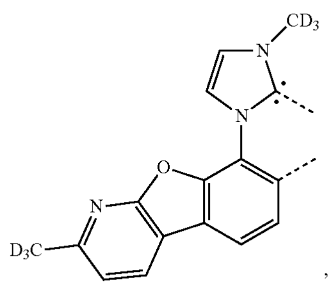
$L_{B96}$
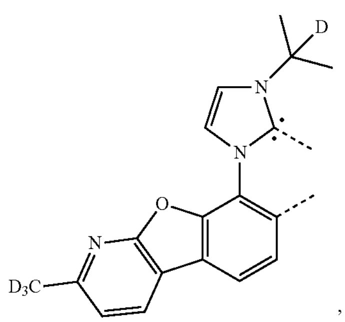
$L_{B97}$
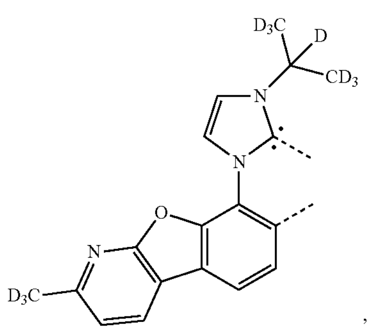
-continued
$L_{B98}$
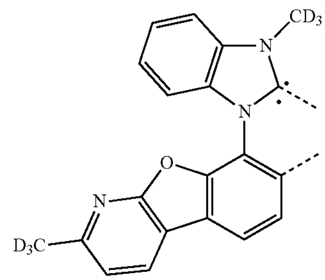
$L_{B99}$
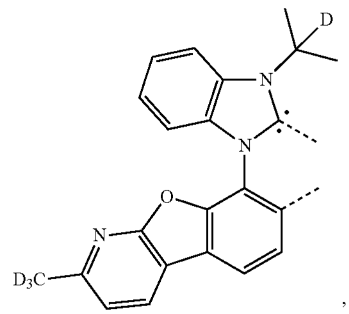
$L_{B100}$
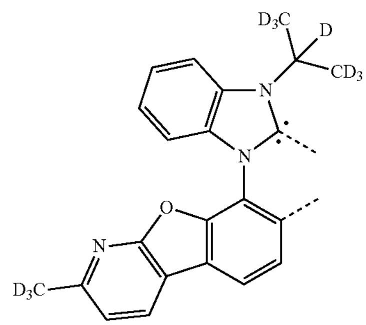
$L_{B101}$
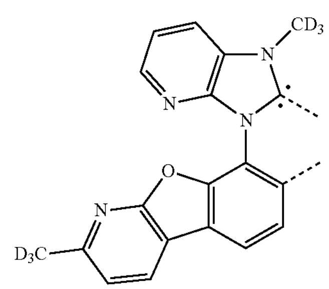
$L_{B102}$
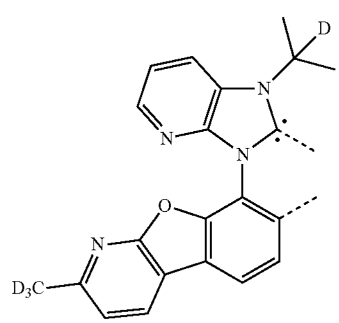

-continued
$L_{B103}$
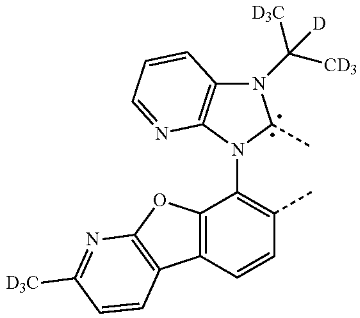
,
$L_{B104}$
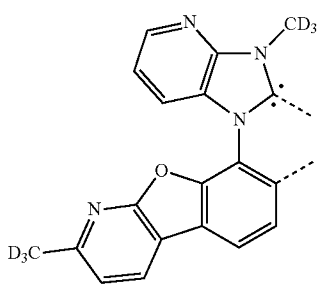
,
$L_{B105}$
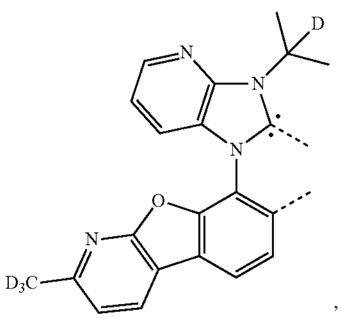
,
$L_{B106}$
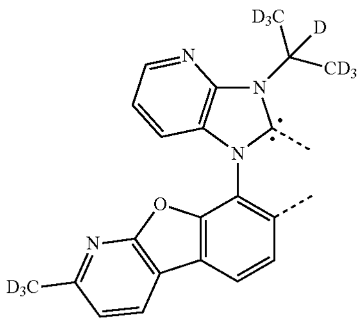
,
$L_{B107}$
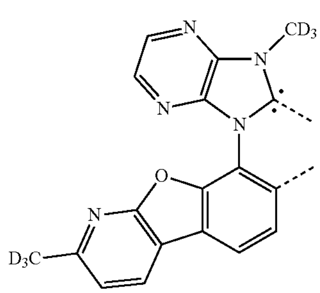
,
-continued
$L_{B108}$
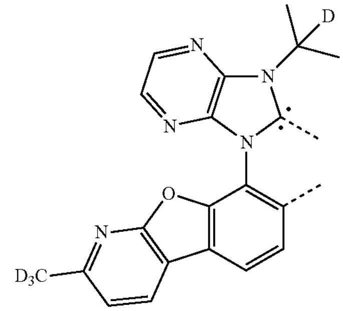
,
$L_{B109}$
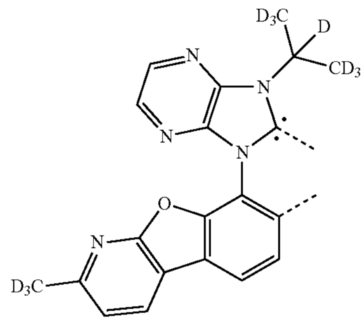
,
$L_{B110}$
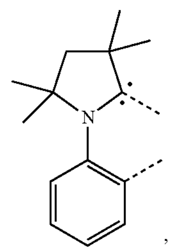
,
$L_{B111}$
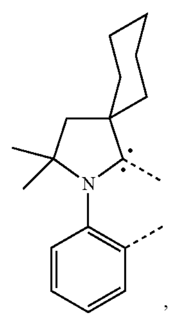
,
$L_{B112}$
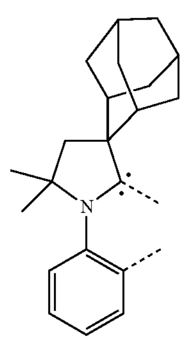
, -continued
$L_{B113}$
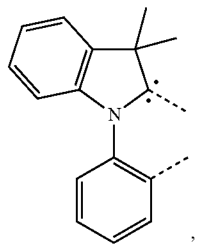
,
$L_{B114}$
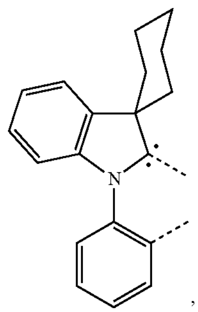
,
$L_{B115}$
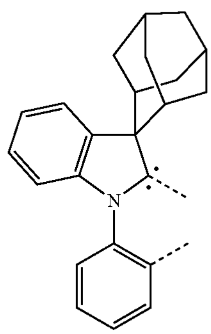
,
$L_{B116}$
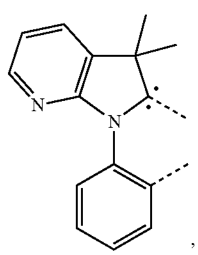
,
$L_{B117}$
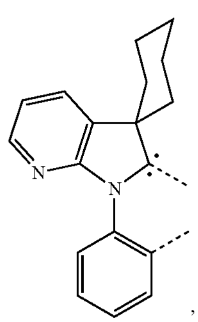
,
-continued
$L_{B118}$
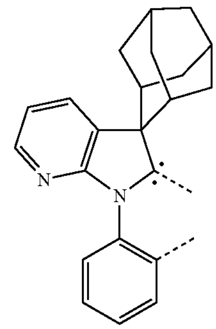
,
$L_{B119}$
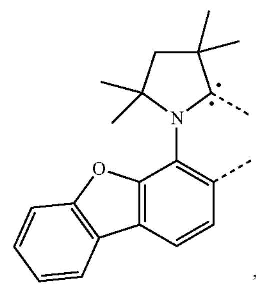
,
$L_{B120}$
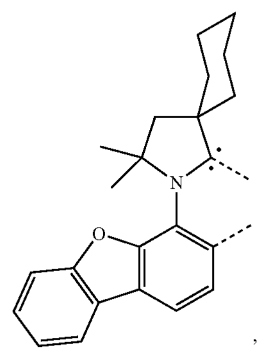
,
$L_{B121}$
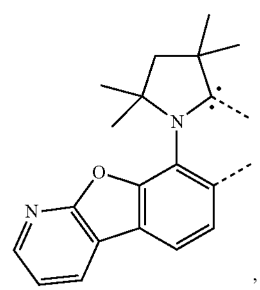
,
$L_{B122}$
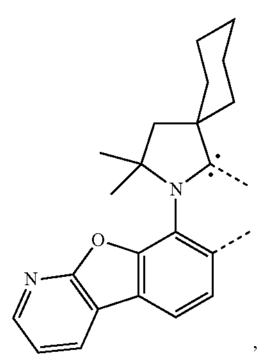
, -continued
$L_{B123}$
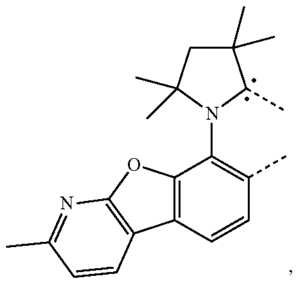
$L_{B124}$
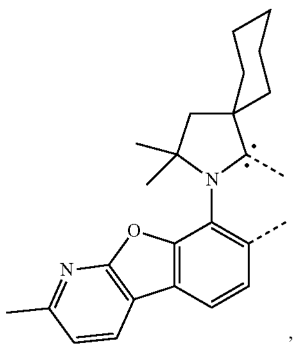
$L_{B125}$
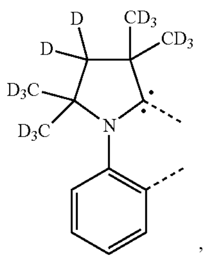
$L_{B126}$
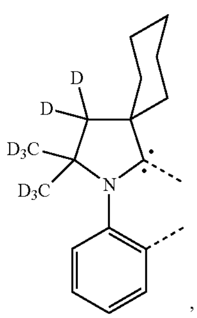
$L_{B127}$
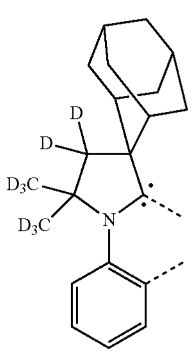
-continued
$L_{B128}$
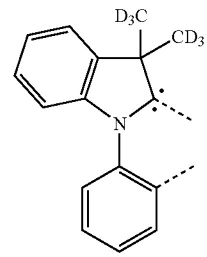
$L_{B129}$
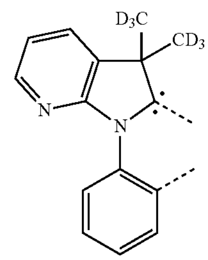
$L_{B130}$
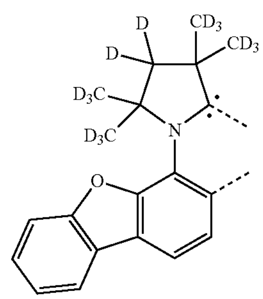
$L_{B131}$
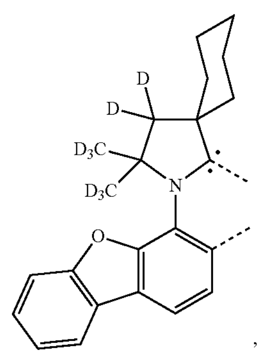
$L_{B132}$
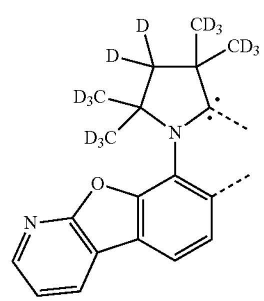

$L_{B133}$
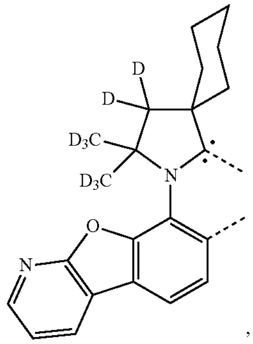
,
$L_{B134}$
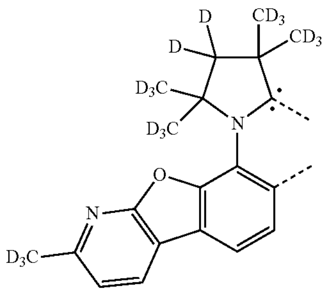
,
$L_{B135}$
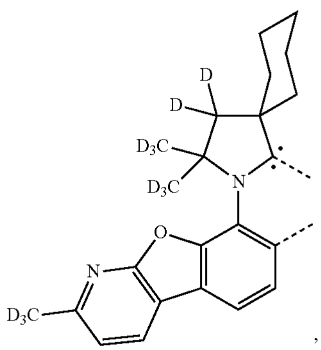
,
$L_{B136}$
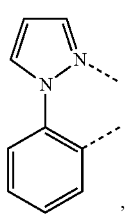
,
$L_{B137}$
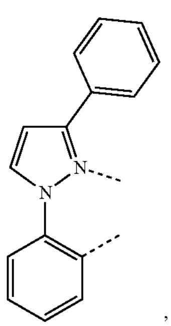
,
$L_{B138}$
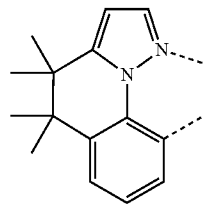
,
$L_{B139}$
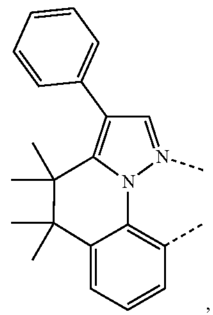
,
$L_{B140}$
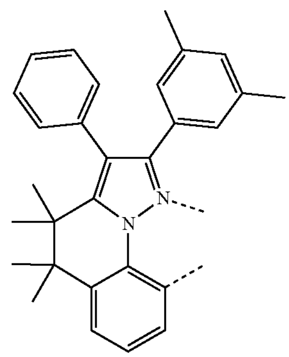
,
$L_{B141}$
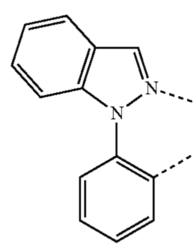
,
$L_{B142}$
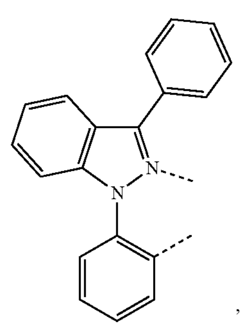
, -continued
$L_{B143}$
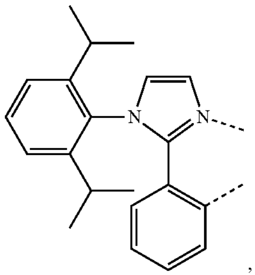
,
$L_{B144}$
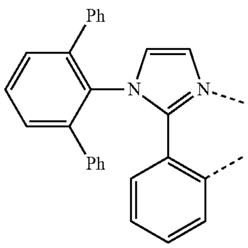
,
$L_{B145}$
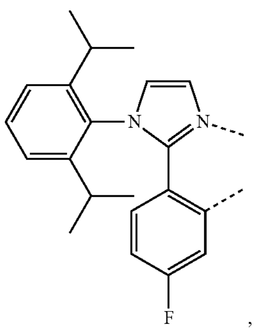
,
$L_{B146}$
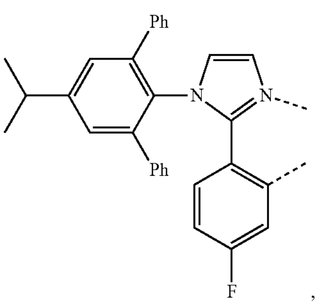
,
$L_{B147}$
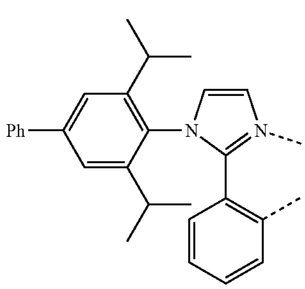
,
-continued
$L_{B148}$
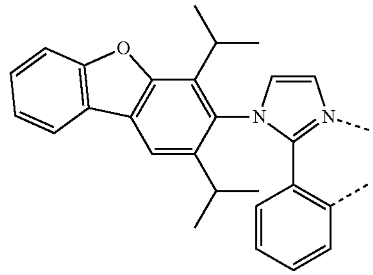
,
$L_{B149}$
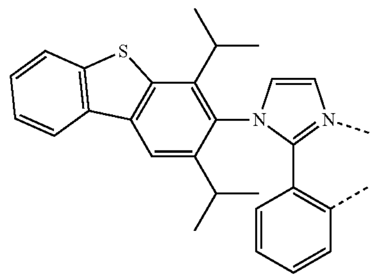
,
$L_{B150}$
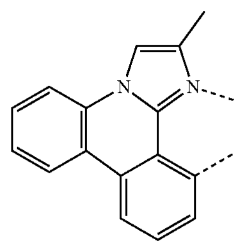
,
$L_{B151}$
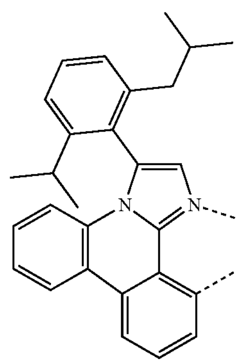
,
$L_{B152}$
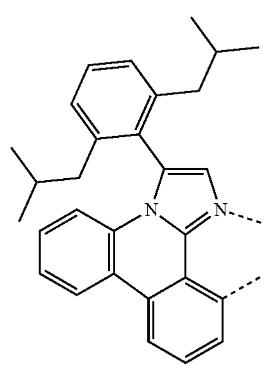
, -continued
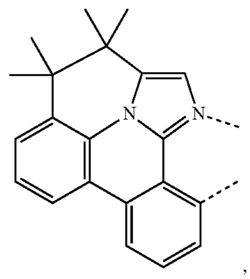
$L_{B153}$
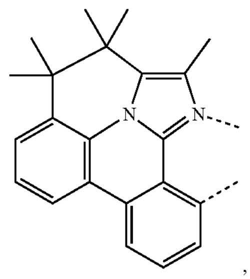
$L_{B154}$
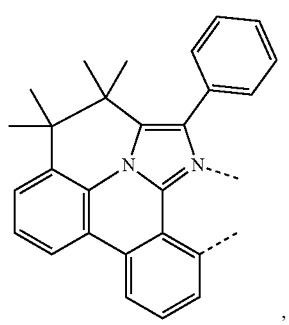
$L_{B155}$
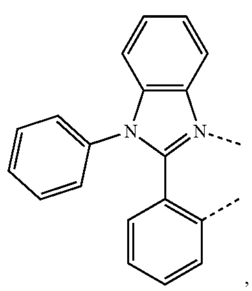
$L_{B156}$
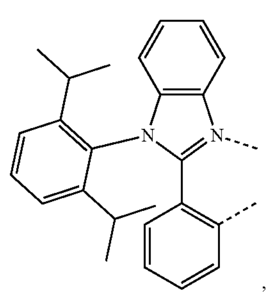
$L_{B157}$
-continued
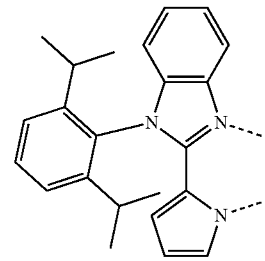
$L_{B158}$
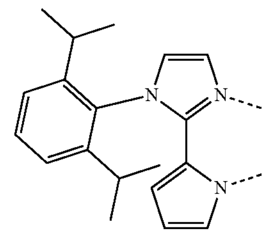
$L_{B159}$
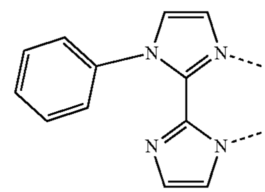
$L_{B160}$
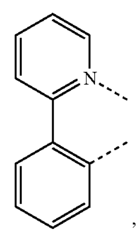
$L_{B161}$
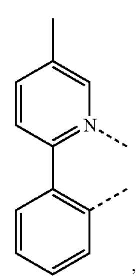
$L_{B162}$
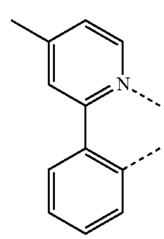
$L_{B163}$ $L_{B164}$
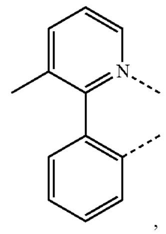
$L_{B165}$
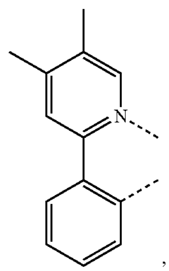
$L_{B166}$
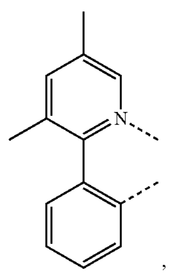
$L_{B167}$
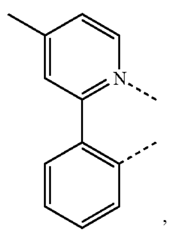
$L_{B168}$
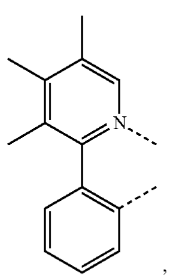
$L_{B169}$
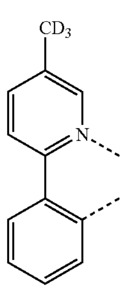
$L_{B170}$
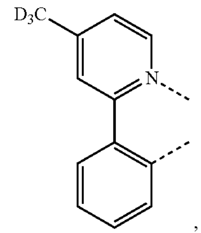
$L_{B171}$
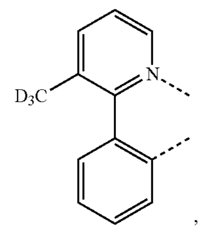
$L_{B172}$
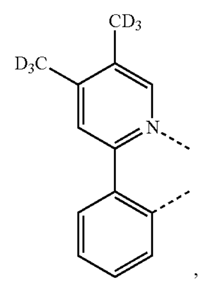
$L_{B173}$
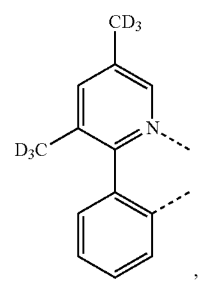
$L_{B174}$
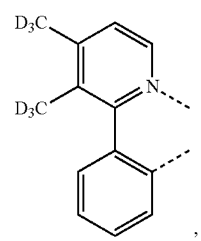
$L_{B175}$
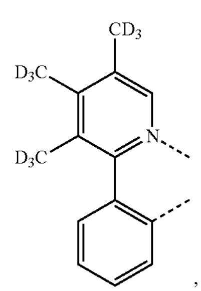

-continued
$L_{B176}$
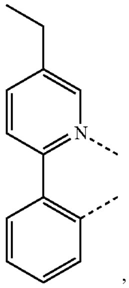
$L_{B177}$
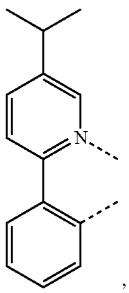
$L_{B178}$
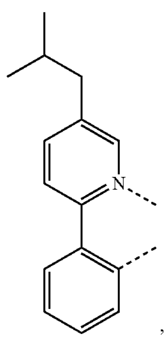
$L_{B179}$
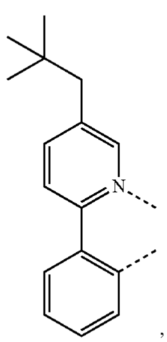
$L_{B180}$
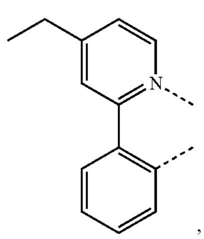
-continued
$L_{B181}$
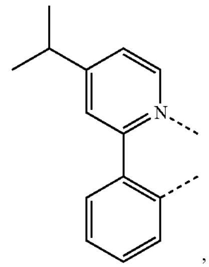
$L_{B182}$
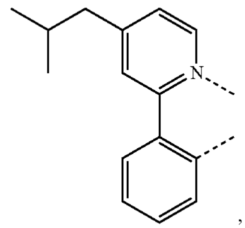
$L_{B183}$
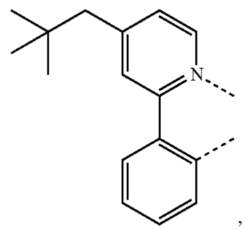
$L_{B184}$
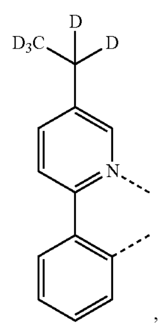
$L_{B185}$
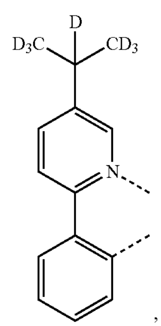

-continued
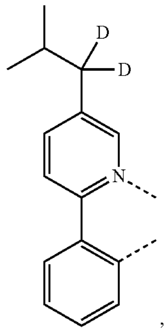
$L_{B186}$
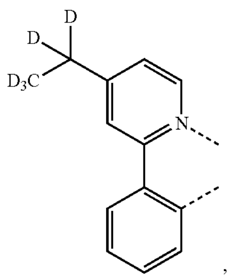
$L_{B187}$
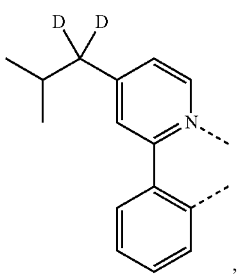
$L_{B188}$
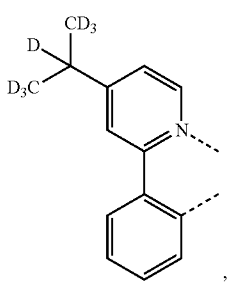
$L_{B189}$
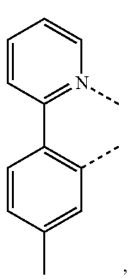
$L_{B190}$
-continued
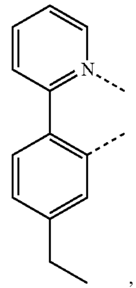
$L_{B191}$
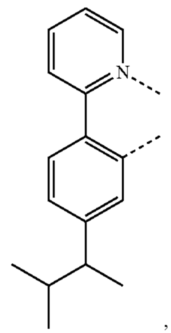
$L_{B192}$
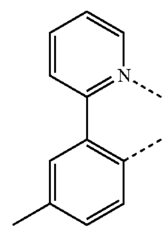
$L_{B193}$
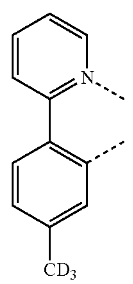
$L_{B194}$
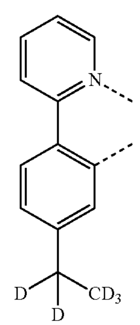
$L_{B195}$ -continued
$L_{B196}$
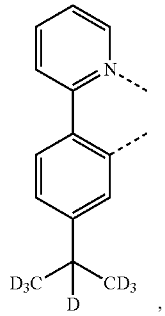
$L_{B197}$
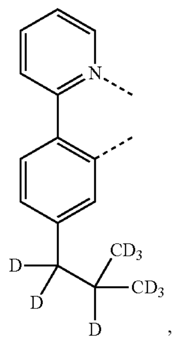
$L_{B198}$
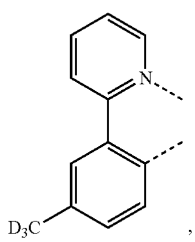
$L_{B199}$
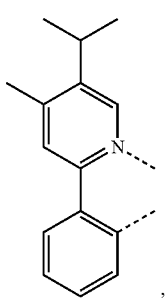
$L_{B200}$
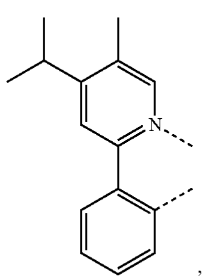
-continued
$L_{B201}$
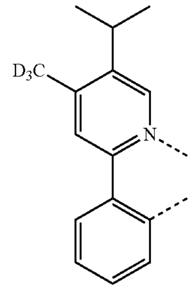
$L_{B202}$
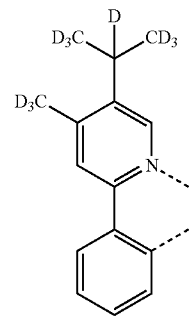
$L_{B203}$
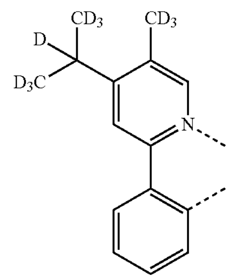
$L_{B204}$
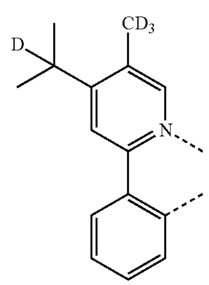
$L_{B205}$
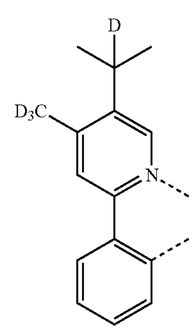

104
-continued
L$_{B206}$
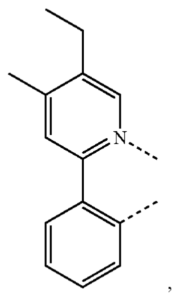
L$_{B207}$
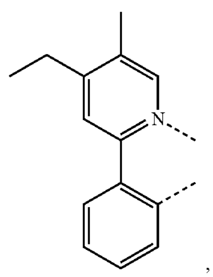
L$_{B208}$
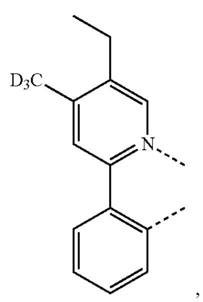
L$_{B209}$
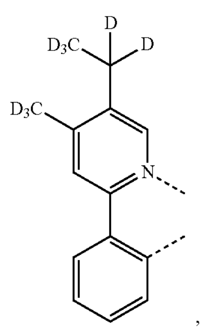
L$_{B210}$
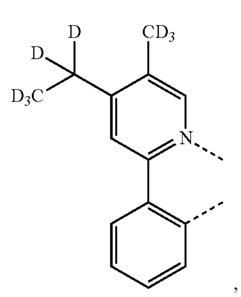
L$_{B211}$
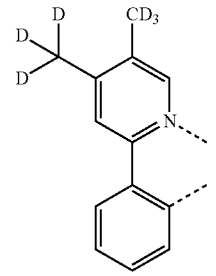
L$_{B212}$
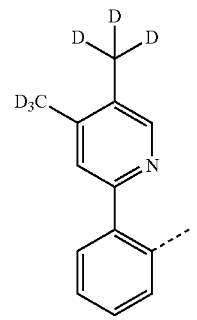
L$_{B213}$
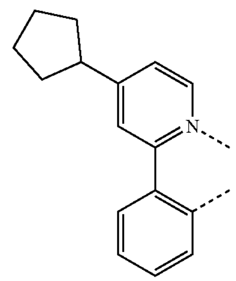
L$_{B214}$
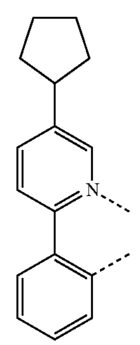
L$_{B215}$
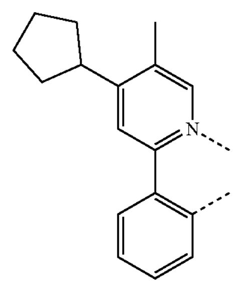

-continued
$L_{B216}$
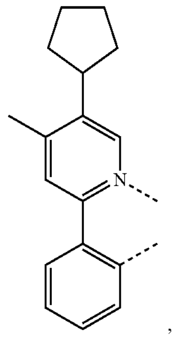
$L_{B217}$
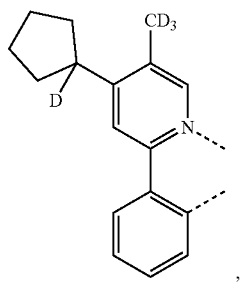
$L_{B218}$
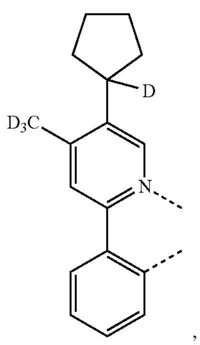
$L_{B219}$
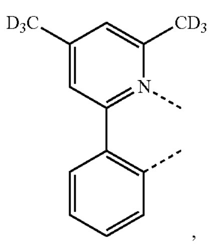
$L_{B220}$
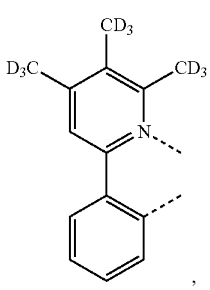
-continued
$L_{B221}$
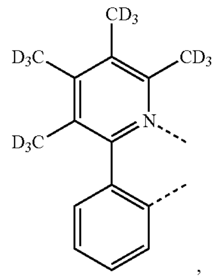
$L_{B222}$
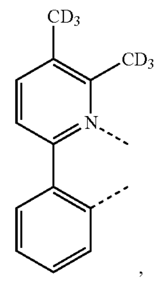
$L_{B223}$
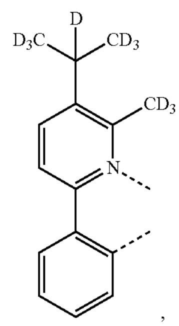
$L_{B224}$
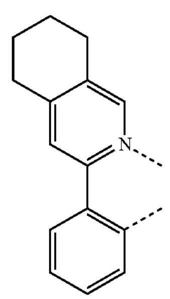
$L_{B225}$
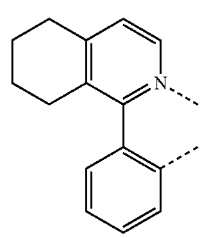

-continued
$L_{B226}$
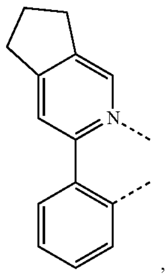
$L_{B227}$
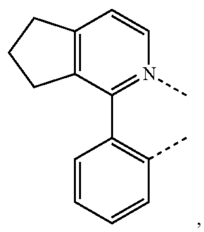
$L_{B228}$
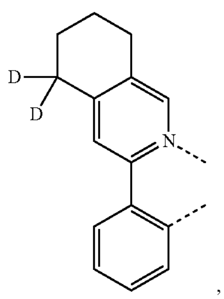
$L_{B229}$
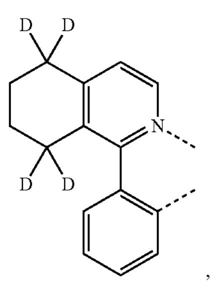
$L_{B230}$
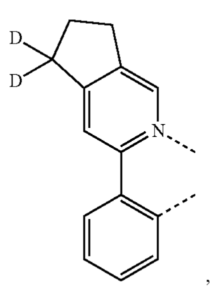
-continued
$L_{B231}$
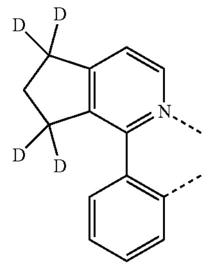
$L_{B232}$
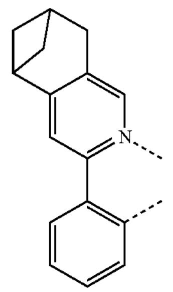
$L_{B233}$
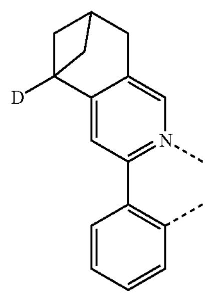
$L_{B234}$
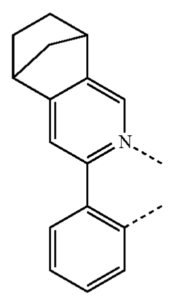
$L_{B235}$
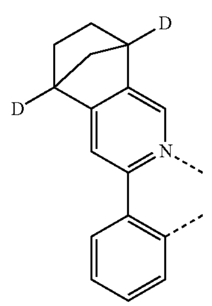

$L_{B236}$
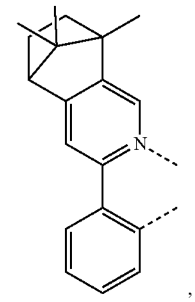
$L_{B237}$
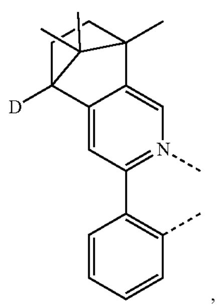
$L_{B238}$
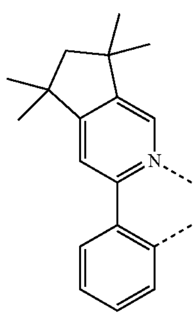
$L_{B239}$
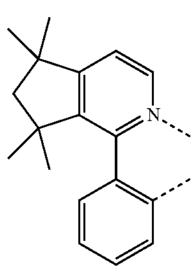
$L_{B240}$
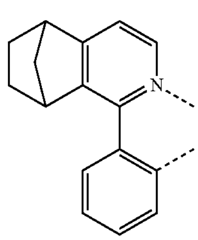
$L_{B241}$
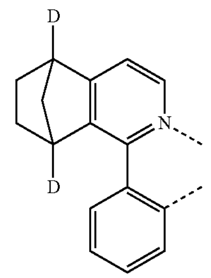
$L_{B242}$
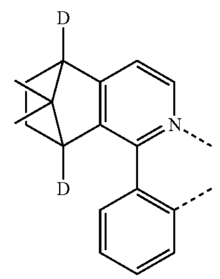
$L_{B243}$
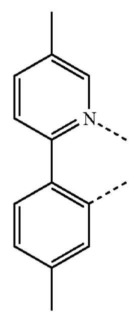
$L_{B244}$
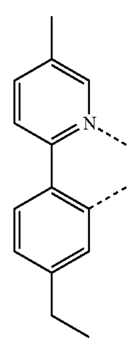
$L_{B245}$
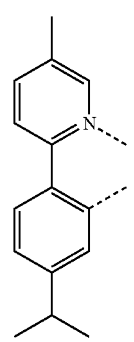

-continued
$L_{B246}$
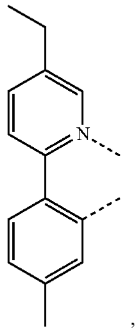
$L_{B247}$
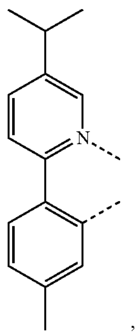
$L_{B248}$
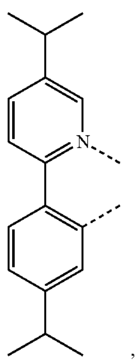
$L_{B249}$
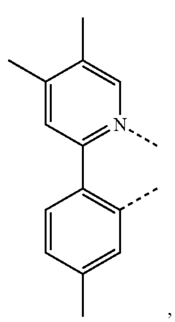
-continued
$L_{B250}$
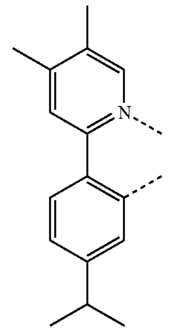
$L_{B251}$
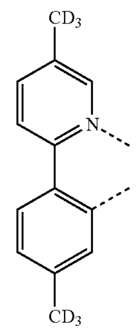
$L_{B252}$
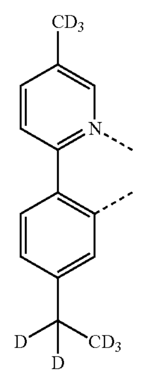
$L_{B253}$
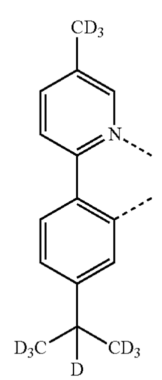

-continued
$L_{B254}$
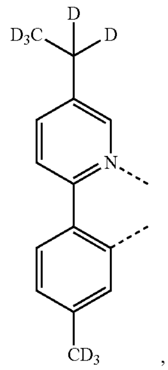
$L_{B255}$
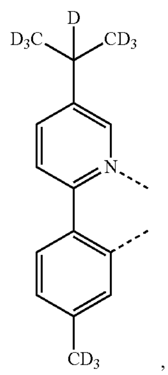
$L_{B256}$
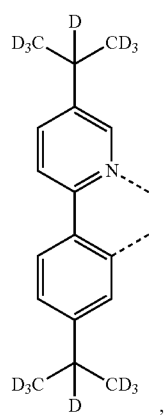
$L_{B257}$
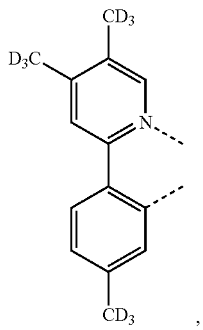
-continued
$L_{B258}$
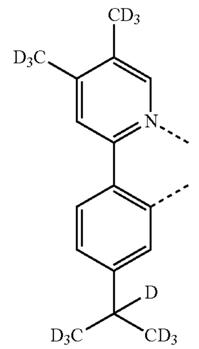
$L_{B259}$
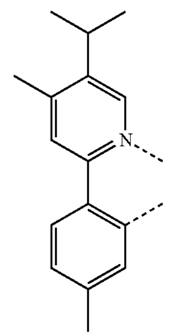
$L_{B260}$
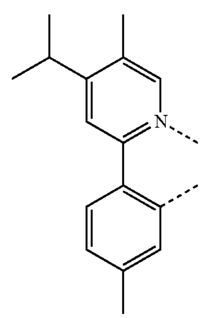
$L_{B261}$
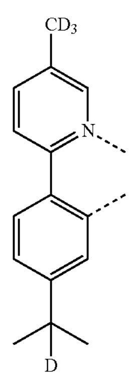

-continued
$L_{B262}$
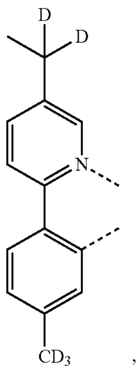
$L_{B263}$
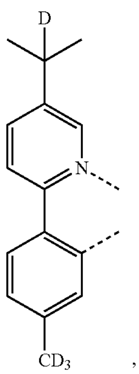
$L_{B264}$
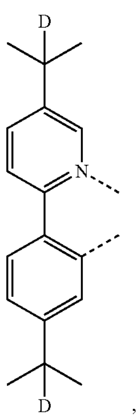
$L_{B265}$
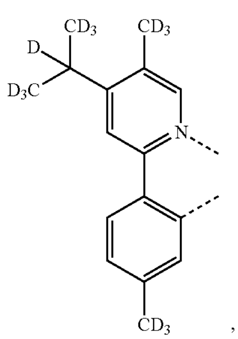
-continued
$L_{B266}$
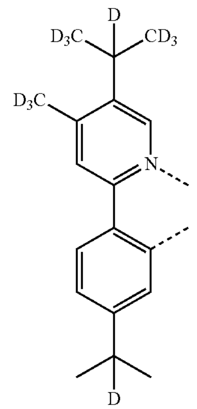
$L_{B267}$
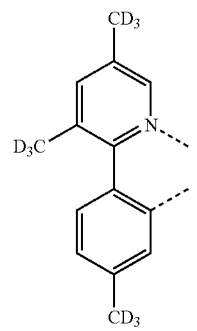
$L_{B268}$
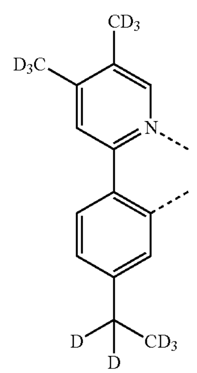
$L_{B269}$
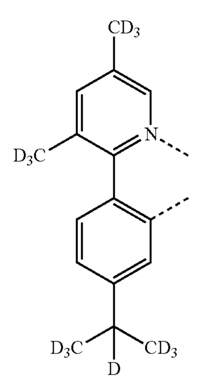

-continued
$L_{B270}$
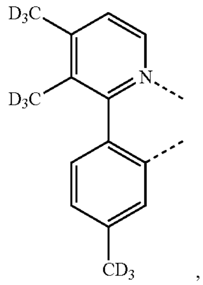
$L_{B271}$
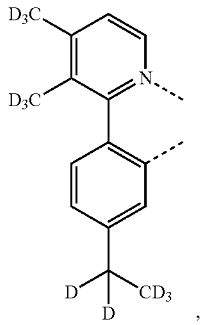
$L_{B272}$
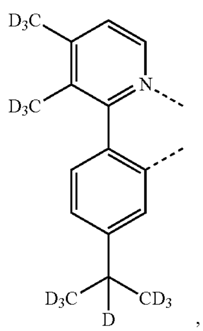
$L_{B273}$
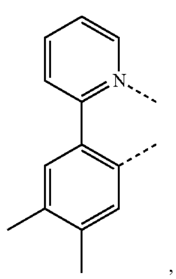
$L_{B274}$
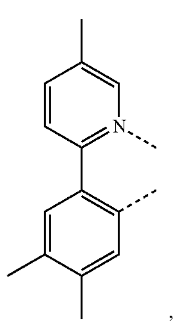
-continued
$L_{B275}$
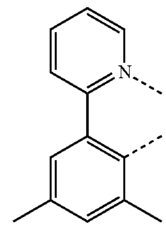
$L_{B276}$
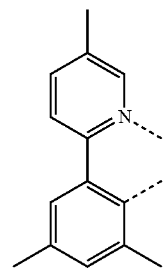
$L_{B277}$
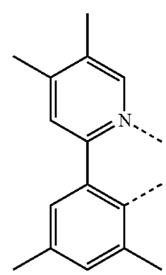
$L_{B278}$
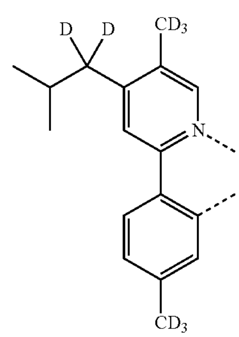
$L_{B279}$
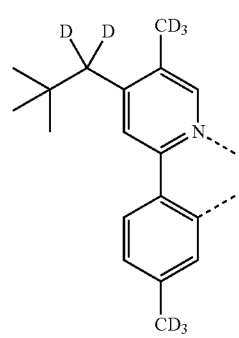

-continued
$L_{B280}$
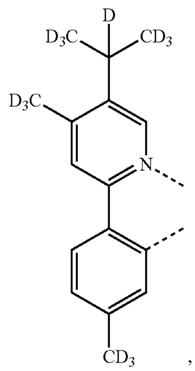
$L_{B281}$
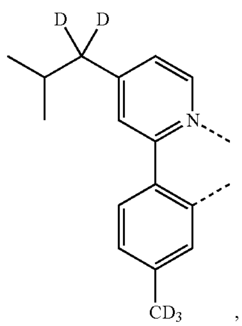
$L_{B282}$
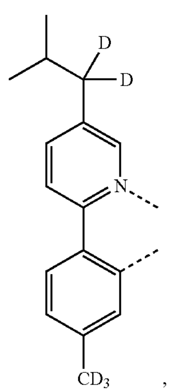
$L_{B283}$
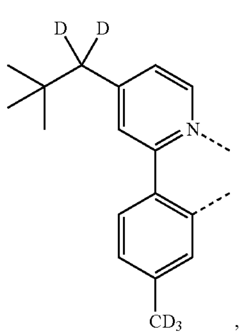
-continued
$L_{B284}$
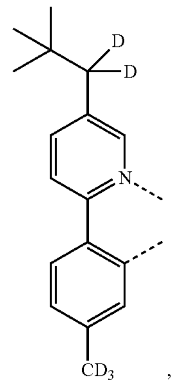
$L_{B285}$
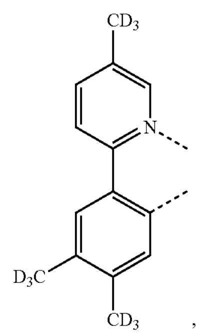
$L_{B286}$
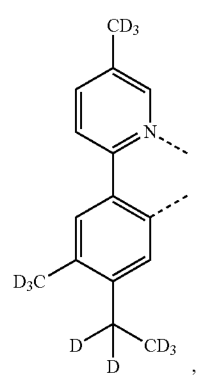
$L_{B287}$
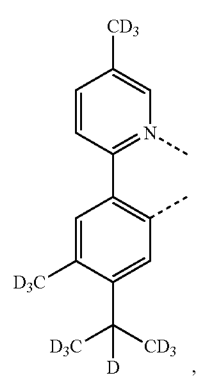

-continued
L_{B288}
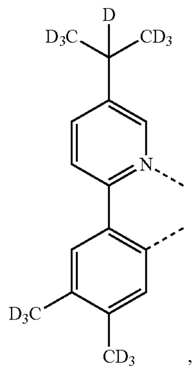
L_{B289}
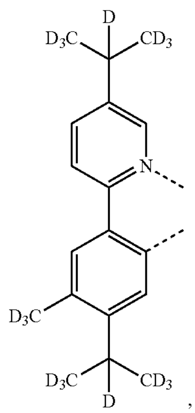
L_{B290}
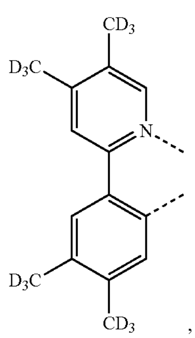
L_{B291}
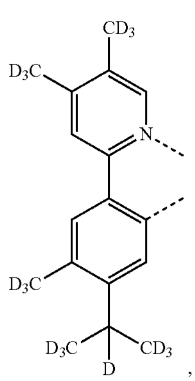
-continued
L_{B292}
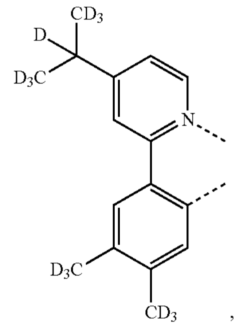
L_{B293}
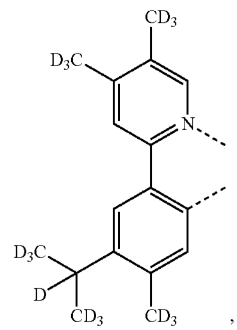
L_{B294}
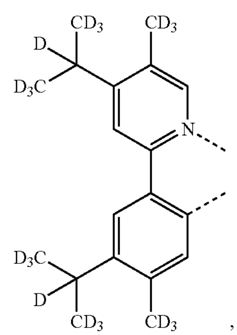
L_{B295}
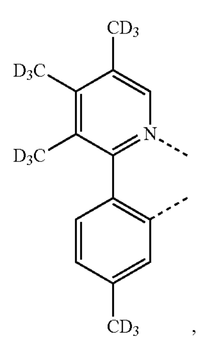

$L_{B296}$
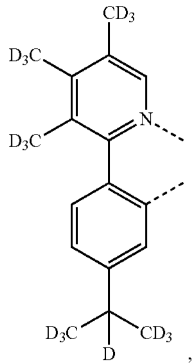
,
$L_{B297}$
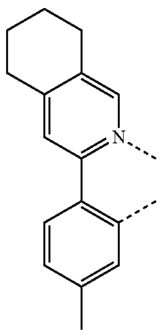
,
$L_{B298}$
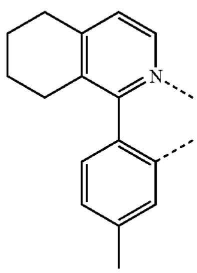
,
$L_{B299}$
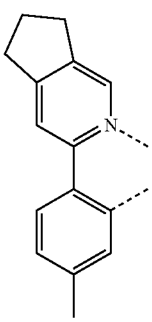
,
$L_{B300}$
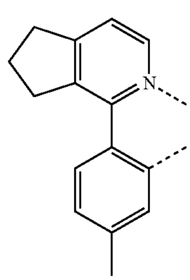
,
$L_{B301}$
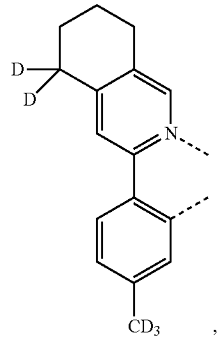
,
$L_{B302}$
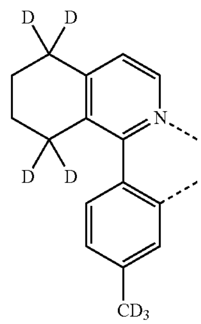
,
$L_{B303}$
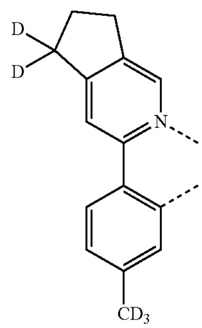
,
$L_{B304}$
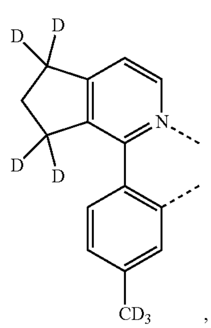
, -continued
$L_{B305}$
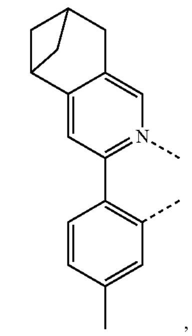
$L_{B306}$
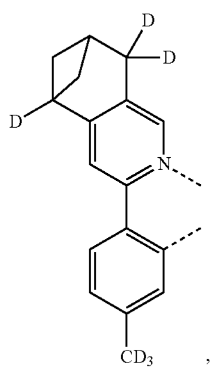
$L_{B307}$
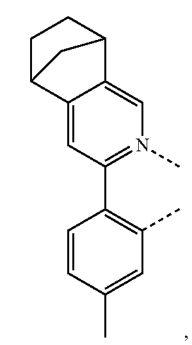
$L_{B308}$
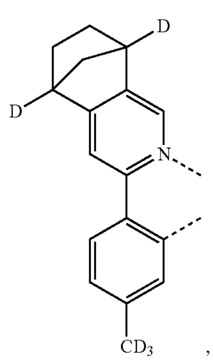
-continued
$L_{B309}$
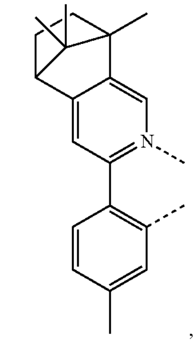
$L_{B310}$
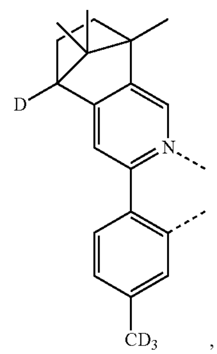
$L_{B311}$
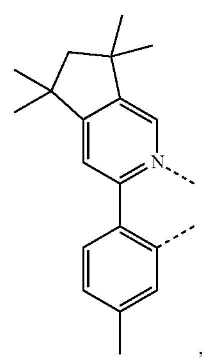
$L_{B312}$
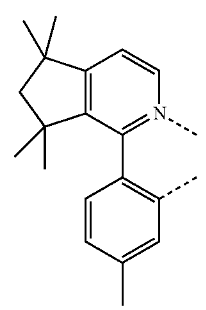

$L_{B312}$
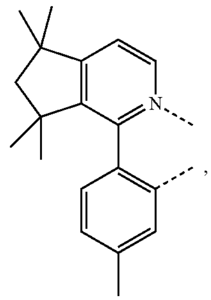
$L_{B313}$
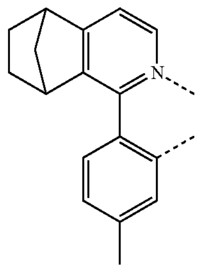
$L_{B314}$
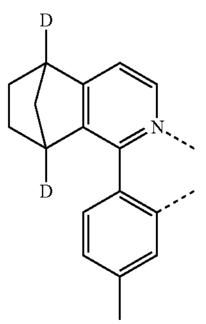
$L_{B315}$
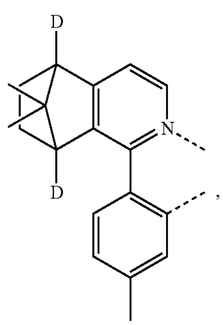
$L_{B316}$
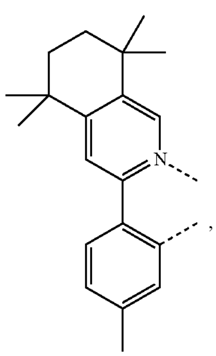
$L_{B317}$
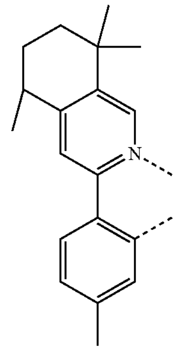
$L_{B318}$
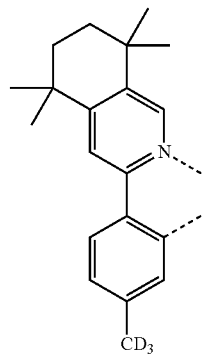
$L_{B319}$
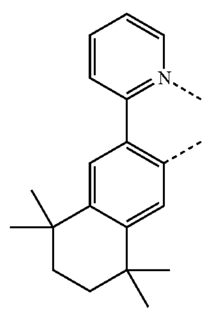
$L_{B320}$
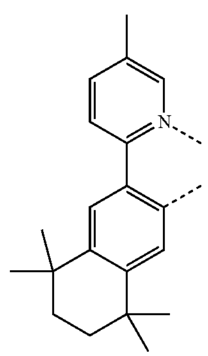

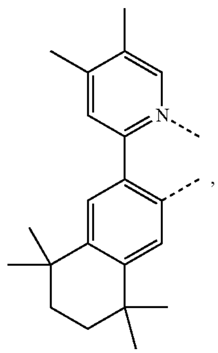
$L_{B321}$
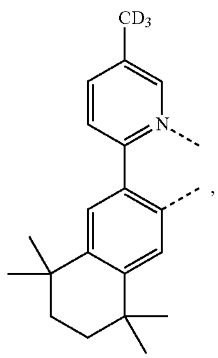
$L_{B322}$
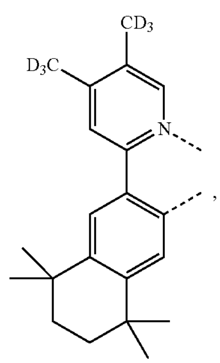
$L_{B323}$
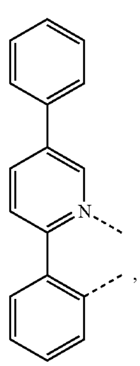
$L_{B324}$
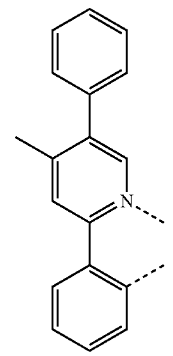
$L_{B325}$
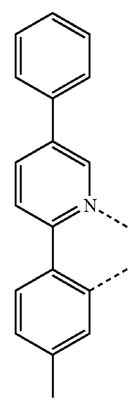
$L_{B326}$
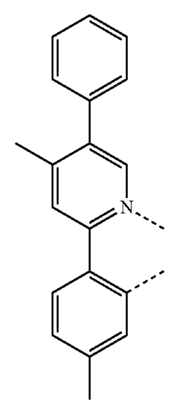
$L_{B327}$
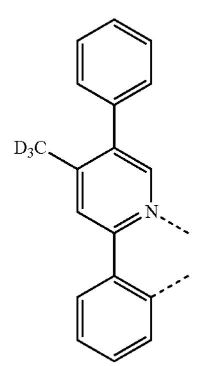
$L_{B328}$ -continued
$L_{B329}$
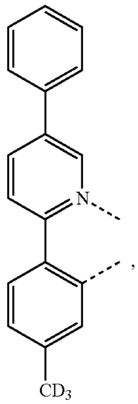
$L_{B330}$
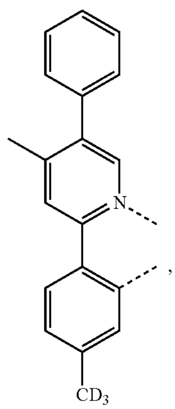
$L_{B331}$
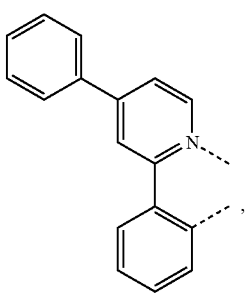
$L_{B332}$
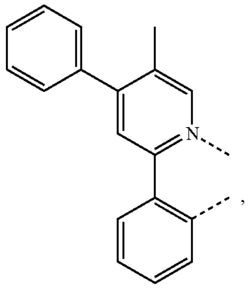
-continued
$L_{B333}$
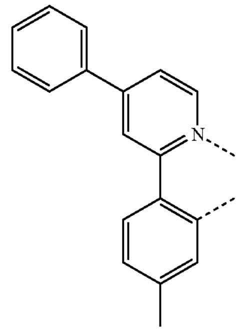
$L_{B334}$
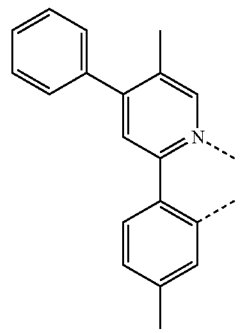
$L_{B335}$
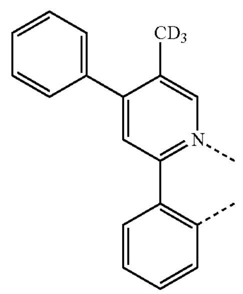
$L_{B336}$
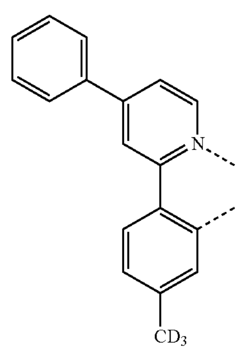

L$_{B337}$
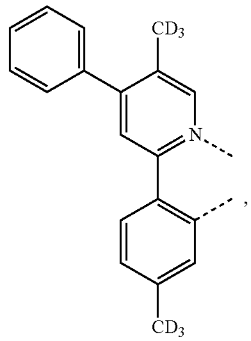
L$_{B338}$
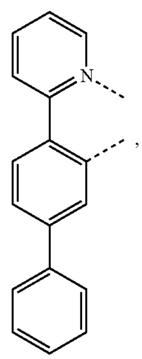
L$_{B339}$
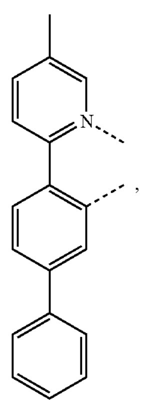
L$_{B340}$
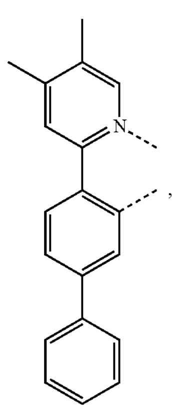
L$_{B341}$
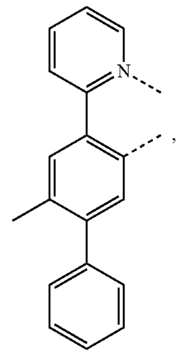
L$_{B342}$
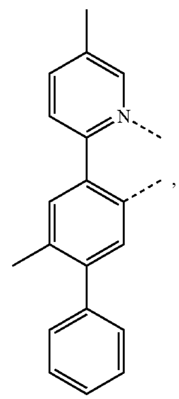
L$_{B343}$
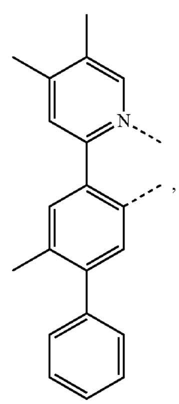
L$_{B344}$
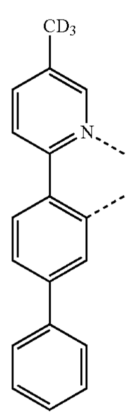

-continued
$L_{B345}$
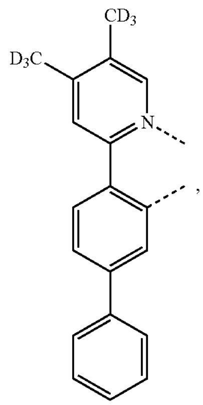
$L_{B346}$
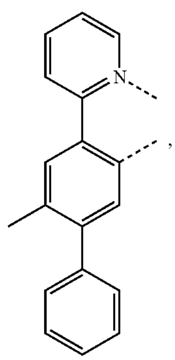
$L_{B346}$
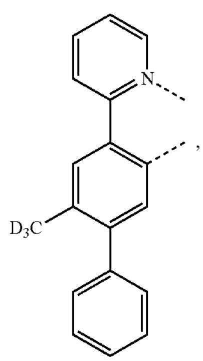
$L_{B347}$
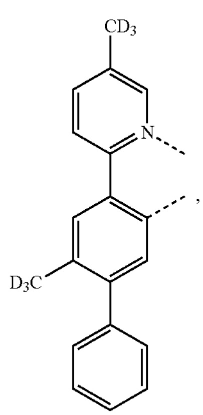
-continued
$L_{B348}$
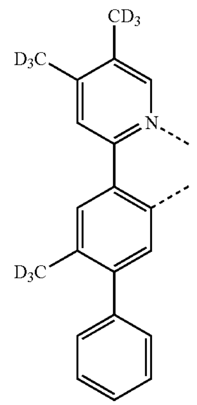
$L_{B349}$
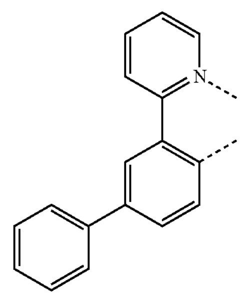
$L_{B350}$
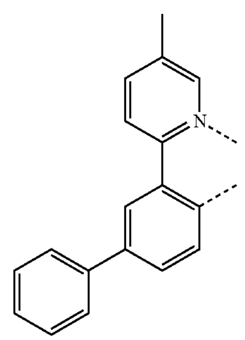
$L_{B351}$
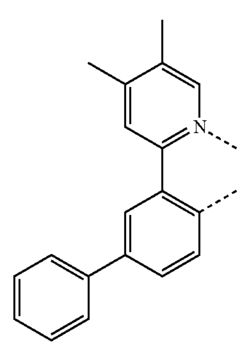

$L_{B352}$
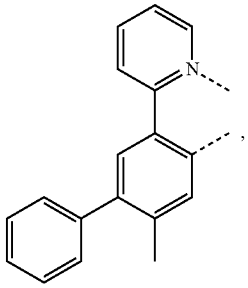
$L_{B353}$
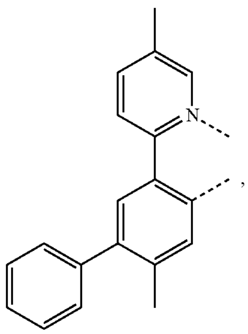
$L_{B354}$
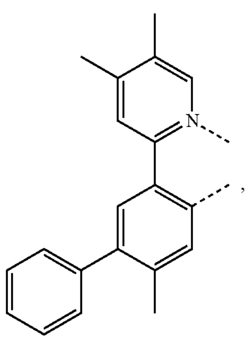
$L_{B355}$
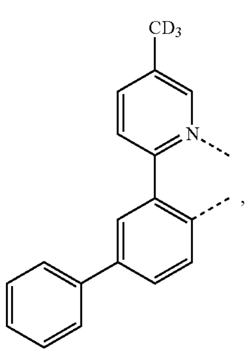
$L_{B356}$
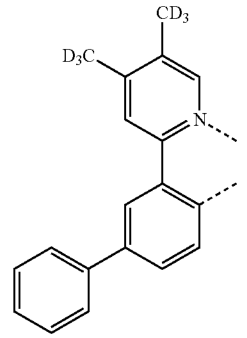
$L_{B357}$
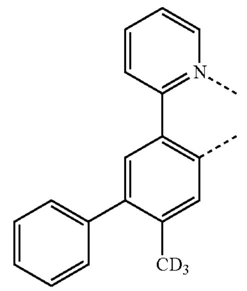
$L_{B358}$
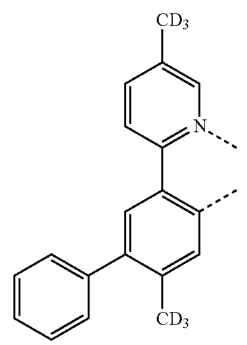
$L_{B359}$
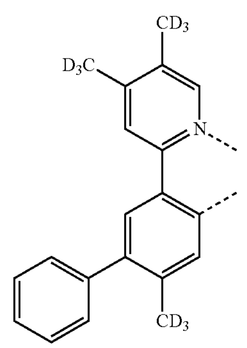
$L_{B360}$
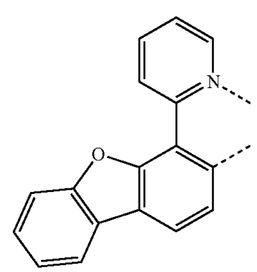

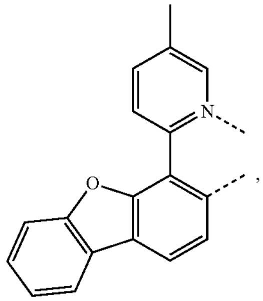
$L_{B361}$
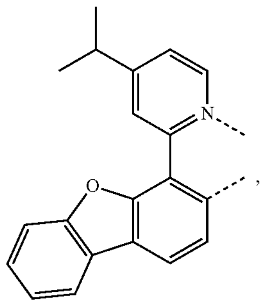
$L_{B362}$
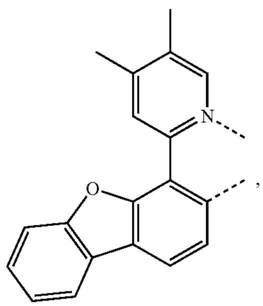
$L_{B363}$
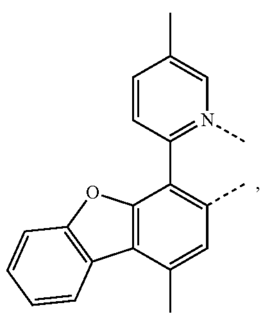
$L_{B364}$
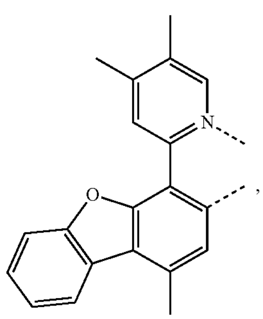
$L_{B365}$
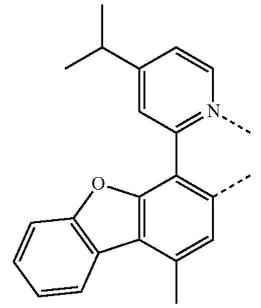
$L_{B366}$
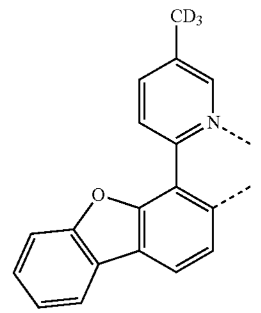
$L_{B367}$
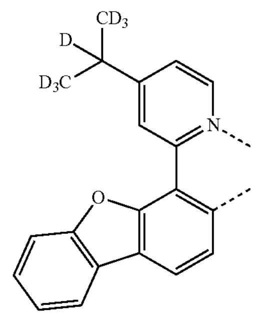
$L_{B368}$
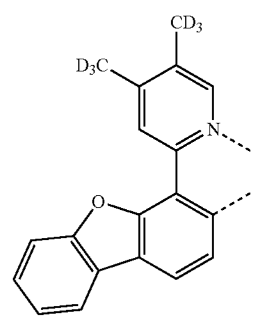
$L_{B369}$
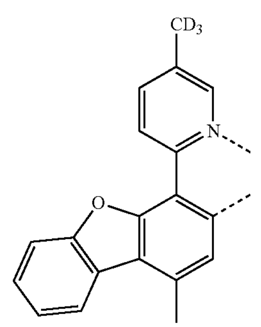
$L_{B370}$ $L_{B371}$
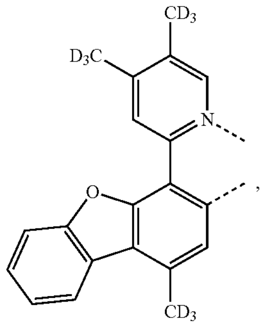
$L_{B372}$
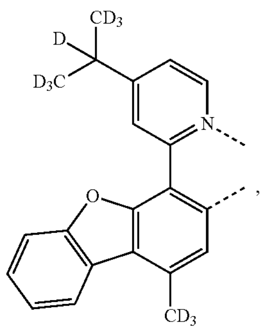
$L_{B373}$
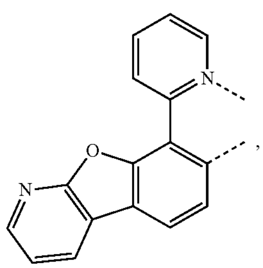
$L_{B374}$
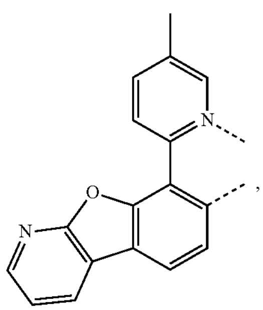
$L_{B375}$
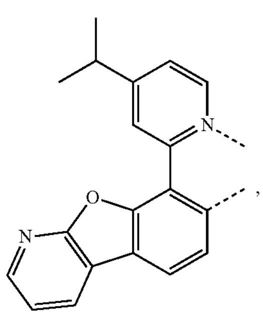
$L_{B376}$
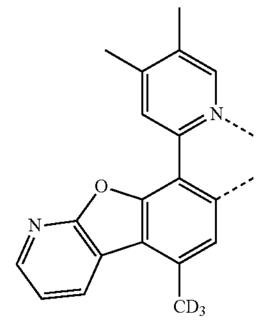
$L_{B377}$
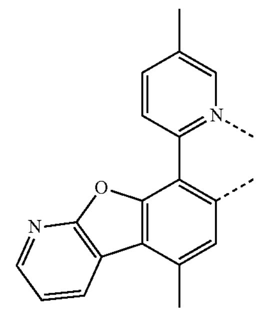
$L_{B378}$
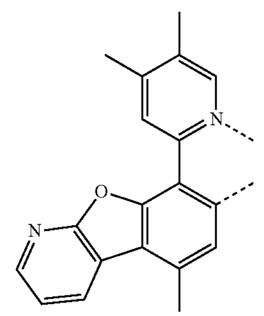
$L_{B379}$
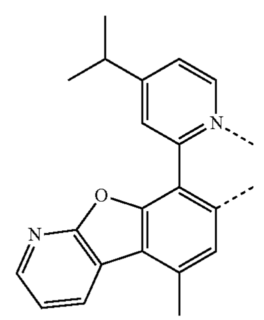
$L_{B380}$
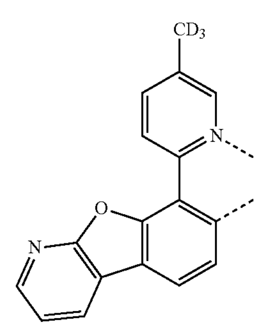

-continued
$L_{B381}$
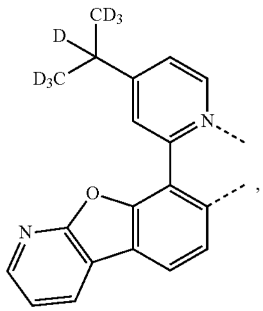
$L_{B382}$
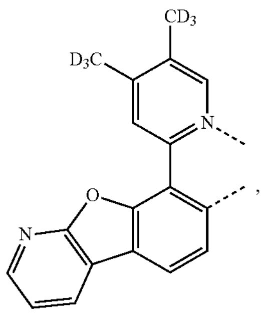
$L_{B383}$
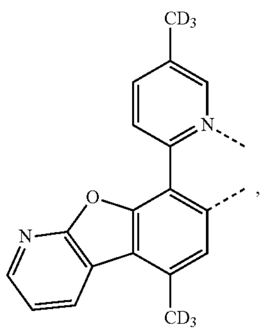
$L_{B384}$
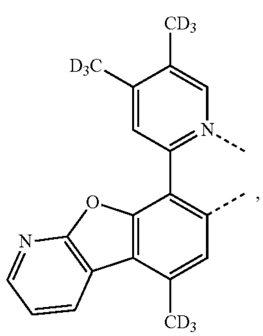
$L_{B385}$
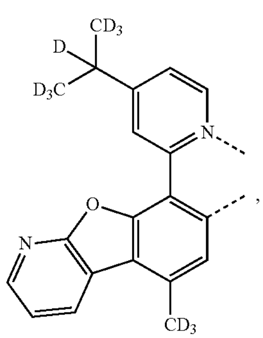
-continued
$L_{B386}$
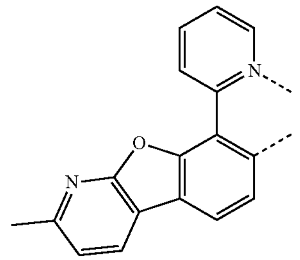
$L_{B387}$
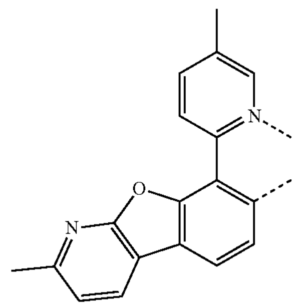
$L_{B388}$
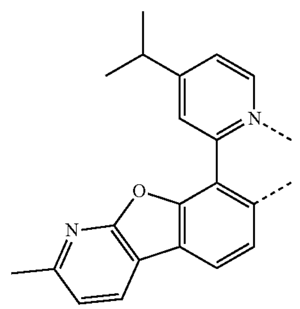
$L_{B389}$
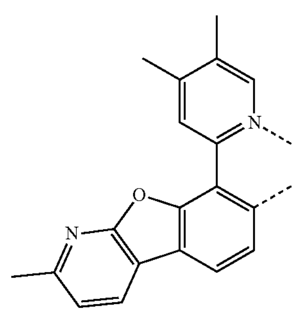
$L_{B390}$
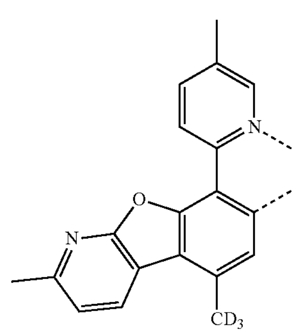

-continued
$L_{B391}$
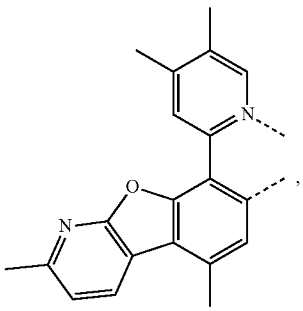
$L_{B392}$
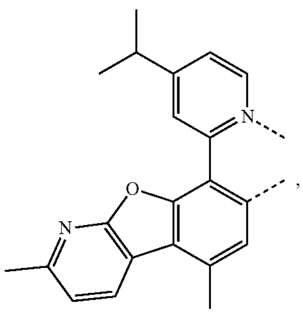
$L_{B393}$
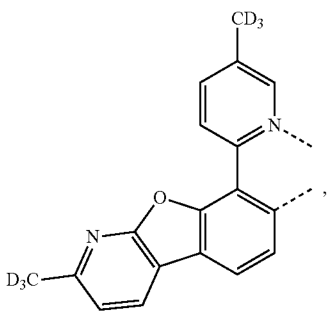
$L_{B394}$
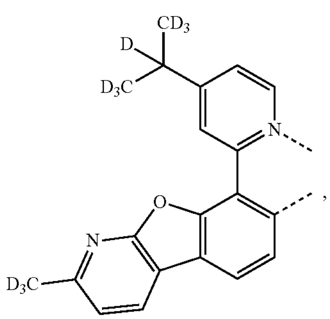
$L_{B395}$
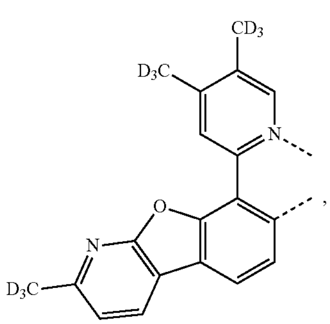
-continued
$L_{B396}$
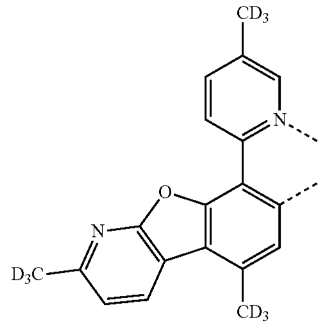
$L_{B397}$
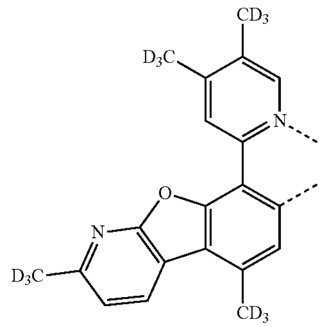
$L_{B398}$
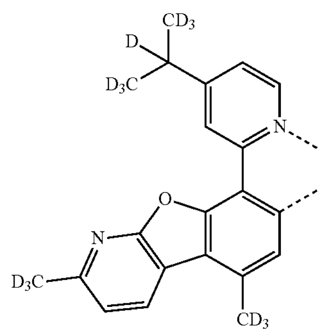
$L_{B399}$
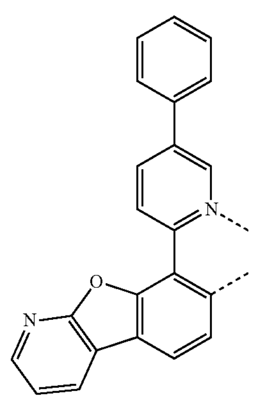

-continued
$L_{B400}$
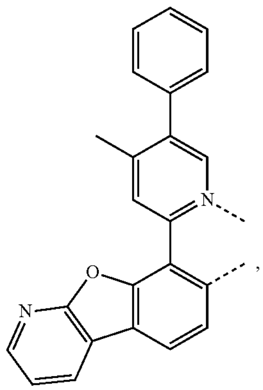
$L_{B401}$
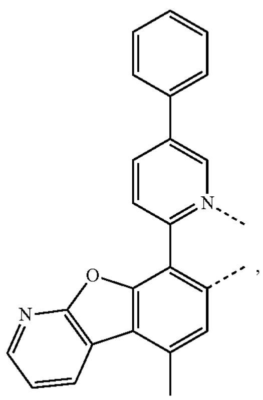
$L_{B402}$
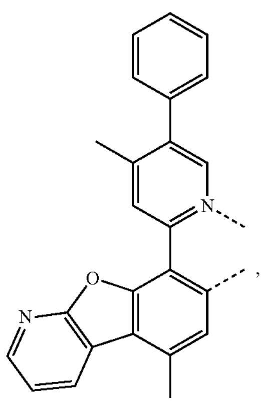
$L_{B403}$
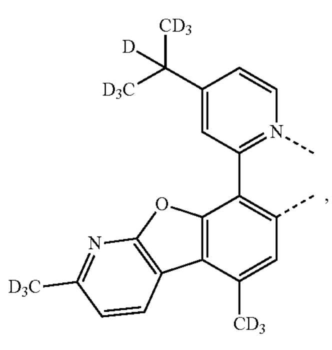
-continued
$L_{B404}$
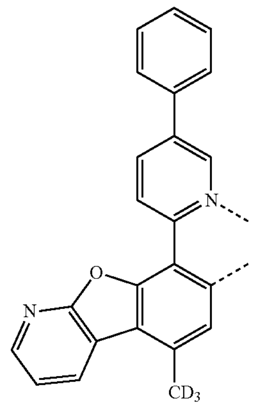
$L_{B405}$
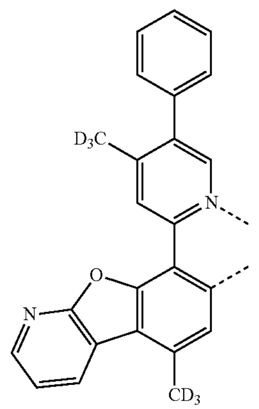
$L_{B406}$
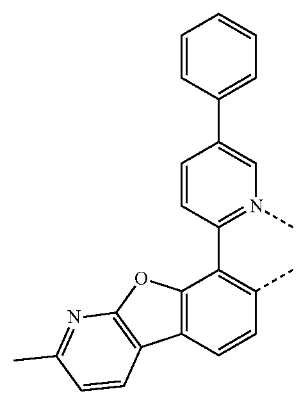
$L_{B407}$
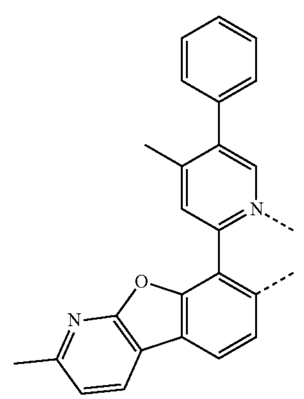

$L_{B408}$
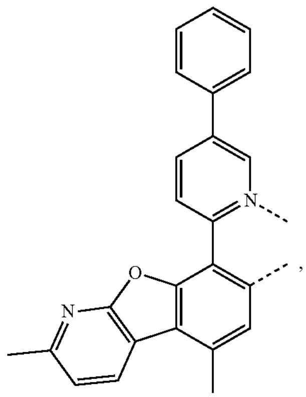
$L_{B409}$
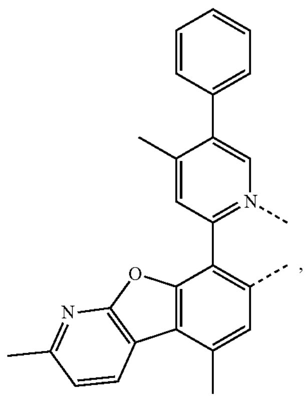
$L_{B410}$
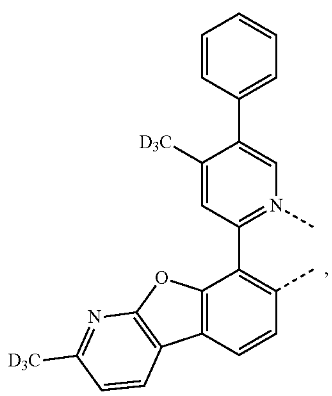
$L_{B411}$
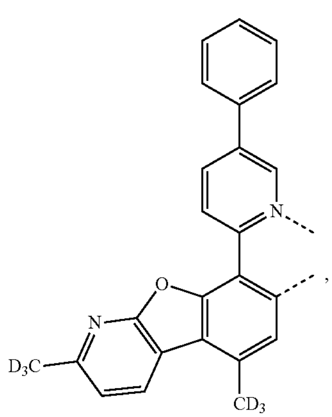
$L_{B412}$
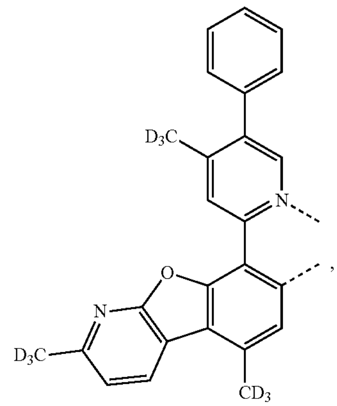
$L_{B413}$
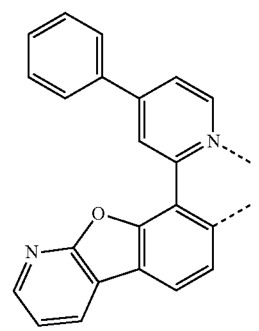
$L_{B414}$
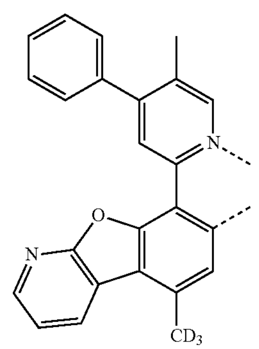
$L_{B415}$
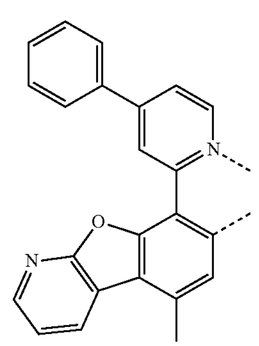

-continued
L$_{B416}$
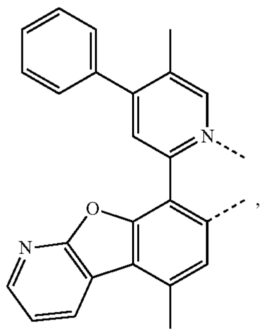
L$_{B417}$
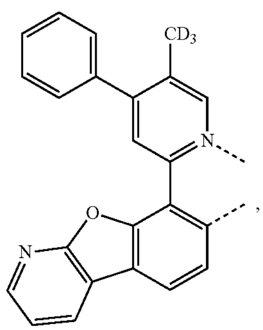
L$_{B418}$
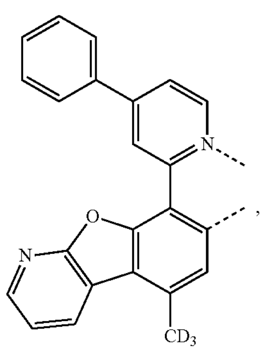
L$_{B419}$
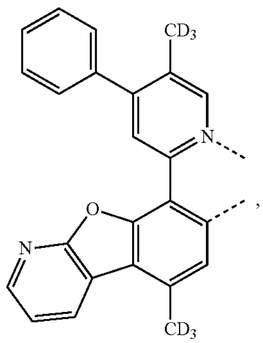
-continued
L$_{B420}$
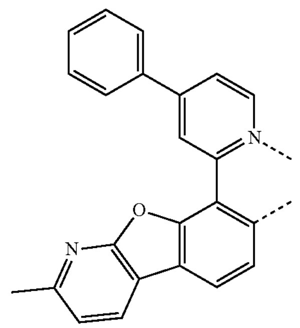
L$_{B421}$
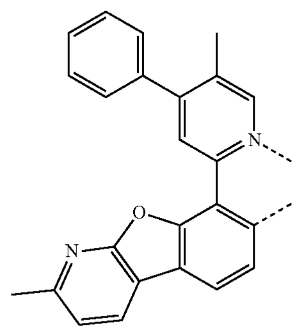
L$_{B422}$
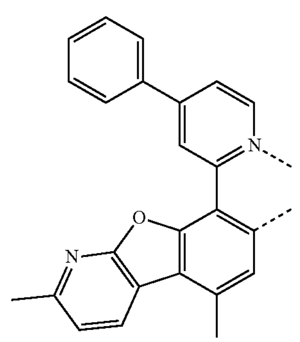
L$_{B423}$
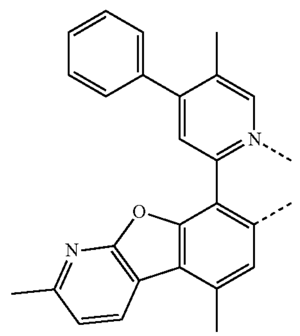

$L_{B424}$
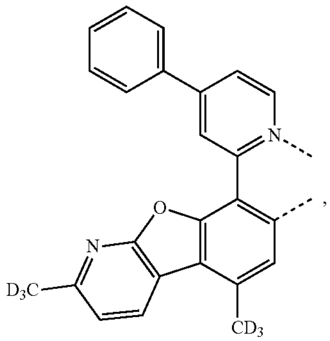
$L_{B425}$
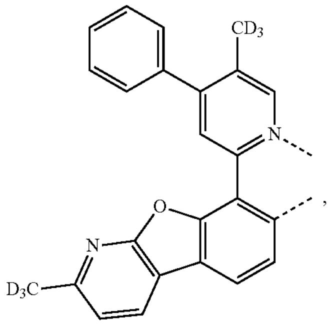
$L_{B426}$
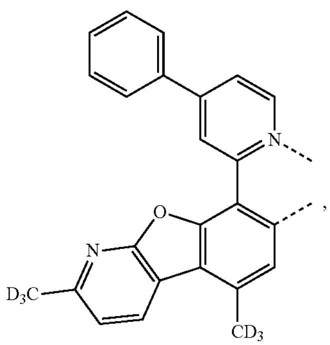
$L_{B427}$
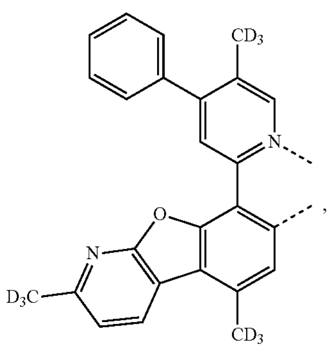
$L_{B428}$
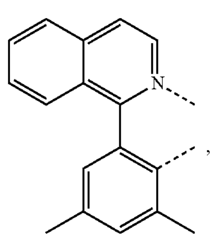
$L_{B429}$
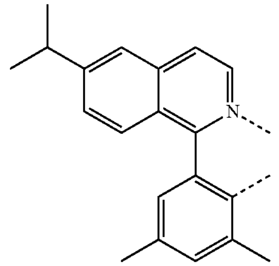
$L_{B430}$
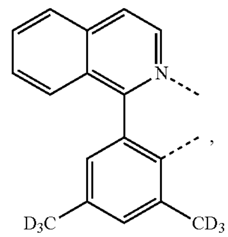
$L_{B431}$
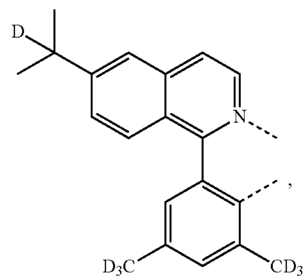
$L_{B432}$
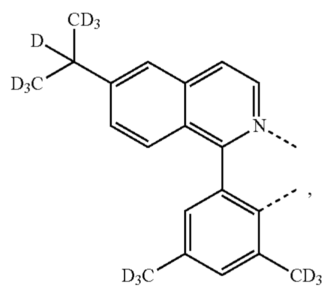
$L_{B433}$
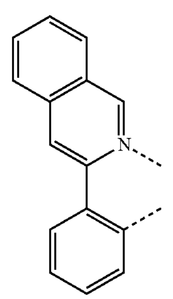

-continued
$L_{B434}$
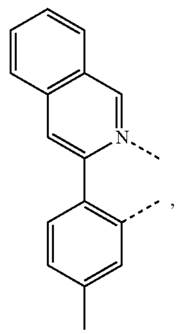
$L_{B435}$
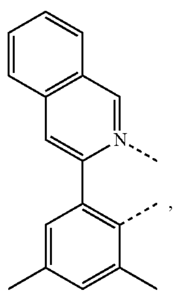
$L_{B436}$
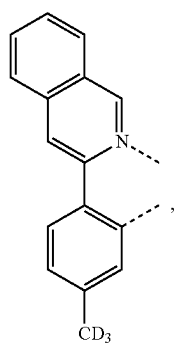
$L_{B437}$
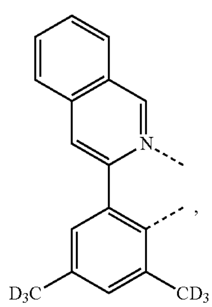
$L_{B438}$
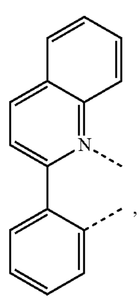
-continued
$L_{B439}$
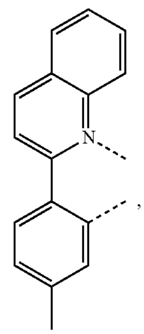
$L_{B440}$
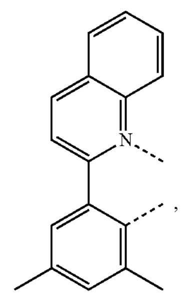
$L_{B441}$
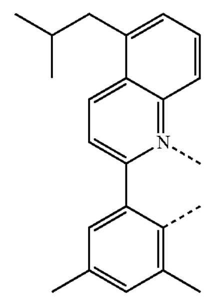
$L_{B442}$
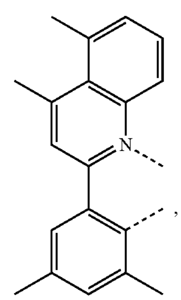
$L_{B443}$
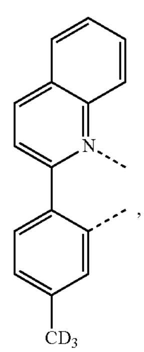

-continued
$L_{B444}$
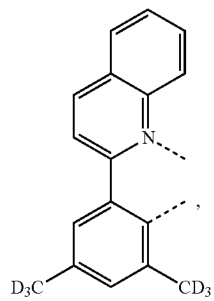
$L_{B445}$
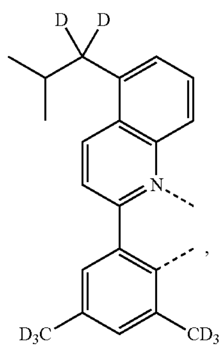
$L_{B446}$
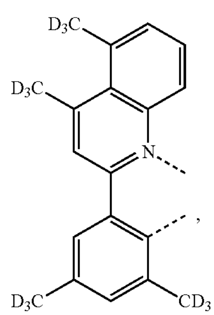
$L_{B447}$
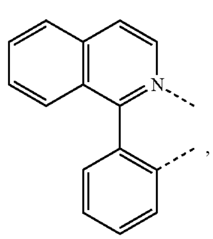
$L_{B448}$
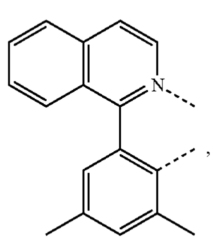
-continued
$L_{B449}$
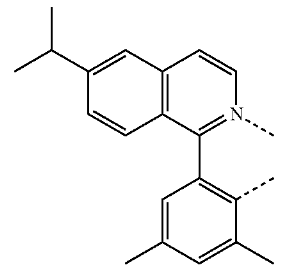
$L_{B450}$
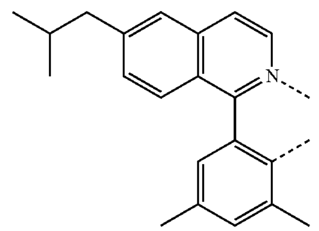
$L_{B451}$
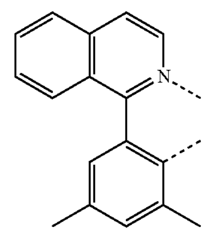
$L_{B452}$
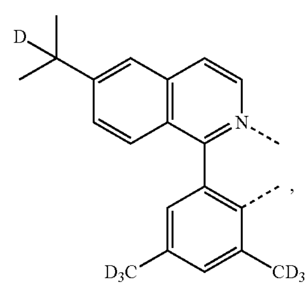
$L_{B453}$
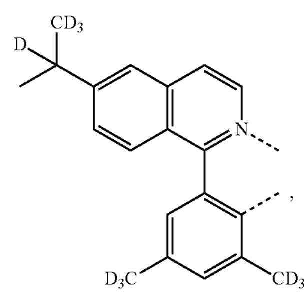
$L_{B454}$
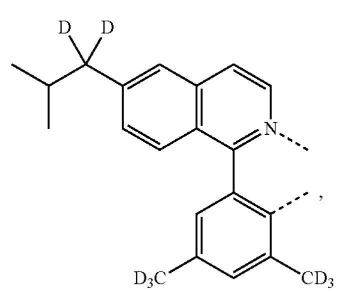

-continued
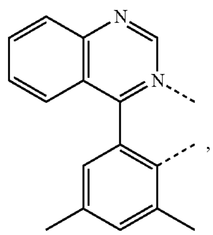
$L_{B455}$
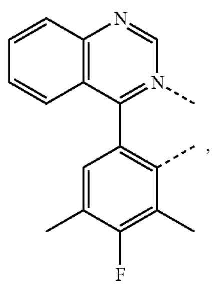
$L_{B456}$
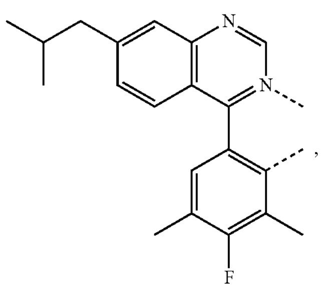
$L_{B457}$
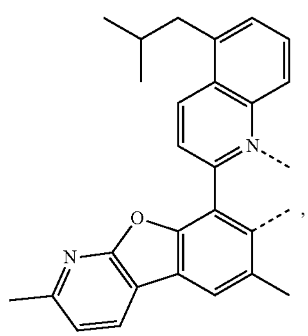
$L_{B458}$
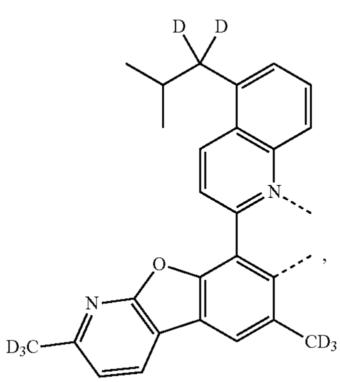
$L_{B459}$
-continued
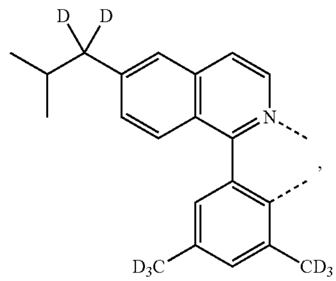
$L_{B460}$
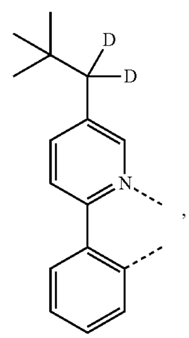
$L_{B461}$
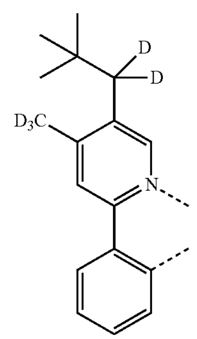
$L_{B462}$
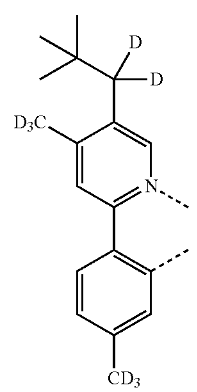
$L_{B463}$
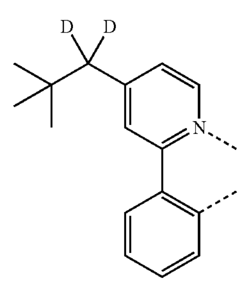
$L_{B464}$ -continued $L_{B465}$

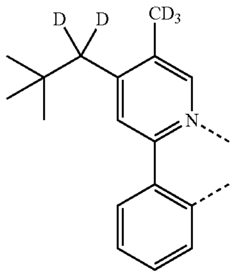

, $L_{B466}$

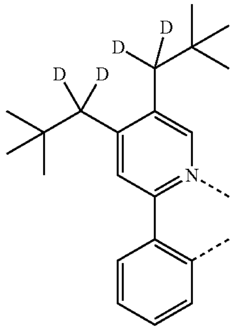

, $L_{B467}$

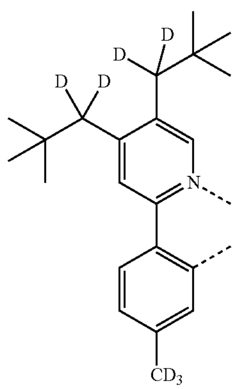

and $L_{B468}$

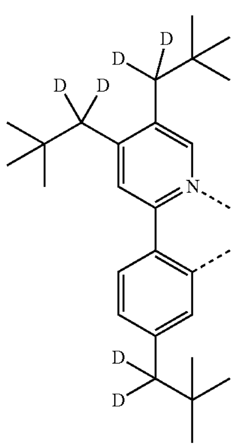

;

and each $L_{Cj}$ has a structure of Formula X

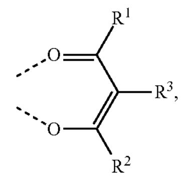

in which $R^1$, $R^2$, and $R^3$ are defined as:

| Ligand | $R^1$ | $R^2$ | $R^3$ |
|---|---|---|---|
| $L_{C1}$ | $R^{D1}$ | $R^{D1}$ | H |
| $L_{C2}$ | $R^{D2}$ | $R^{D2}$ | H |
| $L_{C3}$ | $R^{D3}$ | $R^{D3}$ | H |
| $L_{C4}$ | $R^{D4}$ | $R^{D4}$ | H |
| $L_{C5}$ | $R^{D5}$ | $R^{D5}$ | H |
| $L_{C6}$ | $R^{D6}$ | $R^{D6}$ | H |
| $L_{C7}$ | $R^{D7}$ | $R^{D7}$ | H |
| $L_{C8}$ | $R^{D8}$ | $R^{D8}$ | H |
| $L_{C9}$ | $R^{D9}$ | $R^{D9}$ | H |
| $L_{C10}$ | $R^{D10}$ | $R^{D10}$ | H |
| $L_{C11}$ | $R^{D11}$ | $R^{D11}$ | H |
| $L_{C12}$ | $R^{D12}$ | $R^{D12}$ | H |
| $L_{C13}$ | $R^{D13}$ | $R^{D13}$ | H |
| $L_{C14}$ | $R^{D14}$ | $R^{D14}$ | H |
| $L_{C15}$ | $R^{D15}$ | $R^{D15}$ | H |
| $L_{C16}$ | $R^{D16}$ | $R^{D16}$ | H |
| $L_{C17}$ | $R^{D17}$ | $R^{D17}$ | H |
| $L_{C18}$ | $R^{D18}$ | $R^{D18}$ | H |
| $L_{C19}$ | $R^{D19}$ | $R^{D19}$ | H |
| $L_{C20}$ | $R^{D20}$ | $R^{D20}$ | H |
| $L_{C21}$ | $R^{D21}$ | $R^{D21}$ | H |
| $L_{C22}$ | $R^{D22}$ | $R^{D22}$ | H |
| $L_{C23}$ | $R^{D23}$ | $R^{D23}$ | H |
| $L_{C24}$ | $R^{D24}$ | $R^{D24}$ | H |
| $L_{C25}$ | $R^{D25}$ | $R^{D25}$ | H |
| $L_{C26}$ | $R^{D26}$ | $R^{D26}$ | H |
| $L_{C27}$ | $R^{D27}$ | $R^{D27}$ | H |
| $L_{C28}$ | $R^{D28}$ | $R^{D28}$ | H |
| $L_{C29}$ | $R^{D29}$ | $R^{D29}$ | H |
| $L_{C30}$ | $R^{D30}$ | $R^{D30}$ | H |
| $L_{C31}$ | $R^{D31}$ | $R^{D31}$ | H |
| $L_{C32}$ | $R^{D32}$ | $R^{D32}$ | H |
| $L_{C33}$ | $R^{D33}$ | $R^{D33}$ | H |
| $L_{C34}$ | $R^{D34}$ | $R^{D34}$ | H |
| $L_{C35}$ | $R^{D35}$ | $R^{D35}$ | H |
| $L_{C36}$ | $R^{D40}$ | $R^{D40}$ | H |
| $L_{C37}$ | $R^{D41}$ | $R^{D41}$ | H |
| $L_{C38}$ | $R^{D42}$ | $R^{D42}$ | H |
| $L_{C39}$ | $R^{D64}$ | $R^{D64}$ | H |
| $L_{C40}$ | $R^{D66}$ | $R^{D66}$ | H |
| $L_{C41}$ | $R^{D68}$ | $R^{D68}$ | H |
| $L_{C42}$ | $R^{D76}$ | $R^{D76}$ | H |
| $L_{C43}$ | $R^{D1}$ | $R^{D2}$ | H |
| $L_{C44}$ | $R^{D1}$ | $R^{D3}$ | H |
| $L_{C45}$ | $R^{D1}$ | $R^{D4}$ | H |
| $L_{C46}$ | $R^{D1}$ | $R^{D5}$ | H |
| $L_{C47}$ | $R^{D1}$ | $R^{D6}$ | H |
| $L_{C48}$ | $R^{D1}$ | $R^{D7}$ | H |
| $L_{C49}$ | $R^{D1}$ | $R^{D8}$ | H |
| $L_{C50}$ | $R^{D1}$ | $R^{D9}$ | H |
| $L_{C51}$ | $R^{D1}$ | $R^{D10}$ | H |
| $L_{C52}$ | $R^{D1}$ | $R^{D11}$ | H |
| $L_{C53}$ | $R^{D1}$ | $R^{D12}$ | H |
| $L_{C54}$ | $R^{D1}$ | $R^{D13}$ | H |
| $L_{C55}$ | $R^{D1}$ | $R^{D14}$ | H |
| $L_{C56}$ | $R^{D1}$ | $R^{D15}$ | H |
| $L_{C57}$ | $R^{D1}$ | $R^{D16}$ | H |
| $L_{C58}$ | $R^{D1}$ | $R^{D17}$ | H |
| $L_{C59}$ | $R^{D1}$ | $R^{D18}$ | H |
| $L_{C60}$ | $R^{D1}$ | $R^{D19}$ | H |
| $L_{C61}$ | $R^{D1}$ | $R^{D20}$ | H |
| $L_{C62}$ | $R^{D1}$ | $R^{D21}$ | H |
| $L_{C63}$ | $R^{D1}$ | $R^{D22}$ | H |

-continued

| Ligand | $R^1$ | $R^2$ | $R^3$ |
|---|---|---|---|
| $L_{C64}$ | $R^{D1}$ | $R^{D23}$ | H |
| $L_{C65}$ | $R^{D1}$ | $R^{D24}$ | H |
| $L_{C66}$ | $R^{D1}$ | $R^{D25}$ | H |
| $L_{C67}$ | $R^{D1}$ | $R^{D26}$ | H |
| $L_{C68}$ | $R^{D1}$ | $R^{D27}$ | H |
| $L_{C69}$ | $R^{D1}$ | $R^{D28}$ | H |
| $L_{C70}$ | $R^{D1}$ | $R^{D29}$ | H |
| $L_{C71}$ | $R^{D1}$ | $R^{D30}$ | H |
| $L_{C72}$ | $R^{D1}$ | $R^{D31}$ | H |
| $L_{C73}$ | $R^{D1}$ | $R^{D32}$ | H |
| $L_{C74}$ | $R^{D1}$ | $R^{D33}$ | H |
| $L_{C75}$ | $R^{D1}$ | $R^{D34}$ | H |
| $L_{C76}$ | $R^{D1}$ | $R^{D35}$ | H |
| $L_{C77}$ | $R^{D1}$ | $R^{D40}$ | H |
| $L_{C78}$ | $R^{D1}$ | $R^{D41}$ | H |
| $L_{C79}$ | $R^{D1}$ | $R^{D42}$ | H |
| $L_{C80}$ | $R^{D1}$ | $R^{D64}$ | H |
| $L_{C81}$ | $R^{D1}$ | $R^{D66}$ | H |
| $L_{C82}$ | $R^{D1}$ | $R^{D68}$ | H |
| $L_{C83}$ | $R^{D1}$ | $R^{D76}$ | H |
| $L_{C84}$ | $R^{D2}$ | $R^{D1}$ | H |
| $L_{C85}$ | $R^{D2}$ | $R^{D3}$ | H |
| $L_{C86}$ | $R^{D2}$ | $R^{D4}$ | H |
| $L_{C87}$ | $R^{D2}$ | $R^{D5}$ | H |
| $L_{C88}$ | $R^{D2}$ | $R^{D6}$ | H |
| $L_{C89}$ | $R^{D2}$ | $R^{D7}$ | H |
| $L_{C90}$ | $R^{D2}$ | $R^{D8}$ | H |
| $L_{C91}$ | $R^{D2}$ | $R^{D9}$ | H |
| $L_{C92}$ | $R^{D2}$ | $R^{D10}$ | H |
| $L_{C93}$ | $R^{D2}$ | $R^{D11}$ | H |
| $L_{C94}$ | $R^{D2}$ | $R^{D12}$ | H |
| $L_{C95}$ | $R^{D2}$ | $R^{D13}$ | H |
| $L_{C96}$ | $R^{D2}$ | $R^{D14}$ | H |
| $L_{C97}$ | $R^{D2}$ | $R^{D15}$ | H |
| $L_{C98}$ | $R^{D2}$ | $R^{D16}$ | H |
| $L_{C99}$ | $R^{D2}$ | $R^{D17}$ | H |
| $L_{C100}$ | $R^{D2}$ | $R^{D18}$ | H |
| $L_{C101}$ | $R^{D2}$ | $R^{D19}$ | H |
| $L_{C102}$ | $R^{D2}$ | $R^{D20}$ | H |
| $L_{C103}$ | $R^{D2}$ | $R^{D21}$ | H |
| $L_{C104}$ | $R^{D2}$ | $R^{D22}$ | H |
| $L_{C105}$ | $R^{D2}$ | $R^{D23}$ | H |
| $L_{C106}$ | $R^{D2}$ | $R^{D24}$ | H |
| $L_{C107}$ | $R^{D2}$ | $R^{D25}$ | H |
| $L_{C108}$ | $R^{D2}$ | $R^{D26}$ | H |
| $L_{C109}$ | $R^{D2}$ | $R^{D27}$ | H |
| $L_{C110}$ | $R^{D2}$ | $R^{D28}$ | H |
| $L_{C111}$ | $R^{D2}$ | $R^{D29}$ | H |
| $L_{C112}$ | $R^{D2}$ | $R^{D30}$ | H |
| $L_{C113}$ | $R^{D2}$ | $R^{D31}$ | H |
| $L_{C114}$ | $R^{D2}$ | $R^{D32}$ | H |
| $L_{C115}$ | $R^{D2}$ | $R^{D33}$ | H |
| $L_{C116}$ | $R^{D2}$ | $R^{D34}$ | H |
| $L_{C117}$ | $R^{D2}$ | $R^{D35}$ | H |
| $L_{C118}$ | $R^{D2}$ | $R^{D40}$ | H |
| $L_{C119}$ | $R^{D2}$ | $R^{D41}$ | H |
| $L_{C120}$ | $R^{D2}$ | $R^{D42}$ | H |
| $L_{C121}$ | $R^{D2}$ | $R^{D64}$ | H |
| $L_{C122}$ | $R^{D2}$ | $R^{D66}$ | H |
| $L_{C123}$ | $R^{D2}$ | $R^{D68}$ | H |
| $L_{C124}$ | $R^{D2}$ | $R^{D76}$ | H |
| $L_{C125}$ | $R^{D3}$ | $R^{D4}$ | H |
| $L_{C126}$ | $R^{D3}$ | $R^{D5}$ | H |
| $L_{C127}$ | $R^{D3}$ | $R^{D6}$ | H |
| $L_{C128}$ | $R^{D3}$ | $R^{D7}$ | H |
| $L_{C129}$ | $R^{D3}$ | $R^{D8}$ | H |
| $L_{C130}$ | $R^{D3}$ | $R^{D9}$ | H |
| $L_{C131}$ | $R^{D3}$ | $R^{D10}$ | H |
| $L_{C132}$ | $R^{D3}$ | $R^{D11}$ | H |
| $L_{C133}$ | $R^{D3}$ | $R^{D12}$ | H |
| $L_{C134}$ | $R^{D3}$ | $R^{D13}$ | H |
| $L_{C135}$ | $R^{D3}$ | $R^{D14}$ | H |
| $L_{C136}$ | $R^{D3}$ | $R^{D15}$ | H |
| $L_{C137}$ | $R^{D3}$ | $R^{D16}$ | H |
| $L_{C138}$ | $R^{D3}$ | $R^{D17}$ | H |
| $L_{C139}$ | $R^{D3}$ | $R^{D18}$ | H |
| $L_{C140}$ | $R^{D3}$ | $R^{D19}$ | H |

-continued

| Ligand | $R^1$ | $R^2$ | $R^3$ |
|---|---|---|---|
| $L_{C141}$ | $R^{D3}$ | $R^{D20}$ | H |
| $L_{C142}$ | $R^{D3}$ | $R^{D21}$ | H |
| $L_{C143}$ | $R^{D3}$ | $R^{D22}$ | H |
| $L_{C144}$ | $R^{D3}$ | $R^{D23}$ | H |
| $L_{C145}$ | $R^{D3}$ | $R^{D24}$ | H |
| $L_{C146}$ | $R^{D3}$ | $R^{D25}$ | H |
| $L_{C147}$ | $R^{D3}$ | $R^{D26}$ | H |
| $L_{C148}$ | $R^{D3}$ | $R^{D27}$ | H |
| $L_{C149}$ | $R^{D3}$ | $R^{D28}$ | H |
| $L_{C150}$ | $R^{D3}$ | $R^{D29}$ | H |
| $L_{C151}$ | $R^{D3}$ | $R^{D30}$ | H |
| $L_{C152}$ | $R^{D3}$ | $R^{D31}$ | H |
| $L_{C153}$ | $R^{D3}$ | $R^{D32}$ | H |
| $L_{C154}$ | $R^{D3}$ | $R^{D33}$ | H |
| $L_{C155}$ | $R^{D3}$ | $R^{D34}$ | H |
| $L_{C156}$ | $R^{D3}$ | $R^{D35}$ | H |
| $L_{C157}$ | $R^{D3}$ | $R^{D40}$ | H |
| $L_{C158}$ | $R^{D3}$ | $R^{D41}$ | H |
| $L_{C159}$ | $R^{D3}$ | $R^{D42}$ | H |
| $L_{C160}$ | $R^{D3}$ | $R^{D64}$ | H |
| $L_{C161}$ | $R^{D3}$ | $R^{D66}$ | H |
| $L_{C162}$ | $R^{D3}$ | $R^{D68}$ | H |
| $L_{C163}$ | $R^{D3}$ | $R^{D76}$ | H |
| $L_{C164}$ | $R^{D4}$ | $R^{D5}$ | H |
| $L_{C165}$ | $R^{D4}$ | $R^{D6}$ | H |
| $L_{C166}$ | $R^{D4}$ | $R^{D7}$ | H |
| $L_{C167}$ | $R^{D4}$ | $R^{D8}$ | H |
| $L_{C168}$ | $R^{D4}$ | $R^{D9}$ | H |
| $L_{C169}$ | $R^{D4}$ | $R^{D10}$ | H |
| $L_{C170}$ | $R^{D4}$ | $R^{D11}$ | H |
| $L_{C171}$ | $R^{D4}$ | $R^{D12}$ | H |
| $L_{C172}$ | $R^{D4}$ | $R^{D13}$ | H |
| $L_{C173}$ | $R^{D4}$ | $R^{D14}$ | H |
| $L_{C174}$ | $R^{D4}$ | $R^{D15}$ | H |
| $L_{C175}$ | $R^{D4}$ | $R^{D16}$ | H |
| $L_{C176}$ | $R^{D4}$ | $R^{D17}$ | H |
| $L_{C177}$ | $R^{D4}$ | $R^{D18}$ | H |
| $L_{C178}$ | $R^{D4}$ | $R^{D19}$ | H |
| $L_{C179}$ | $R^{D4}$ | $R^{D20}$ | H |
| $L_{C180}$ | $R^{D4}$ | $R^{D21}$ | H |
| $L_{C181}$ | $R^{D4}$ | $R^{D22}$ | H |
| $L_{C182}$ | $R^{D4}$ | $R^{D23}$ | H |
| $L_{C183}$ | $R^{D4}$ | $R^{D24}$ | H |
| $L_{C184}$ | $R^{D4}$ | $R^{D25}$ | H |
| $L_{C185}$ | $R^{D4}$ | $R^{D26}$ | H |
| $L_{C186}$ | $R^{D4}$ | $R^{D27}$ | H |
| $L_{C187}$ | $R^{D4}$ | $R^{D28}$ | H |
| $L_{C188}$ | $R^{D4}$ | $R^{D29}$ | H |
| $L_{C189}$ | $R^{D4}$ | $R^{D30}$ | H |
| $L_{C190}$ | $R^{D4}$ | $R^{D31}$ | H |
| $L_{C191}$ | $R^{D4}$ | $R^{D32}$ | H |
| $L_{C192}$ | $R^{D4}$ | $R^{D33}$ | H |
| $L_{C193}$ | $R^{D4}$ | $R^{D34}$ | H |
| $L_{C194}$ | $R^{D4}$ | $R^{D35}$ | H |
| $L_{C195}$ | $R^{D4}$ | $R^{D40}$ | H |
| $L_{C196}$ | $R^{D4}$ | $R^{D41}$ | H |
| $L_{C197}$ | $R^{D4}$ | $R^{D42}$ | H |
| $L_{C198}$ | $R^{D4}$ | $R^{D64}$ | H |
| $L_{C199}$ | $R^{D4}$ | $R^{D66}$ | H |
| $L_{C200}$ | $R^{D4}$ | $R^{D68}$ | H |
| $L_{C201}$ | $R^{D4}$ | $R^{D76}$ | H |
| $L_{C202}$ | $R^{D4}$ | $R^{D1}$ | H |
| $L_{C203}$ | $R^{D7}$ | $R^{D5}$ | H |
| $L_{C204}$ | $R^{D7}$ | $R^{D6}$ | H |
| $L_{C205}$ | $R^{D7}$ | $R^{D8}$ | H |
| $L_{C206}$ | $R^{D7}$ | $R^{D9}$ | H |
| $L_{C207}$ | $R^{D7}$ | $R^{D10}$ | H |
| $L_{C208}$ | $R^{D7}$ | $R^{D11}$ | H |
| $L_{C209}$ | $R^{D7}$ | $R^{D12}$ | H |
| $L_{C210}$ | $R^{D7}$ | $R^{D13}$ | H |
| $L_{C211}$ | $R^{D7}$ | $R^{D14}$ | H |
| $L_{C212}$ | $R^{D7}$ | $R^{D15}$ | H |
| $L_{C213}$ | $R^{D7}$ | $R^{D16}$ | H |
| $L_{C214}$ | $R^{D7}$ | $R^{D17}$ | H |
| $L_{C215}$ | $R^{D7}$ | $R^{D18}$ | H |
| $L_{C216}$ | $R^{D7}$ | $R^{D19}$ | H |
| $L_{C217}$ | $R^{D7}$ | $R^{D20}$ | H |

| Ligand | $R^1$ | $R^2$ | $R^3$ |
|---|---|---|---|
| $L_{C218}$ | $R^{D7}$ | $R^{D21}$ | H |
| $L_{C219}$ | $R^{D7}$ | $R^{D22}$ | H |
| $L_{C220}$ | $R^{D7}$ | $R^{D23}$ | H |
| $L_{C221}$ | $R^{D7}$ | $R^{D24}$ | H |
| $L_{C222}$ | $R^{D7}$ | $R^{D25}$ | H |
| $L_{C223}$ | $R^{D7}$ | $R^{D26}$ | H |
| $L_{C224}$ | $R^{D7}$ | $R^{D27}$ | H |
| $L_{C225}$ | $R^{D7}$ | $R^{D28}$ | H |
| $L_{C226}$ | $R^{D7}$ | $R^{D29}$ | H |
| $L_{C227}$ | $R^{D7}$ | $R^{D30}$ | H |
| $L_{C228}$ | $R^{D7}$ | $R^{D31}$ | H |
| $L_{C229}$ | $R^{D7}$ | $R^{D32}$ | H |
| $L_{C230}$ | $R^{D7}$ | $R^{D33}$ | H |
| $L_{C231}$ | $R^{D7}$ | $R^{D34}$ | H |
| $L_{C232}$ | $R^{D7}$ | $R^{D35}$ | H |
| $L_{C233}$ | $R^{D7}$ | $R^{D40}$ | H |
| $L_{C234}$ | $R^{D7}$ | $R^{D41}$ | H |
| $L_{C235}$ | $R^{D7}$ | $R^{D42}$ | H |
| $L_{C236}$ | $R^{D7}$ | $R^{D64}$ | H |
| $L_{C237}$ | $R^{D7}$ | $R^{D66}$ | H |
| $L_{C238}$ | $R^{D7}$ | $R^{D68}$ | H |
| $L_{C239}$ | $R^{D7}$ | $R^{D76}$ | H |
| $L_{C240}$ | $R^{D8}$ | $R^{D5}$ | H |
| $L_{C241}$ | $R^{D8}$ | $R^{D6}$ | H |
| $L_{C242}$ | $R^{D8}$ | $R^{D9}$ | H |
| $L_{C243}$ | $R^{D8}$ | $R^{D10}$ | H |
| $L_{C244}$ | $R^{D8}$ | $R^{D11}$ | H |
| $L_{C245}$ | $R^{D8}$ | $R^{D12}$ | H |
| $L_{C246}$ | $R^{D8}$ | $R^{D13}$ | H |
| $L_{C247}$ | $R^{D8}$ | $R^{D14}$ | H |
| $L_{C248}$ | $R^{D8}$ | $R^{D15}$ | H |
| $L_{C249}$ | $R^{D8}$ | $R^{D16}$ | H |
| $L_{C250}$ | $R^{D8}$ | $R^{D17}$ | H |
| $L_{C251}$ | $R^{D8}$ | $R^{D18}$ | H |
| $L_{C252}$ | $R^{D8}$ | $R^{D19}$ | H |
| $L_{C253}$ | $R^{D8}$ | $R^{D20}$ | H |
| $L_{C254}$ | $R^{D8}$ | $R^{D21}$ | H |
| $L_{C255}$ | $R^{D8}$ | $R^{D22}$ | H |
| $L_{C256}$ | $R^{D8}$ | $R^{D23}$ | H |
| $L_{C257}$ | $R^{D8}$ | $R^{D24}$ | H |
| $L_{C258}$ | $R^{D8}$ | $R^{D25}$ | H |
| $L_{C259}$ | $R^{D8}$ | $R^{D26}$ | H |
| $L_{C260}$ | $R^{D8}$ | $R^{D27}$ | H |
| $L_{C261}$ | $R^{D8}$ | $R^{D28}$ | H |
| $L_{C262}$ | $R^{D8}$ | $R^{D29}$ | H |
| $L_{C263}$ | $R^{D8}$ | $R^{D30}$ | H |
| $L_{C264}$ | $R^{D8}$ | $R^{D31}$ | H |
| $L_{C265}$ | $R^{D8}$ | $R^{D32}$ | H |
| $L_{C266}$ | $R^{D8}$ | $R^{D33}$ | H |
| $L_{C267}$ | $R^{D8}$ | $R^{D34}$ | H |
| $L_{C268}$ | $R^{D8}$ | $R^{D35}$ | H |
| $L_{C269}$ | $R^{D8}$ | $R^{D40}$ | H |
| $L_{C270}$ | $R^{D8}$ | $R^{D41}$ | H |
| $L_{C271}$ | $R^{D8}$ | $R^{D42}$ | H |
| $L_{C272}$ | $R^{D8}$ | $R^{D64}$ | H |
| $L_{C273}$ | $R^{D8}$ | $R^{D66}$ | H |
| $L_{C274}$ | $R^{D8}$ | $R^{D68}$ | H |
| $L_{C275}$ | $R^{D8}$ | $R^{D76}$ | H |
| $L_{C276}$ | $R^{D11}$ | $R^{D5}$ | H |
| $L_{C277}$ | $R^{D11}$ | $R^{D6}$ | H |
| $L_{C278}$ | $R^{D11}$ | $R^{D9}$ | H |
| $L_{C279}$ | $R^{D11}$ | $R^{D10}$ | H |
| $L_{C280}$ | $R^{D11}$ | $R^{D12}$ | H |
| $L_{C281}$ | $R^{D11}$ | $R^{D13}$ | H |
| $L_{C282}$ | $R^{D11}$ | $R^{D14}$ | H |
| $L_{C283}$ | $R^{D11}$ | $R^{D15}$ | H |
| $L_{C284}$ | $R^{D11}$ | $R^{D16}$ | H |
| $L_{C285}$ | $R^{D11}$ | $R^{D17}$ | H |
| $L_{C286}$ | $R^{D11}$ | $R^{D18}$ | H |
| $L_{C287}$ | $R^{D11}$ | $R^{D19}$ | H |
| $L_{C288}$ | $R^{D11}$ | $R^{D20}$ | H |
| $L_{C289}$ | $R^{D11}$ | $R^{D21}$ | H |
| $L_{C290}$ | $R^{D11}$ | $R^{D22}$ | H |
| $L_{C291}$ | $R^{D11}$ | $R^{D23}$ | H |
| $L_{C292}$ | $R^{D11}$ | $R^{D24}$ | H |
| $L_{C293}$ | $R^{D11}$ | $R^{D25}$ | H |
| $L_{C294}$ | $R^{D11}$ | $R^{D26}$ | H |

| Ligand | $R^1$ | $R^2$ | $R^3$ |
|---|---|---|---|
| $L_{C295}$ | $R^{D11}$ | $R^{D27}$ | H |
| $L_{C296}$ | $R^{D11}$ | $R^{D28}$ | H |
| $L_{C297}$ | $R^{D11}$ | $R^{D29}$ | H |
| $L_{C298}$ | $R^{D11}$ | $R^{D30}$ | H |
| $L_{C299}$ | $R^{D11}$ | $R^{D31}$ | H |
| $L_{C300}$ | $R^{D11}$ | $R^{D32}$ | H |
| $L_{C301}$ | $R^{D11}$ | $R^{D33}$ | H |
| $L_{C302}$ | $R^{D11}$ | $R^{D34}$ | H |
| $L_{C303}$ | $R^{D11}$ | $R^{D35}$ | H |
| $L_{C304}$ | $R^{D11}$ | $R^{D40}$ | H |
| $L_{C305}$ | $R^{D11}$ | $R^{D41}$ | H |
| $L_{C306}$ | $R^{D11}$ | $R^{D42}$ | H |
| $L_{C307}$ | $R^{D11}$ | $R^{D64}$ | H |
| $L_{C308}$ | $R^{D11}$ | $R^{D66}$ | H |
| $L_{C309}$ | $R^{D11}$ | $R^{D68}$ | H |
| $L_{C310}$ | $R^{D11}$ | $R^{D76}$ | H |
| $L_{C311}$ | $R^{D13}$ | $R^{D5}$ | H |
| $L_{C312}$ | $R^{D13}$ | $R^{D6}$ | H |
| $L_{C313}$ | $R^{D13}$ | $R^{D9}$ | H |
| $L_{C314}$ | $R^{D13}$ | $R^{D10}$ | H |
| $L_{C315}$ | $R^{D13}$ | $R^{D12}$ | H |
| $L_{C316}$ | $R^{D13}$ | $R^{D14}$ | H |
| $L_{C317}$ | $R^{D13}$ | $R^{D15}$ | H |
| $L_{C318}$ | $R^{D13}$ | $R^{D16}$ | H |
| $L_{C319}$ | $R^{D13}$ | $R^{D17}$ | H |
| $L_{C320}$ | $R^{D13}$ | $R^{D18}$ | H |
| $L_{C321}$ | $R^{D13}$ | $R^{D19}$ | H |
| $L_{C322}$ | $R^{D13}$ | $R^{D20}$ | H |
| $L_{C323}$ | $R^{D13}$ | $R^{D21}$ | H |
| $L_{C324}$ | $R^{D13}$ | $R^{D22}$ | H |
| $L_{C325}$ | $R^{D13}$ | $R^{D23}$ | H |
| $L_{C326}$ | $R^{D13}$ | $R^{D24}$ | H |
| $L_{C327}$ | $R^{D13}$ | $R^{D25}$ | H |
| $L_{C328}$ | $R^{D13}$ | $R^{D26}$ | H |
| $L_{C329}$ | $R^{D13}$ | $R^{D27}$ | H |
| $L_{C330}$ | $R^{D13}$ | $R^{D28}$ | H |
| $L_{C331}$ | $R^{D13}$ | $R^{D29}$ | H |
| $L_{C332}$ | $R^{D13}$ | $R^{D30}$ | H |
| $L_{C333}$ | $R^{D13}$ | $R^{D31}$ | H |
| $L_{C334}$ | $R^{D13}$ | $R^{D32}$ | H |
| $L_{C335}$ | $R^{D13}$ | $R^{D33}$ | H |
| $L_{C336}$ | $R^{D13}$ | $R^{D34}$ | H |
| $L_{C337}$ | $R^{D13}$ | $R^{D35}$ | H |
| $L_{C338}$ | $R^{D13}$ | $R^{D40}$ | H |
| $L_{C339}$ | $R^{D13}$ | $R^{D41}$ | H |
| $L_{C340}$ | $R^{D13}$ | $R^{D42}$ | H |
| $L_{C341}$ | $R^{D13}$ | $R^{D64}$ | H |
| $L_{C342}$ | $R^{D13}$ | $R^{D66}$ | H |
| $L_{C343}$ | $R^{D13}$ | $R^{D68}$ | H |
| $L_{C344}$ | $R^{D13}$ | $R^{D76}$ | H |
| $L_{C345}$ | $R^{D14}$ | $R^{D5}$ | H |
| $L_{C346}$ | $R^{D14}$ | $R^{D6}$ | H |
| $L_{C347}$ | $R^{D14}$ | $R^{D9}$ | H |
| $L_{C348}$ | $R^{D14}$ | $R^{D10}$ | H |
| $L_{C349}$ | $R^{D14}$ | $R^{D12}$ | H |
| $L_{C350}$ | $R^{D14}$ | $R^{D15}$ | H |
| $L_{C351}$ | $R^{D14}$ | $R^{D16}$ | H |
| $L_{C352}$ | $R^{D14}$ | $R^{D17}$ | H |
| $L_{C353}$ | $R^{D14}$ | $R^{D18}$ | H |
| $L_{C354}$ | $R^{D14}$ | $R^{D19}$ | H |
| $L_{C355}$ | $R^{D14}$ | $R^{D20}$ | H |
| $L_{C356}$ | $R^{D14}$ | $R^{D21}$ | H |
| $L_{C357}$ | $R^{D14}$ | $R^{D22}$ | H |
| $L_{C358}$ | $R^{D14}$ | $R^{D23}$ | H |
| $L_{C359}$ | $R^{D14}$ | $R^{D24}$ | H |
| $L_{C360}$ | $R^{D14}$ | $R^{D25}$ | H |
| $L_{C361}$ | $R^{D14}$ | $R^{D26}$ | H |
| $L_{C362}$ | $R^{D14}$ | $R^{D27}$ | H |
| $L_{C363}$ | $R^{D14}$ | $R^{D28}$ | H |
| $L_{C364}$ | $R^{D14}$ | $R^{D29}$ | H |
| $L_{C365}$ | $R^{D14}$ | $R^{D30}$ | H |
| $L_{C366}$ | $R^{D14}$ | $R^{D31}$ | H |
| $L_{C367}$ | $R^{D14}$ | $R^{D32}$ | H |
| $L_{C368}$ | $R^{D14}$ | $R^{D33}$ | H |
| $L_{C369}$ | $R^{D14}$ | $R^{D34}$ | H |
| $L_{C370}$ | $R^{D14}$ | $R^{D35}$ | H |
| $L_{C371}$ | $R^{D14}$ | $R^{D40}$ | H |

-continued

| Ligand | $R^1$ | $R^2$ | $R^3$ |
|---|---|---|---|
| $L_{C372}$ | $R^{D14}$ | $R^{D41}$ | H |
| $L_{C373}$ | $R^{D14}$ | $R^{D42}$ | H |
| $L_{C374}$ | $R^{D14}$ | $R^{D64}$ | H |
| $L_{C375}$ | $R^{D14}$ | $R^{D66}$ | H |
| $L_{C376}$ | $R^{D14}$ | $R^{D68}$ | H |
| $L_{C377}$ | $R^{D14}$ | $R^{D76}$ | H |
| $L_{C378}$ | $R^{D22}$ | $R^{D5}$ | H |
| $L_{C379}$ | $R^{D22}$ | $R^{D6}$ | H |
| $L_{C380}$ | $R^{D22}$ | $R^{D9}$ | H |
| $L_{C381}$ | $R^{D22}$ | $R^{D10}$ | H |
| $L_{C382}$ | $R^{D22}$ | $R^{D12}$ | H |
| $L_{C383}$ | $R^{D22}$ | $R^{D15}$ | H |
| $L_{C384}$ | $R^{D22}$ | $R^{D16}$ | H |
| $L_{C385}$ | $R^{D22}$ | $R^{D17}$ | H |
| $L_{C386}$ | $R^{D22}$ | $R^{D18}$ | H |
| $L_{C387}$ | $R^{D22}$ | $R^{D19}$ | H |
| $L_{C388}$ | $R^{D22}$ | $R^{D20}$ | H |
| $L_{C389}$ | $R^{D22}$ | $R^{D21}$ | H |
| $L_{C390}$ | $R^{D22}$ | $R^{D23}$ | H |
| $L_{C391}$ | $R^{D22}$ | $R^{D24}$ | H |
| $L_{C392}$ | $R^{D22}$ | $R^{D25}$ | H |
| $L_{C393}$ | $R^{D22}$ | $R^{D26}$ | H |
| $L_{C394}$ | $R^{D22}$ | $R^{D27}$ | H |
| $L_{C395}$ | $R^{D22}$ | $R^{D28}$ | H |
| $L_{C396}$ | $R^{D22}$ | $R^{D29}$ | H |
| $L_{C397}$ | $R^{D22}$ | $R^{D30}$ | H |
| $L_{C398}$ | $R^{D22}$ | $R^{D31}$ | H |
| $L_{C399}$ | $R^{D22}$ | $R^{D32}$ | H |
| $L_{C400}$ | $R^{D22}$ | $R^{D33}$ | H |
| $L_{C401}$ | $R^{D22}$ | $R^{D34}$ | H |
| $L_{C402}$ | $R^{D22}$ | $R^{D35}$ | H |
| $L_{C403}$ | $R^{D22}$ | $R^{D40}$ | H |
| $L_{C404}$ | $R^{D22}$ | $R^{D41}$ | H |
| $L_{C405}$ | $R^{D22}$ | $R^{D42}$ | H |
| $L_{C406}$ | $R^{D22}$ | $R^{D64}$ | H |
| $L_{C407}$ | $R^{D22}$ | $R^{D66}$ | H |
| $L_{C408}$ | $R^{D22}$ | $R^{D68}$ | H |
| $L_{C409}$ | $R^{D22}$ | $R^{D76}$ | H |
| $L_{C410}$ | $R^{D26}$ | $R^{D5}$ | H |
| $L_{C411}$ | $R^{D26}$ | $R^{D6}$ | H |
| $L_{C412}$ | $R^{D26}$ | $R^{D9}$ | H |
| $L_{C413}$ | $R^{D26}$ | $R^{D10}$ | H |
| $L_{C414}$ | $R^{D26}$ | $R^{D12}$ | H |
| $L_{C415}$ | $R^{D26}$ | $R^{D15}$ | H |
| $L_{C416}$ | $R^{D26}$ | $R^{D16}$ | H |
| $L_{C417}$ | $R^{D26}$ | $R^{D17}$ | H |
| $L_{C418}$ | $R^{D26}$ | $R^{D18}$ | H |
| $L_{C419}$ | $R^{D26}$ | $R^{D19}$ | H |
| $L_{C420}$ | $R^{D26}$ | $R^{D20}$ | H |
| $L_{C421}$ | $R^{D26}$ | $R^{D21}$ | H |
| $L_{C422}$ | $R^{D26}$ | $R^{D23}$ | H |
| $L_{C423}$ | $R^{D26}$ | $R^{D24}$ | H |
| $L_{C424}$ | $R^{D26}$ | $R^{D25}$ | H |
| $L_{C425}$ | $R^{D26}$ | $R^{D27}$ | H |
| $L_{C426}$ | $R^{D26}$ | $R^{D28}$ | H |
| $L_{C427}$ | $R^{D26}$ | $R^{D29}$ | H |
| $L_{C428}$ | $R^{D26}$ | $R^{D30}$ | H |
| $L_{C429}$ | $R^{D26}$ | $R^{D31}$ | H |
| $L_{C430}$ | $R^{D26}$ | $R^{D32}$ | H |
| $L_{C431}$ | $R^{D26}$ | $R^{D33}$ | H |
| $L_{C432}$ | $R^{D26}$ | $R^{D34}$ | H |
| $L_{C433}$ | $R^{D26}$ | $R^{D35}$ | H |
| $L_{C434}$ | $R^{D26}$ | $R^{D40}$ | H |
| $L_{C435}$ | $R^{D26}$ | $R^{D41}$ | H |
| $L_{C436}$ | $R^{D26}$ | $R^{D42}$ | H |
| $L_{C437}$ | $R^{D26}$ | $R^{D64}$ | H |
| $L_{C438}$ | $R^{D26}$ | $R^{D66}$ | H |
| $L_{C439}$ | $R^{D26}$ | $R^{D68}$ | H |
| $L_{C440}$ | $R^{D26}$ | $R^{D76}$ | H |
| $L_{C441}$ | $R^{D35}$ | $R^{D5}$ | H |
| $L_{C442}$ | $R^{D35}$ | $R^{D6}$ | H |
| $L_{C443}$ | $R^{D35}$ | $R^{D9}$ | H |
| $L_{C444}$ | $R^{D35}$ | $R^{D10}$ | H |
| $L_{C445}$ | $R^{D35}$ | $R^{D12}$ | H |
| $L_{C446}$ | $R^{D35}$ | $R^{D15}$ | H |
| $L_{C447}$ | $R^{D35}$ | $R^{D16}$ | H |
| $L_{C448}$ | $R^{D35}$ | $R^{D17}$ | H |

-continued

| Ligand | $R^1$ | $R^2$ | $R^3$ |
|---|---|---|---|
| $L_{C449}$ | $R^{D35}$ | $R^{D18}$ | H |
| $L_{C450}$ | $R^{D35}$ | $R^{D19}$ | H |
| $L_{C451}$ | $R^{D35}$ | $R^{D20}$ | H |
| $L_{C452}$ | $R^{D35}$ | $R^{D21}$ | H |
| $L_{C453}$ | $R^{D35}$ | $R^{D23}$ | H |
| $L_{C454}$ | $R^{D35}$ | $R^{D24}$ | H |
| $L_{C455}$ | $R^{D35}$ | $R^{D25}$ | H |
| $L_{C456}$ | $R^{D35}$ | $R^{D27}$ | H |
| $L_{C457}$ | $R^{D35}$ | $R^{D28}$ | H |
| $L_{C458}$ | $R^{D35}$ | $R^{D29}$ | H |
| $L_{C459}$ | $R^{D35}$ | $R^{D30}$ | H |
| $L_{C460}$ | $R^{D35}$ | $R^{D31}$ | H |
| $L_{C461}$ | $R^{D35}$ | $R^{D32}$ | H |
| $L_{C462}$ | $R^{D35}$ | $R^{D33}$ | H |
| $L_{C463}$ | $R^{D35}$ | $R^{D34}$ | H |
| $L_{C464}$ | $R^{D35}$ | $R^{D40}$ | H |
| $L_{C465}$ | $R^{D35}$ | $R^{D41}$ | H |
| $L_{C466}$ | $R^{D35}$ | $R^{D42}$ | H |
| $L_{C467}$ | $R^{D35}$ | $R^{D64}$ | H |
| $L_{C468}$ | $R^{D35}$ | $R^{D66}$ | H |
| $L_{C469}$ | $R^{D35}$ | $R^{D68}$ | H |
| $L_{C470}$ | $R^{D35}$ | $R^{D76}$ | H |
| $L_{C471}$ | $R^{D40}$ | $R^{D5}$ | H |
| $L_{C472}$ | $R^{D40}$ | $R^{D6}$ | H |
| $L_{C473}$ | $R^{D40}$ | $R^{D9}$ | H |
| $L_{C474}$ | $R^{D40}$ | $R^{D10}$ | H |
| $L_{C475}$ | $R^{D40}$ | $R^{D12}$ | H |
| $L_{C476}$ | $R^{D40}$ | $R^{D15}$ | H |
| $L_{C477}$ | $R^{D40}$ | $R^{D16}$ | H |
| $L_{C478}$ | $R^{D40}$ | $R^{D17}$ | H |
| $L_{C479}$ | $R^{D40}$ | $R^{D18}$ | H |
| $L_{C480}$ | $R^{D40}$ | $R^{D19}$ | H |
| $L_{C481}$ | $R^{D40}$ | $R^{D20}$ | H |
| $L_{C482}$ | $R^{D40}$ | $R^{D21}$ | H |
| $L_{C483}$ | $R^{D40}$ | $R^{D23}$ | H |
| $L_{C484}$ | $R^{D40}$ | $R^{D24}$ | H |
| $L_{C485}$ | $R^{D40}$ | $R^{D25}$ | H |
| $L_{C486}$ | $R^{D40}$ | $R^{D27}$ | H |
| $L_{C487}$ | $R^{D40}$ | $R^{D28}$ | H |
| $L_{C488}$ | $R^{D40}$ | $R^{D29}$ | H |
| $L_{C489}$ | $R^{D40}$ | $R^{D30}$ | H |
| $L_{C490}$ | $R^{D40}$ | $R^{D31}$ | H |
| $L_{C491}$ | $R^{D40}$ | $R^{D32}$ | H |
| $L_{C492}$ | $R^{D40}$ | $R^{D33}$ | H |
| $L_{C493}$ | $R^{D40}$ | $R^{D34}$ | H |
| $L_{C494}$ | $R^{D40}$ | $R^{D41}$ | H |
| $L_{C495}$ | $R^{D40}$ | $R^{D42}$ | H |
| $L_{C496}$ | $R^{D40}$ | $R^{D64}$ | H |
| $L_{C497}$ | $R^{D40}$ | $R^{D66}$ | H |
| $L_{C498}$ | $R^{D40}$ | $R^{D68}$ | H |
| $L_{C499}$ | $R^{D40}$ | $R^{D76}$ | H |
| $L_{C500}$ | $R^{D41}$ | $R^{D5}$ | H |
| $L_{C501}$ | $R^{D41}$ | $R^{D6}$ | H |
| $L_{C502}$ | $R^{D41}$ | $R^{D9}$ | H |
| $L_{C503}$ | $R^{D41}$ | $R^{D10}$ | H |
| $L_{C504}$ | $R^{D41}$ | $R^{D12}$ | H |
| $L_{C505}$ | $R^{D41}$ | $R^{D15}$ | H |
| $L_{C506}$ | $R^{D41}$ | $R^{D16}$ | H |
| $L_{C507}$ | $R^{D41}$ | $R^{D17}$ | H |
| $L_{C508}$ | $R^{D41}$ | $R^{D18}$ | H |
| $L_{C509}$ | $R^{D41}$ | $R^{D19}$ | H |
| $L_{C510}$ | $R^{D41}$ | $R^{D20}$ | H |
| $L_{C511}$ | $R^{D41}$ | $R^{D21}$ | H |
| $L_{C512}$ | $R^{D41}$ | $R^{D23}$ | H |
| $L_{C513}$ | $R^{D41}$ | $R^{D24}$ | H |
| $L_{C514}$ | $R^{D41}$ | $R^{D25}$ | H |
| $L_{C515}$ | $R^{D41}$ | $R^{D27}$ | H |
| $L_{C516}$ | $R^{D41}$ | $R^{D28}$ | H |
| $L_{C517}$ | $R^{D41}$ | $R^{D29}$ | H |
| $L_{C518}$ | $R^{D41}$ | $R^{D30}$ | H |
| $L_{C519}$ | $R^{D41}$ | $R^{D31}$ | H |
| $L_{C520}$ | $R^{D41}$ | $R^{D32}$ | H |
| $L_{C521}$ | $R^{D41}$ | $R^{D33}$ | H |
| $L_{C522}$ | $R^{D41}$ | $R^{D34}$ | H |
| $L_{C523}$ | $R^{D41}$ | $R^{D42}$ | H |
| $L_{C524}$ | $R^{D41}$ | $R^{D64}$ | H |
| $L_{C525}$ | $R^{D41}$ | $R^{D66}$ | H |

-continued

| Ligand | $R^1$ | $R^2$ | $R^3$ |
|---|---|---|---|
| $L_{C526}$ | $R^{D41}$ | $R^{D68}$ | H |
| $L_{C527}$ | $R^{D41}$ | $R^{D76}$ | H |
| $L_{C528}$ | $R^{D64}$ | $R^{D5}$ | H |
| $L_{C529}$ | $R^{D64}$ | $R^{D6}$ | H |
| $L_{C530}$ | $R^{D64}$ | $R^{D9}$ | H |
| $L_{C531}$ | $R^{D64}$ | $R^{D10}$ | H |
| $L_{C532}$ | $R^{D64}$ | $R^{D12}$ | H |
| $L_{C533}$ | $R^{D64}$ | $R^{D15}$ | H |
| $L_{C534}$ | $R^{D64}$ | $R^{D16}$ | H |
| $L_{C535}$ | $R^{D64}$ | $R^{D17}$ | H |
| $L_{C536}$ | $R^{D64}$ | $R^{D18}$ | H |
| $L_{C537}$ | $R^{D64}$ | $R^{D19}$ | H |
| $L_{C538}$ | $R^{D64}$ | $R^{D20}$ | H |
| $L_{C539}$ | $R^{D64}$ | $R^{D21}$ | H |
| $L_{C540}$ | $R^{D64}$ | $R^{D23}$ | H |
| $L_{C541}$ | $R^{D64}$ | $R^{D24}$ | H |
| $L_{C542}$ | $R^{D64}$ | $R^{D25}$ | H |
| $L_{C543}$ | $R^{D64}$ | $R^{D27}$ | H |
| $L_{C544}$ | $R^{D64}$ | $R^{D28}$ | H |
| $L_{C545}$ | $R^{D64}$ | $R^{D29}$ | H |
| $L_{C546}$ | $R^{D64}$ | $R^{D30}$ | H |
| $L_{C547}$ | $R^{D64}$ | $R^{D31}$ | H |
| $L_{C548}$ | $R^{D64}$ | $R^{D32}$ | H |
| $L_{C549}$ | $R^{D64}$ | $R^{D33}$ | H |
| $L_{C550}$ | $R^{D64}$ | $R^{D34}$ | H |
| $L_{C551}$ | $R^{D64}$ | $R^{D42}$ | H |
| $L_{C552}$ | $R^{D64}$ | $R^{D64}$ | H |
| $L_{C553}$ | $R^{D64}$ | $R^{D66}$ | H |
| $L_{C554}$ | $R^{D64}$ | $R^{D68}$ | H |
| $L_{C555}$ | $R^{D64}$ | $R^{D76}$ | H |
| $L_{C556}$ | $R^{D66}$ | $R^{D5}$ | H |
| $L_{C557}$ | $R^{D66}$ | $R^{D6}$ | H |
| $L_{C558}$ | $R^{D66}$ | $R^{D9}$ | H |
| $L_{C559}$ | $R^{D66}$ | $R^{D10}$ | H |
| $L_{C560}$ | $R^{D66}$ | $R^{D12}$ | H |
| $L_{C561}$ | $R^{D66}$ | $R^{D15}$ | H |
| $L_{C562}$ | $R^{D66}$ | $R^{D16}$ | H |
| $L_{C563}$ | $R^{D66}$ | $R^{D17}$ | H |
| $L_{C564}$ | $R^{D66}$ | $R^{D18}$ | H |
| $L_{C565}$ | $R^{D66}$ | $R^{D19}$ | H |
| $L_{C566}$ | $R^{D66}$ | $R^{D20}$ | H |
| $L_{C567}$ | $R^{D66}$ | $R^{D21}$ | H |
| $L_{C568}$ | $R^{D66}$ | $R^{D23}$ | H |
| $L_{C569}$ | $R^{D66}$ | $R^{D24}$ | H |
| $L_{C570}$ | $R^{D66}$ | $R^{D25}$ | H |
| $L_{C571}$ | $R^{D66}$ | $R^{D27}$ | H |
| $L_{C572}$ | $R^{D66}$ | $R^{D28}$ | H |
| $L_{C573}$ | $R^{D66}$ | $R^{D29}$ | H |
| $L_{C574}$ | $R^{D66}$ | $R^{D30}$ | H |
| $L_{C575}$ | $R^{D66}$ | $R^{D31}$ | H |
| $L_{C576}$ | $R^{D66}$ | $R^{D32}$ | H |
| $L_{C577}$ | $R^{D66}$ | $R^{D33}$ | H |
| $L_{C578}$ | $R^{D66}$ | $R^{D34}$ | H |
| $L_{C579}$ | $R^{D66}$ | $R^{D42}$ | H |
| $L_{C580}$ | $R^{D66}$ | $R^{D68}$ | H |
| $L_{C581}$ | $R^{D66}$ | $R^{D76}$ | H |
| $L_{C582}$ | $R^{D68}$ | $R^{D5}$ | H |
| $L_{C583}$ | $R^{D68}$ | $R^{D6}$ | H |
| $L_{C584}$ | $R^{D68}$ | $R^{D9}$ | H |
| $L_{C585}$ | $R^{D68}$ | $R^{D10}$ | H |
| $L_{C586}$ | $R^{D68}$ | $R^{D12}$ | H |
| $L_{C587}$ | $R^{D68}$ | $R^{D15}$ | H |
| $L_{C588}$ | $R^{D68}$ | $R^{D16}$ | H |
| $L_{C589}$ | $R^{D68}$ | $R^{D17}$ | H |
| $L_{C590}$ | $R^{D68}$ | $R^{D18}$ | H |
| $L_{C591}$ | $R^{D68}$ | $R^{D19}$ | H |
| $L_{C592}$ | $R^{D68}$ | $R^{D20}$ | H |
| $L_{C593}$ | $R^{D68}$ | $R^{D21}$ | H |
| $L_{C594}$ | $R^{D68}$ | $R^{D23}$ | H |
| $L_{C595}$ | $R^{D68}$ | $R^{D24}$ | H |
| $L_{C596}$ | $R^{D68}$ | $R^{D25}$ | H |
| $L_{C597}$ | $R^{D68}$ | $R^{D27}$ | H |
| $L_{C598}$ | $R^{D68}$ | $R^{D28}$ | H |
| $L_{C599}$ | $R^{D68}$ | $R^{D29}$ | H |
| $L_{C600}$ | $R^{D68}$ | $R^{D30}$ | H |
| $L_{C601}$ | $R^{D68}$ | $R^{D31}$ | H |
| $L_{C602}$ | $R^{D68}$ | $R^{D32}$ | H |

-continued

| Ligand | $R^1$ | $R^2$ | $R^3$ |
|---|---|---|---|
| $L_{C603}$ | $R^{D68}$ | $R^{D33}$ | H |
| $L_{C604}$ | $R^{D68}$ | $R^{D34}$ | H |
| $L_{C605}$ | $R^{D68}$ | $R^{D42}$ | H |
| $L_{C606}$ | $R^{D68}$ | $R^{D76}$ | H |
| $L_{C607}$ | $R^{D76}$ | $R^{D5}$ | H |
| $L_{C608}$ | $R^{D76}$ | $R^{D6}$ | H |
| $L_{C609}$ | $R^{D76}$ | $R^{D9}$ | H |
| $L_{C610}$ | $R^{D76}$ | $R^{D10}$ | H |
| $L_{C611}$ | $R^{D76}$ | $R^{D12}$ | H |
| $L_{C612}$ | $R^{D76}$ | $R^{D15}$ | H |
| $L_{C613}$ | $R^{D76}$ | $R^{D16}$ | H |
| $L_{C614}$ | $R^{D76}$ | $R^{D17}$ | H |
| $L_{C615}$ | $R^{D76}$ | $R^{D18}$ | H |
| $L_{C616}$ | $R^{D76}$ | $R^{D19}$ | H |
| $L_{C617}$ | $R^{D76}$ | $R^{D20}$ | H |
| $L_{C618}$ | $R^{D76}$ | $R^{D21}$ | H |
| $L_{C619}$ | $R^{D76}$ | $R^{D23}$ | H |
| $L_{C620}$ | $R^{D76}$ | $R^{D24}$ | H |
| $L_{C621}$ | $R^{D76}$ | $R^{D25}$ | H |
| $L_{C622}$ | $R^{D76}$ | $R^{D27}$ | H |
| $L_{C623}$ | $R^{D76}$ | $R^{D28}$ | H |
| $L_{C624}$ | $R^{D76}$ | $R^{D29}$ | H |
| $L_{C625}$ | $R^{D76}$ | $R^{D30}$ | H |
| $L_{C626}$ | $R^{D76}$ | $R^{D31}$ | H |
| $L_{C627}$ | $R^{D76}$ | $R^{D32}$ | H |
| $L_{C628}$ | $R^{D76}$ | $R^{D33}$ | H |
| $L_{C629}$ | $R^{D76}$ | $R^{D34}$ | H |
| $L_{C630}$ | $R^{D76}$ | $R^{D42}$ | H |
| $L_{C631}$ | $R^{D1}$ | $R^{D1}$ | $R^{D1}$ |
| $L_{C632}$ | $R^{D2}$ | $R^{D2}$ | $R^{D1}$ |
| $L_{C633}$ | $R^{D3}$ | $R^{D3}$ | $R^{D1}$ |
| $L_{C634}$ | $R^{D4}$ | $R^{D4}$ | $R^{D1}$ |
| $L_{C635}$ | $R^{D5}$ | $R^{D5}$ | $R^{D1}$ |
| $L_{C636}$ | $R^{D6}$ | $R^{D6}$ | $R^{D1}$ |
| $L_{C637}$ | $R^{D7}$ | $R^{D7}$ | $R^{D1}$ |
| $L_{C638}$ | $R^{D8}$ | $R^{D8}$ | $R^{D1}$ |
| $L_{C639}$ | $R^{D9}$ | $R^{D9}$ | $R^{D1}$ |
| $L_{C640}$ | $R^{D10}$ | $R^{D10}$ | $R^{D1}$ |
| $L_{C641}$ | $R^{D11}$ | $R^{D11}$ | $R^{D1}$ |
| $L_{C642}$ | $R^{D12}$ | $R^{D12}$ | $R^{D1}$ |
| $L_{C643}$ | $R^{D13}$ | $R^{D13}$ | $R^{D1}$ |
| $L_{C644}$ | $R^{D14}$ | $R^{D14}$ | $R^{D1}$ |
| $L_{C645}$ | $R^{D15}$ | $R^{D15}$ | $R^{D1}$ |
| $L_{C646}$ | $R^{D16}$ | $R^{D16}$ | $R^{D1}$ |
| $L_{C647}$ | $R^{D17}$ | $R^{D17}$ | $R^{D1}$ |
| $L_{C648}$ | $R^{D18}$ | $R^{D18}$ | $R^{D1}$ |
| $L_{C649}$ | $R^{D19}$ | $R^{D19}$ | $R^{D1}$ |
| $L_{C650}$ | $R^{D20}$ | $R^{D20}$ | $R^{D1}$ |
| $L_{C651}$ | $R^{D21}$ | $R^{D21}$ | $R^{D1}$ |
| $L_{C652}$ | $R^{D22}$ | $R^{D22}$ | $R^{D1}$ |
| $L_{C653}$ | $R^{D23}$ | $R^{D23}$ | $R^{D1}$ |
| $L_{C654}$ | $R^{D24}$ | $R^{D24}$ | $R^{D1}$ |
| $L_{C655}$ | $R^{D25}$ | $R^{D25}$ | $R^{D1}$ |
| $L_{C656}$ | $R^{D26}$ | $R^{D26}$ | $R^{D1}$ |
| $L_{C657}$ | $R^{D27}$ | $R^{D27}$ | $R^{D1}$ |
| $L_{C658}$ | $R^{D28}$ | $R^{D28}$ | $R^{D1}$ |
| $L_{C659}$ | $R^{D29}$ | $R^{D29}$ | $R^{D1}$ |
| $L_{C660}$ | $R^{D30}$ | $R^{D30}$ | $R^{D1}$ |
| $L_{C661}$ | $R^{D31}$ | $R^{D31}$ | $R^{D1}$ |
| $L_{C662}$ | $R^{D32}$ | $R^{D32}$ | $R^{D1}$ |
| $L_{C663}$ | $R^{D33}$ | $R^{D33}$ | $R^{D1}$ |
| $L_{C664}$ | $R^{D34}$ | $R^{D34}$ | $R^{D1}$ |
| $L_{C665}$ | $R^{D35}$ | $R^{D35}$ | $R^{D1}$ |
| $L_{C666}$ | $R^{D40}$ | $R^{D40}$ | $R^{D1}$ |
| $L_{C667}$ | $R^{D41}$ | $R^{D41}$ | $R^{D1}$ |
| $L_{C668}$ | $R^{D42}$ | $R^{D42}$ | $R^{D1}$ |
| $L_{C669}$ | $R^{D64}$ | $R^{D64}$ | $R^{D1}$ |
| $L_{C670}$ | $R^{D66}$ | $R^{D66}$ | $R^{D1}$ |
| $L_{C671}$ | $R^{D68}$ | $R^{D68}$ | $R^{D1}$ |
| $L_{C672}$ | $R^{D76}$ | $R^{D76}$ | $R^{D1}$ |
| $L_{C673}$ | $R^{D1}$ | $R^{D2}$ | $R^{D1}$ |
| $L_{C674}$ | $R^{D1}$ | $R^{D3}$ | $R^{D1}$ |
| $L_{C675}$ | $R^{D1}$ | $R^{D4}$ | $R^{D1}$ |
| $L_{C676}$ | $R^{D1}$ | $R^{D5}$ | $R^{D1}$ |
| $L_{C677}$ | $R^{D1}$ | $R^{D6}$ | $R^{D1}$ |
| $L_{C678}$ | $R^{D1}$ | $R^{D7}$ | $R^{D1}$ |
| $L_{C679}$ | $R^{D1}$ | $R^{D8}$ | $R^{D1}$ |

-continued

| Ligand | $R^1$ | $R^2$ | $R^3$ |
|---|---|---|---|
| $L_{C680}$ | $R^{D1}$ | $R^{D9}$ | $R^{D1}$ |
| $L_{C681}$ | $R^{D1}$ | $R^{D10}$ | $R^{D1}$ |
| $L_{C682}$ | $R^{D1}$ | $R^{D11}$ | $R^{D1}$ |
| $L_{C683}$ | $R^{D1}$ | $R^{D12}$ | $R^{D1}$ |
| $L_{C684}$ | $R^{D1}$ | $R^{D13}$ | $R^{D1}$ |
| $L_{C685}$ | $R^{D1}$ | $R^{D14}$ | $R^{D1}$ |
| $L_{C686}$ | $R^{D1}$ | $R^{D15}$ | $R^{D1}$ |
| $L_{C687}$ | $R^{D1}$ | $R^{D16}$ | $R^{D1}$ |
| $L_{C688}$ | $R^{D1}$ | $R^{D17}$ | $R^{D1}$ |
| $L_{C689}$ | $R^{D1}$ | $R^{D8}$ | $R^{D1}$ |
| $L_{C690}$ | $R^{D1}$ | $R^{D9}$ | $R^{D1}$ |
| $L_{C691}$ | $R^{D1}$ | $R^{D20}$ | $R^{D1}$ |
| $L_{C692}$ | $R^{D1}$ | $R^{D21}$ | $R^{D1}$ |
| $L_{C693}$ | $R^{D1}$ | $R^{D22}$ | $R^{D1}$ |
| $L_{C694}$ | $R^{D1}$ | $R^{D23}$ | $R^{D1}$ |
| $L_{C695}$ | $R^{D1}$ | $R^{D24}$ | $R^{D1}$ |
| $L_{C696}$ | $R^{D1}$ | $R^{D25}$ | $R^{D1}$ |
| $L_{C697}$ | $R^{D1}$ | $R^{D26}$ | $R^{D1}$ |
| $L_{C698}$ | $R^{D1}$ | $R^{D27}$ | $R^{D1}$ |
| $L_{C699}$ | $R^{D1}$ | $R^{D28}$ | $R^{D1}$ |
| $L_{C700}$ | $R^{D1}$ | $R^{D29}$ | $R^{D1}$ |
| $L_{C701}$ | $R^{D1}$ | $R^{D30}$ | $R^{D1}$ |
| $L_{C702}$ | $R^{D1}$ | $R^{D31}$ | $R^{D1}$ |
| $L_{C703}$ | $R^{D1}$ | $R^{D32}$ | $R^{D1}$ |
| $L_{C704}$ | $R^{D1}$ | $R^{D33}$ | $R^{D1}$ |
| $L_{C705}$ | $R^{D1}$ | $R^{D34}$ | $R^{D1}$ |
| $L_{C706}$ | $R^{D1}$ | $R^{D35}$ | $R^{D1}$ |
| $L_{C707}$ | $R^{D1}$ | $R^{D40}$ | $R^{D1}$ |
| $L_{C708}$ | $R^{D1}$ | $R^{D41}$ | $R^{D1}$ |
| $L_{C709}$ | $R^{D1}$ | $R^{D42}$ | $R^{D1}$ |
| $L_{C710}$ | $R^{D1}$ | $R^{D64}$ | $R^{D1}$ |
| $L_{C711}$ | $R^{D1}$ | $R^{D66}$ | $R^{D1}$ |
| $L_{C712}$ | $R^{D1}$ | $R^{D68}$ | $R^{D1}$ |
| $L_{C713}$ | $R^{D1}$ | $R^{D76}$ | $R^{D1}$ |
| $L_{C714}$ | $R^{D2}$ | $R^{D1}$ | $R^{D1}$ |
| $L_{C715}$ | $R^{D2}$ | $R^{D3}$ | $R^{D1}$ |
| $L_{C716}$ | $R^{D2}$ | $R^{D4}$ | $R^{D1}$ |
| $L_{C717}$ | $R^{D2}$ | $R^{D5}$ | $R^{D1}$ |
| $L_{C718}$ | $R^{D2}$ | $R^{D6}$ | $R^{D1}$ |
| $L_{C719}$ | $R^{D2}$ | $R^{D7}$ | $R^{D1}$ |
| $L_{C720}$ | $R^{D2}$ | $R^{D8}$ | $R^{D1}$ |
| $L_{C721}$ | $R^{D2}$ | $R^{D9}$ | $R^{D1}$ |
| $L_{C722}$ | $R^{D2}$ | $R^{D10}$ | $R^{D1}$ |
| $L_{C723}$ | $R^{D2}$ | $R^{D11}$ | $R^{D1}$ |
| $L_{C724}$ | $R^{D2}$ | $R^{D12}$ | $R^{D1}$ |
| $L_{C725}$ | $R^{D2}$ | $R^{D13}$ | $R^{D1}$ |
| $L_{C726}$ | $R^{D2}$ | $R^{D14}$ | $R^{D1}$ |
| $L_{C727}$ | $R^{D2}$ | $R^{D15}$ | $R^{D1}$ |
| $L_{C728}$ | $R^{D2}$ | $R^{D16}$ | $R^{D1}$ |
| $L_{C729}$ | $R^{D2}$ | $R^{D17}$ | $R^{D1}$ |
| $L_{C730}$ | $R^{D2}$ | $R^{D18}$ | $R^{D1}$ |
| $L_{C731}$ | $R^{D2}$ | $R^{D19}$ | $R^{D1}$ |
| $L_{C732}$ | $R^{D2}$ | $R^{D20}$ | $R^{D1}$ |
| $L_{C733}$ | $R^{D2}$ | $R^{D21}$ | $R^{D1}$ |
| $L_{C734}$ | $R^{D2}$ | $R^{D22}$ | $R^{D1}$ |
| $L_{C735}$ | $R^{D2}$ | $R^{D23}$ | $R^{D1}$ |
| $L_{C736}$ | $R^{D2}$ | $R^{D24}$ | $R^{D1}$ |
| $L_{C737}$ | $R^{D2}$ | $R^{D25}$ | $R^{D1}$ |
| $L_{C738}$ | $R^{D2}$ | $R^{D26}$ | $R^{D1}$ |
| $L_{C739}$ | $R^{D2}$ | $R^{D27}$ | $R^{D1}$ |
| $L_{C740}$ | $R^{D2}$ | $R^{D28}$ | $R^{D1}$ |
| $L_{C741}$ | $R^{D2}$ | $R^{D29}$ | $R^{D1}$ |
| $L_{C742}$ | $R^{D2}$ | $R^{D30}$ | $R^{D1}$ |
| $L_{C743}$ | $R^{D2}$ | $R^{D31}$ | $R^{D1}$ |
| $L_{C744}$ | $R^{D2}$ | $R^{D32}$ | $R^{D1}$ |
| $L_{C745}$ | $R^{D2}$ | $R^{D33}$ | $R^{D1}$ |
| $L_{C746}$ | $R^{D2}$ | $R^{D34}$ | $R^{D1}$ |
| $L_{C747}$ | $R^{D2}$ | $R^{D35}$ | $R^{D1}$ |
| $L_{C748}$ | $R^{D2}$ | $R^{D40}$ | $R^{D1}$ |
| $L_{C749}$ | $R^{D2}$ | $R^{D41}$ | $R^{D1}$ |
| $L_{C750}$ | $R^{D2}$ | $R^{D42}$ | $R^{D1}$ |
| $L_{C751}$ | $R^{D2}$ | $R^{D64}$ | $R^{D1}$ |
| $L_{C752}$ | $R^{D2}$ | $R^{D66}$ | $R^{D1}$ |
| $L_{C753}$ | $R^{D2}$ | $R^{D68}$ | $R^{D1}$ |
| $L_{C754}$ | $R^{D2}$ | $R^{D76}$ | $R^{D1}$ |
| $L_{C755}$ | $R^{D3}$ | $R^{D4}$ | $R^{D1}$ |
| $L_{C756}$ | $R^{D3}$ | $R^{D5}$ | $R^{D1}$ |

-continued

| Ligand | $R^1$ | $R^2$ | $R^3$ |
|---|---|---|---|
| $L_{C757}$ | $R^{D3}$ | $R^{D6}$ | $R^{D1}$ |
| $L_{C758}$ | $R^{D3}$ | $R^{D7}$ | $R^{D1}$ |
| $L_{C759}$ | $R^{D3}$ | $R^{D8}$ | $R^{D1}$ |
| $L_{C760}$ | $R^{D3}$ | $R^{D9}$ | $R^{D1}$ |
| $L_{C761}$ | $R^{D3}$ | $R^{D10}$ | $R^{D1}$ |
| $L_{C762}$ | $R^{D3}$ | $R^{D11}$ | $R^{D1}$ |
| $L_{C763}$ | $R^{D3}$ | $R^{D12}$ | $R^{D1}$ |
| $L_{C764}$ | $R^{D3}$ | $R^{D13}$ | $R^{D1}$ |
| $L_{C765}$ | $R^{D3}$ | $R^{D14}$ | $R^{D1}$ |
| $L_{C766}$ | $R^{D3}$ | $R^{D15}$ | $R^{D1}$ |
| $L_{C767}$ | $R^{D3}$ | $R^{D6}$ | $R^{D1}$ |
| $L_{C768}$ | $R^{D3}$ | $R^{D17}$ | $R^{D1}$ |
| $L_{C769}$ | $R^{D3}$ | $R^{D18}$ | $R^{D1}$ |
| $L_{C770}$ | $R^{D3}$ | $R^{D19}$ | $R^{D1}$ |
| $L_{C771}$ | $R^{D3}$ | $R^{D20}$ | $R^{D1}$ |
| $L_{C772}$ | $R^{D3}$ | $R^{D21}$ | $R^{D1}$ |
| $L_{C773}$ | $R^{D3}$ | $R^{D22}$ | $R^{D1}$ |
| $L_{C774}$ | $R^{D3}$ | $R^{D23}$ | $R^{D1}$ |
| $L_{C775}$ | $R^{D3}$ | $R^{D24}$ | $R^{D1}$ |
| $L_{C776}$ | $R^{D3}$ | $R^{D25}$ | $R^{D1}$ |
| $L_{C777}$ | $R^{D3}$ | $R^{D26}$ | $R^{D1}$ |
| $L_{C778}$ | $R^{D3}$ | $R^{D27}$ | $R^{D1}$ |
| $L_{C779}$ | $R^{D3}$ | $R^{D28}$ | $R^{D1}$ |
| $L_{C780}$ | $R^{D3}$ | $R^{D29}$ | $R^{D1}$ |
| $L_{C781}$ | $R^{D3}$ | $R^{D30}$ | $R^{D1}$ |
| $L_{C782}$ | $R^{D3}$ | $R^{D31}$ | $R^{D1}$ |
| $L_{C783}$ | $R^{D3}$ | $R^{D32}$ | $R^{D1}$ |
| $L_{C784}$ | $R^{D3}$ | $R^{D33}$ | $R^{D1}$ |
| $L_{C785}$ | $R^{D3}$ | $R^{D34}$ | $R^{D1}$ |
| $L_{C786}$ | $R^{D3}$ | $R^{D35}$ | $R^{D1}$ |
| $L_{C787}$ | $R^{D3}$ | $R^{D40}$ | $R^{D1}$ |
| $L_{C788}$ | $R^{D3}$ | $R^{D41}$ | $R^{D1}$ |
| $L_{C789}$ | $R^{D3}$ | $R^{D42}$ | $R^{D1}$ |
| $L_{C790}$ | $R^{D3}$ | $R^{D64}$ | $R^{D1}$ |
| $L_{C791}$ | $R^{D3}$ | $R^{D66}$ | $R^{D1}$ |
| $L_{C792}$ | $R^{D3}$ | $R^{D68}$ | $R^{D1}$ |
| $L_{C793}$ | $R^{D3}$ | $R^{D76}$ | $R^{D1}$ |
| $L_{C794}$ | $R^{D4}$ | $R^{D5}$ | $R^{D1}$ |
| $L_{C795}$ | $R^{D4}$ | $R^{D6}$ | $R^{D1}$ |
| $L_{C796}$ | $R^{D4}$ | $R^{D7}$ | $R^{D1}$ |
| $L_{C797}$ | $R^{D4}$ | $R^{D8}$ | $R^{D1}$ |
| $L_{C798}$ | $R^{D4}$ | $R^{D9}$ | $R^{D1}$ |
| $L_{C799}$ | $R^{D4}$ | $R^{D10}$ | $R^{D1}$ |
| $L_{C800}$ | $R^{D4}$ | $R^{D11}$ | $R^{D1}$ |
| $L_{C801}$ | $R^{D4}$ | $R^{D12}$ | $R^{D1}$ |
| $L_{C802}$ | $R^{D4}$ | $R^{D13}$ | $R^{D1}$ |
| $L_{C803}$ | $R^{D4}$ | $R^{D14}$ | $R^{D1}$ |
| $L_{C804}$ | $R^{D4}$ | $R^{D15}$ | $R^{D1}$ |
| $L_{C805}$ | $R^{D4}$ | $R^{D16}$ | $R^{D1}$ |
| $L_{C806}$ | $R^{D4}$ | $R^{D17}$ | $R^{D1}$ |
| $L_{C807}$ | $R^{D4}$ | $R^{D18}$ | $R^{D1}$ |
| $L_{C808}$ | $R^{D4}$ | $R^{D19}$ | $R^{D1}$ |
| $L_{C809}$ | $R^{D4}$ | $R^{D20}$ | $R^{D1}$ |
| $L_{C810}$ | $R^{D4}$ | $R^{D21}$ | $R^{D1}$ |
| $L_{C811}$ | $R^{D4}$ | $R^{D22}$ | $R^{D1}$ |
| $L_{C812}$ | $R^{D4}$ | $R^{D23}$ | $R^{D1}$ |
| $L_{C813}$ | $R^{D4}$ | $R^{D24}$ | $R^{D1}$ |
| $L_{C814}$ | $R^{D4}$ | $R^{D25}$ | $R^{D1}$ |
| $L_{C815}$ | $R^{D4}$ | $R^{D26}$ | $R^{D1}$ |
| $L_{C816}$ | $R^{D4}$ | $R^{D27}$ | $R^{D1}$ |
| $L_{C817}$ | $R^{D4}$ | $R^{D28}$ | $R^{D1}$ |
| $L_{C818}$ | $R^{D4}$ | $R^{D29}$ | $R^{D1}$ |
| $L_{C819}$ | $R^{D4}$ | $R^{D30}$ | $R^{D1}$ |
| $L_{C820}$ | $R^{D4}$ | $R^{D31}$ | $R^{D1}$ |
| $L_{C821}$ | $R^{D4}$ | $R^{D32}$ | $R^{D1}$ |
| $L_{C822}$ | $R^{D4}$ | $R^{D33}$ | $R^{D1}$ |
| $L_{C823}$ | $R^{D4}$ | $R^{D34}$ | $R^{D1}$ |
| $L_{C824}$ | $R^{D4}$ | $R^{D35}$ | $R^{D1}$ |
| $L_{C825}$ | $R^{D4}$ | $R^{D40}$ | $R^{D1}$ |
| $L_{C826}$ | $R^{D4}$ | $R^{D41}$ | $R^{D1}$ |
| $L_{C827}$ | $R^{D4}$ | $R^{D42}$ | $R^{D1}$ |
| $L_{C828}$ | $R^{D4}$ | $R^{D64}$ | $R^{D1}$ |
| $L_{C829}$ | $R^{D4}$ | $R^{D66}$ | $R^{D1}$ |
| $L_{C830}$ | $R^{D4}$ | $R^{D68}$ | $R^{D1}$ |
| $L_{C831}$ | $R^{D4}$ | $R^{D76}$ | $R^{D1}$ |
| $L_{C832}$ | $R^{D4}$ | $R^{D1}$ | $R^{D1}$ |
| $L_{C833}$ | $R^{D7}$ | $R^{D5}$ | $R^{D1}$ |

-continued

| Ligand | $R^1$ | $R^2$ | $R^3$ |
|---|---|---|---|
| $L_{C834}$ | $R^{D7}$ | $R^{D6}$ | $R^{D1}$ |
| $L_{C835}$ | $R^{D7}$ | $R^{D8}$ | $R^{D1}$ |
| $L_{C836}$ | $R^{D7}$ | $R^{D9}$ | $R^{D1}$ |
| $L_{C837}$ | $R^{D7}$ | $R^{D10}$ | $R^{D1}$ |
| $L_{C838}$ | $R^{D7}$ | $R^{D11}$ | $R^{D1}$ |
| $L_{C839}$ | $R^{D7}$ | $R^{D12}$ | $R^{D1}$ |
| $L_{C840}$ | $R^{D7}$ | $R^{D13}$ | $R^{D1}$ |
| $L_{C841}$ | $R^{D7}$ | $R^{D14}$ | $R^{D1}$ |
| $L_{C842}$ | $R^{D7}$ | $R^{D15}$ | $R^{D1}$ |
| $L_{C843}$ | $R^{D7}$ | $R^{D16}$ | $R^{D1}$ |
| $L_{C844}$ | $R^{D7}$ | $R^{D17}$ | $R^{D1}$ |
| $L_{C845}$ | $R^{D7}$ | $R^{D18}$ | $R^{D1}$ |
| $L_{C846}$ | $R^{D7}$ | $R^{D19}$ | $R^{D1}$ |
| $L_{C847}$ | $R^{D7}$ | $R^{D20}$ | $R^{D1}$ |
| $L_{C848}$ | $R^{D7}$ | $R^{D21}$ | $R^{D1}$ |
| $L_{C849}$ | $R^{D7}$ | $R^{D22}$ | $R^{D1}$ |
| $L_{C850}$ | $R^{D7}$ | $R^{D23}$ | $R^{D1}$ |
| $L_{C851}$ | $R^{D7}$ | $R^{D24}$ | $R^{D1}$ |
| $L_{C852}$ | $R^{D7}$ | $R^{D25}$ | $R^{D1}$ |
| $L_{C853}$ | $R^{D7}$ | $R^{D26}$ | $R^{D1}$ |
| $L_{C854}$ | $R^{D7}$ | $R^{D27}$ | $R^{D1}$ |
| $L_{C855}$ | $R^{D7}$ | $R^{D28}$ | $R^{D1}$ |
| $L_{C856}$ | $R^{D7}$ | $R^{D29}$ | $R^{D1}$ |
| $L_{C857}$ | $R^{D7}$ | $R^{D30}$ | $R^{D1}$ |
| $L_{C858}$ | $R^{D7}$ | $R^{D31}$ | $R^{D1}$ |
| $L_{C859}$ | $R^{D7}$ | $R^{D32}$ | $R^{D1}$ |
| $L_{C860}$ | $R^{D7}$ | $R^{D33}$ | $R^{D1}$ |
| $L_{C861}$ | $R^{D7}$ | $R^{D34}$ | $R^{D1}$ |
| $L_{C862}$ | $R^{D7}$ | $R^{D35}$ | $R^{D1}$ |
| $L_{C863}$ | $R^{D7}$ | $R^{D40}$ | $R^{D1}$ |
| $L_{C864}$ | $R^{D7}$ | $R^{D41}$ | $R^{D1}$ |
| $L_{C865}$ | $R^{D7}$ | $R^{D42}$ | $R^{D1}$ |
| $L_{C866}$ | $R^{D7}$ | $R^{D64}$ | $R^{D1}$ |
| $L_{C867}$ | $R^{D7}$ | $R^{D66}$ | $R^{D1}$ |
| $L_{C868}$ | $R^{D7}$ | $R^{D68}$ | $R^{D1}$ |
| $L_{C869}$ | $R^{D7}$ | $R^{D76}$ | $R^{D1}$ |
| $L_{C870}$ | $R^{D8}$ | $R^{D5}$ | $R^{D1}$ |
| $L_{C871}$ | $R^{D8}$ | $R^{D6}$ | $R^{D1}$ |
| $L_{C872}$ | $R^{D8}$ | $R^{D9}$ | $R^{D1}$ |
| $L_{C873}$ | $R^{D8}$ | $R^{D10}$ | $R^{D1}$ |
| $L_{C874}$ | $R^{D8}$ | $R^{D11}$ | $R^{D1}$ |
| $L_{C875}$ | $R^{D8}$ | $R^{D12}$ | $R^{D1}$ |
| $L_{C876}$ | $R^{D8}$ | $R^{D13}$ | $R^{D1}$ |
| $L_{C877}$ | $R^{D8}$ | $R^{D14}$ | $R^{D1}$ |
| $L_{C878}$ | $R^{D8}$ | $R^{D15}$ | $R^{D1}$ |
| $L_{C879}$ | $R^{D8}$ | $R^{D16}$ | $R^{D1}$ |
| $L_{C880}$ | $R^{D8}$ | $R^{D17}$ | $R^{D1}$ |
| $L_{C881}$ | $R^{D8}$ | $R^{D18}$ | $R^{D1}$ |
| $L_{C882}$ | $R^{D8}$ | $R^{D19}$ | $R^{D1}$ |
| $L_{C883}$ | $R^{D8}$ | $R^{D20}$ | $R^{D1}$ |
| $L_{C884}$ | $R^{D8}$ | $R^{D21}$ | $R^{D1}$ |
| $L_{C885}$ | $R^{D8}$ | $R^{D22}$ | $R^{D1}$ |
| $L_{C886}$ | $R^{D8}$ | $R^{D23}$ | $R^{D1}$ |
| $L_{C887}$ | $R^{D8}$ | $R^{D24}$ | $R^{D1}$ |
| $L_{C888}$ | $R^{D8}$ | $R^{D25}$ | $R^{D1}$ |
| $L_{C889}$ | $R^{D8}$ | $R^{D26}$ | $R^{D1}$ |
| $L_{C890}$ | $R^{D8}$ | $R^{D27}$ | $R^{D1}$ |
| $L_{C891}$ | $R^{D8}$ | $R^{D28}$ | $R^{D1}$ |
| $L_{C892}$ | $R^{D8}$ | $R^{D29}$ | $R^{D1}$ |
| $L_{C893}$ | $R^{D8}$ | $R^{D30}$ | $R^{D1}$ |
| $L_{C894}$ | $R^{D8}$ | $R^{D31}$ | $R^{D1}$ |
| $L_{C895}$ | $R^{D8}$ | $R^{D32}$ | $R^{D1}$ |
| $L_{C896}$ | $R^{D8}$ | $R^{D33}$ | $R^{D1}$ |
| $L_{C897}$ | $R^{D8}$ | $R^{D34}$ | $R^{D1}$ |
| $L_{C898}$ | $R^{D8}$ | $R^{D35}$ | $R^{D1}$ |
| $L_{C899}$ | $R^{D8}$ | $R^{D40}$ | $R^{D1}$ |
| $L_{C900}$ | $R^{D8}$ | $R^{D41}$ | $R^{D1}$ |
| $L_{C901}$ | $R^{D8}$ | $R^{D42}$ | $R^{D1}$ |
| $L_{C902}$ | $R^{D8}$ | $R^{D64}$ | $R^{D1}$ |
| $L_{C903}$ | $R^{D8}$ | $R^{D66}$ | $R^{D1}$ |
| $L_{C904}$ | $R^{D8}$ | $R^{D68}$ | $R^{D1}$ |
| $L_{C905}$ | $R^{D8}$ | $R^{D76}$ | $R^{D1}$ |
| $L_{C906}$ | $R^{D11}$ | $R^{D5}$ | $R^{D1}$ |
| $L_{C907}$ | $R^{D11}$ | $R^{D6}$ | $R^{D1}$ |
| $L_{C908}$ | $R^{D11}$ | $R^{D9}$ | $R^{D1}$ |
| $L_{C909}$ | $R^{D11}$ | $R^{D10}$ | $R^{D1}$ |
| $L_{C910}$ | $R^{D11}$ | $R^{D12}$ | $R^{D1}$ |

-continued

| Ligand | $R^1$ | $R^2$ | $R^3$ |
|---|---|---|---|
| $L_{C911}$ | $R^{D11}$ | $R^{D13}$ | $R^{D1}$ |
| $L_{C912}$ | $R^{D11}$ | $R^{D14}$ | $R^{D1}$ |
| $L_{C913}$ | $R^{D11}$ | $R^{D15}$ | $R^{D1}$ |
| $L_{C914}$ | $R^{D11}$ | $R^{D16}$ | $R^{D1}$ |
| $L_{C915}$ | $R^{D11}$ | $R^{D17}$ | $R^{D1}$ |
| $L_{C916}$ | $R^{D11}$ | $R^{D18}$ | $R^{D1}$ |
| $L_{C917}$ | $R^{D11}$ | $R^{D19}$ | $R^{D1}$ |
| $L_{C918}$ | $R^{D11}$ | $R^{D20}$ | $R^{D1}$ |
| $L_{C919}$ | $R^{D11}$ | $R^{D21}$ | $R^{D1}$ |
| $L_{C920}$ | $R^{D11}$ | $R^{D22}$ | $R^{D1}$ |
| $L_{C921}$ | $R^{D11}$ | $R^{D23}$ | $R^{D1}$ |
| $L_{C922}$ | $R^{D11}$ | $R^{D24}$ | $R^{D1}$ |
| $L_{C923}$ | $R^{D11}$ | $R^{D25}$ | $R^{D1}$ |
| $L_{C924}$ | $R^{D11}$ | $R^{D26}$ | $R^{D1}$ |
| $L_{C925}$ | $R^{D11}$ | $R^{D27}$ | $R^{D1}$ |
| $L_{C926}$ | $R^{D11}$ | $R^{D28}$ | $R^{D1}$ |
| $L_{C927}$ | $R^{D11}$ | $R^{D29}$ | $R^{D1}$ |
| $L_{C928}$ | $R^{D11}$ | $R^{D30}$ | $R^{D1}$ |
| $L_{C929}$ | $R^{D11}$ | $R^{D31}$ | $R^{D1}$ |
| $L_{C930}$ | $R^{D11}$ | $R^{D32}$ | $R^{D1}$ |
| $L_{C931}$ | $R^{D11}$ | $R^{D33}$ | $R^{D1}$ |
| $L_{C932}$ | $R^{D11}$ | $R^{D34}$ | $R^{D1}$ |
| $L_{C933}$ | $R^{D11}$ | $R^{D35}$ | $R^{D1}$ |
| $L_{C934}$ | $R^{D11}$ | $R^{D40}$ | $R^{D1}$ |
| $L_{C935}$ | $R^{D11}$ | $R^{D41}$ | $R^{D1}$ |
| $L_{C936}$ | $R^{D11}$ | $R^{D42}$ | $R^{D1}$ |
| $L_{C937}$ | $R^{D11}$ | $R^{D64}$ | $R^{D1}$ |
| $L_{C938}$ | $R^{D11}$ | $R^{D66}$ | $R^{D1}$ |
| $L_{C939}$ | $R^{D11}$ | $R^{D68}$ | $R^{D1}$ |
| $L_{C940}$ | $R^{D11}$ | $R^{D76}$ | $R^{D1}$ |
| $L_{C941}$ | $R^{D13}$ | $R^{D5}$ | $R^{D1}$ |
| $L_{C942}$ | $R^{D13}$ | $R^{D6}$ | $R^{D1}$ |
| $L_{C943}$ | $R^{D13}$ | $R^{D9}$ | $R^{D1}$ |
| $L_{C944}$ | $R^{D13}$ | $R^{D10}$ | $R^{D1}$ |
| $L_{C945}$ | $R^{D13}$ | $R^{D12}$ | $R^{D1}$ |
| $L_{C946}$ | $R^{D13}$ | $R^{D14}$ | $R^{D1}$ |
| $L_{C947}$ | $R^{D13}$ | $R^{D15}$ | $R^{D1}$ |
| $L_{C948}$ | $R^{D13}$ | $R^{D16}$ | $R^{D1}$ |
| $L_{C949}$ | $R^{D13}$ | $R^{D17}$ | $R^{D1}$ |
| $L_{C950}$ | $R^{D13}$ | $R^{D18}$ | $R^{D1}$ |
| $L_{C951}$ | $R^{D13}$ | $R^{D19}$ | $R^{D1}$ |
| $L_{C952}$ | $R^{D13}$ | $R^{D20}$ | $R^{D1}$ |
| $L_{C953}$ | $R^{D13}$ | $R^{D21}$ | $R^{D1}$ |
| $L_{C954}$ | $R^{D13}$ | $R^{D22}$ | $R^{D1}$ |
| $L_{C955}$ | $R^{D13}$ | $R^{D23}$ | $R^{D1}$ |
| $L_{C956}$ | $R^{D13}$ | $R^{D24}$ | $R^{D1}$ |
| $L_{C957}$ | $R^{D13}$ | $R^{D25}$ | $R^{D1}$ |
| $L_{C958}$ | $R^{D13}$ | $R^{D26}$ | $R^{D1}$ |
| $L_{C959}$ | $R^{D13}$ | $R^{D27}$ | $R^{D1}$ |
| $L_{C960}$ | $R^{D13}$ | $R^{D28}$ | $R^{D1}$ |
| $L_{C961}$ | $R^{D13}$ | $R^{D29}$ | $R^{D1}$ |
| $L_{C962}$ | $R^{D13}$ | $R^{D30}$ | $R^{D1}$ |
| $L_{C963}$ | $R^{D13}$ | $R^{D31}$ | $R^{D1}$ |
| $L_{C964}$ | $R^{D13}$ | $R^{D32}$ | $R^{D1}$ |
| $L_{C965}$ | $R^{D13}$ | $R^{D33}$ | $R^{D1}$ |
| $L_{C966}$ | $R^{D13}$ | $R^{D34}$ | $R^{D1}$ |
| $L_{C967}$ | $R^{D13}$ | $R^{D35}$ | $R^{D1}$ |
| $L_{C968}$ | $R^{D13}$ | $R^{D40}$ | $R^{D1}$ |
| $L_{C969}$ | $R^{D13}$ | $R^{D41}$ | $R^{D1}$ |
| $L_{C970}$ | $R^{D13}$ | $R^{D42}$ | $R^{D1}$ |
| $L_{C971}$ | $R^{D13}$ | $R^{D64}$ | $R^{D1}$ |
| $L_{C972}$ | $R^{D13}$ | $R^{D66}$ | $R^{D1}$ |
| $L_{C973}$ | $R^{D13}$ | $R^{D68}$ | $R^{D1}$ |
| $L_{C974}$ | $R^{D13}$ | $R^{D76}$ | $R^{D1}$ |
| $L_{C975}$ | $R^{D14}$ | $R^{D5}$ | $R^{D1}$ |
| $L_{C976}$ | $R^{D14}$ | $R^{D6}$ | $R^{D1}$ |
| $L_{C977}$ | $R^{D14}$ | $R^{D9}$ | $R^{D1}$ |
| $L_{C978}$ | $R^{D14}$ | $R^{D10}$ | $R^{D1}$ |
| $L_{C979}$ | $R^{D14}$ | $R^{D12}$ | $R^{D1}$ |
| $L_{C980}$ | $R^{D14}$ | $R^{D15}$ | $R^{D1}$ |
| $L_{C981}$ | $R^{D14}$ | $R^{D16}$ | $R^{D1}$ |
| $L_{C982}$ | $R^{D14}$ | $R^{D17}$ | $R^{D1}$ |
| $L_{C983}$ | $R^{D14}$ | $R^{D18}$ | $R^{D1}$ |
| $L_{C984}$ | $R^{D14}$ | $R^{D19}$ | $R^{D1}$ |
| $L_{C985}$ | $R^{D14}$ | $R^{D20}$ | $R^{D1}$ |
| $L_{C986}$ | $R^{D14}$ | $R^{D21}$ | $R^{D1}$ |
| $L_{C987}$ | $R^{D14}$ | $R^{D22}$ | $R^{D1}$ |

-continued

| Ligand | $R^1$ | $R^2$ | $R^3$ |
|---|---|---|---|
| $L_{C988}$ | $R^{D14}$ | $R^{D23}$ | $R^{D1}$ |
| $L_{C989}$ | $R^{D14}$ | $R^{D24}$ | $R^{D1}$ |
| $L_{C990}$ | $R^{D14}$ | $R^{D25}$ | $R^{D1}$ |
| $L_{C991}$ | $R^{D14}$ | $R^{D26}$ | $R^{D1}$ |
| $L_{C992}$ | $R^{D14}$ | $R^{D27}$ | $R^{D1}$ |
| $L_{C993}$ | $R^{D14}$ | $R^{D28}$ | $R^{D1}$ |
| $L_{C994}$ | $R^{D14}$ | $R^{D29}$ | $R^{D1}$ |
| $L_{C995}$ | $R^{D14}$ | $R^{D30}$ | $R^{D1}$ |
| $L_{C996}$ | $R^{D14}$ | $R^{D31}$ | $R^{D1}$ |
| $L_{C997}$ | $R^{D14}$ | $R^{D32}$ | $R^{D1}$ |
| $L_{C998}$ | $R^{D14}$ | $R^{D33}$ | $R^{D1}$ |
| $L_{C999}$ | $R^{D14}$ | $R^{D34}$ | $R^{D1}$ |
| $L_{C1000}$ | $R^{D14}$ | $R^{D35}$ | $R^{D1}$ |
| $L_{C1001}$ | $R^{D14}$ | $R^{D40}$ | $R^{D1}$ |
| $L_{C1002}$ | $R^{D14}$ | $R^{D41}$ | $R^{D1}$ |
| $L_{C1003}$ | $R^{D14}$ | $R^{D42}$ | $R^{D1}$ |
| $L_{C1004}$ | $R^{D14}$ | $R^{D64}$ | $R^{D1}$ |
| $L_{C1005}$ | $R^{D14}$ | $R^{D66}$ | $R^{D1}$ |
| $L_{C1006}$ | $R^{D14}$ | $R^{D68}$ | $R^{D1}$ |
| $L_{C1007}$ | $R^{D14}$ | $R^{D76}$ | $R^{D1}$ |
| $L_{C1008}$ | $R^{D22}$ | $R^{D5}$ | $R^{D1}$ |
| $L_{C1009}$ | $R^{D22}$ | $R^{D6}$ | $R^{D1}$ |
| $L_{C1010}$ | $R^{D22}$ | $R^{D9}$ | $R^{D1}$ |
| $L_{C1011}$ | $R^{D22}$ | $R^{D10}$ | $R^{D1}$ |
| $L_{C1012}$ | $R^{D22}$ | $R^{D12}$ | $R^{D1}$ |
| $L_{C1013}$ | $R^{D22}$ | $R^{D15}$ | $R^{D1}$ |
| $L_{C1014}$ | $R^{D22}$ | $R^{D16}$ | $R^{D1}$ |
| $L_{C1015}$ | $R^{D22}$ | $R^{D17}$ | $R^{D1}$ |
| $L_{C1016}$ | $R^{D22}$ | $R^{D18}$ | $R^{D1}$ |
| $L_{C1017}$ | $R^{D22}$ | $R^{D19}$ | $R^{D1}$ |
| $L_{C1018}$ | $R^{D22}$ | $R^{D20}$ | $R^{D1}$ |
| $L_{C1019}$ | $R^{D22}$ | $R^{D21}$ | $R^{D1}$ |
| $L_{C1020}$ | $R^{D22}$ | $R^{D23}$ | $R^{D1}$ |
| $L_{C1021}$ | $R^{D22}$ | $R^{D24}$ | $R^{D1}$ |
| $L_{C1022}$ | $R^{D22}$ | $R^{D25}$ | $R^{D1}$ |
| $L_{C1023}$ | $R^{D22}$ | $R^{D26}$ | $R^{D1}$ |
| $L_{C1024}$ | $R^{D22}$ | $R^{D27}$ | $R^{D1}$ |
| $L_{C1025}$ | $R^{D22}$ | $R^{D28}$ | $R^{D1}$ |
| $L_{C1026}$ | $R^{D22}$ | $R^{D29}$ | $R^{D1}$ |
| $L_{C1027}$ | $R^{D22}$ | $R^{D30}$ | $R^{D1}$ |
| $L_{C1028}$ | $R^{D22}$ | $R^{D31}$ | $R^{D1}$ |
| $L_{C1029}$ | $R^{D22}$ | $R^{D32}$ | $R^{D1}$ |
| $L_{C1030}$ | $R^{D22}$ | $R^{D33}$ | $R^{D1}$ |
| $L_{C1031}$ | $R^{D22}$ | $R^{D34}$ | $R^{D1}$ |
| $L_{C1032}$ | $R^{D22}$ | $R^{D35}$ | $R^{D1}$ |
| $L_{C1033}$ | $R^{D22}$ | $R^{D40}$ | $R^{D1}$ |
| $L_{C1034}$ | $R^{D22}$ | $R^{D41}$ | $R^{D1}$ |
| $L_{C1035}$ | $R^{D22}$ | $R^{D42}$ | $R^{D1}$ |
| $L_{C1036}$ | $R^{D22}$ | $R^{D64}$ | $R^{D1}$ |
| $L_{C1037}$ | $R^{D22}$ | $R^{D66}$ | $R^{D1}$ |
| $L_{C1038}$ | $R^{D22}$ | $R^{D68}$ | $R^{D1}$ |
| $L_{C1039}$ | $R^{D22}$ | $R^{D76}$ | $R^{D1}$ |
| $L_{C1040}$ | $R^{D26}$ | $R^{D5}$ | $R^{D1}$ |
| $L_{C1041}$ | $R^{D26}$ | $R^{D6}$ | $R^{D1}$ |
| $L_{C1042}$ | $R^{D26}$ | $R^{D9}$ | $R^{D1}$ |
| $L_{C1043}$ | $R^{D26}$ | $R^{D10}$ | $R^{D1}$ |
| $L_{C1044}$ | $R^{D26}$ | $R^{D12}$ | $R^{D1}$ |
| $L_{C1045}$ | $R^{D26}$ | $R^{D15}$ | $R^{D1}$ |
| $L_{C1046}$ | $R^{D26}$ | $R^{D16}$ | $R^{D1}$ |
| $L_{C1047}$ | $R^{D26}$ | $R^{D17}$ | $R^{D1}$ |
| $L_{C1048}$ | $R^{D26}$ | $R^{D18}$ | $R^{D1}$ |
| $L_{C1049}$ | $R^{D26}$ | $R^{D19}$ | $R^{D1}$ |
| $L_{C1050}$ | $R^{D26}$ | $R^{D20}$ | $R^{D1}$ |
| $L_{C1051}$ | $R^{D26}$ | $R^{D21}$ | $R^{D1}$ |
| $L_{C1052}$ | $R^{D26}$ | $R^{D23}$ | $R^{D1}$ |
| $L_{C1053}$ | $R^{D26}$ | $R^{D24}$ | $R^{D1}$ |
| $L_{C1054}$ | $R^{D26}$ | $R^{D25}$ | $R^{D1}$ |
| $L_{C1055}$ | $R^{D26}$ | $R^{D27}$ | $R^{D1}$ |
| $L_{C1056}$ | $R^{D26}$ | $R^{D28}$ | $R^{D1}$ |
| $L_{C1057}$ | $R^{D26}$ | $R^{D29}$ | $R^{D1}$ |
| $L_{C1058}$ | $R^{D26}$ | $R^{D30}$ | $R^{D1}$ |
| $L_{C1059}$ | $R^{D26}$ | $R^{D31}$ | $R^{D1}$ |
| $L_{C1060}$ | $R^{D26}$ | $R^{D32}$ | $R^{D1}$ |
| $L_{C1061}$ | $R^{D26}$ | $R^{D33}$ | $R^{D1}$ |
| $L_{C1062}$ | $R^{D26}$ | $R^{D34}$ | $R^{D1}$ |
| $L_{C1063}$ | $R^{D26}$ | $R^{D35}$ | $R^{D1}$ |
| $L_{C1064}$ | $R^{D26}$ | $R^{D40}$ | $R^{D1}$ |

-continued

| Ligand | $R^1$ | $R^2$ | $R^3$ |
|---|---|---|---|
| $L_{C1065}$ | $R^{D26}$ | $R^{D41}$ | $R^{D1}$ |
| $L_{C1066}$ | $R^{D26}$ | $R^{D42}$ | $R^{D1}$ |
| $L_{C1067}$ | $R^{D26}$ | $R^{D64}$ | $R^{D1}$ |
| $L_{C1068}$ | $R^{D26}$ | $R^{D66}$ | $R^{D1}$ |
| $L_{C1069}$ | $R^{D26}$ | $R^{D68}$ | $R^{D1}$ |
| $L_{C1070}$ | $R^{D26}$ | $R^{D76}$ | $R^{D1}$ |
| $L_{C1071}$ | $R^{D35}$ | $R^{D5}$ | $R^{D1}$ |
| $L_{C1072}$ | $R^{D35}$ | $R^{D6}$ | $R^{D1}$ |
| $L_{C1073}$ | $R^{D35}$ | $R^{D9}$ | $R^{D1}$ |
| $L_{C1074}$ | $R^{D35}$ | $R^{D10}$ | $R^{D1}$ |
| $L_{C1075}$ | $R^{D35}$ | $R^{D12}$ | $R^{D1}$ |
| $L_{C1076}$ | $R^{D35}$ | $R^{D15}$ | $R^{D1}$ |
| $L_{C1077}$ | $R^{D35}$ | $R^{D16}$ | $R^{D1}$ |
| $L_{C1078}$ | $R^{D35}$ | $R^{D17}$ | $R^{D1}$ |
| $L_{C1079}$ | $R^{D35}$ | $R^{D18}$ | $R^{D1}$ |
| $L_{C1080}$ | $R^{D35}$ | $R^{D19}$ | $R^{D1}$ |
| $L_{C1081}$ | $R^{D35}$ | $R^{D20}$ | $R^{D1}$ |
| $L_{C1082}$ | $R^{D35}$ | $R^{D21}$ | $R^{D1}$ |
| $L_{C1083}$ | $R^{D35}$ | $R^{D23}$ | $R^{D1}$ |
| $L_{C1084}$ | $R^{D35}$ | $R^{D24}$ | $R^{D1}$ |
| $L_{C1085}$ | $R^{D35}$ | $R^{D25}$ | $R^{D1}$ |
| $L_{C1086}$ | $R^{D35}$ | $R^{D27}$ | $R^{D1}$ |
| $L_{C1087}$ | $R^{D35}$ | $R^{D28}$ | $R^{D1}$ |
| $L_{C1088}$ | $R^{D35}$ | $R^{D29}$ | $R^{D1}$ |
| $L_{C1089}$ | $R^{D35}$ | $R^{D30}$ | $R^{D1}$ |
| $L_{C1090}$ | $R^{D35}$ | $R^{D31}$ | $R^{D1}$ |
| $L_{C1091}$ | $R^{D35}$ | $R^{D32}$ | $R^{D1}$ |
| $L_{C1092}$ | $R^{D35}$ | $R^{D33}$ | $R^{D1}$ |
| $L_{C1093}$ | $R^{D35}$ | $R^{D34}$ | $R^{D1}$ |
| $L_{C1094}$ | $R^{D35}$ | $R^{D40}$ | $R^{D1}$ |
| $L_{C1095}$ | $R^{D35}$ | $R^{D41}$ | $R^{D1}$ |
| $L_{C1096}$ | $R^{D35}$ | $R^{D42}$ | $R^{D1}$ |
| $L_{C1097}$ | $R^{D35}$ | $R^{D64}$ | $R^{D1}$ |
| $L_{C1098}$ | $R^{D35}$ | $R^{D66}$ | $R^{D1}$ |
| $L_{C1099}$ | $R^{D35}$ | $R^{D68}$ | $R^{D1}$ |
| $L_{C1100}$ | $R^{D35}$ | $R^{D76}$ | $R^{D1}$ |
| $L_{C1101}$ | $R^{D40}$ | $R^{D5}$ | $R^{D1}$ |
| $L_{C1102}$ | $R^{D40}$ | $R^{D6}$ | $R^{D1}$ |
| $L_{C1103}$ | $R^{D40}$ | $R^{D9}$ | $R^{D1}$ |
| $L_{C1104}$ | $R^{D40}$ | $R^{D10}$ | $R^{D1}$ |
| $L_{C1105}$ | $R^{D40}$ | $R^{D12}$ | $R^{D1}$ |
| $L_{C1106}$ | $R^{D40}$ | $R^{D15}$ | $R^{D1}$ |
| $L_{C1107}$ | $R^{D40}$ | $R^{D16}$ | $R^{D1}$ |
| $L_{C1108}$ | $R^{D40}$ | $R^{D17}$ | $R^{D1}$ |
| $L_{C1109}$ | $R^{D40}$ | $R^{D8}$ | $R^{D1}$ |
| $L_{C1110}$ | $R^{D40}$ | $R^{D9}$ | $R^{D1}$ |
| $L_{C1111}$ | $R^{D40}$ | $R^{D20}$ | $R^{D1}$ |
| $L_{C1112}$ | $R^{D40}$ | $R^{D21}$ | $R^{D1}$ |
| $L_{C1113}$ | $R^{D40}$ | $R^{D23}$ | $R^{D1}$ |
| $L_{C1114}$ | $R^{D40}$ | $R^{D24}$ | $R^{D1}$ |
| $L_{C1115}$ | $R^{D40}$ | $R^{D25}$ | $R^{D1}$ |
| $L_{C1116}$ | $R^{D40}$ | $R^{D27}$ | $R^{D1}$ |
| $L_{C1117}$ | $R^{D40}$ | $R^{D28}$ | $R^{D1}$ |
| $L_{C1118}$ | $R^{D40}$ | $R^{D29}$ | $R^{D1}$ |
| $L_{C1119}$ | $R^{D40}$ | $R^{D30}$ | $R^{D1}$ |
| $L_{C1120}$ | $R^{D40}$ | $R^{D31}$ | $R^{D1}$ |
| $L_{C1121}$ | $R^{D40}$ | $R^{D32}$ | $R^{D1}$ |
| $L_{C1122}$ | $R^{D40}$ | $R^{D33}$ | $R^{D1}$ |
| $L_{C1123}$ | $R^{D40}$ | $R^{D34}$ | $R^{D1}$ |
| $L_{C1124}$ | $R^{D40}$ | $R^{D41}$ | $R^{D1}$ |
| $L_{C1125}$ | $R^{D40}$ | $R^{D42}$ | $R^{D1}$ |
| $L_{C1126}$ | $R^{D40}$ | $R^{D64}$ | $R^{D1}$ |
| $L_{C1127}$ | $R^{D40}$ | $R^{D66}$ | $R^{D1}$ |
| $L_{C1128}$ | $R^{D40}$ | $R^{D68}$ | $R^{D1}$ |
| $L_{C1129}$ | $R^{D40}$ | $R^{D76}$ | $R^{D1}$ |
| $L_{C1130}$ | $R^{D41}$ | $R^{D5}$ | $R^{D1}$ |
| $L_{C1131}$ | $R^{D41}$ | $R^{D6}$ | $R^{D1}$ |
| $L_{C1132}$ | $R^{D41}$ | $R^{D9}$ | $R^{D1}$ |
| $L_{C1133}$ | $R^{D41}$ | $R^{D10}$ | $R^{D1}$ |
| $L_{C1134}$ | $R^{D41}$ | $R^{D12}$ | $R^{D1}$ |
| $L_{C1135}$ | $R^{D41}$ | $R^{D15}$ | $R^{D1}$ |
| $L_{C1136}$ | $R^{D41}$ | $R^{D16}$ | $R^{D1}$ |
| $L_{C1137}$ | $R^{D41}$ | $R^{D17}$ | $R^{D1}$ |
| $L_{C1138}$ | $R^{D41}$ | $R^{D18}$ | $R^{D1}$ |
| $L_{C1139}$ | $R^{D41}$ | $R^{D19}$ | $R^{D1}$ |
| $L_{C1140}$ | $R^{D41}$ | $R^{D20}$ | $R^{D1}$ |
| $L_{C1141}$ | $R^{D41}$ | $R^{D21}$ | $R^{D1}$ |

-continued

| Ligand | $R^1$ | $R^2$ | $R^3$ |
|---|---|---|---|
| $L_{C1142}$ | $R^{D41}$ | $R^{D23}$ | $R^{D1}$ |
| $L_{C1143}$ | $R^{D41}$ | $R^{D24}$ | $R^{D1}$ |
| $L_{C1144}$ | $R^{D41}$ | $R^{D25}$ | $R^{D1}$ |
| $L_{C1145}$ | $R^{D41}$ | $R^{D27}$ | $R^{D1}$ |
| $L_{C1146}$ | $R^{D41}$ | $R^{D28}$ | $R^{D1}$ |
| $L_{C1147}$ | $R^{D41}$ | $R^{D29}$ | $R^{D1}$ |
| $L_{C1148}$ | $R^{D41}$ | $R^{D30}$ | $R^{D1}$ |
| $L_{C1149}$ | $R^{D41}$ | $R^{D31}$ | $R^{D1}$ |
| $L_{C1150}$ | $R^{D41}$ | $R^{D32}$ | $R^{D1}$ |
| $L_{C1151}$ | $R^{D41}$ | $R^{D33}$ | $R^{D1}$ |
| $L_{C1152}$ | $R^{D41}$ | $R^{D34}$ | $R^{D1}$ |
| $L_{C1153}$ | $R^{D41}$ | $R^{D42}$ | $R^{D1}$ |
| $L_{C1154}$ | $R^{D41}$ | $R^{D64}$ | $R^{D1}$ |
| $L_{C1155}$ | $R^{D41}$ | $R^{D66}$ | $R^{D1}$ |
| $L_{C1156}$ | $R^{D41}$ | $R^{D68}$ | $R^{D1}$ |
| $L_{C1157}$ | $R^{D41}$ | $R^{D76}$ | $R^{D1}$ |
| $L_{C1158}$ | $R^{D64}$ | $R^{D5}$ | $R^{D1}$ |
| $L_{C1159}$ | $R^{D64}$ | $R^{D6}$ | $R^{D1}$ |
| $L_{C1160}$ | $R^{D64}$ | $R^{D9}$ | $R^{D1}$ |
| $L_{C1161}$ | $R^{D64}$ | $R^{D10}$ | $R^{D1}$ |
| $L_{C1162}$ | $R^{D64}$ | $R^{D12}$ | $R^{D1}$ |
| $L_{C1163}$ | $R^{D64}$ | $R^{D15}$ | $R^{D1}$ |
| $L_{C1164}$ | $R^{D64}$ | $R^{D16}$ | $R^{D1}$ |
| $L_{C1165}$ | $R^{D64}$ | $R^{D17}$ | $R^{D1}$ |
| $L_{C1166}$ | $R^{D64}$ | $R^{D18}$ | $R^{D1}$ |
| $L_{C1167}$ | $R^{D64}$ | $R^{D19}$ | $R^{D1}$ |
| $L_{C1168}$ | $R^{D64}$ | $R^{D20}$ | $R^{D1}$ |
| $L_{C1169}$ | $R^{D64}$ | $R^{D21}$ | $R^{D1}$ |
| $L_{C1170}$ | $R^{D64}$ | $R^{D23}$ | $R^{D1}$ |
| $L_{C1171}$ | $R^{D64}$ | $R^{D24}$ | $R^{D1}$ |
| $L_{C1172}$ | $R^{D64}$ | $R^{D25}$ | $R^{D1}$ |
| $L_{C1173}$ | $R^{D64}$ | $R^{D27}$ | $R^{D1}$ |
| $L_{C1174}$ | $R^{D64}$ | $R^{D28}$ | $R^{D1}$ |
| $L_{C1175}$ | $R^{D64}$ | $R^{D29}$ | $R^{D1}$ |
| $L_{C1176}$ | $R^{D64}$ | $R^{D30}$ | $R^{D1}$ |
| $L_{C1177}$ | $R^{D64}$ | $R^{D31}$ | $R^{D1}$ |
| $L_{C1178}$ | $R^{D64}$ | $R^{D32}$ | $R^{D1}$ |
| $L_{C1179}$ | $R^{D64}$ | $R^{D33}$ | $R^{D1}$ |
| $L_{C1180}$ | $R^{D64}$ | $R^{D34}$ | $R^{D1}$ |
| $L_{C1181}$ | $R^{D64}$ | $R^{D42}$ | $R^{D1}$ |
| $L_{C1182}$ | $R^{D64}$ | $R^{D64}$ | $R^{D1}$ |
| $L_{C1183}$ | $R^{D64}$ | $R^{D66}$ | $R^{D1}$ |
| $L_{C1184}$ | $R^{D64}$ | $R^{D68}$ | $R^{D1}$ |
| $L_{C1185}$ | $R^{D64}$ | $R^{D76}$ | $R^{D1}$ |
| $L_{C1186}$ | $R^{D66}$ | $R^{D5}$ | $R^{D1}$ |
| $L_{C1187}$ | $R^{D66}$ | $R^{D6}$ | $R^{D1}$ |
| $L_{C1188}$ | $R^{D66}$ | $R^{D9}$ | $R^{D1}$ |
| $L_{C1189}$ | $R^{D66}$ | $R^{D10}$ | $R^{D1}$ |
| $L_{C1190}$ | $R^{D66}$ | $R^{D12}$ | $R^{D1}$ |
| $L_{C1191}$ | $R^{D66}$ | $R^{D15}$ | $R^{D1}$ |
| $L_{C1192}$ | $R^{D66}$ | $R^{D16}$ | $R^{D1}$ |
| $L_{C1193}$ | $R^{D66}$ | $R^{D17}$ | $R^{D1}$ |
| $L_{C1194}$ | $R^{D66}$ | $R^{D18}$ | $R^{D1}$ |
| $L_{C1195}$ | $R^{D66}$ | $R^{D19}$ | $R^{D1}$ |
| $L_{C1196}$ | $R^{D66}$ | $R^{D20}$ | $R^{D1}$ |
| $L_{C1197}$ | $R^{D66}$ | $R^{D21}$ | $R^{D1}$ |
| $L_{C1198}$ | $R^{D66}$ | $R^{D23}$ | $R^{D1}$ |
| $L_{C1199}$ | $R^{D66}$ | $R^{D24}$ | $R^{D1}$ |
| $L_{C1200}$ | $R^{D66}$ | $R^{D25}$ | $R^{D1}$ |
| $L_{C1201}$ | $R^{D66}$ | $R^{D27}$ | $R^{D1}$ |
| $L_{C1202}$ | $R^{D66}$ | $R^{D28}$ | $R^{D1}$ |
| $L_{C1203}$ | $R^{D66}$ | $R^{D29}$ | $R^{D1}$ |
| $L_{C1204}$ | $R^{D66}$ | $R^{D30}$ | $R^{D1}$ |
| $L_{C1205}$ | $R^{D66}$ | $R^{D31}$ | $R^{D1}$ |
| $L_{C1206}$ | $R^{D66}$ | $R^{D32}$ | $R^{D1}$ |
| $L_{C1207}$ | $R^{D66}$ | $R^{D33}$ | $R^{D1}$ |
| $L_{C1208}$ | $R^{D66}$ | $R^{D34}$ | $R^{D1}$ |
| $L_{C1209}$ | $R^{D66}$ | $R^{D42}$ | $R^{D1}$ |
| $L_{C1210}$ | $R^{D66}$ | $R^{D68}$ | $R^{D1}$ |
| $L_{C1211}$ | $R^{D66}$ | $R^{D76}$ | $R^{D1}$ |
| $L_{C1212}$ | $R^{D68}$ | $R^{D5}$ | $R^{D1}$ |
| $L_{C1213}$ | $R^{D68}$ | $R^{D6}$ | $R^{D1}$ |
| $L_{C1214}$ | $R^{D68}$ | $R^{D9}$ | $R^{D1}$ |
| $L_{C1215}$ | $R^{D68}$ | $R^{D10}$ | $R^{D1}$ |
| $L_{C1216}$ | $R^{D68}$ | $R^{D12}$ | $R^{D1}$ |
| $L_{C1217}$ | $R^{D68}$ | $R^{D15}$ | $R^{D1}$ |
| $L_{C1218}$ | $R^{D68}$ | $R^{D16}$ | $R^{D1}$ |

-continued

| Ligand | $R^1$ | $R^2$ | $R^3$ |
|---|---|---|---|
| $L_{C1219}$ | $R^{D68}$ | $R^{D17}$ | $R^{D1}$ |
| $L_{C1220}$ | $R^{D68}$ | $R^{D18}$ | $R^{D1}$ |
| $L_{C1221}$ | $R^{D68}$ | $R^{D19}$ | $R^{D1}$ |
| $L_{C1222}$ | $R^{D68}$ | $R^{D20}$ | $R^{D1}$ |
| $L_{C1223}$ | $R^{D68}$ | $R^{D21}$ | $R^{D1}$ |
| $L_{C1224}$ | $R^{D68}$ | $R^{D23}$ | $R^{D1}$ |
| $L_{C1225}$ | $R^{D68}$ | $R^{D24}$ | $R^{D1}$ |
| $L_{C1226}$ | $R^{D68}$ | $R^{D25}$ | $R^{D1}$ |
| $L_{C1227}$ | $R^{D68}$ | $R^{D27}$ | $R^{D1}$ |
| $L_{C1228}$ | $R^{D68}$ | $R^{D28}$ | $R^{D1}$ |
| $L_{C1229}$ | $R^{D68}$ | $R^{D29}$ | $R^{D1}$ |
| $L_{C1230}$ | $R^{D68}$ | $R^{D30}$ | $R^{D1}$ |
| $L_{C1231}$ | $R^{D68}$ | $R^{D31}$ | $R^{D1}$ |
| $L_{C1232}$ | $R^{D68}$ | $R^{D32}$ | $R^{D1}$ |
| $L_{C1233}$ | $R^{D68}$ | $R^{D33}$ | $R^{D1}$ |
| $L_{C1234}$ | $R^{D68}$ | $R^{D34}$ | $R^{D1}$ |
| $L_{C1235}$ | $R^{D68}$ | $R^{D42}$ | $R^{D1}$ |
| $L_{C1236}$ | $R^{D68}$ | $R^{D76}$ | $R^{D1}$ |
| $L_{C1237}$ | $R^{D76}$ | $R^{D5}$ | $R^{D1}$ |
| $L_{C1238}$ | $R^{D76}$ | $R^{D6}$ | $R^{D1}$ |
| $L_{C1239}$ | $R^{D76}$ | $R^{D9}$ | $R^{D1}$ |
| $L_{C1240}$ | $R^{D76}$ | $R^{D10}$ | $R^{D1}$ |
| $L_{C1241}$ | $R^{D76}$ | $R^{D12}$ | $R^{D1}$ |
| $L_{C1242}$ | $R^{D76}$ | $R^{D15}$ | $R^{D1}$ |
| $L_{C1243}$ | $R^{D76}$ | $R^{D16}$ | $R^{D1}$ |
| $L_{C1244}$ | $R^{D76}$ | $R^{D17}$ | $R^{D1}$ |
| $L_{C1245}$ | $R^{D76}$ | $R^{D18}$ | $R^{D1}$ |
| $L_{C1246}$ | $R^{D76}$ | $R^{D19}$ | $R^{D1}$ |
| $L_{C1247}$ | $R^{D76}$ | $R^{D20}$ | $R^{D1}$ |
| $L_{C1248}$ | $R^{D76}$ | $R^{D21}$ | $R^{D1}$ |
| $L_{C1249}$ | $R^{D76}$ | $R^{D23}$ | $R^{D1}$ |
| $L_{C1250}$ | $R^{D76}$ | $R^{D24}$ | $R^{D1}$ |
| $L_{C1251}$ | $R^{D76}$ | $R^{D25}$ | $R^{D1}$ |
| $L_{C1252}$ | $R^{D76}$ | $R^{D27}$ | $R^{D1}$ |
| $L_{C1253}$ | $R^{D76}$ | $R^{D28}$ | $R^{D1}$ |
| $L_{C1254}$ | $R^{D76}$ | $R^{D29}$ | $R^{D1}$ |
| $L_{C1255}$ | $R^{D76}$ | $R^{D30}$ | $R^{D1}$ |
| $L_{C1256}$ | $R^{D76}$ | $R^{D31}$ | $R^{D1}$ |
| $L_{C1257}$ | $R^{D76}$ | $R^{D32}$ | $R^{D1}$ |
| $L_{C1258}$ | $R^{D76}$ | $R^{D33}$ | $R^{D1}$ |
| $L_{C1259}$ | $R^{D76}$ | $R^{D34}$ | $R^{D1}$ |
| $L_{C1260}$ | $R^{D76}$ | $R^{D42}$ | $R^{D1}$, |

where $R^{D1}$ to $R^{D21}$ have the following structures:

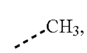

$R^{D1}$

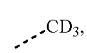

$R^{D2}$

$R^{D3}$

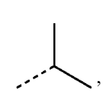

$R^{D4}$

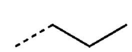

$R^{D5}$

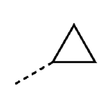

$R^{D6}$

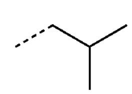

$R^{D7}$

-continued
$R^{D8}$
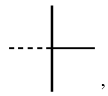
$R^{D9}$
$R^{D10}$
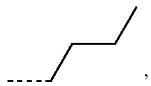
$R^{D11}$
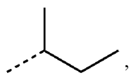
$R^{D12}$
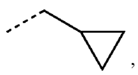
$R^{D13}$
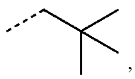
$R^{D14}$
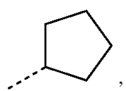
$R^{D15}$
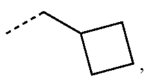
$R^{D16}$
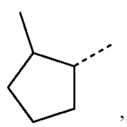
$R^{D17}$
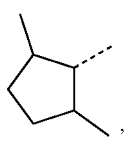
$R^{D18}$
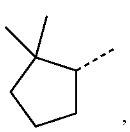
$R^{D19}$
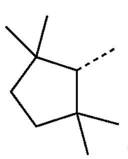
$R^{D20}$
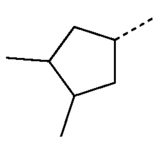
$R^{D21}$
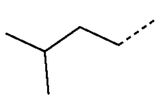
-continued
$R^{D22}$
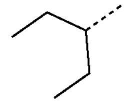
$R^{D23}$
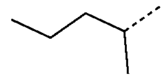
$R^{D24}$
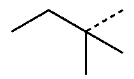
$R^{D25}$
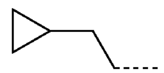
$R^{D26}$
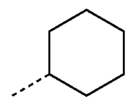
$R^{D27}$
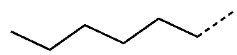
$R^{D28}$
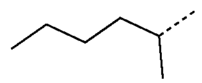
$R^{D29}$
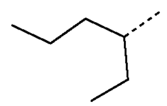
$R^{D30}$
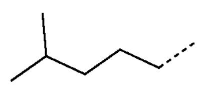
$R^{D31}$
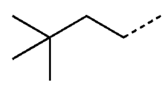
$R^{D32}$
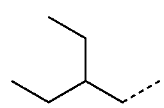
$R^{D33}$
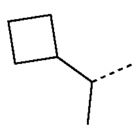
$R^{D34}$
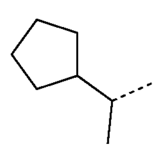
$R^{D35}$
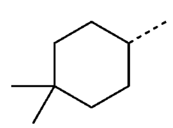

-continued
$R^{D36}$
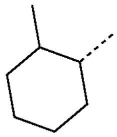
,
$R^{D37}$
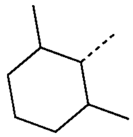
,
$R^{D38}$
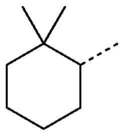
,
$R^{D39}$
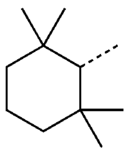
,
$R^{D40}$
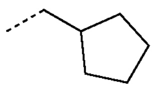
,
$R^{D41}$
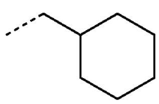
,
$R^{D42}$
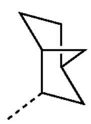
,
$R^{D43}$
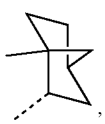
,
$R^{D44}$
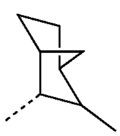
,
$R^{D45}$
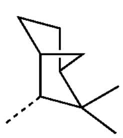
,
$R^{D46}$
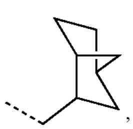
,
-continued
$R^{D47}$
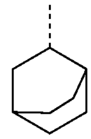
,
$R^{D48}$
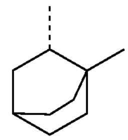
,
$R^{D49}$
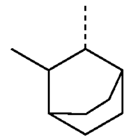
,
$R^{D50}$
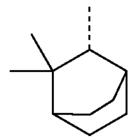
,
$R^{D51}$
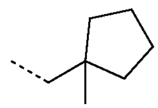
,
$R^{D52}$
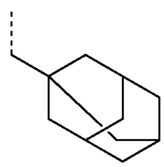
,
$R^{D53}$
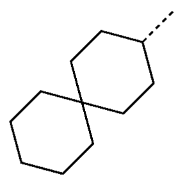
,
$R^{D54}$
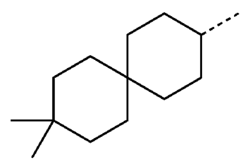
,
$R^{D55}$
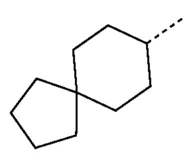
,
$R^{D56}$
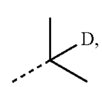
$R^{D57}$
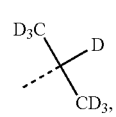

-continued $R^{D58}$

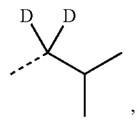

$R^{D59}$

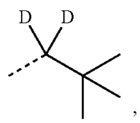

$R^{D60}$

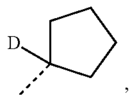

$R^{D61}$

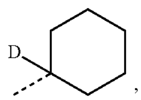

$R^{D62}$

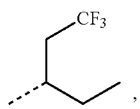

$R^{D63}$

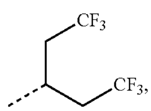

$R^{D64}$

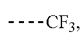

$R^{D65}$

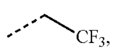

$R^{D66}$

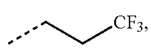

$R^{D67}$

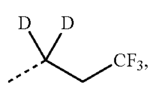

$R^{D68}$

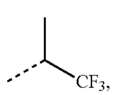

$R^{D69}$

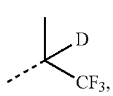

$R^{D70}$

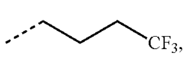

$R^{D71}$

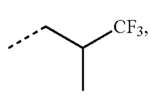

$R^{D72}$

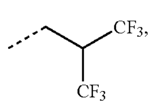

$R^{D73}$

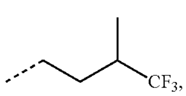

-continued $R^{D74}$

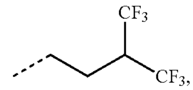

$R^{D75}$

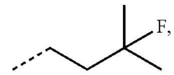

$R^{D76}$

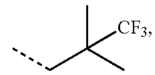

$R^{D77}$

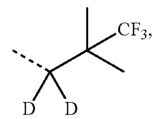

$R^{D78}$

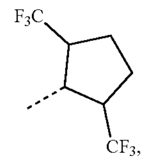

$R^{D79}$

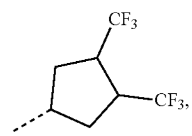

$R^{D80}$

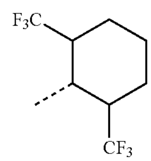

, and $R^{D81}$

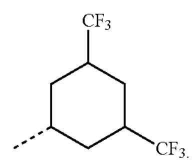

According to another aspect, an organic light emitting device (OLED) comprising: an anode; a cathode; and an organic layer disposed between the anode and the cathode is disclosed. The

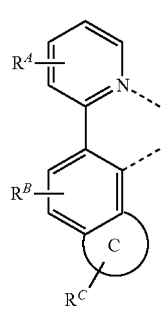

organic layer comprises the compound comprising the ligand $L_A$ of Formula I described herein.

A consumer product also disclosed that comprises the OLED whose organic layer comprises the compound comprising the ligand $L_A$ of Formula I described herein.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

An emissive region in an OLED is also disclosed. The emissive region comprises the compound comprising the ligand $L_A$ of Formula I

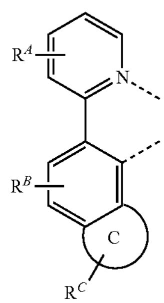

described herein.

In some embodiments of the emissive region, the compound is an emissive dopant or a non-emissive dopant. In some embodiments, the emissive region further comprises a host, wherein the host contains at least one group selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene.

In some embodiments, the emissive region further comprises a host, wherein the host is selected from the group consisting of:

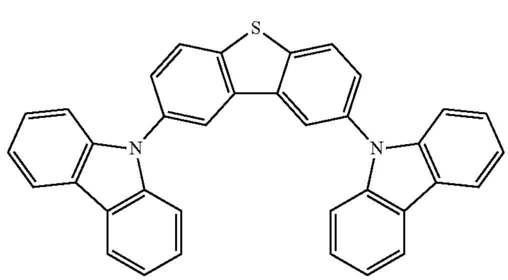

,

-continued

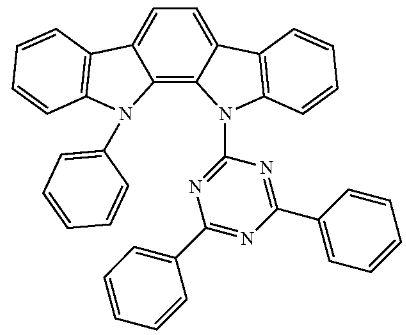

,

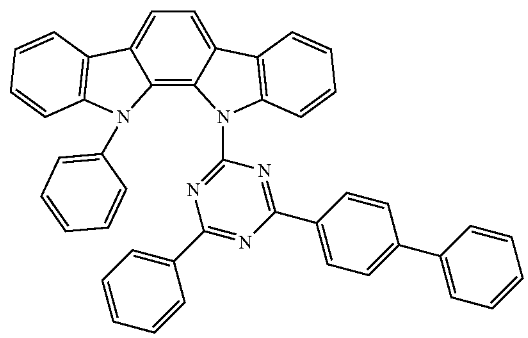

,

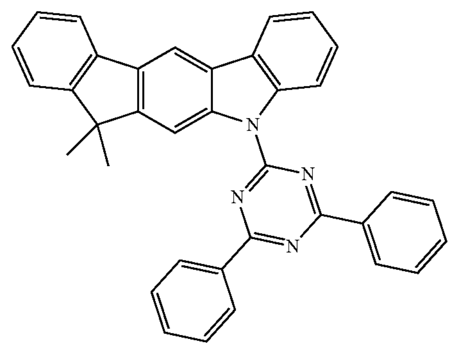

,

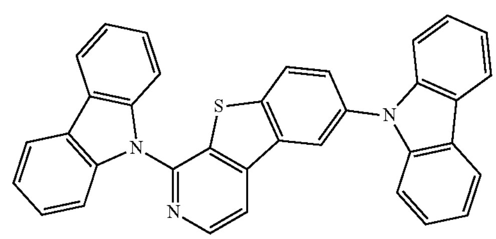

,

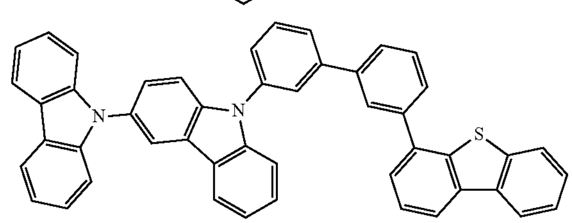

,

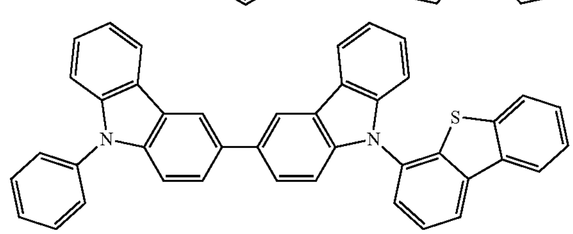

,

-continued
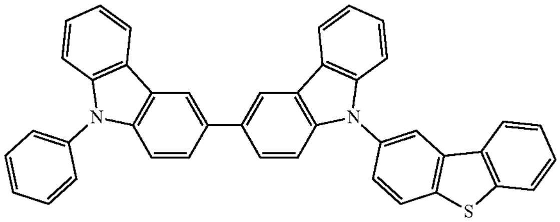
,
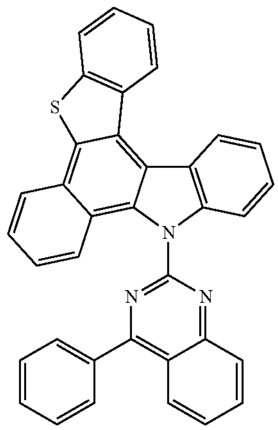
,
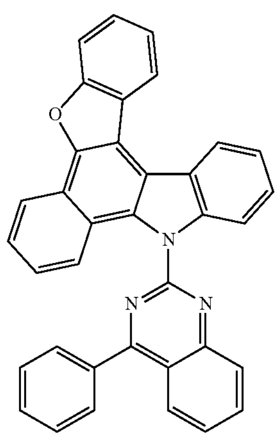
,
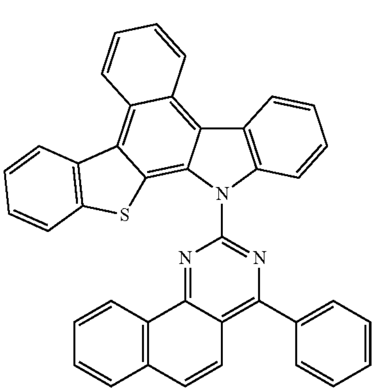
,
-continued
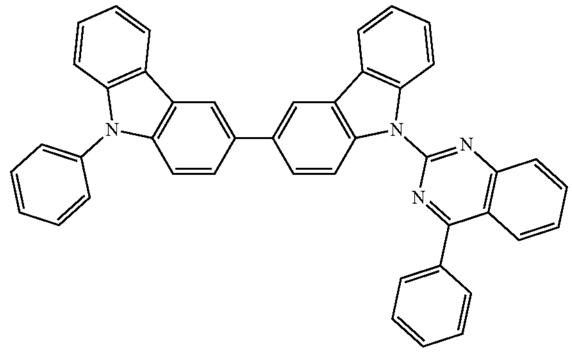
,
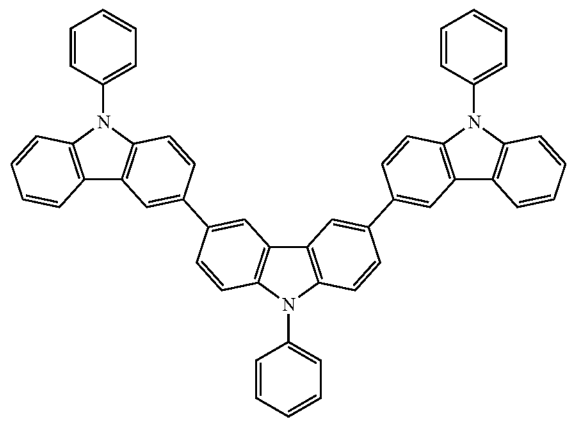
,
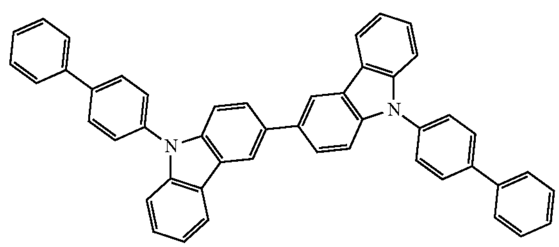
,
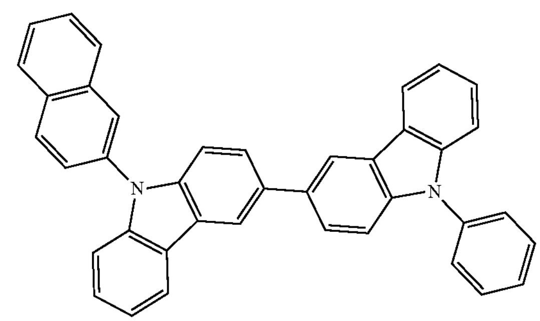
,
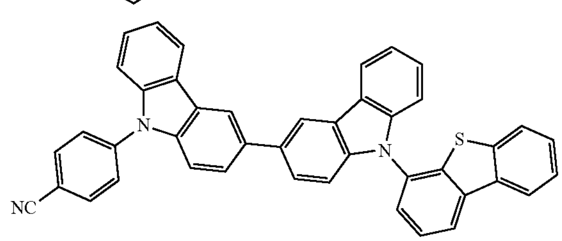
, -continued

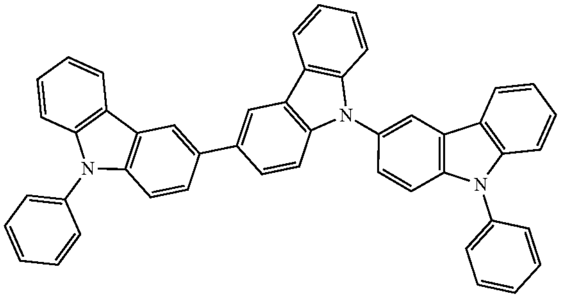

,

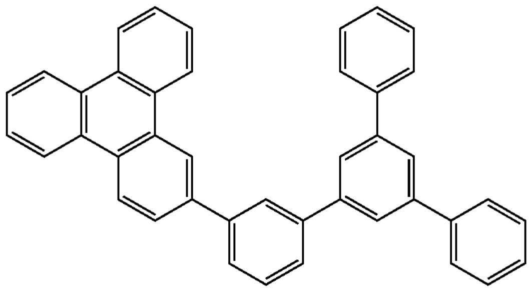

,

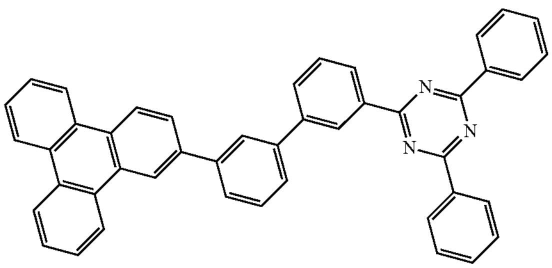

,

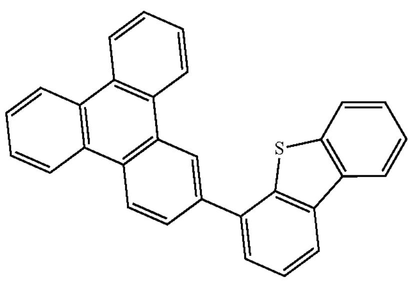

,

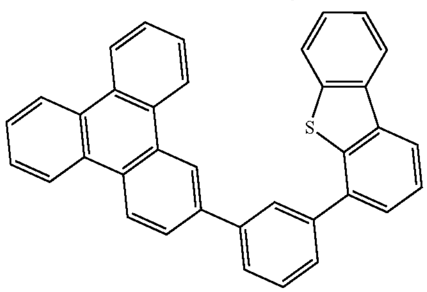

,

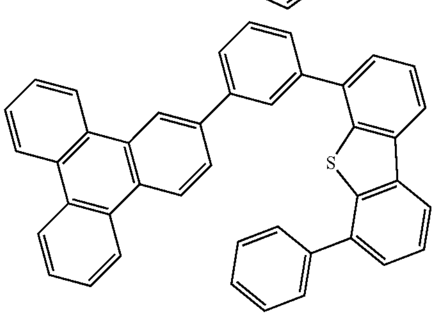

,

-continued

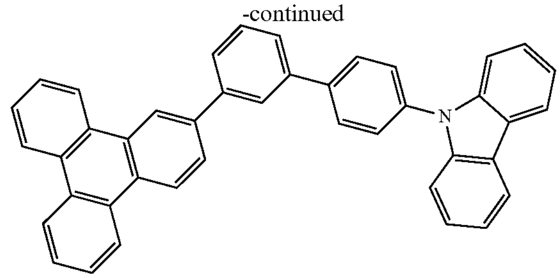

,

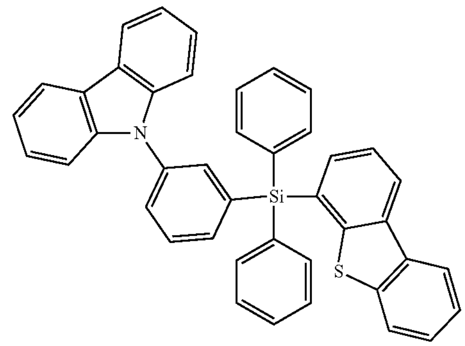

,

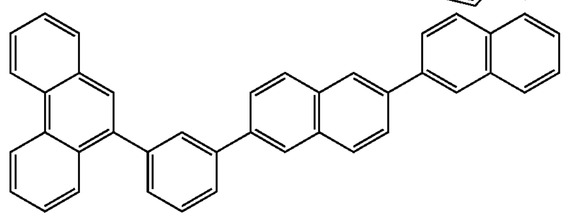

, and combinations thereof.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, published on Mar. 14, 2019 as U.S. patent application publication No. 2019/0081248, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others).

When there are more than one ligand coordinated to a metal, the ligands can all be the same in some embodiments. In some other embodiments, at least one ligand is different from the other ligand(s). In som embodiments, every ligand can be different from each other. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1$-$Ar_2$, and $C_nH_{2n}$-$Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound, for example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

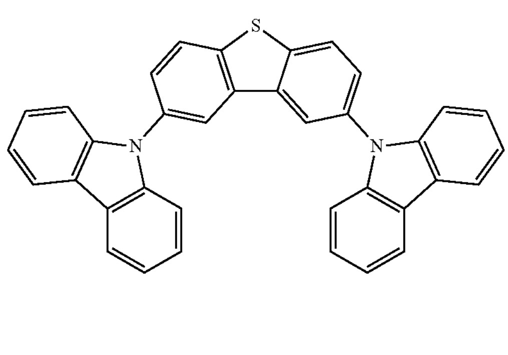

,

-continued

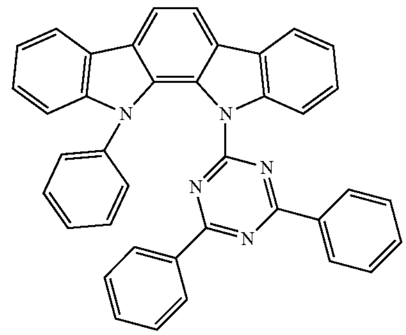

,

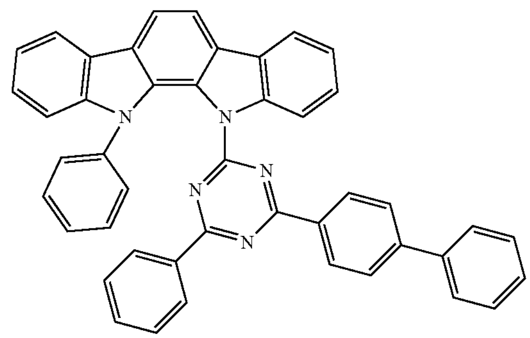

,

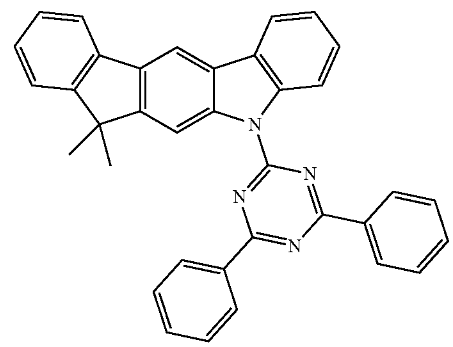

,

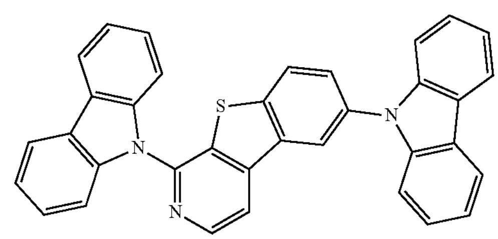

,

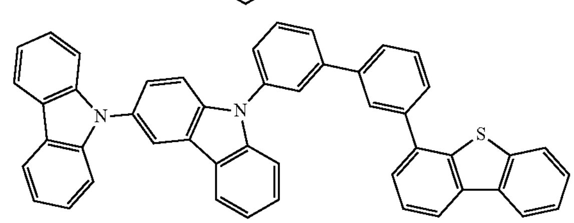

,

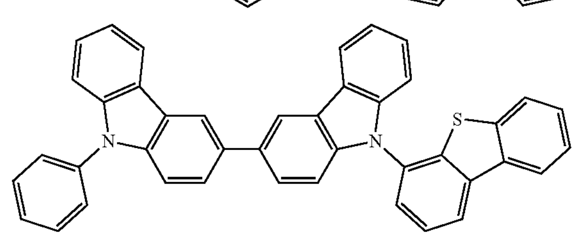

,

-continued
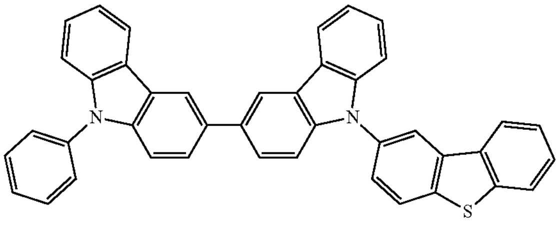
,
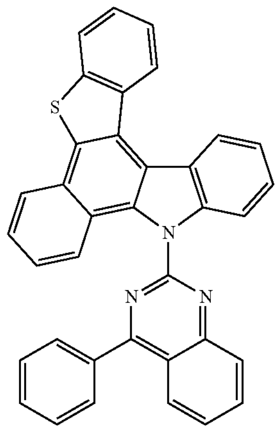
,
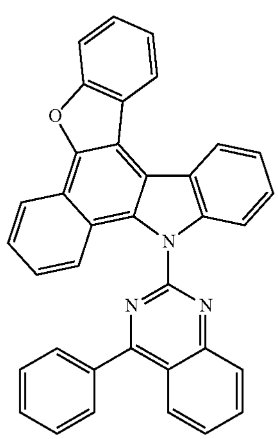
,
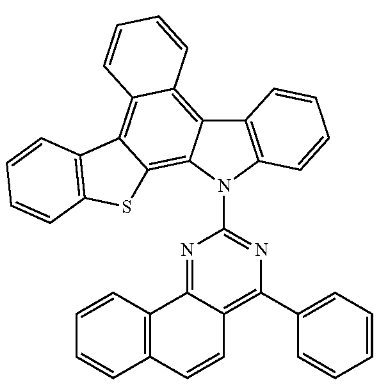
,
-continued
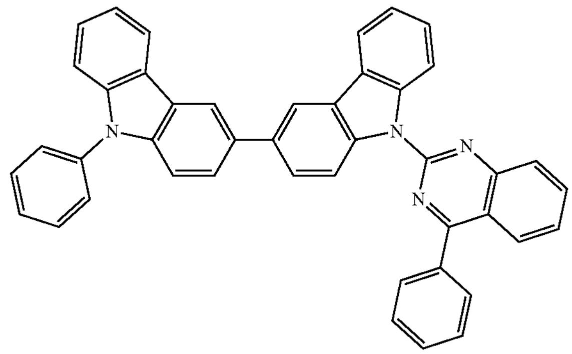
,
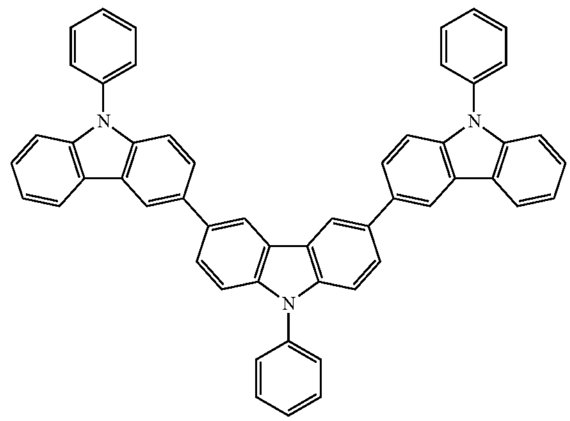
,
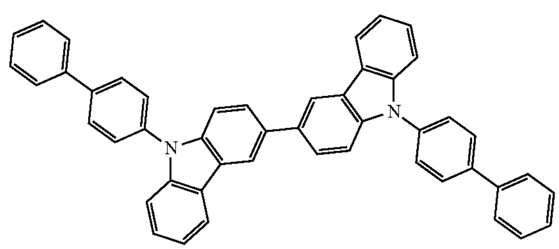
,
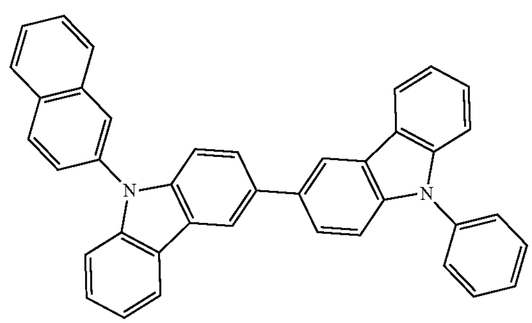
,
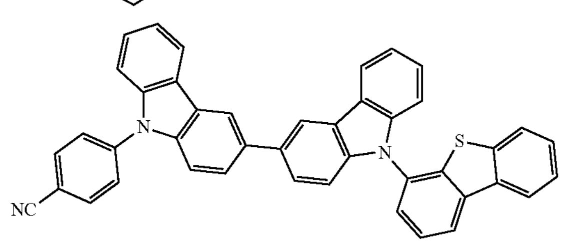
, -continued

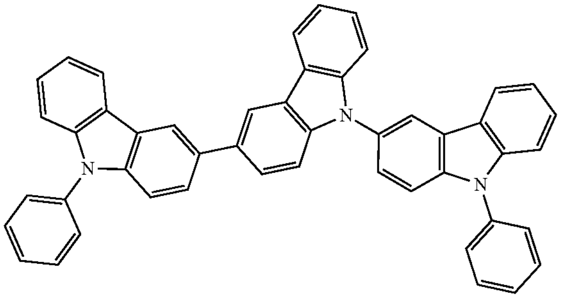

,

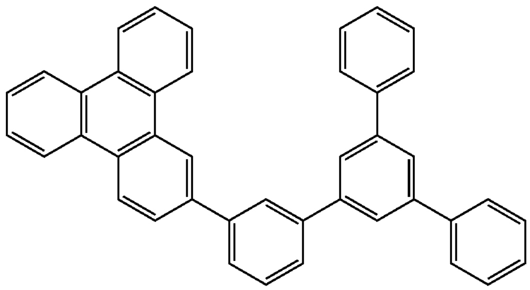

,

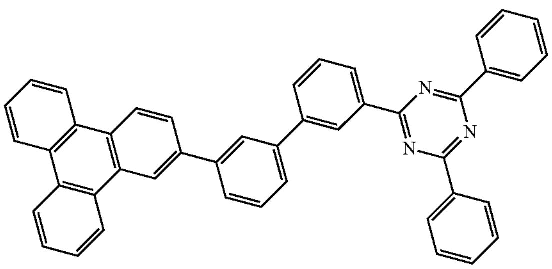

,

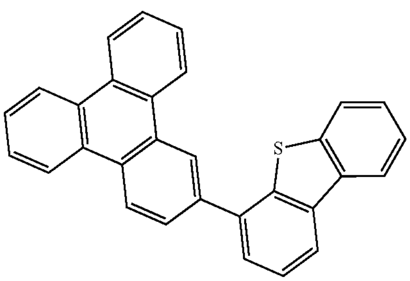

,

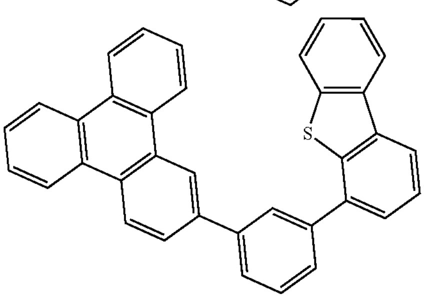

,

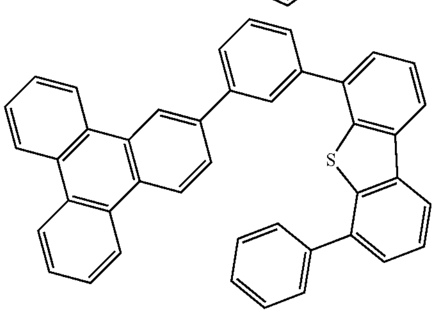

,

-continued

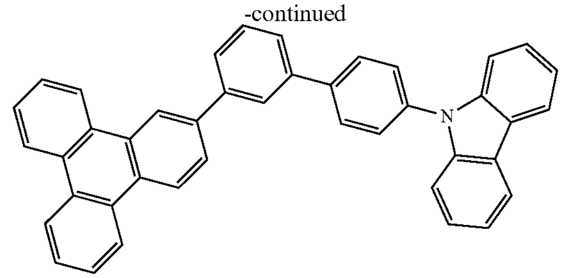

,

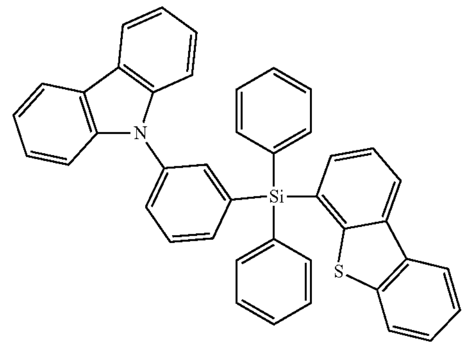

,

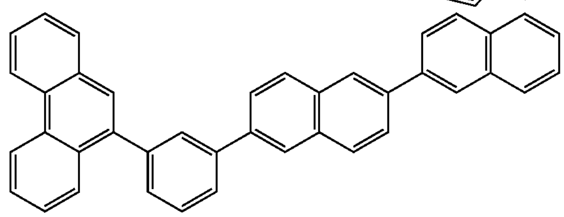

, and combinations thereof.

Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

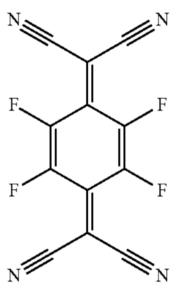

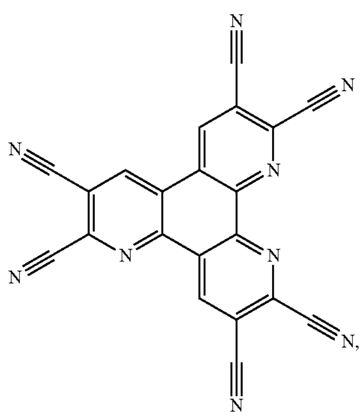

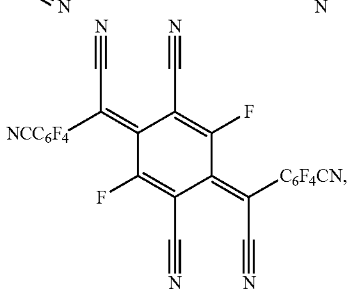

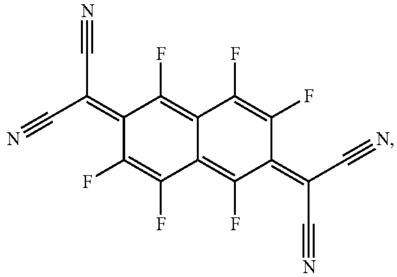

-continued

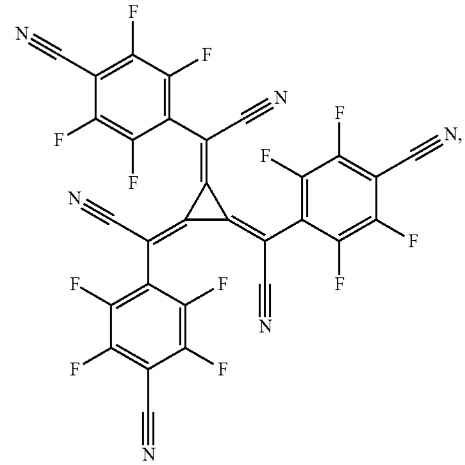

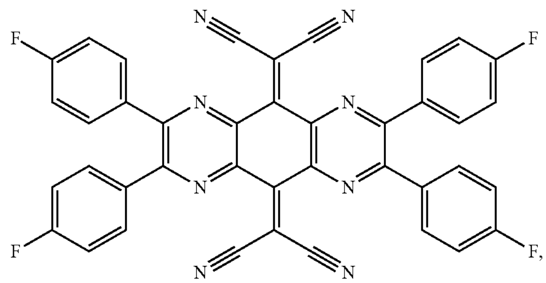

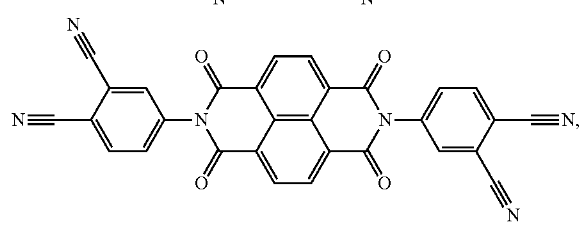

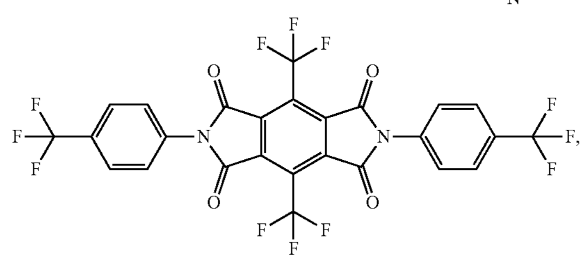

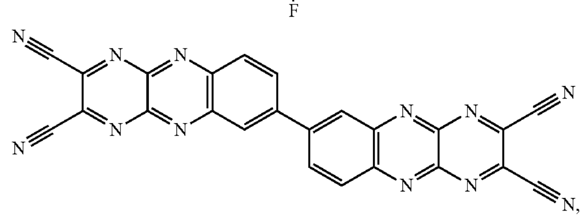

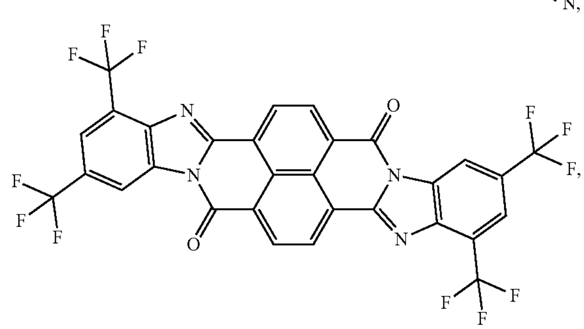

-continued

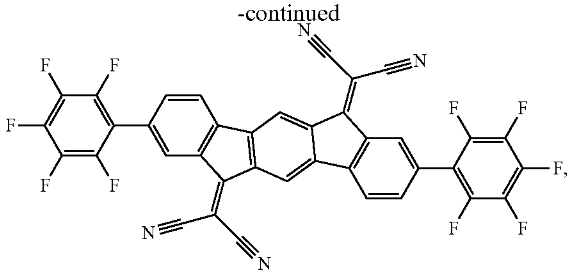

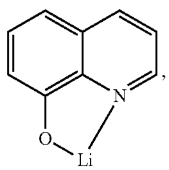

, and

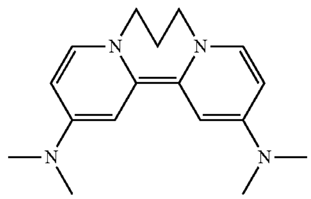

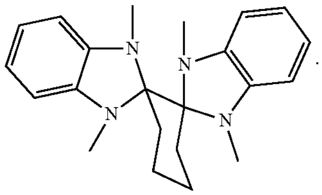

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

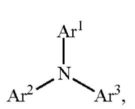

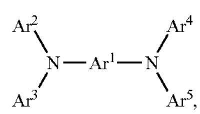

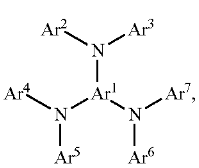

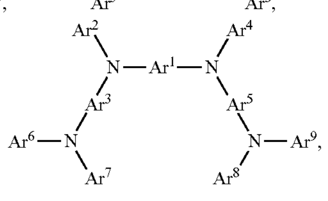

and

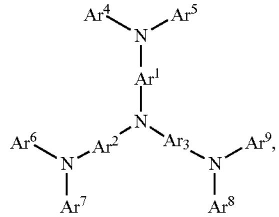

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

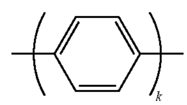

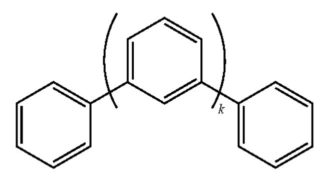

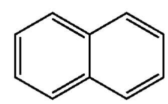

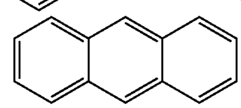

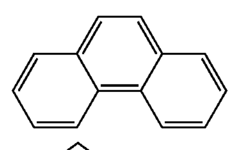

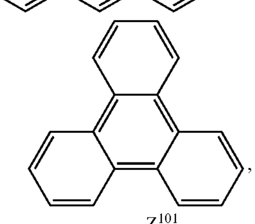

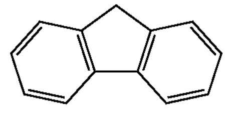

and

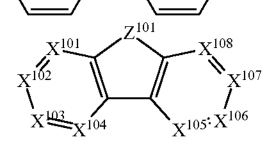

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

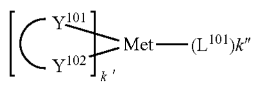

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

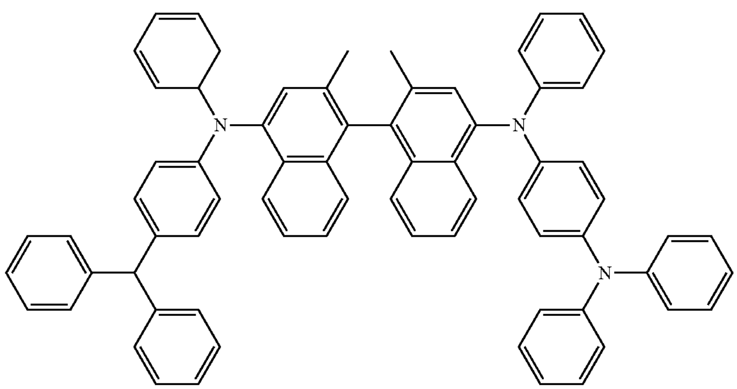

,

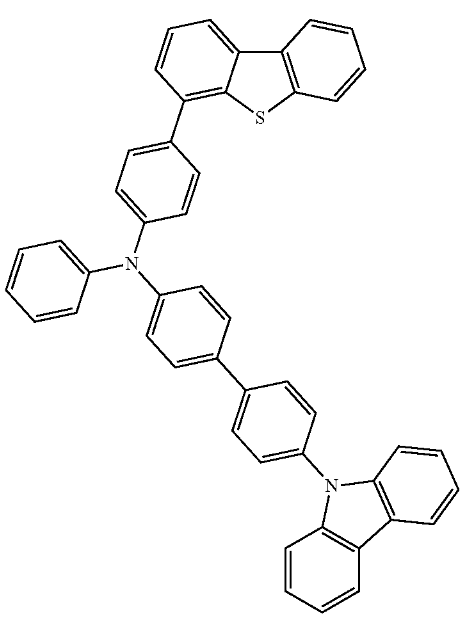

,

-continued
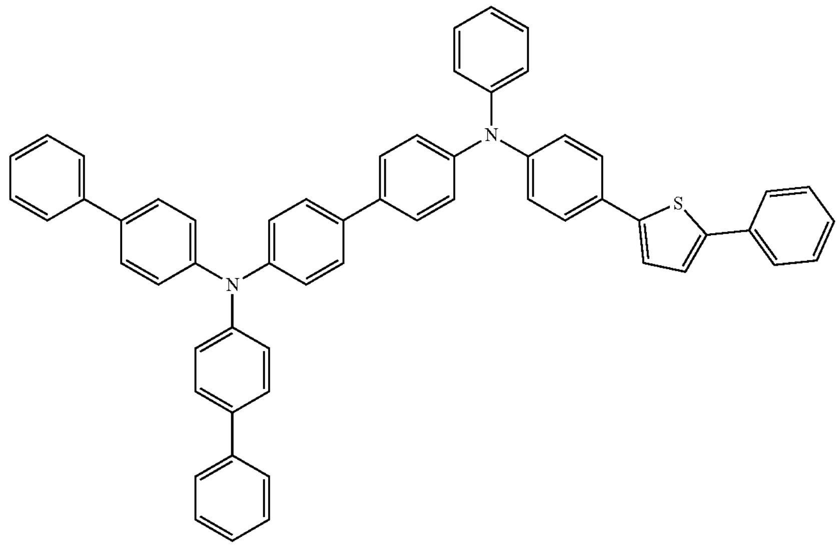
,
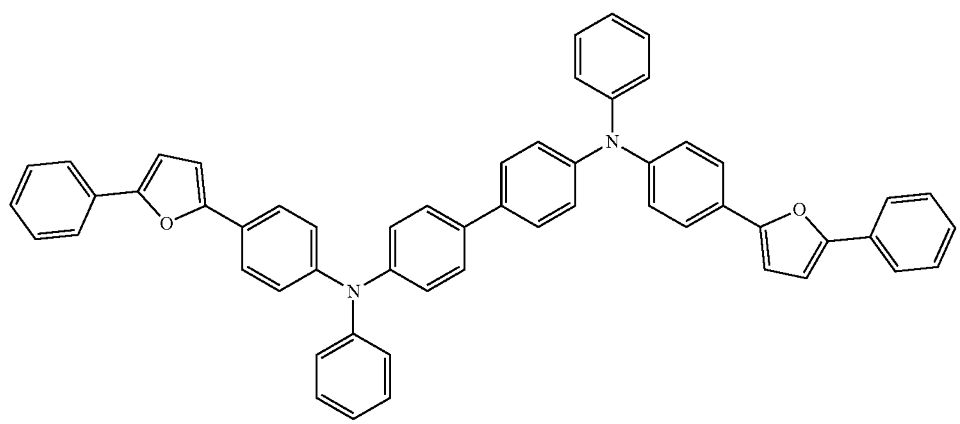
,
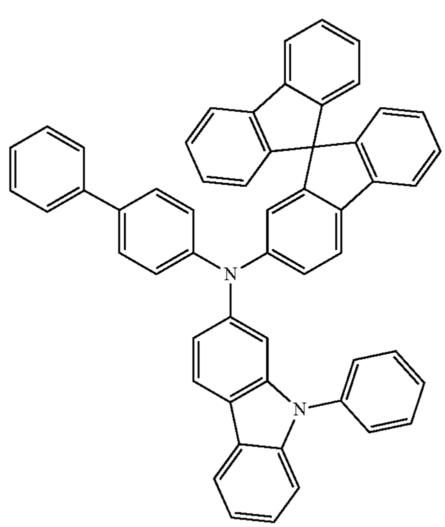
,
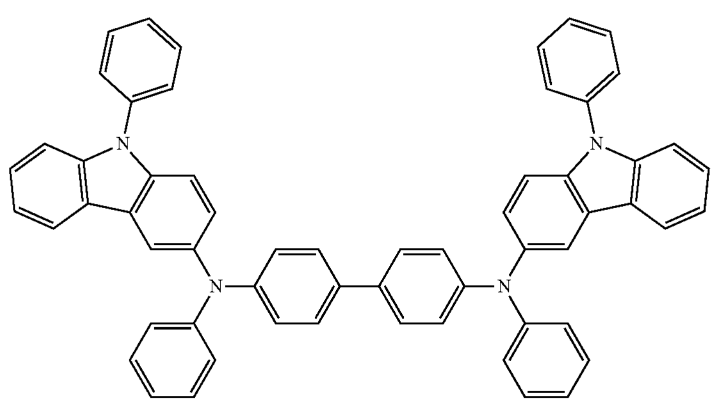
,

-continued
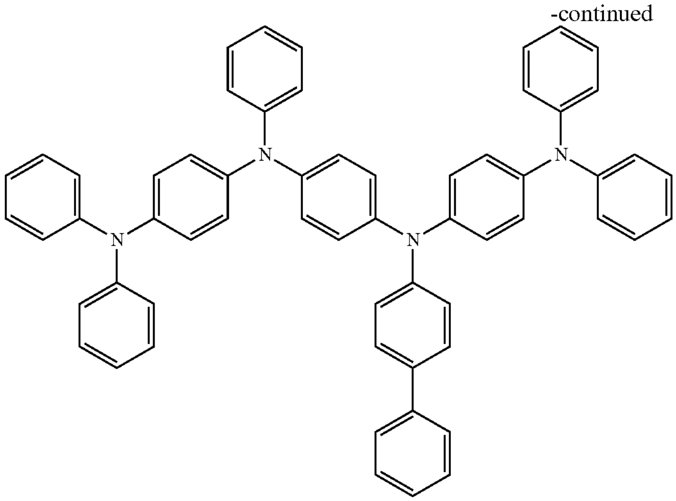
,
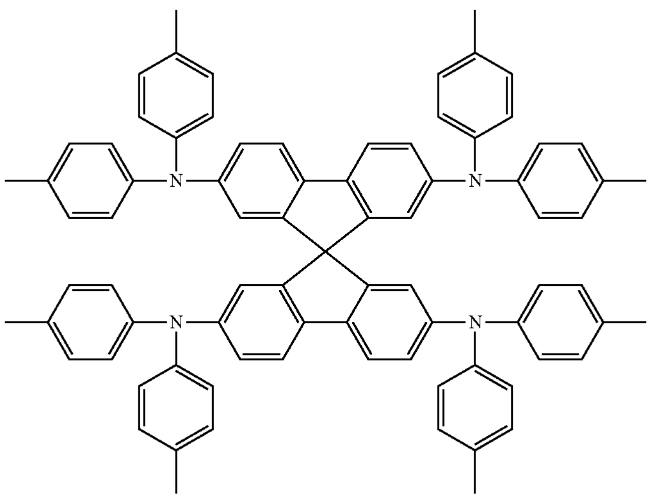
,
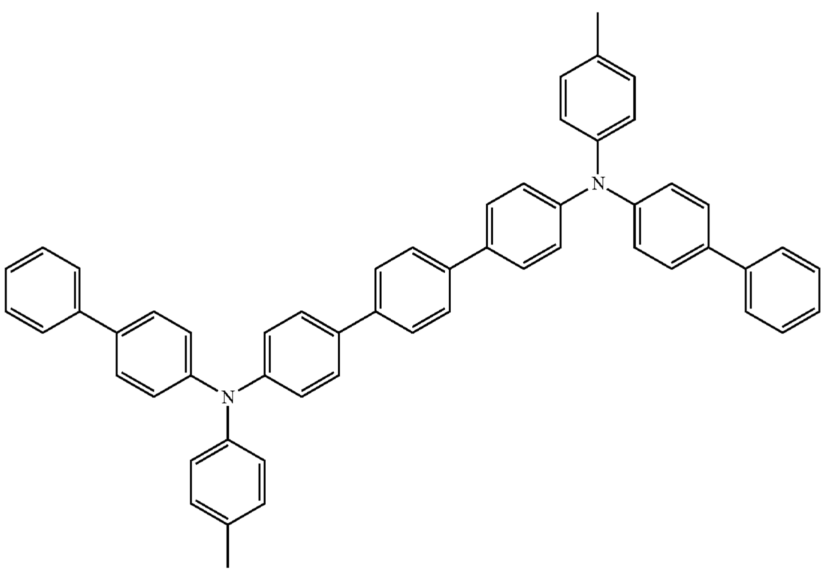
,

-continued
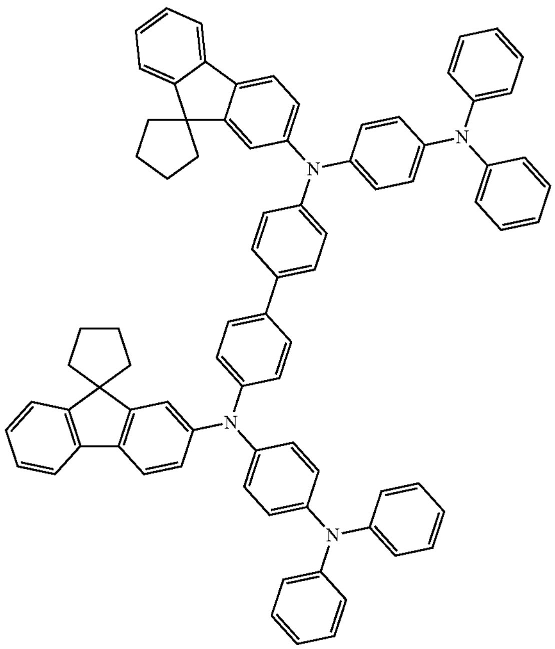
,
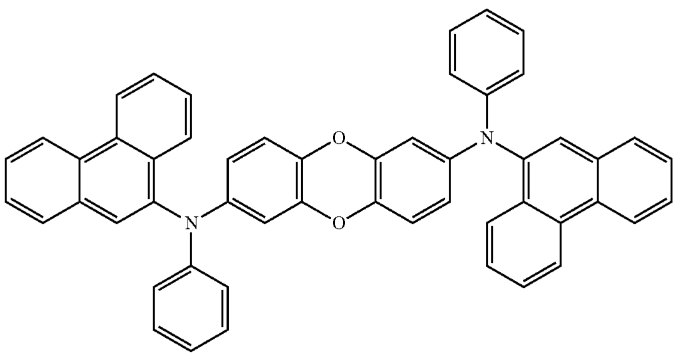
,
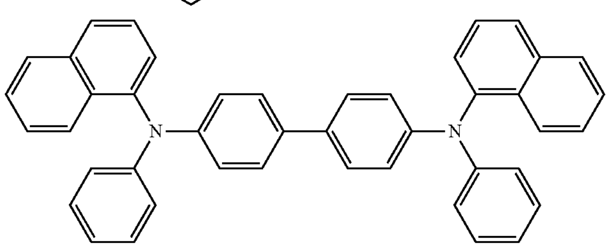
+ $MoO_x$
,
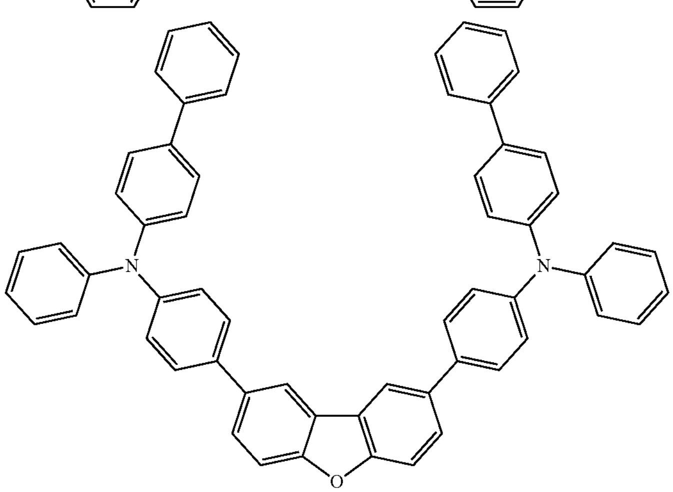
,
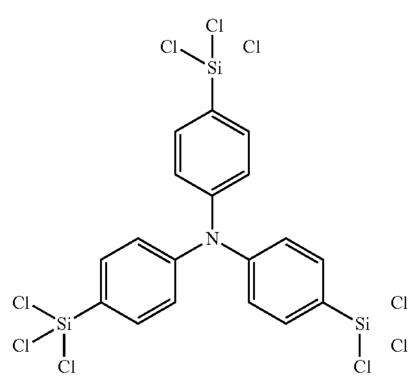
, -continued
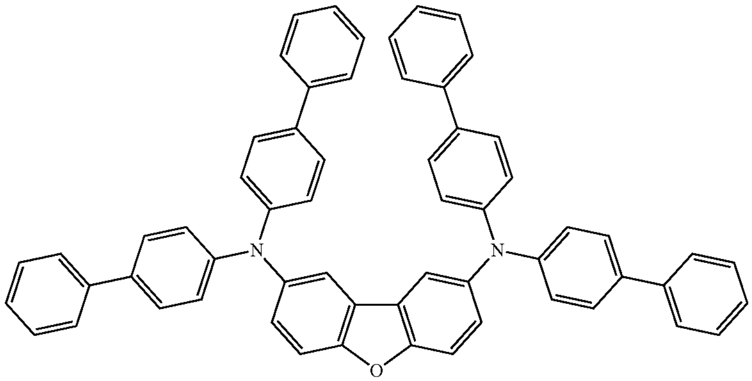
,
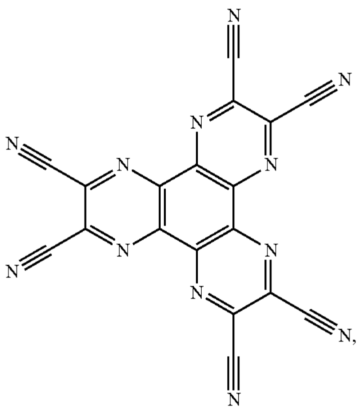
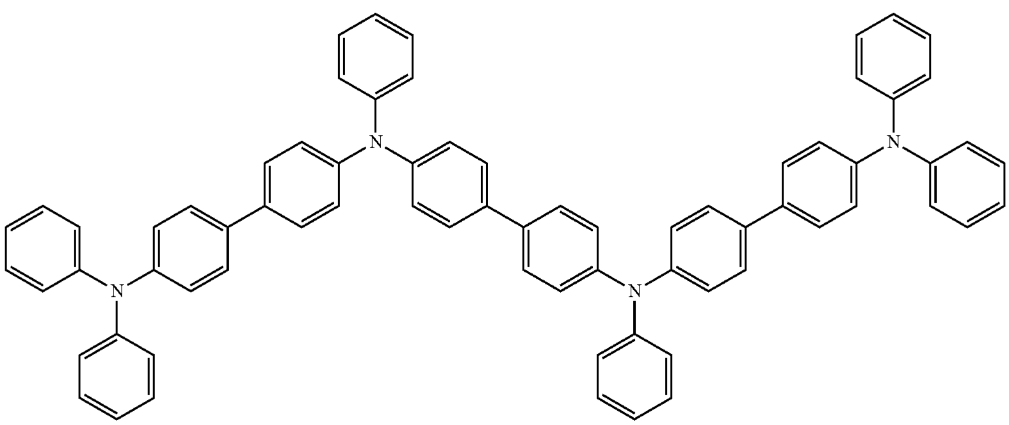
,
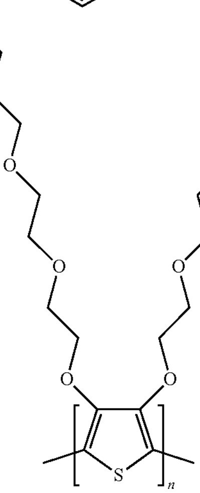
,
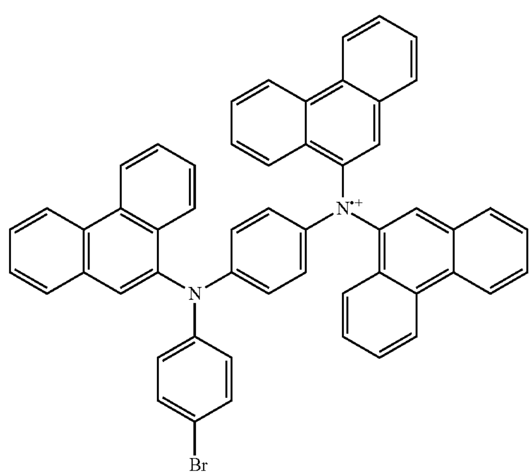
, -continued
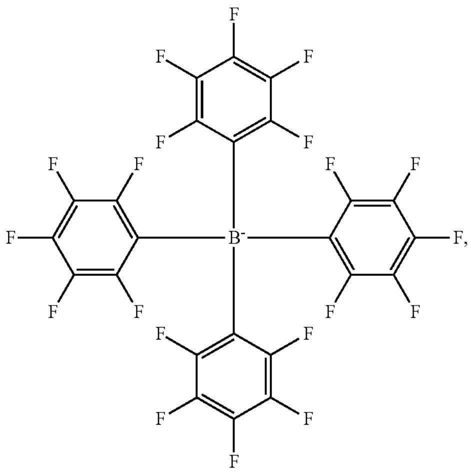
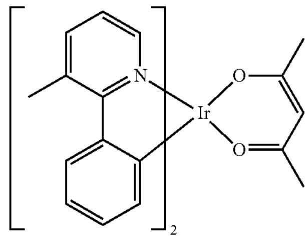
,
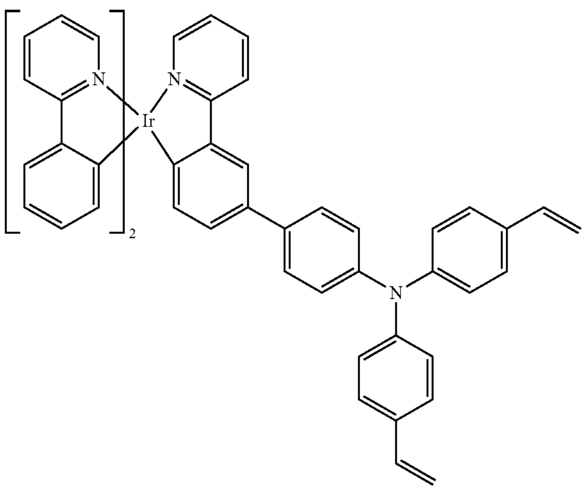
,
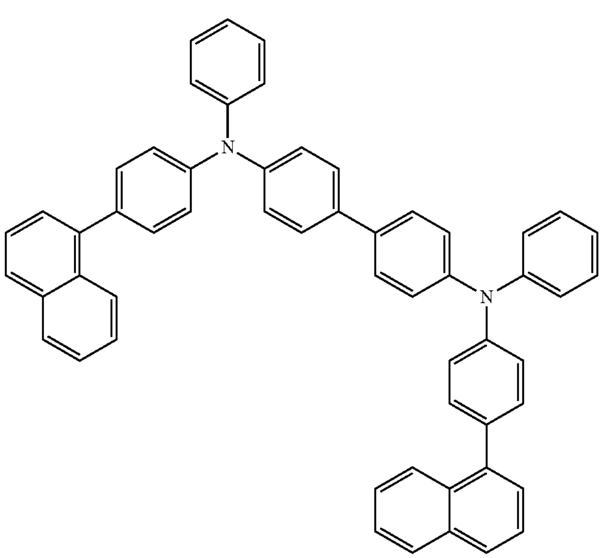
, -continued
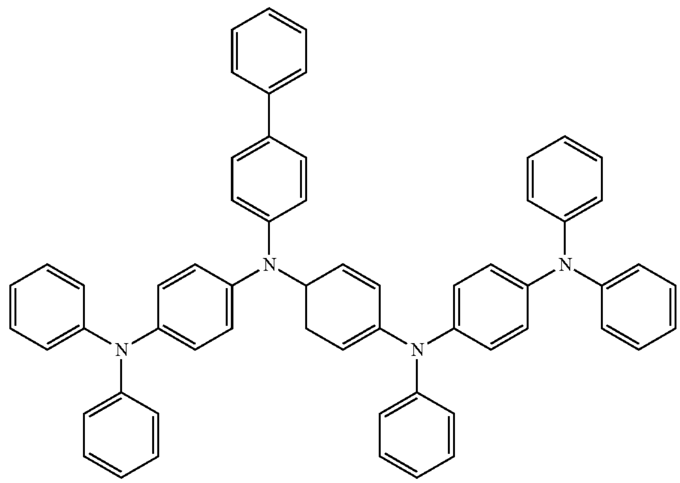
,
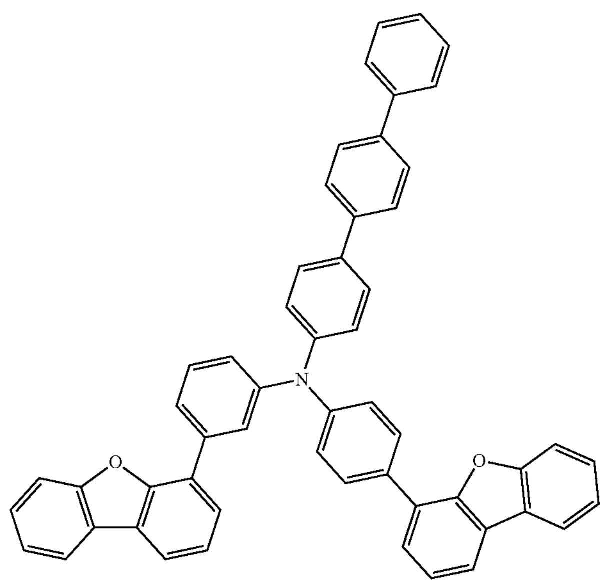
,
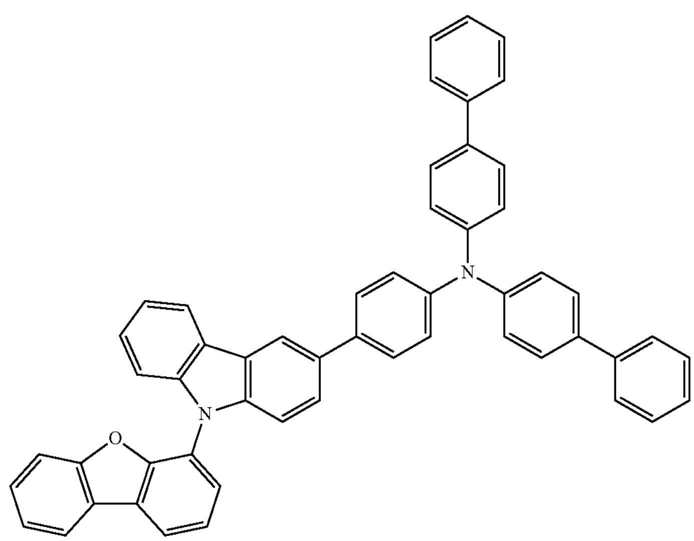
, -continued
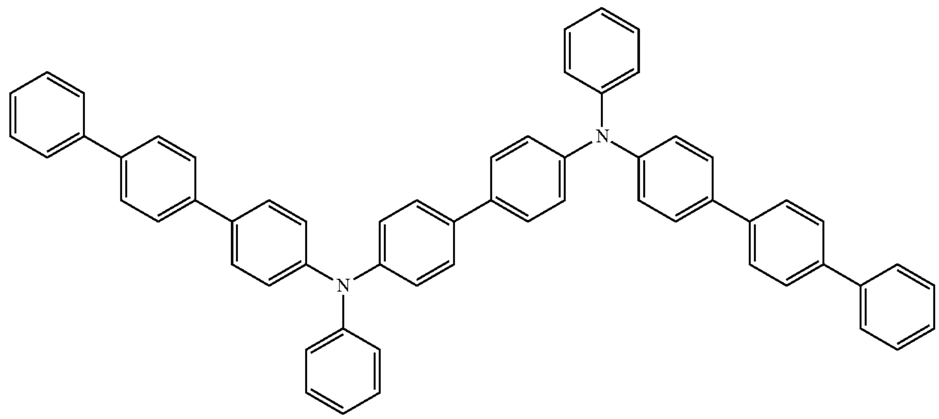
,
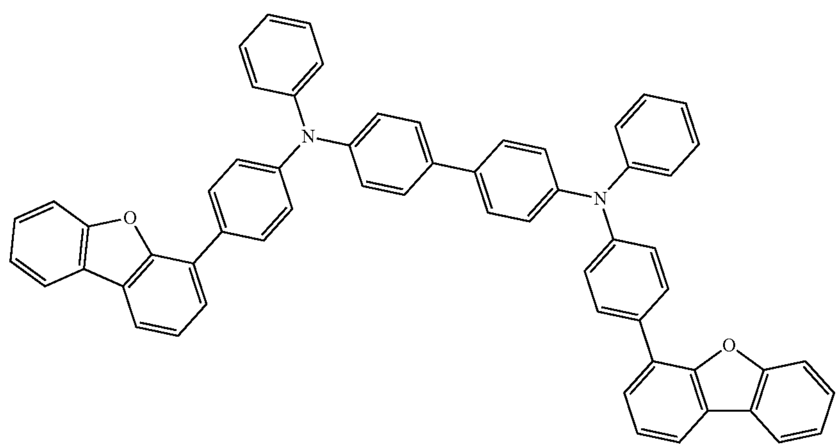
,
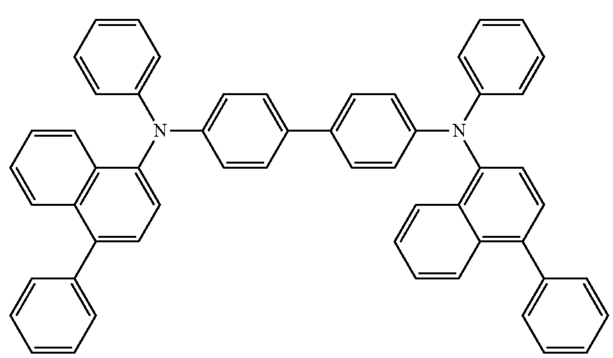
, -continued
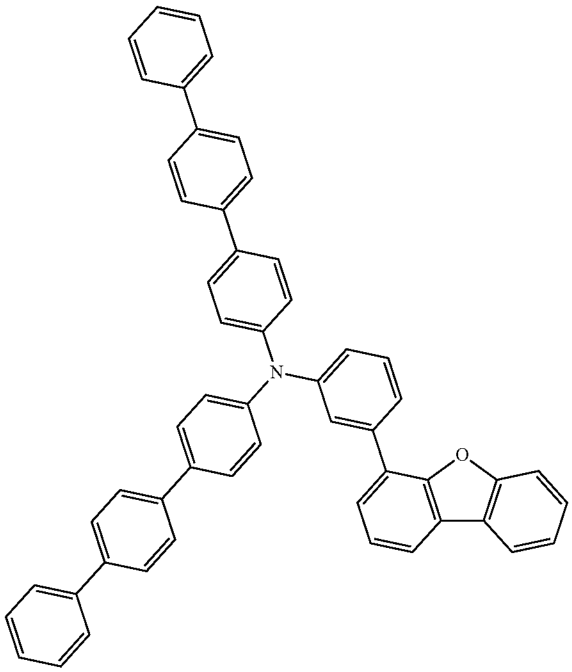
,
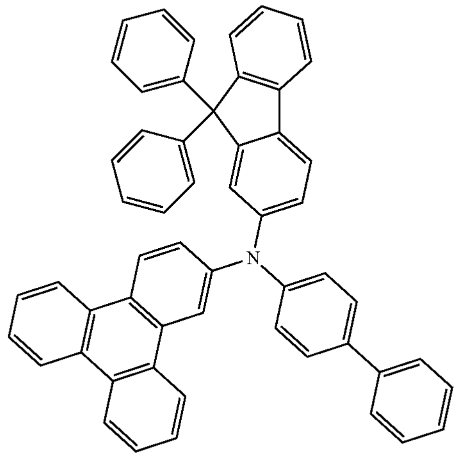
,
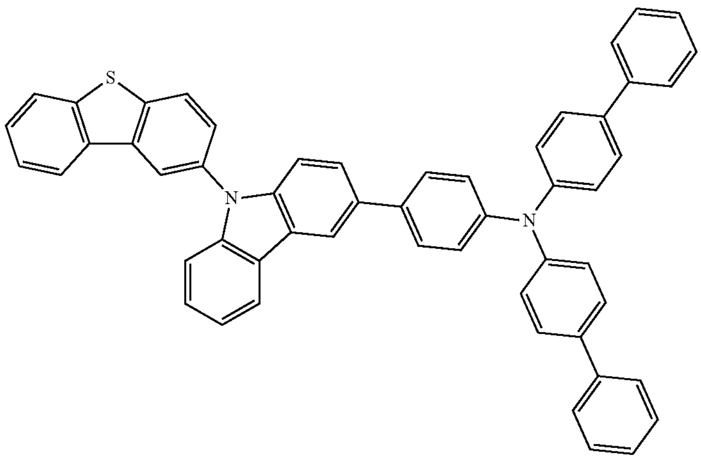
,
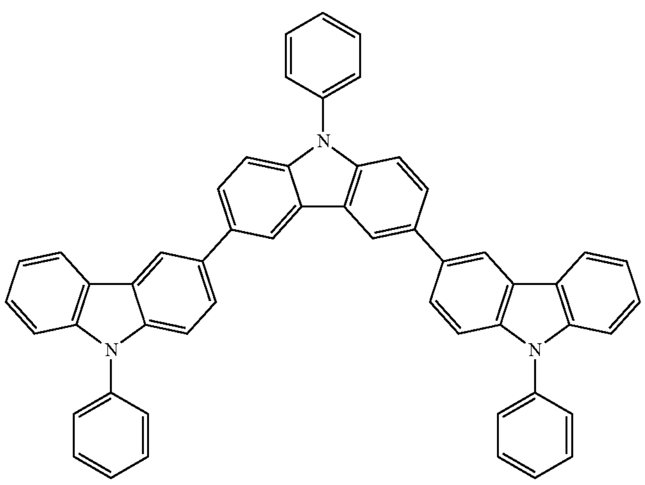
,
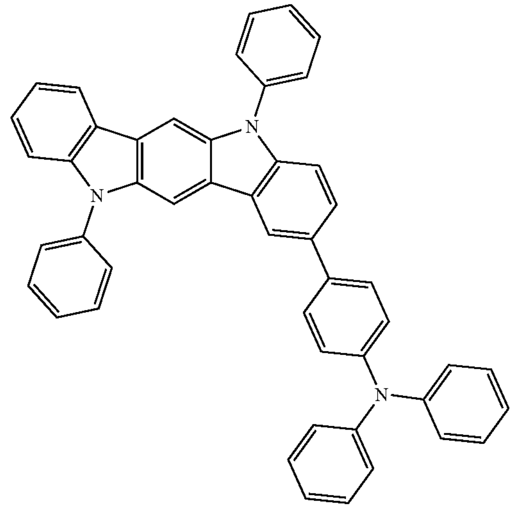
, -continued
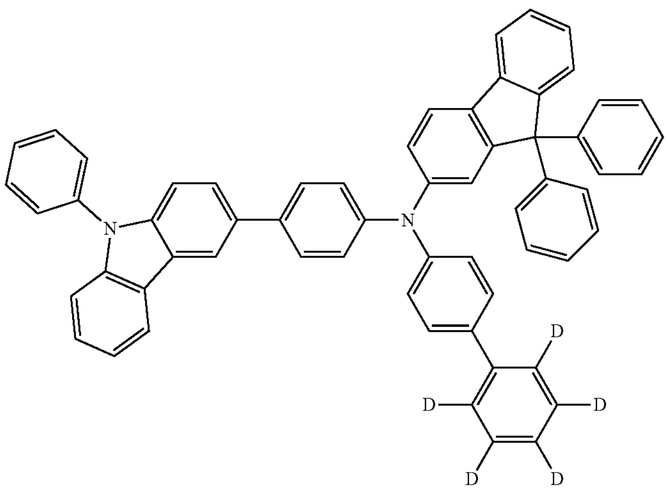
,
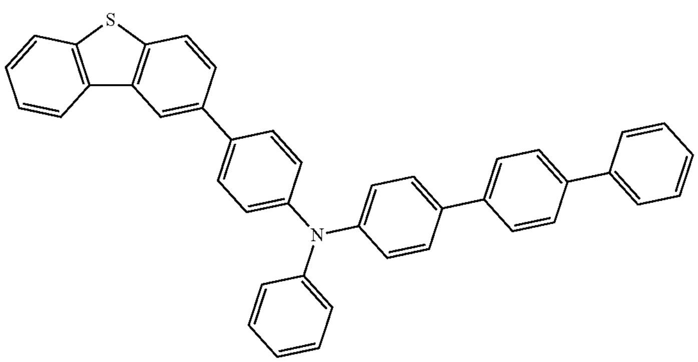
,
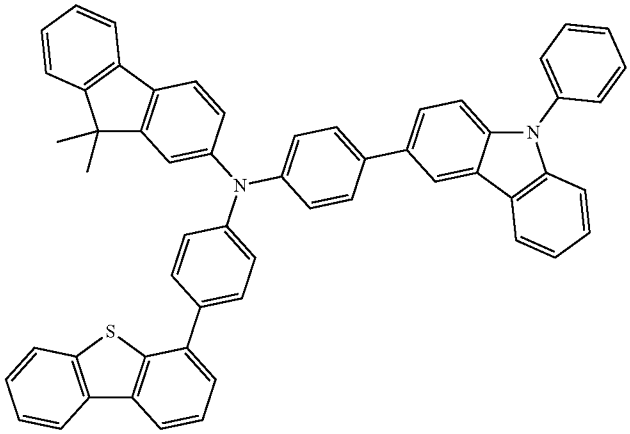
, -continued
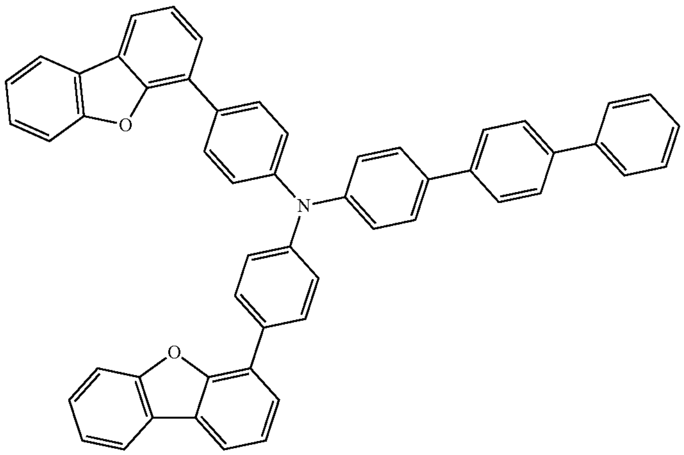
,
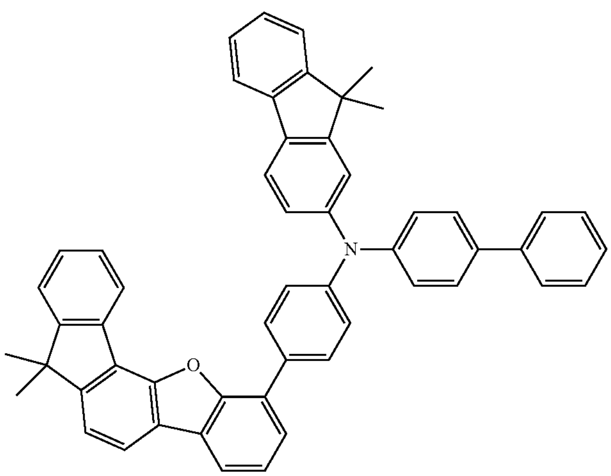
,
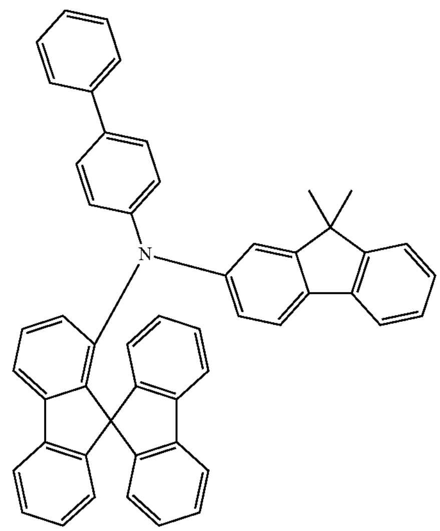
,
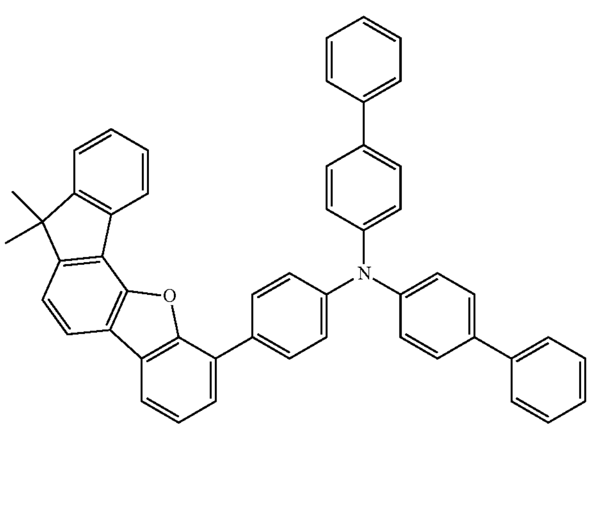
, -continued
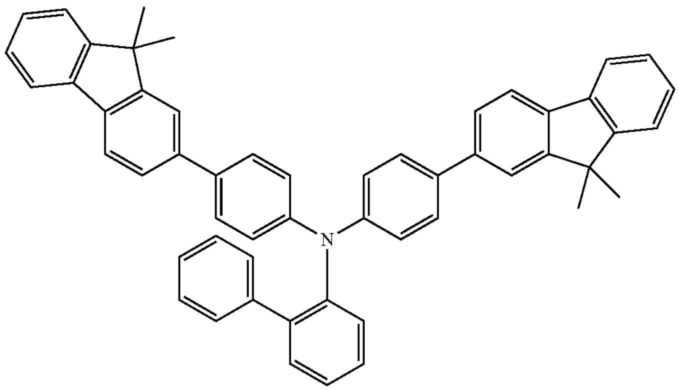
,
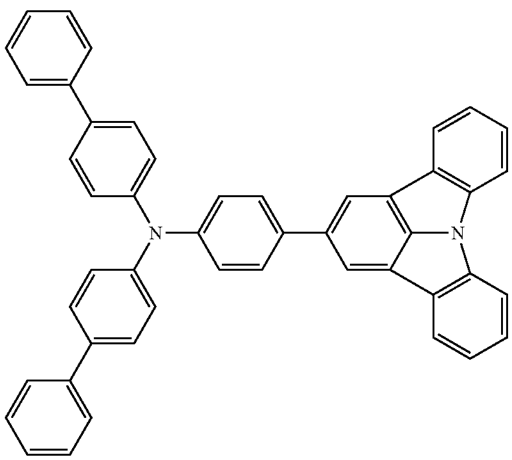
,
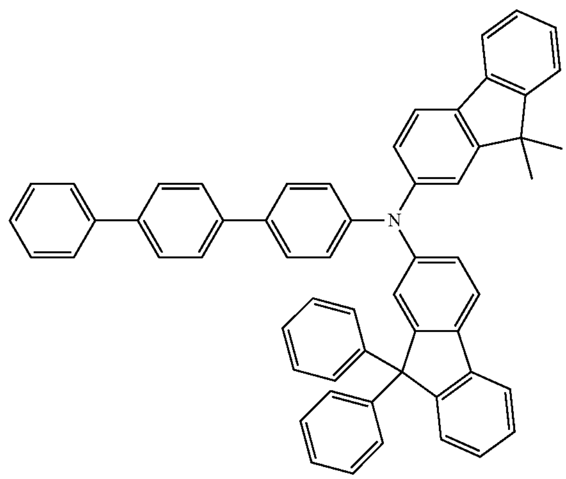
,
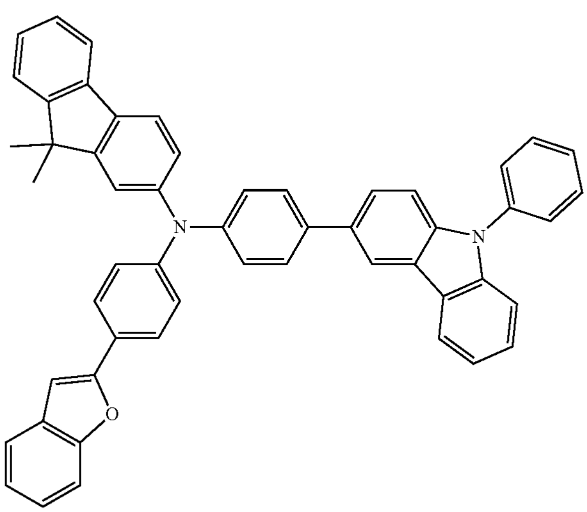
,
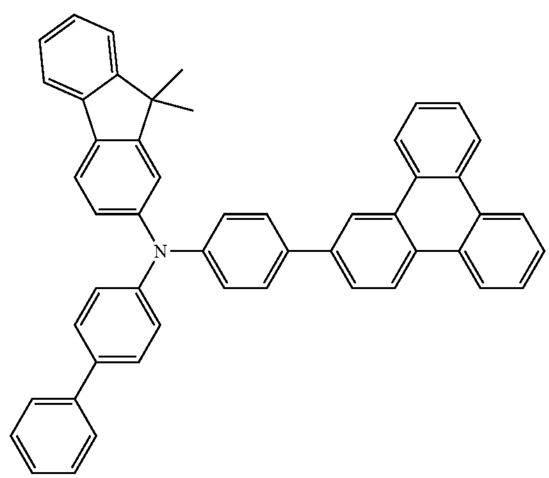
, -continued
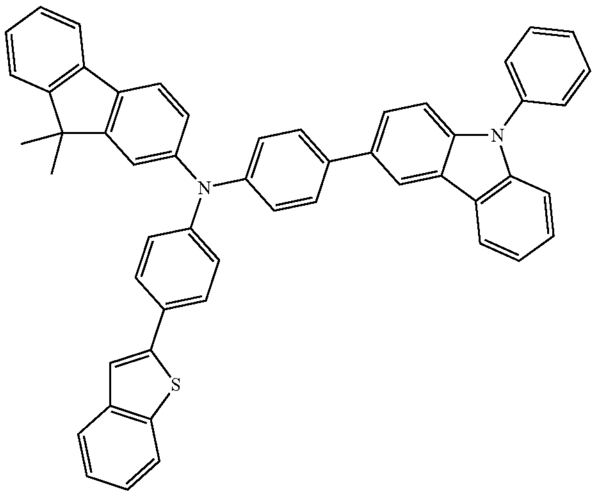
,
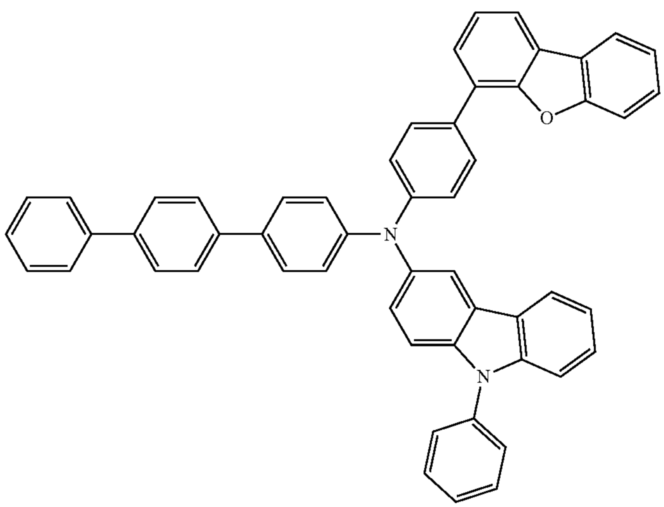
,
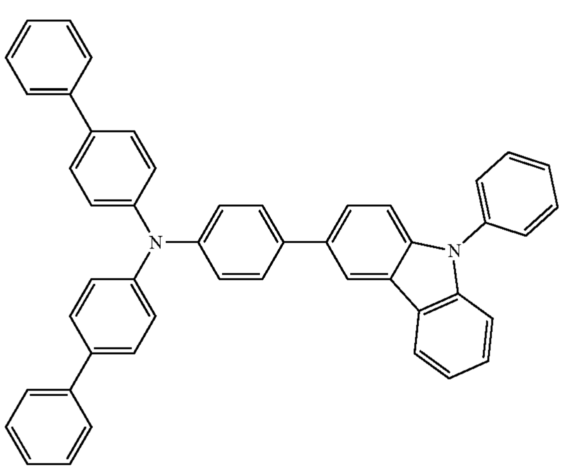
,
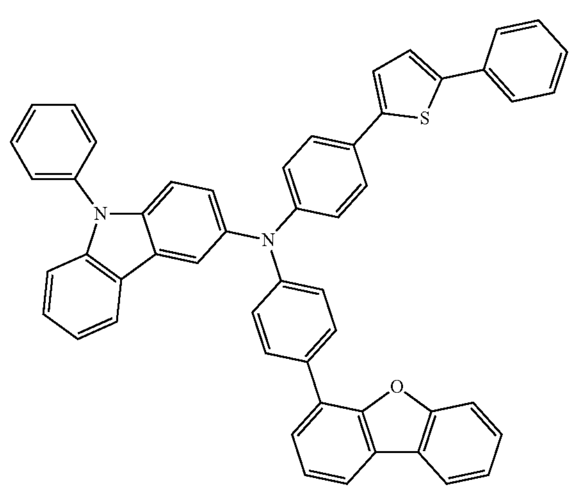
, -continued
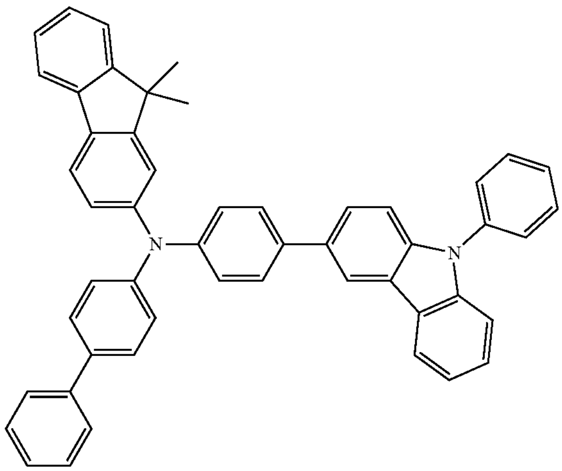
,
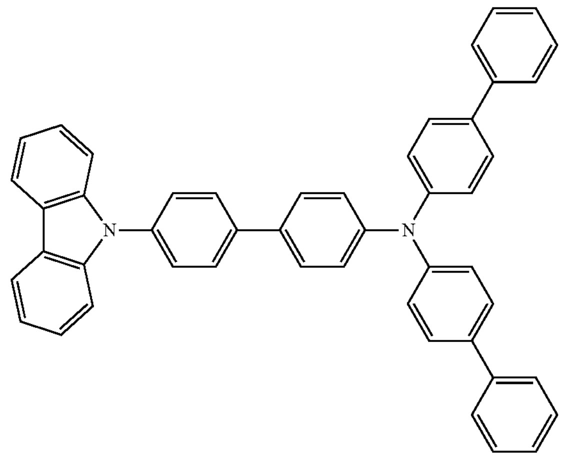
,
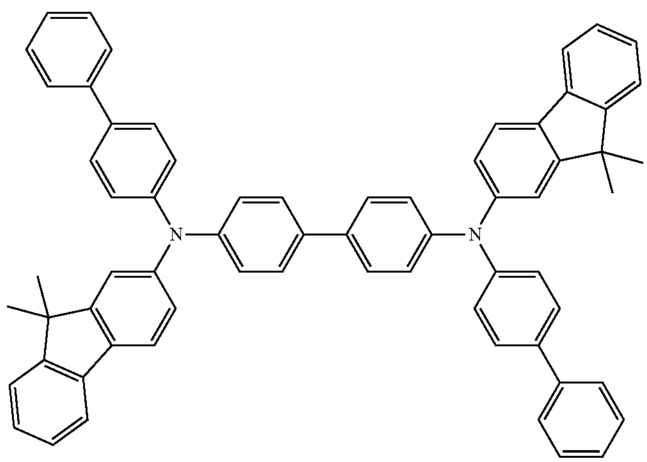
,
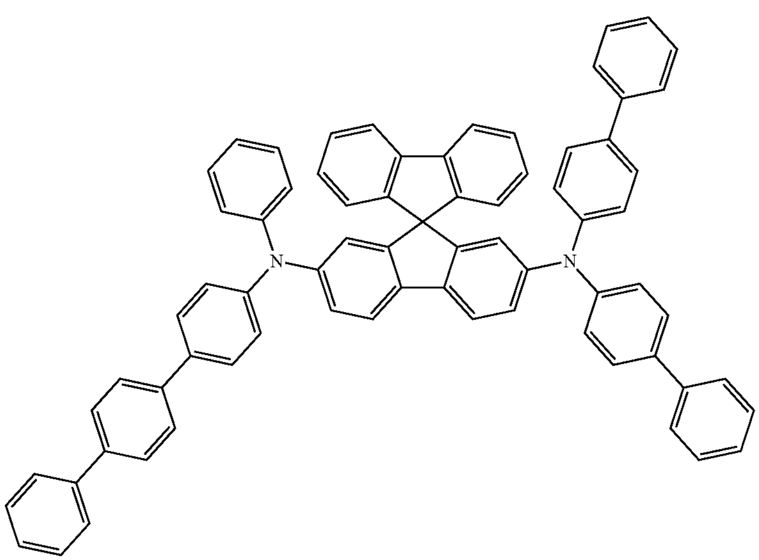
, -continued
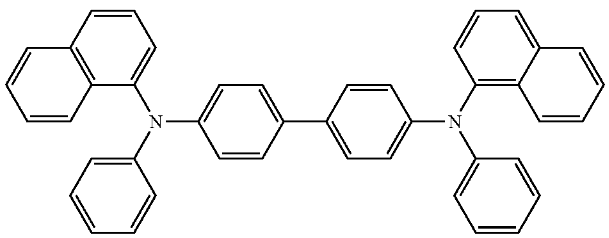
,
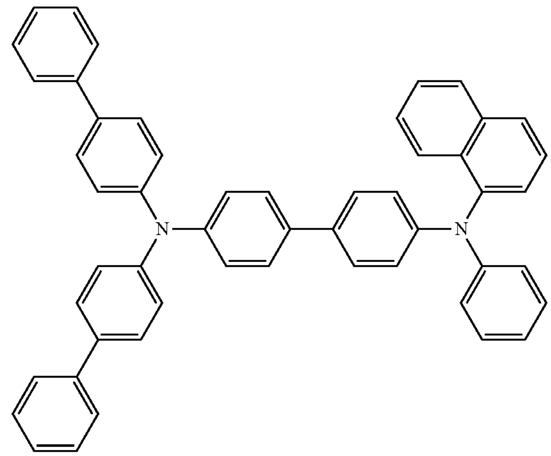
,
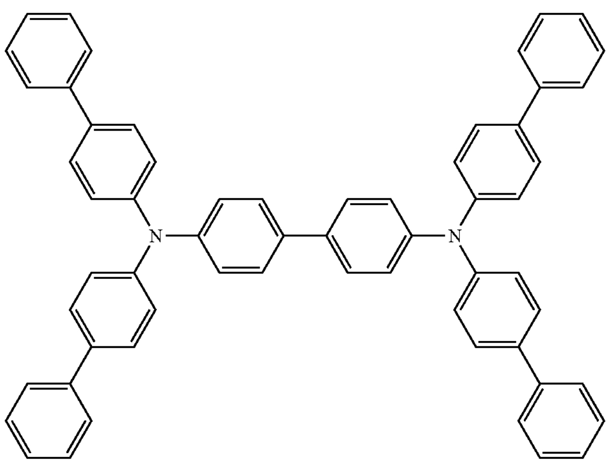
,
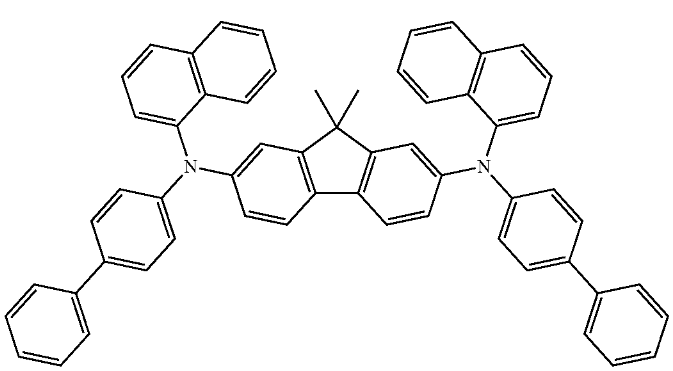
, -continued
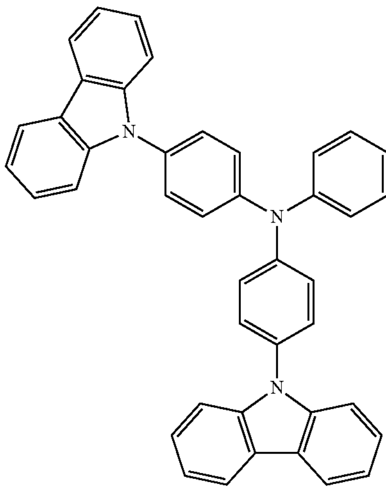
,
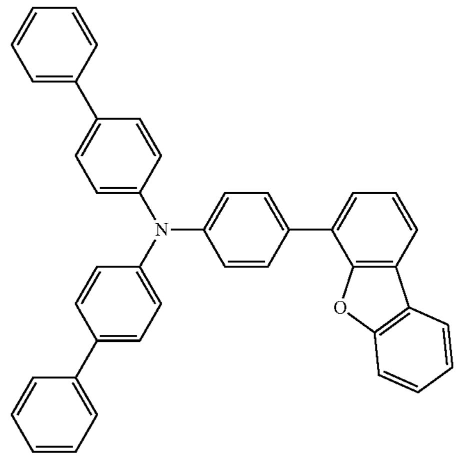
,
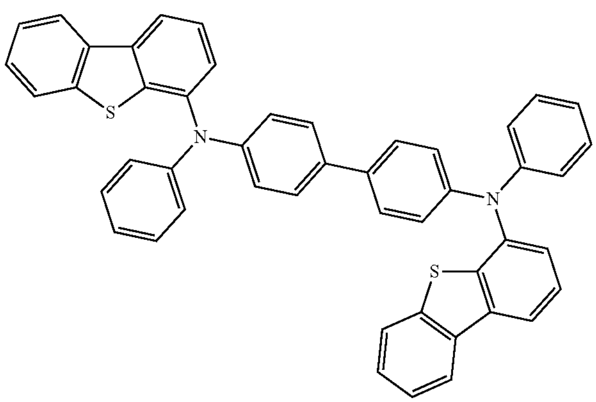
,
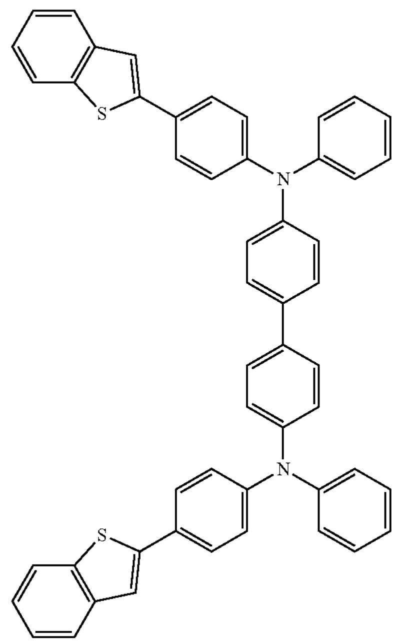
, and
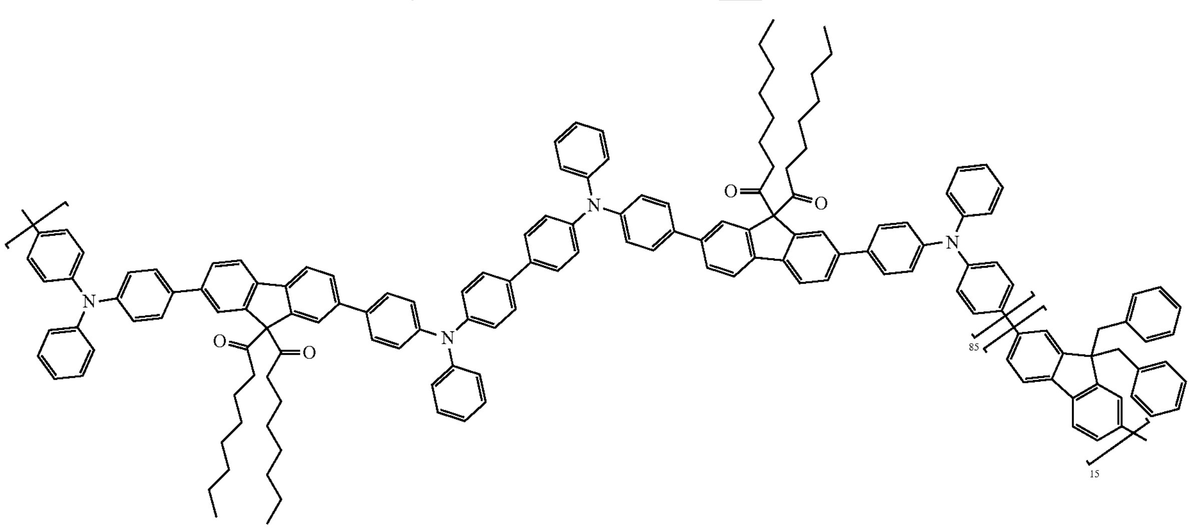
.

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

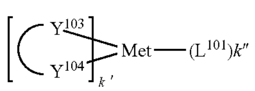

wherein Met is a metal; ($Y^{103}$-$Y^{104}$) is a bidentate ligand, $Y^{103}$ and $Y^{104}$ are independently selected from C, N, O, P, and S; $L_{101}$ is an another ligand; k' is an integer value from 1 to the maximum number of ligands that may be attached to the metal; and k'+k" is the maximum number of ligands that may be attached to the metal.

In one aspect, the metal complexes are:

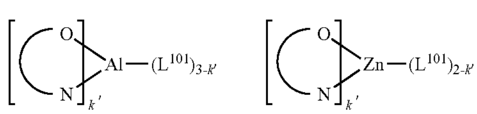

wherein (O—N) is a bidentate ligand, having metal coordinated to atoms O and N.

In another aspect, Met is selected from Ir and Pt. In a further aspect, ($Y_{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

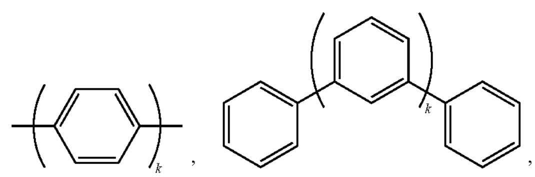

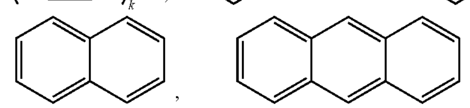

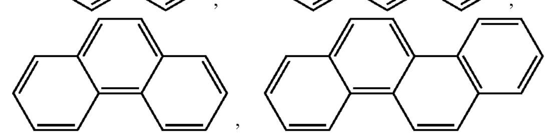

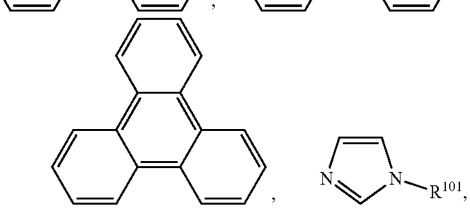

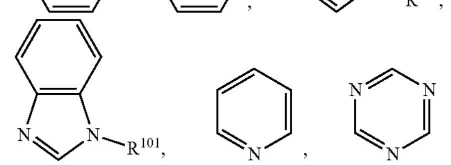

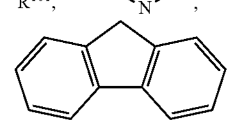

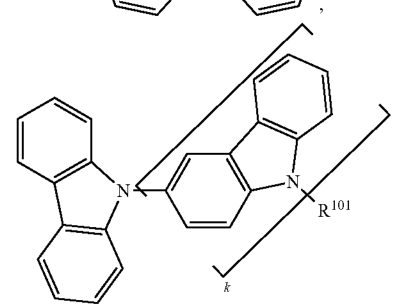

-continued

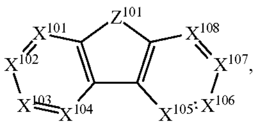

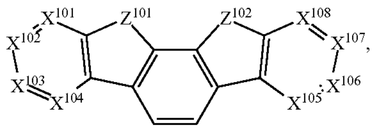

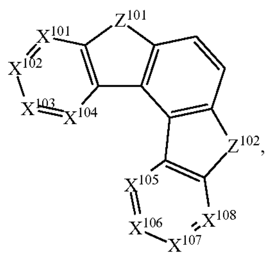

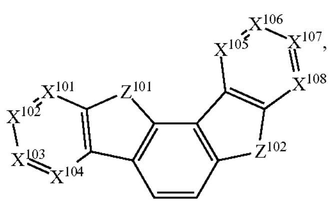

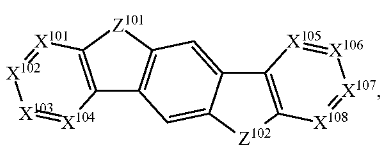

and

-continued

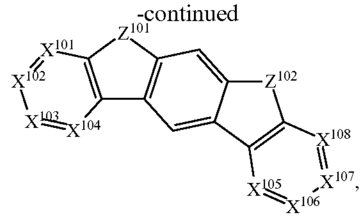

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

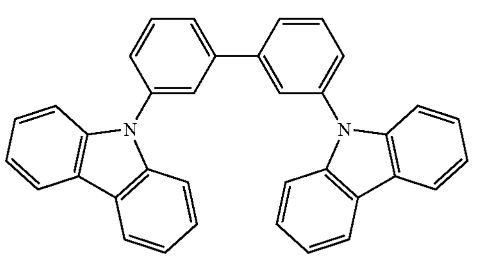

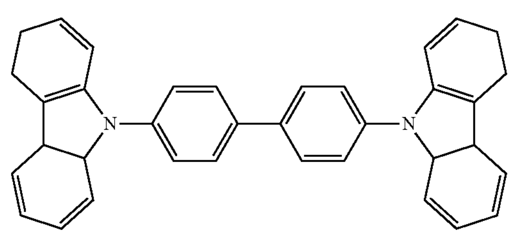

-continued
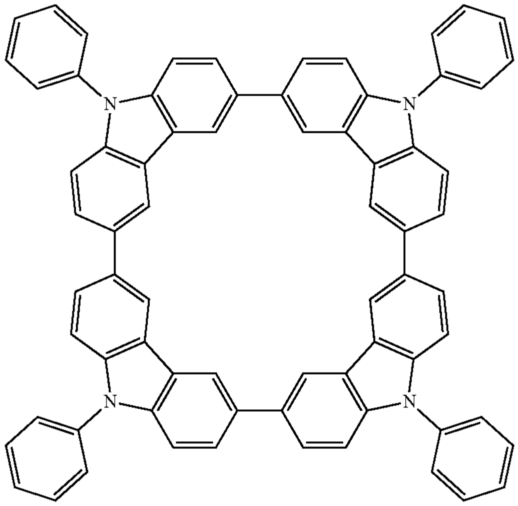
,
,
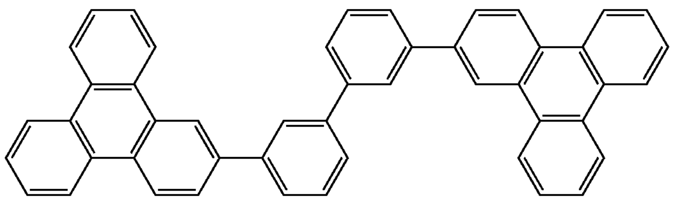
,
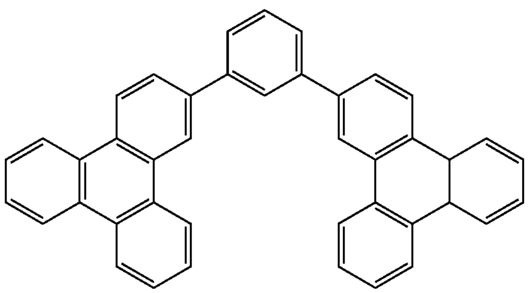
,
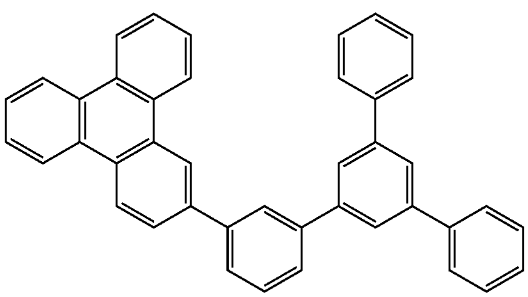
,
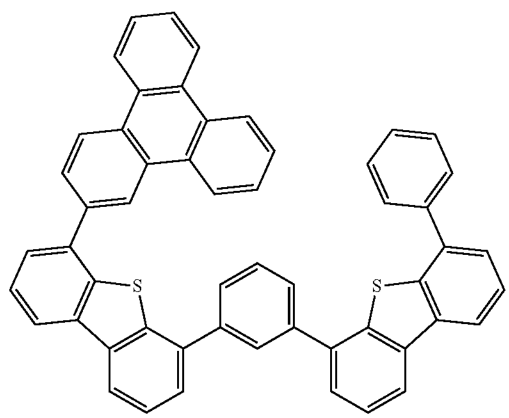
,
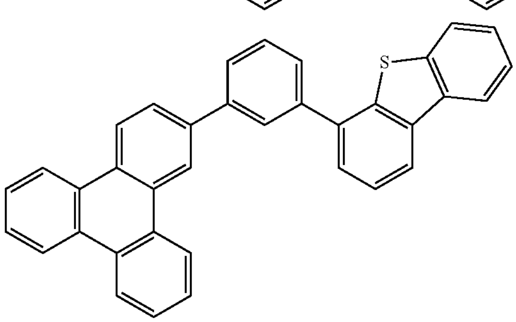
,
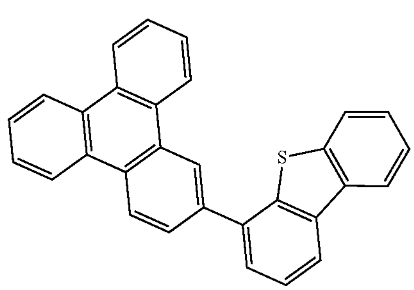
, -continued
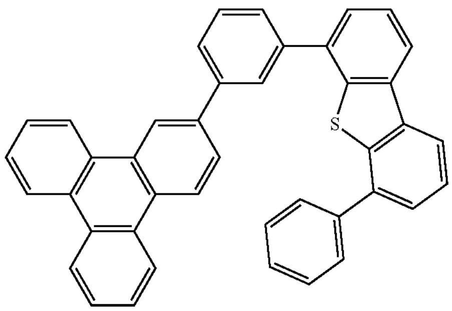
,
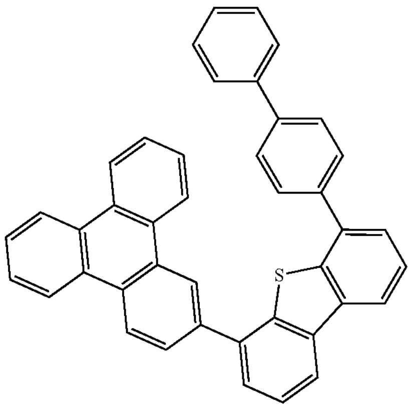
,
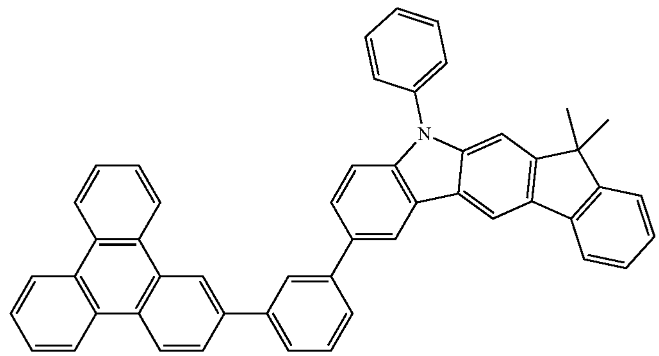
,
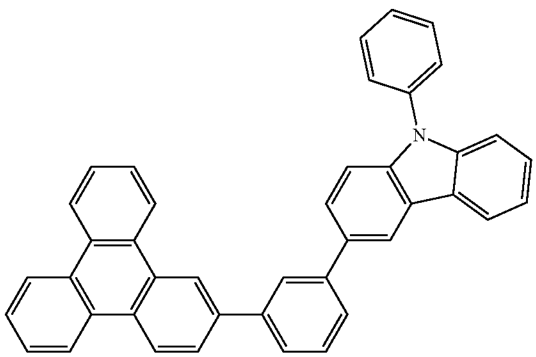
,
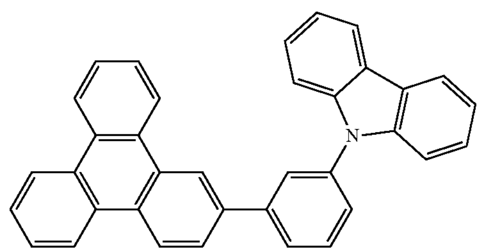
,
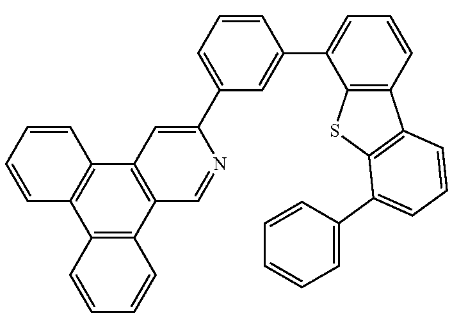
,
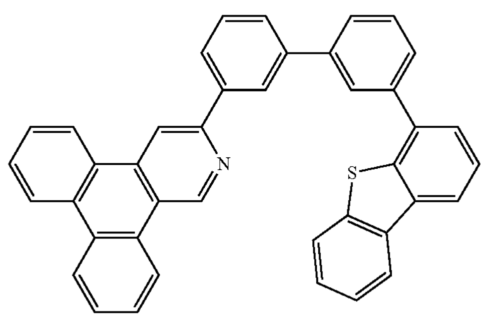
,
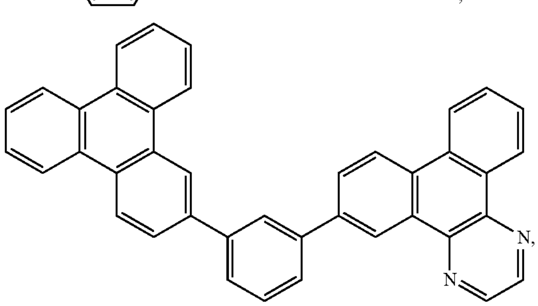
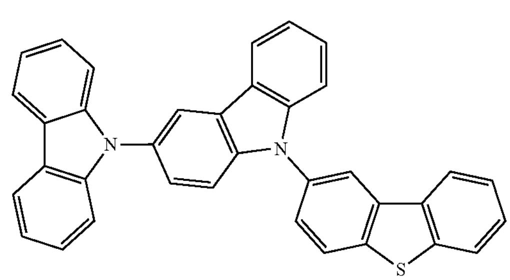
, -continued
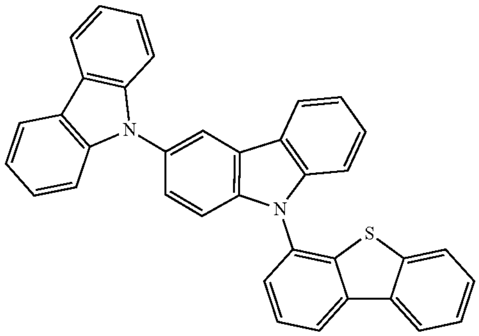
,
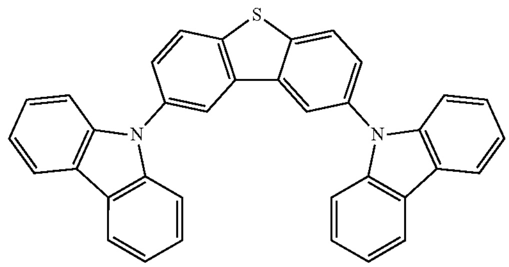
,
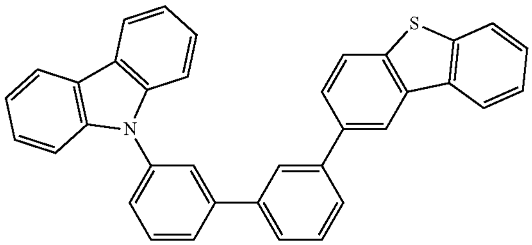
,
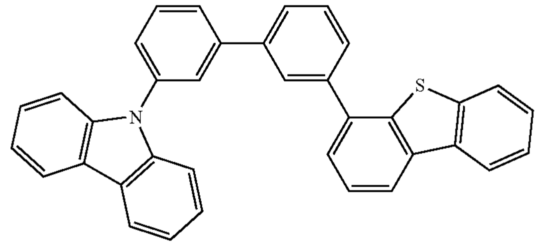
,
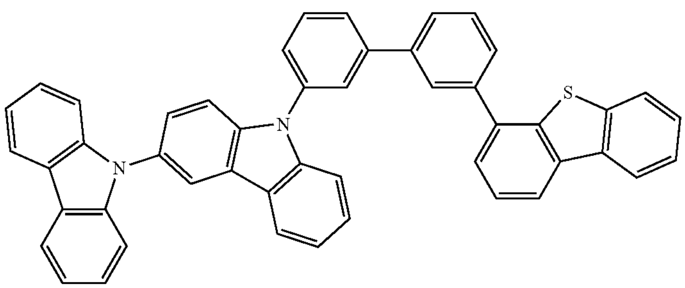
,
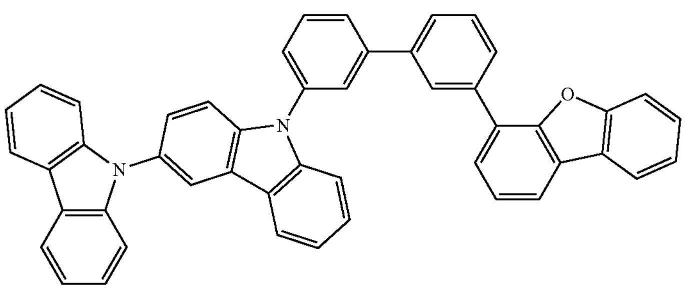
,
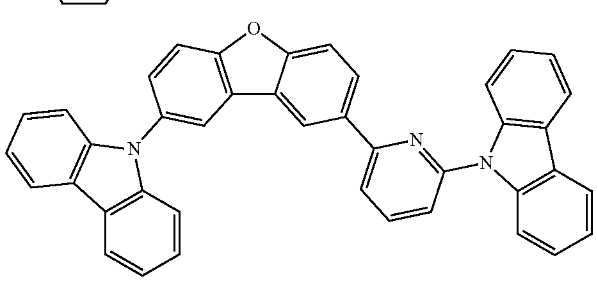
,
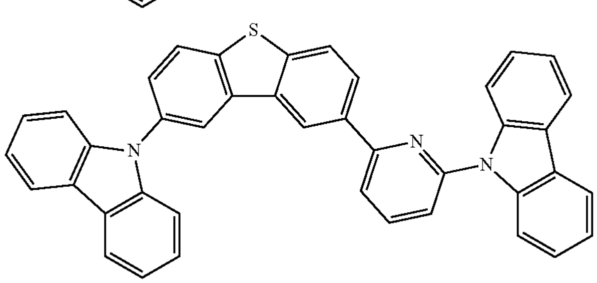
, -continued
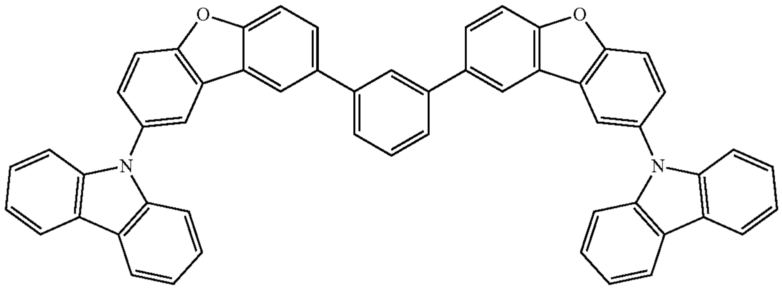
,
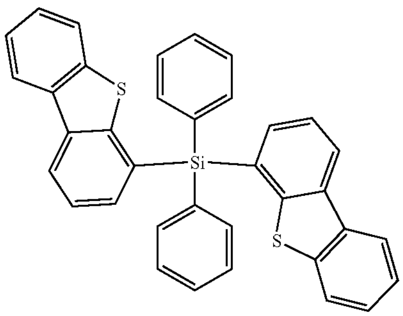
,
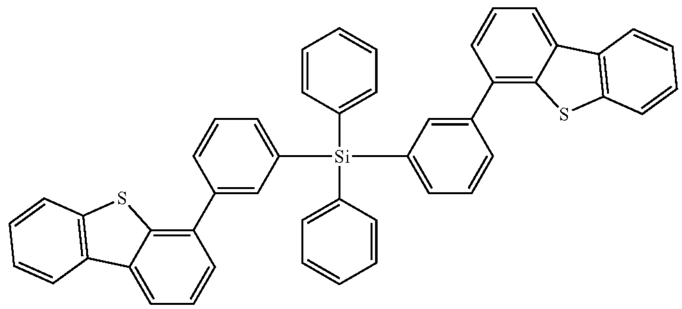
,
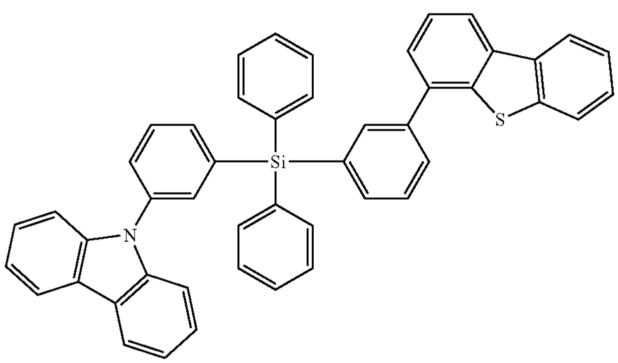
,
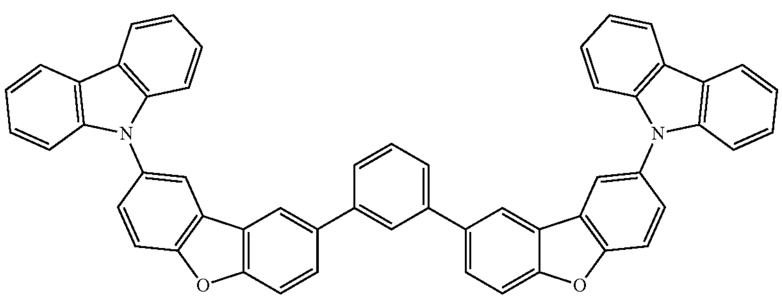
,
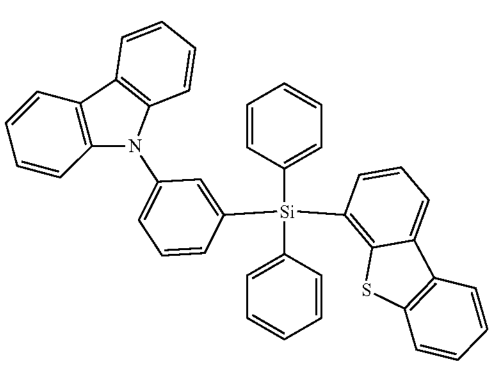
,
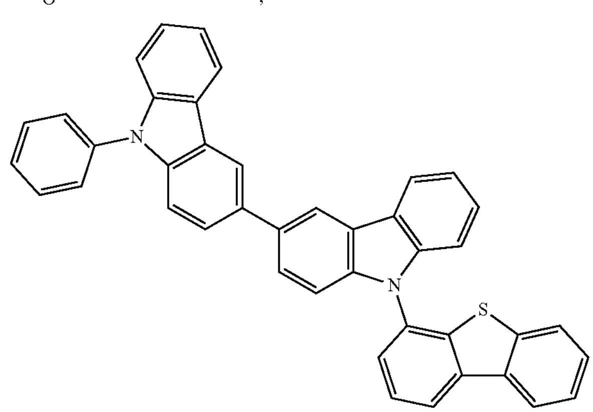
, -continued
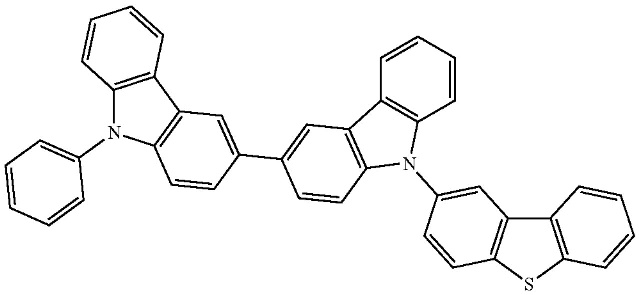
,
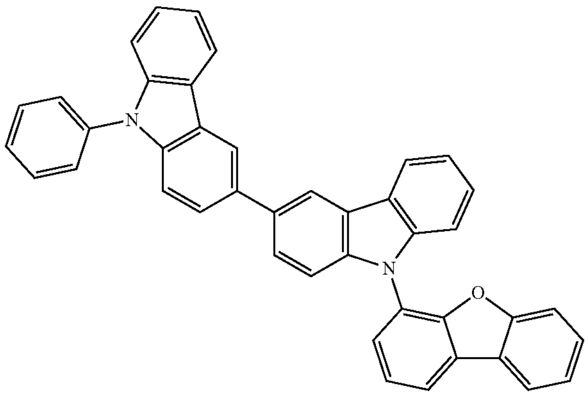
,
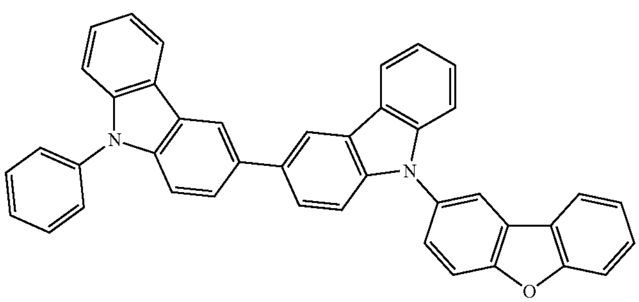
,
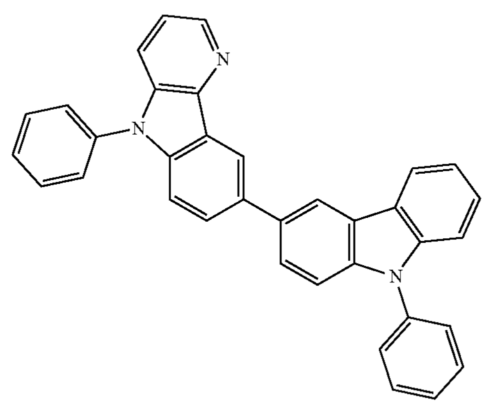
,
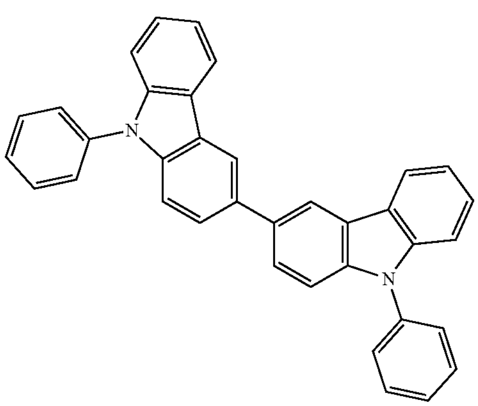
,
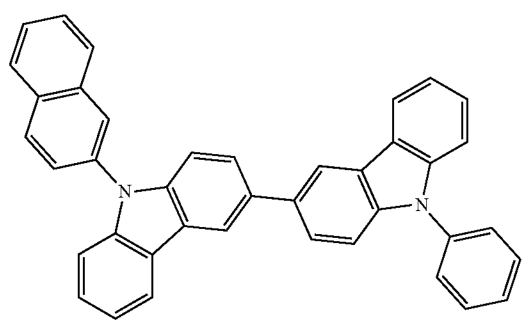
, -continued
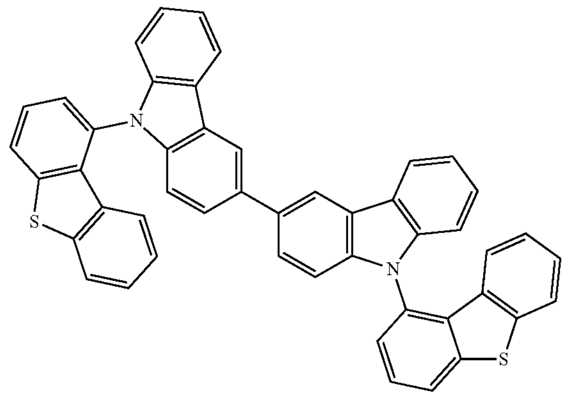
,
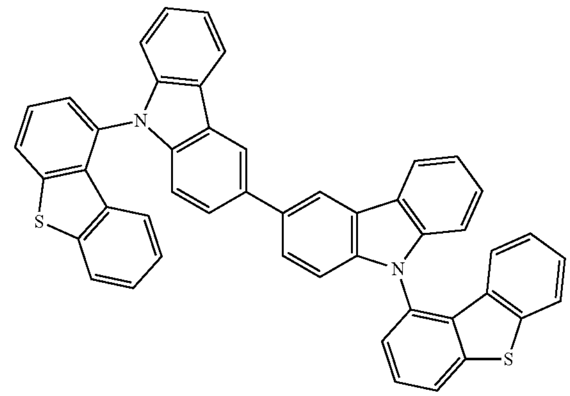
,
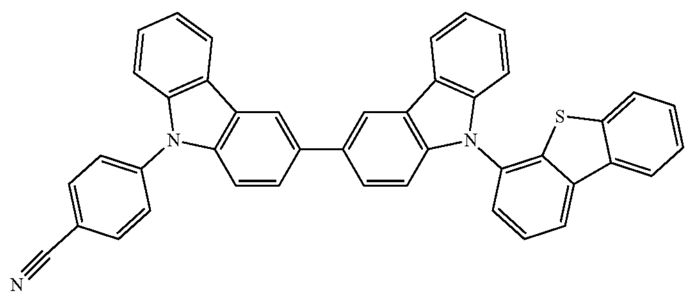
,
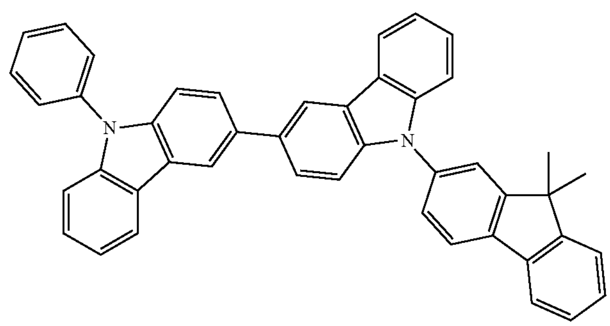
,
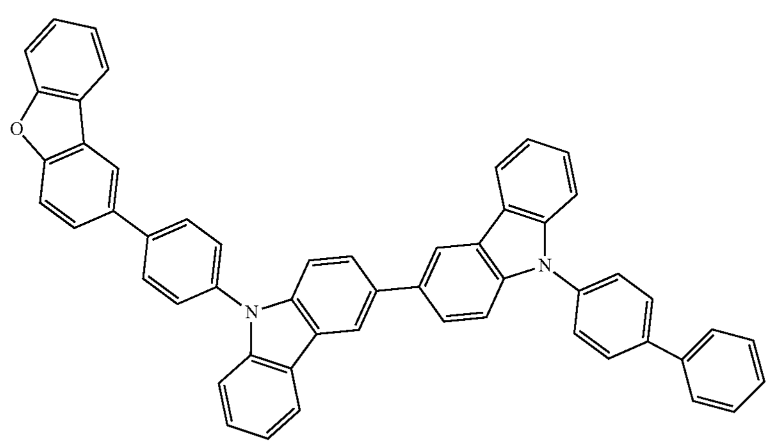
, -continued
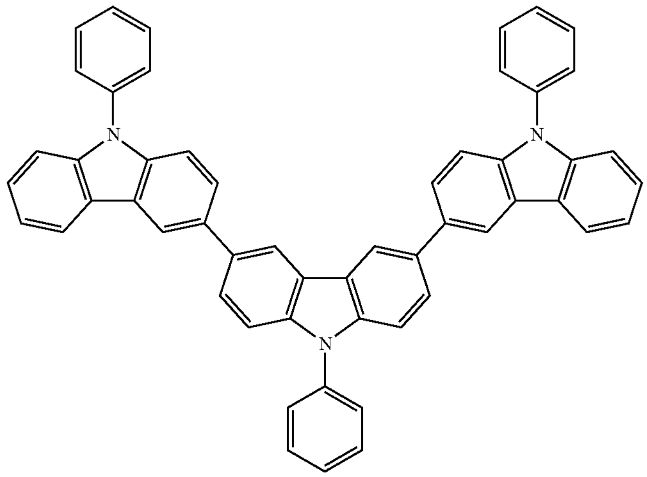
,
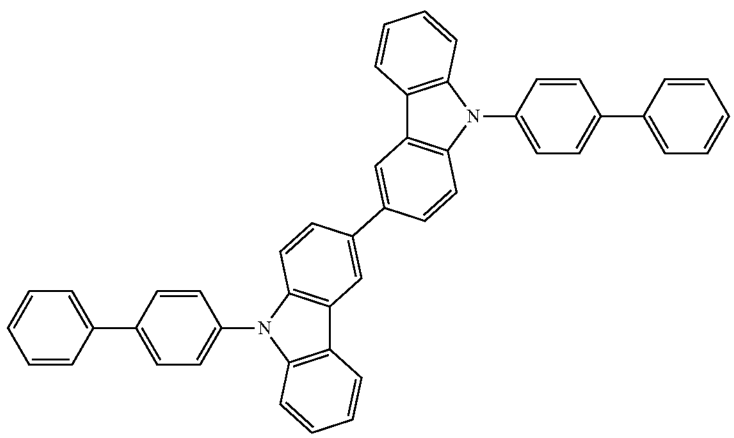
,
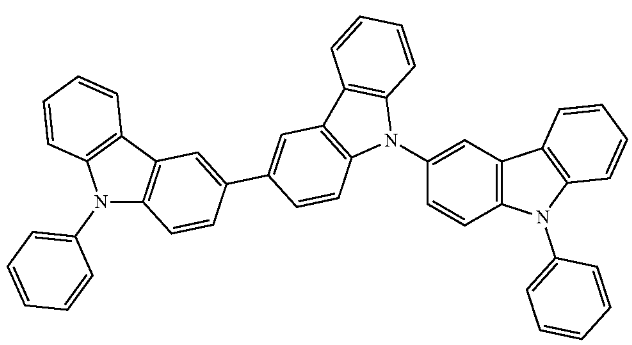
,
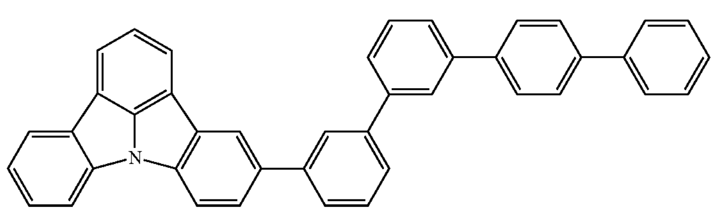
, -continued
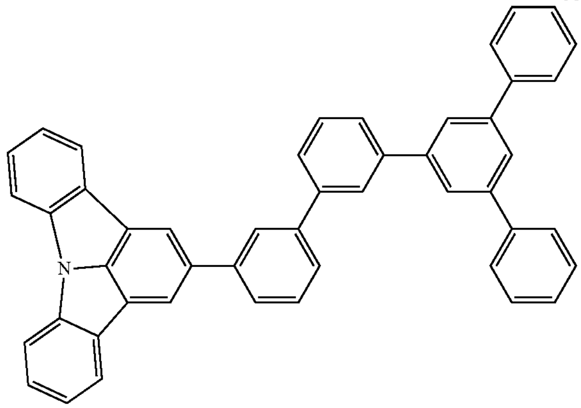
,
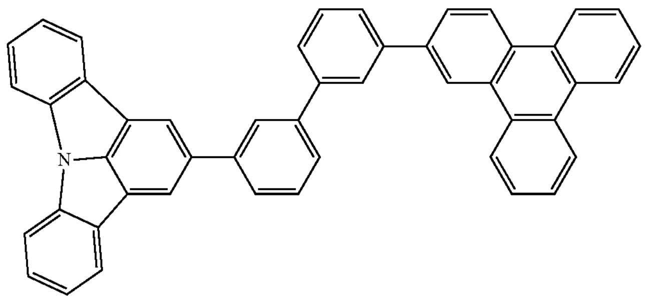
,
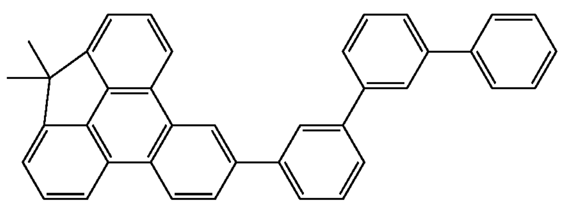
,
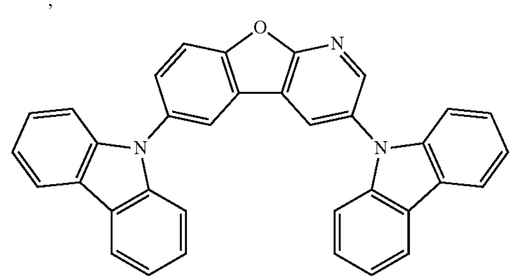
,
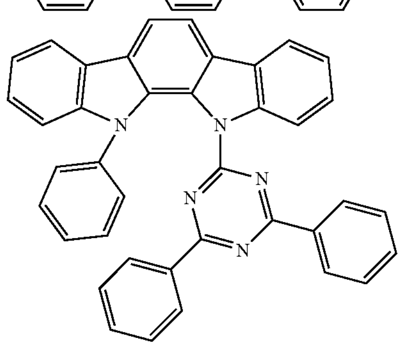
,
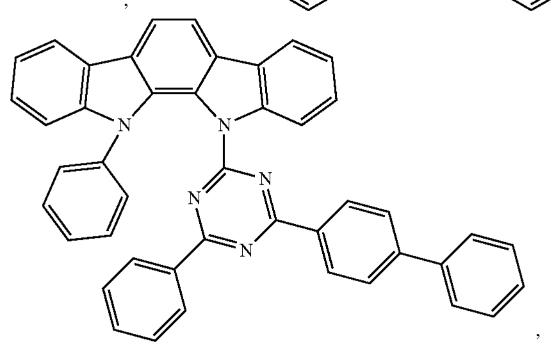
,
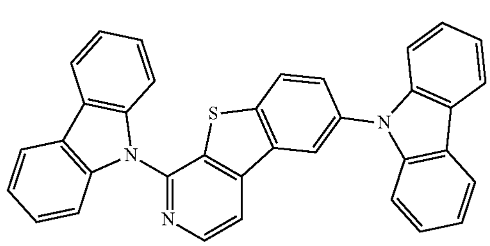
,
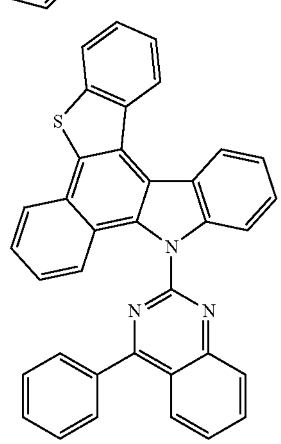
,
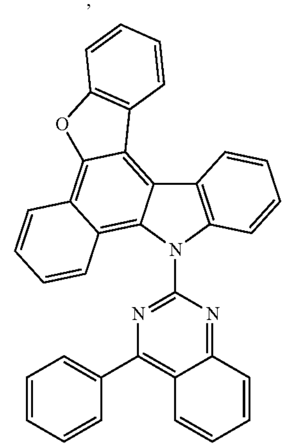
, -continued
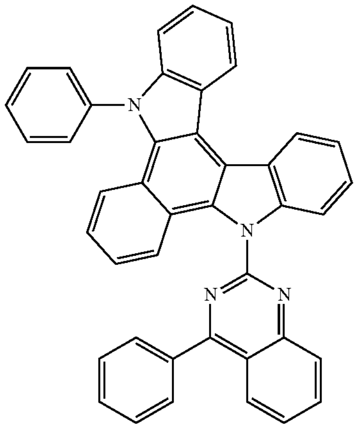
,
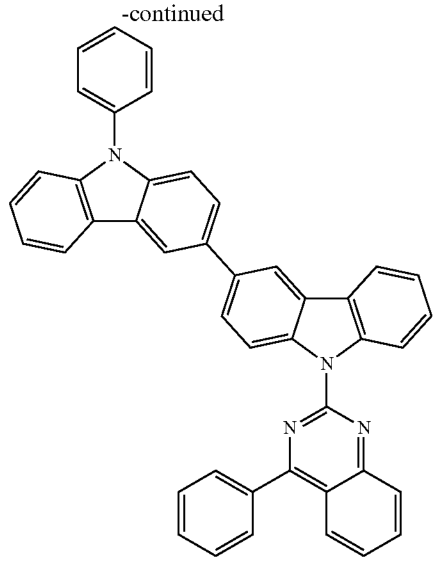
,
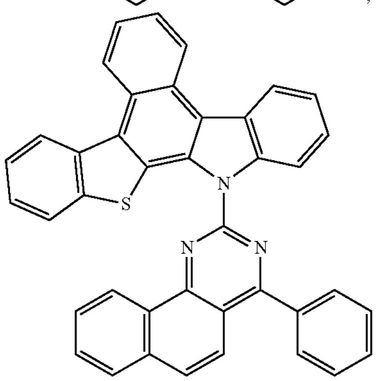
,
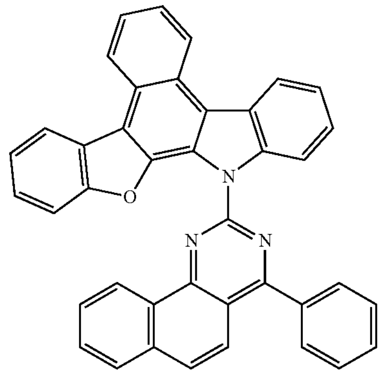
,
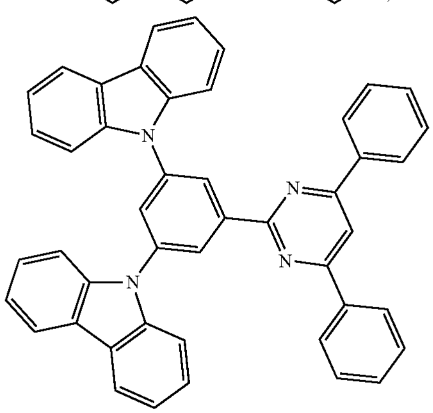
,
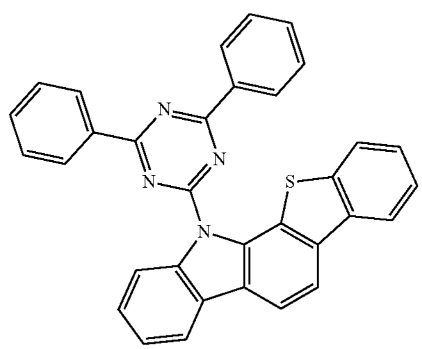
,
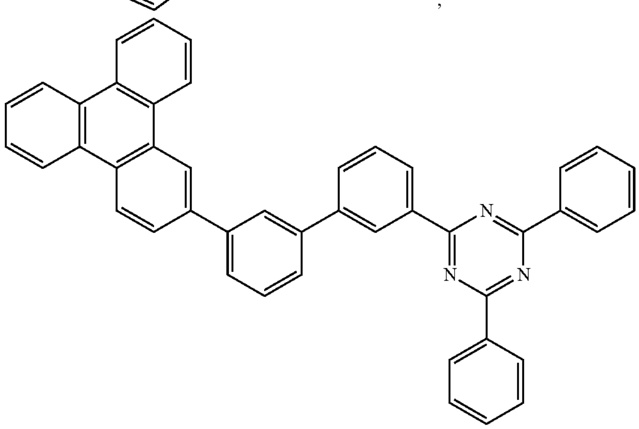
, -continued
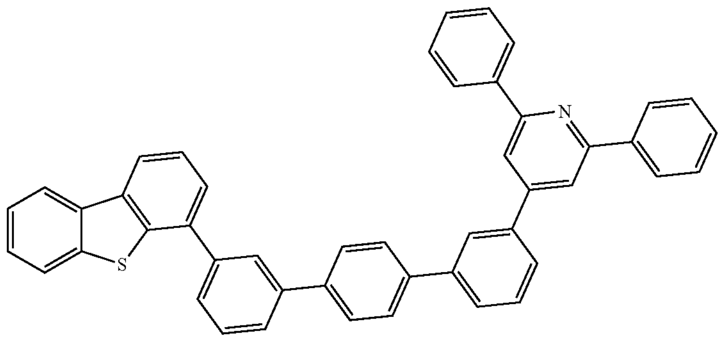
,
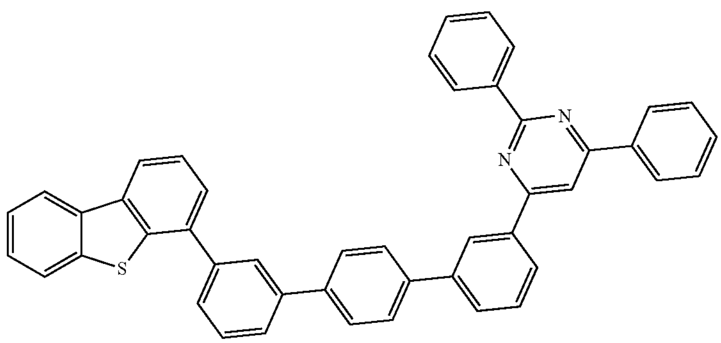
,
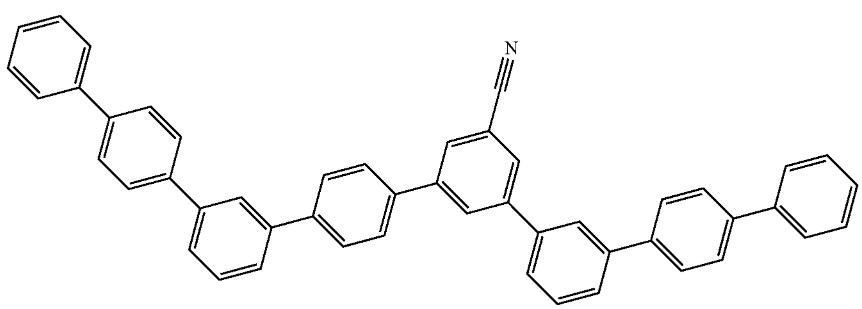
,
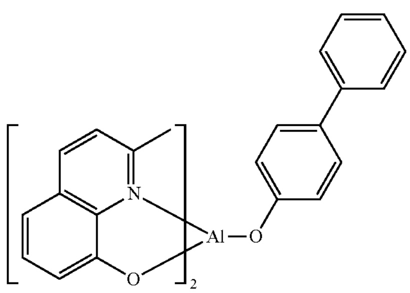
,
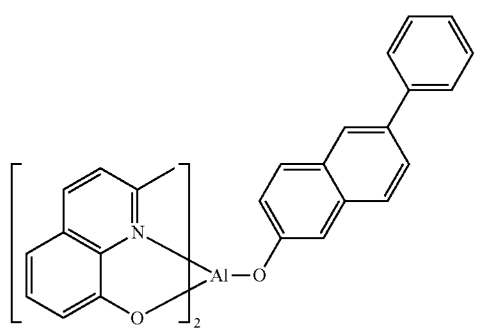
,
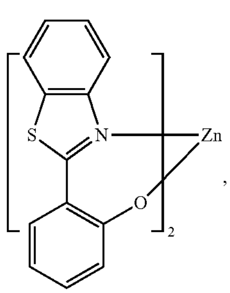
,
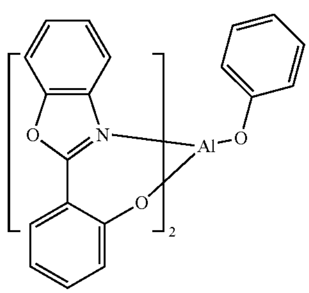
,
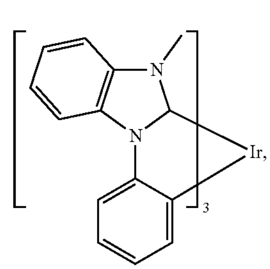

-continued

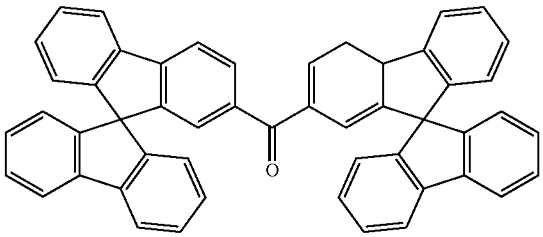

,

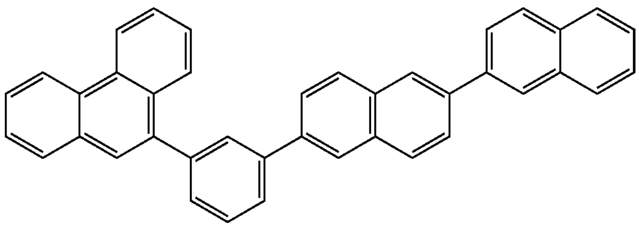

,

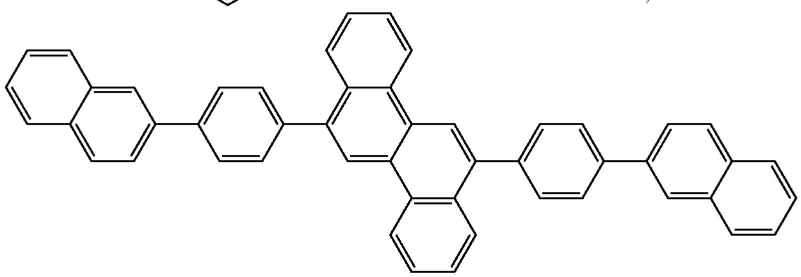

, and

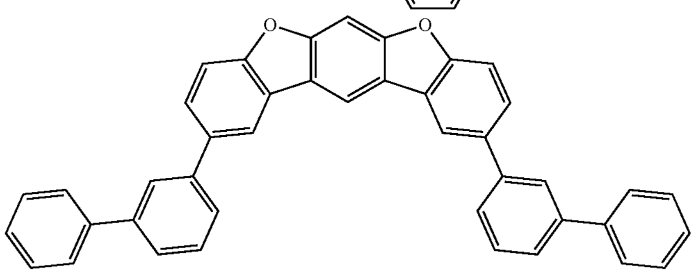

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
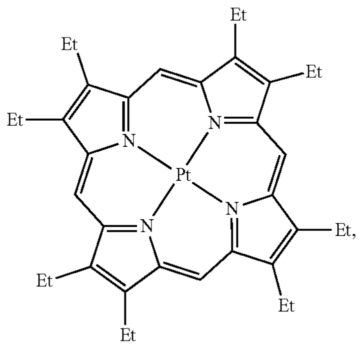
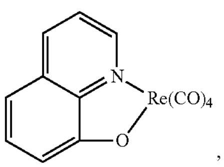
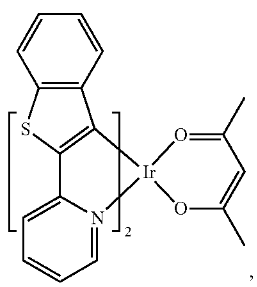
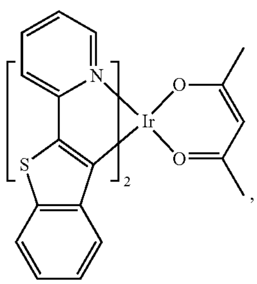
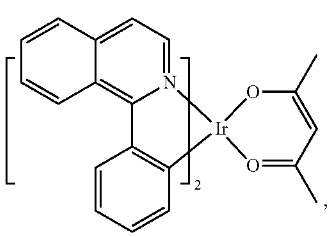
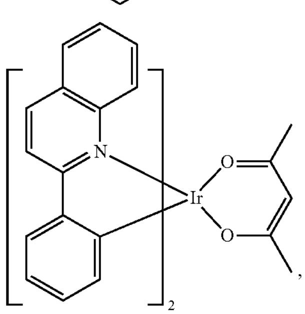
-continued
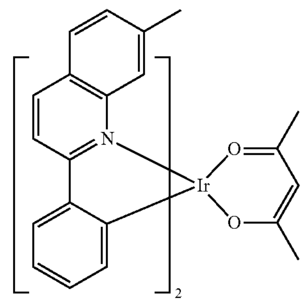
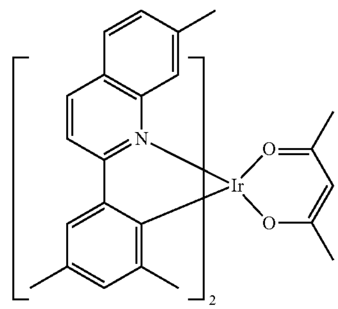
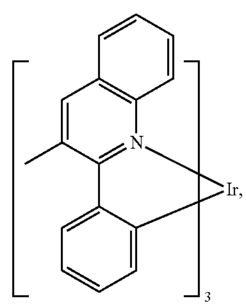
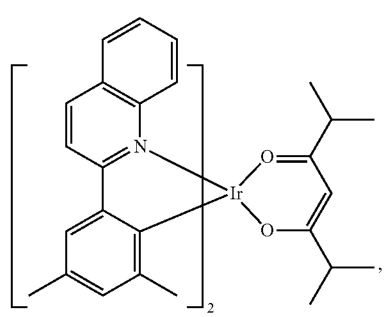
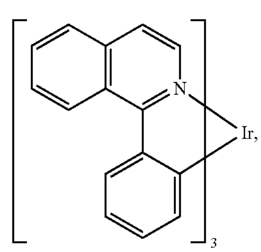

-continued
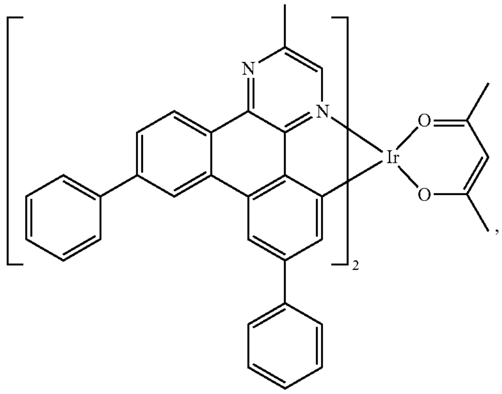
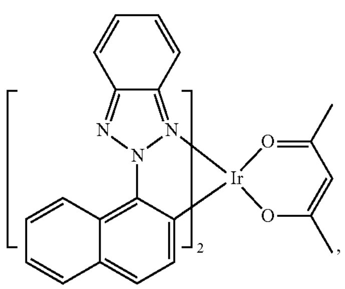
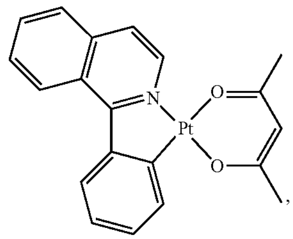
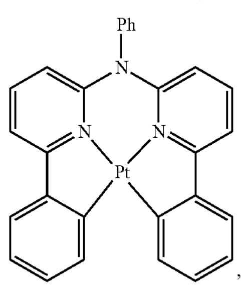
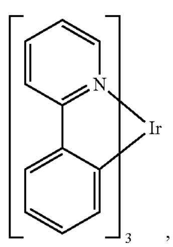
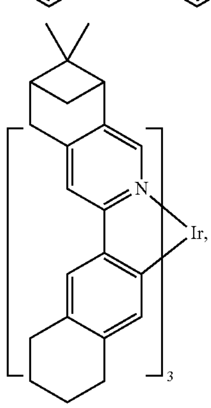
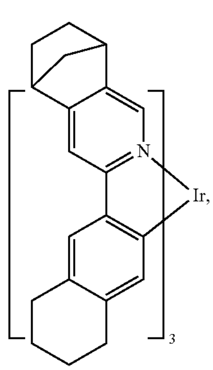
-continued
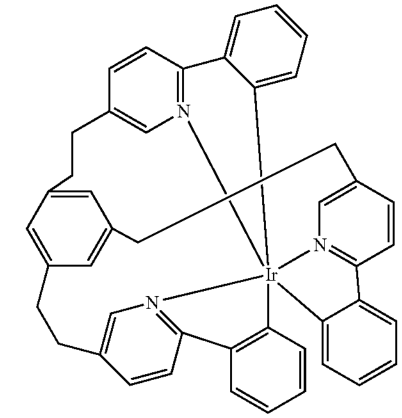
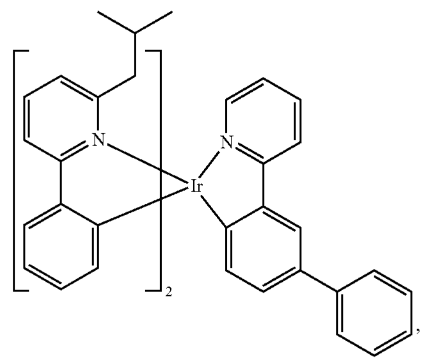
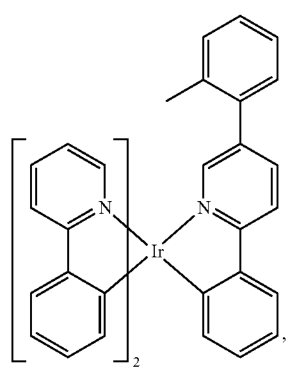
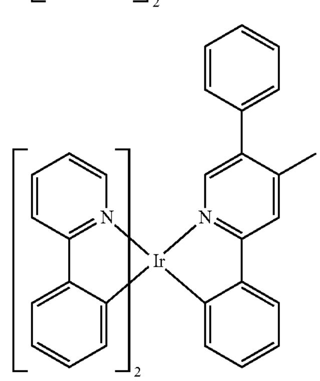

-continued
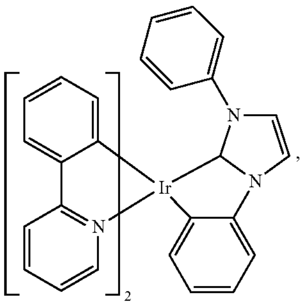
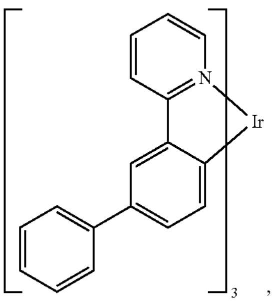
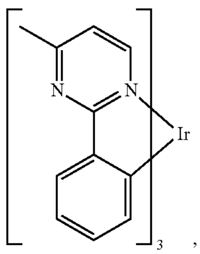
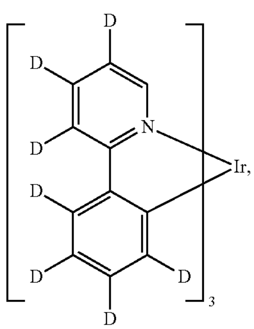
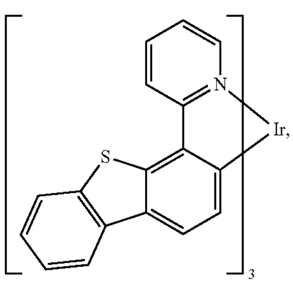
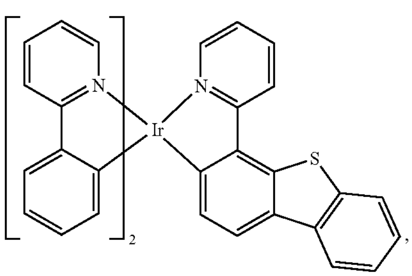
-continued
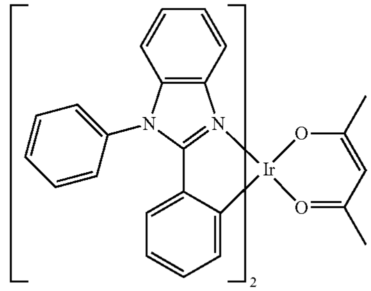
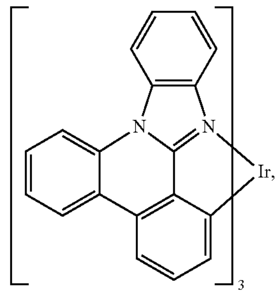
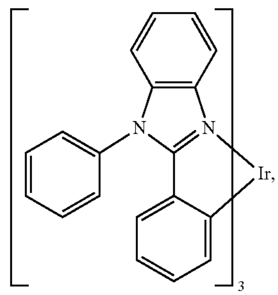
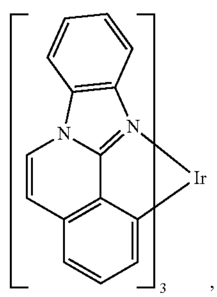
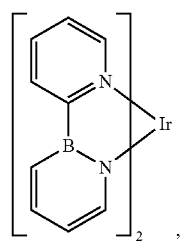
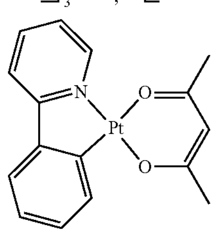
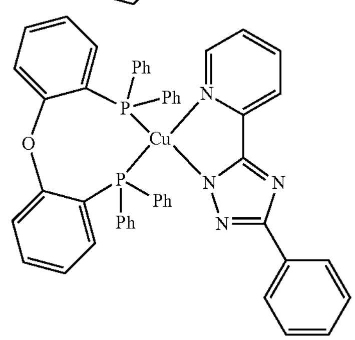

-continued
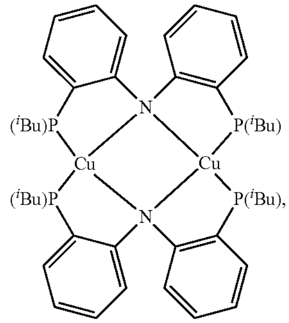
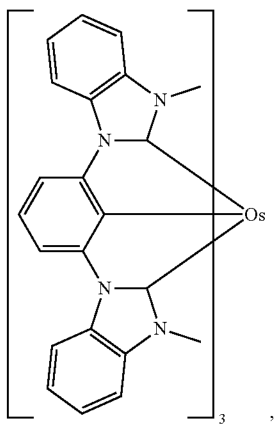
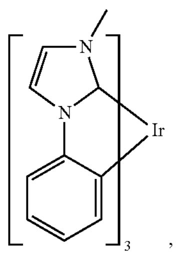
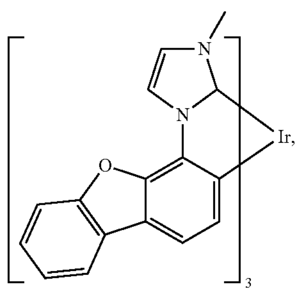
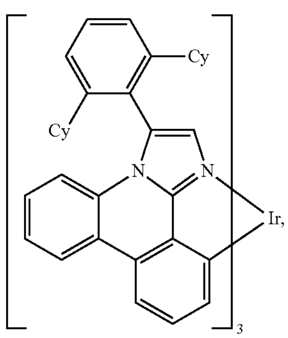
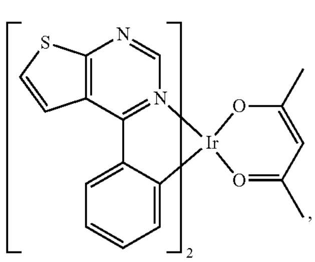
-continued
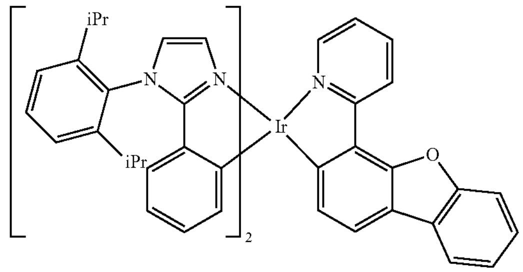
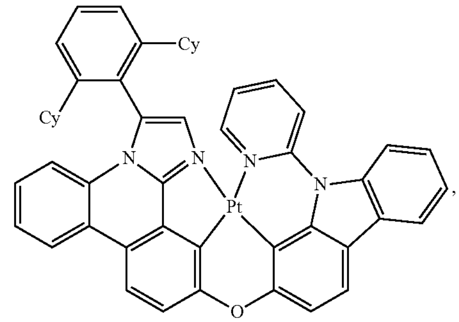
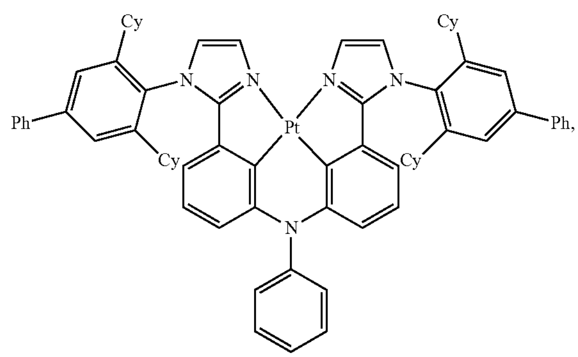
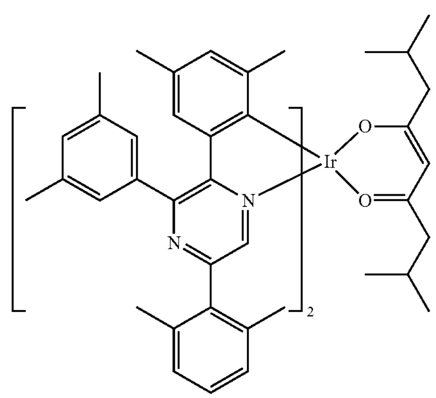
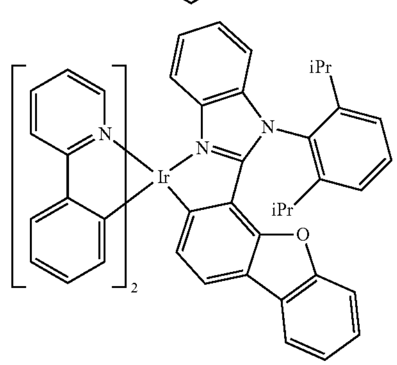

-continued
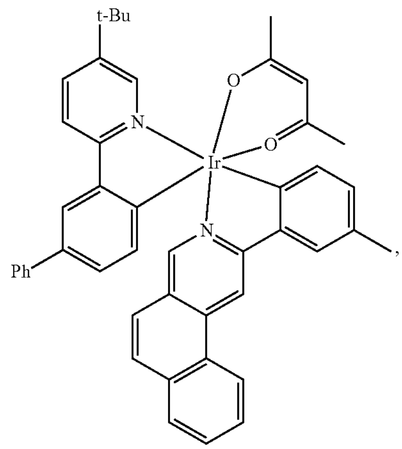
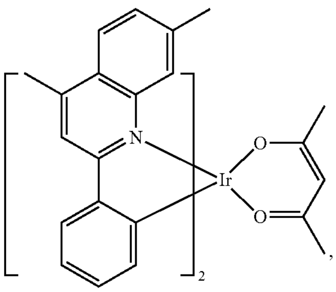
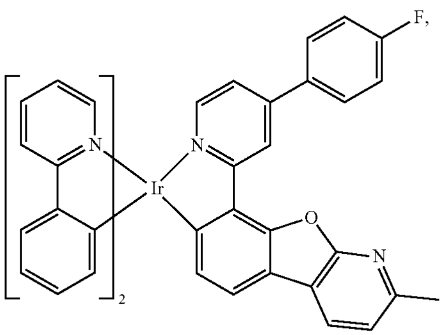
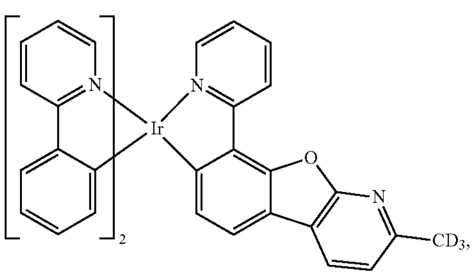
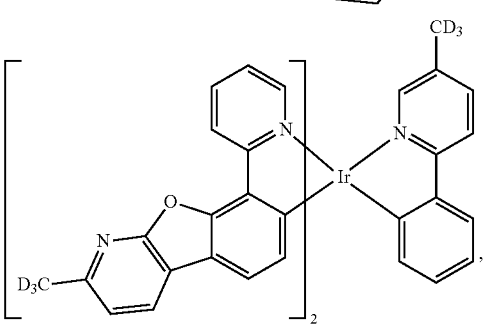
-continued
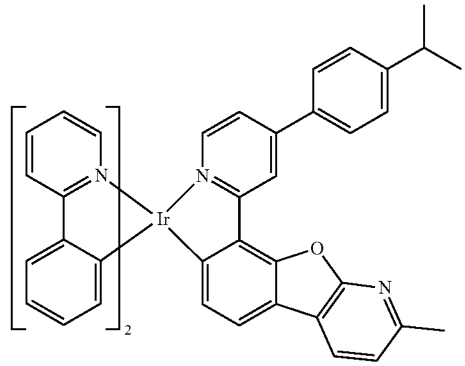
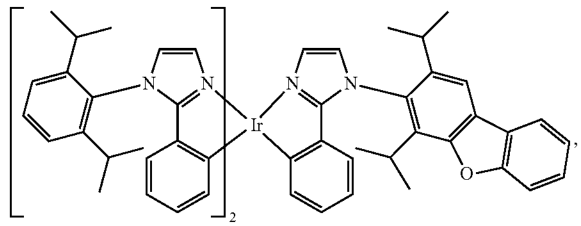
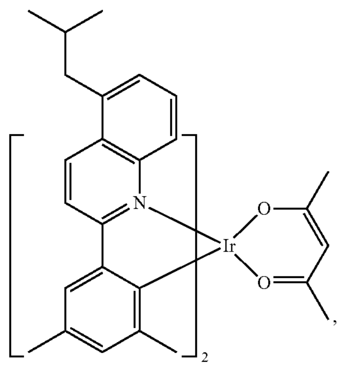
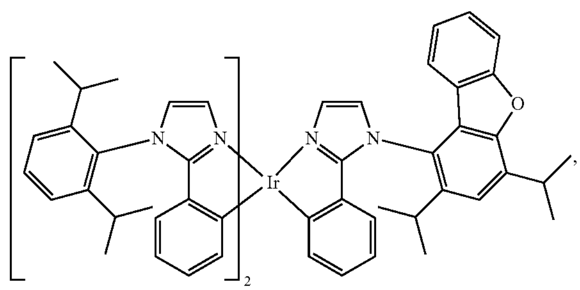
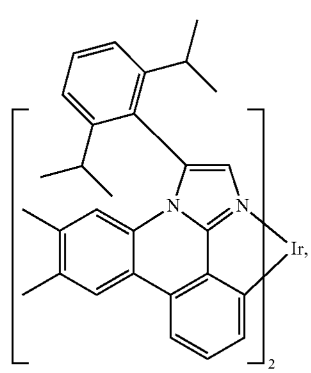

-continued
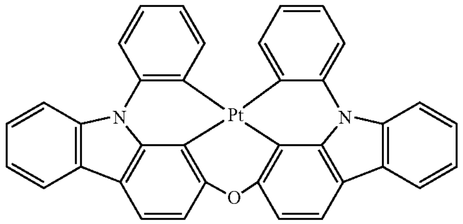
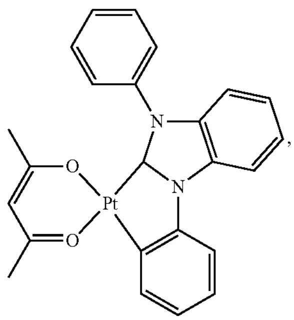
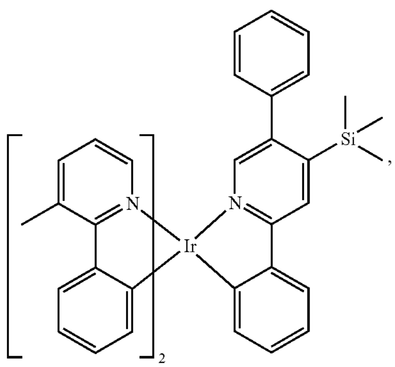
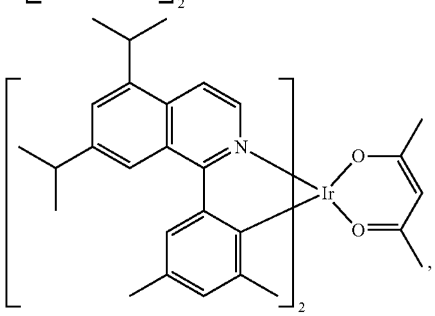
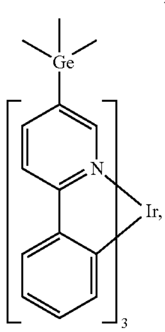
-continued
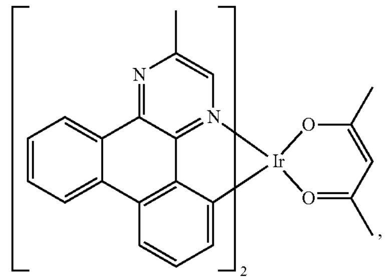
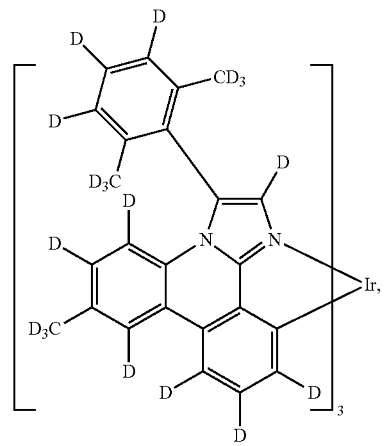
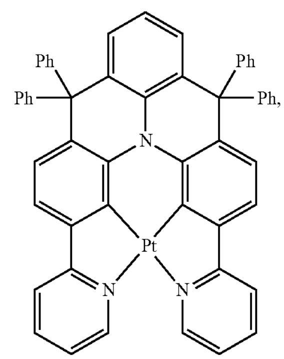
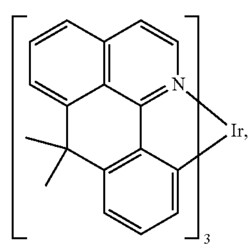
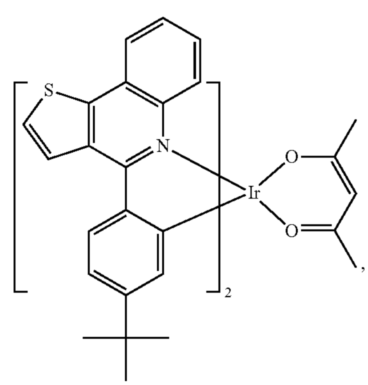

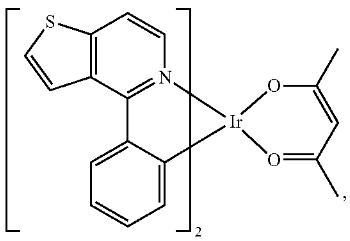
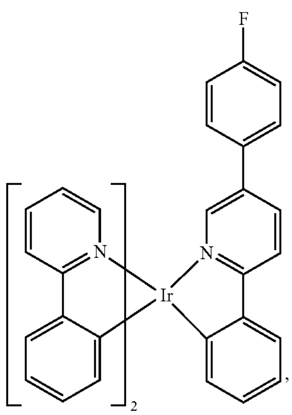
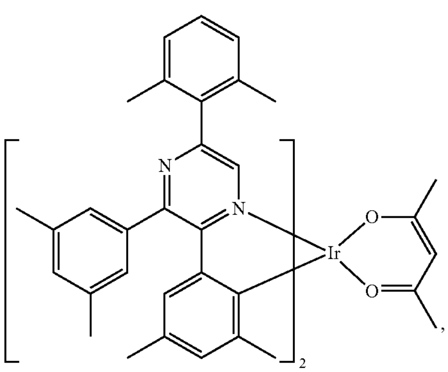
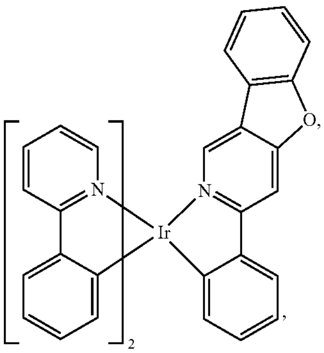
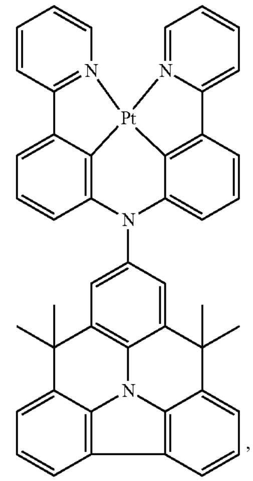
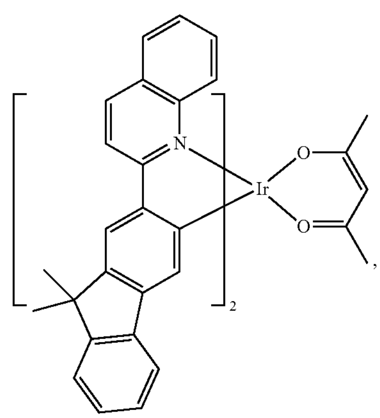
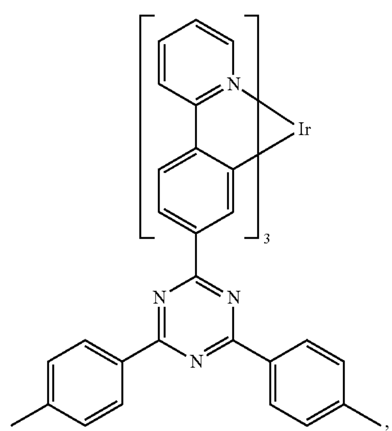
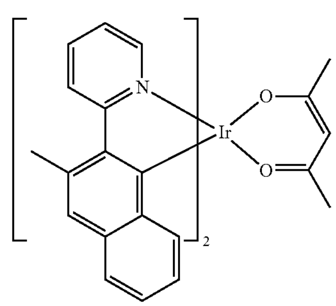

-continued
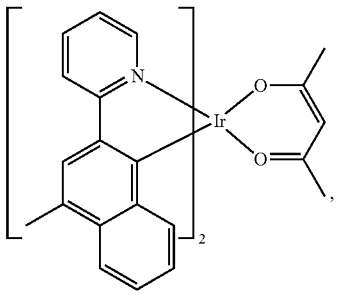
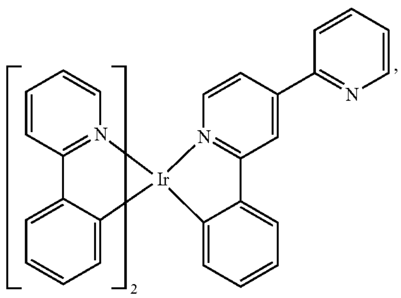
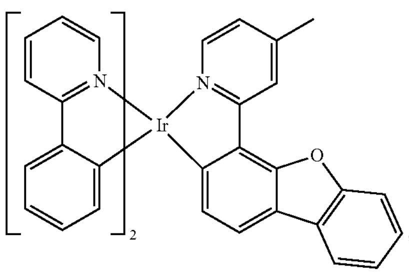
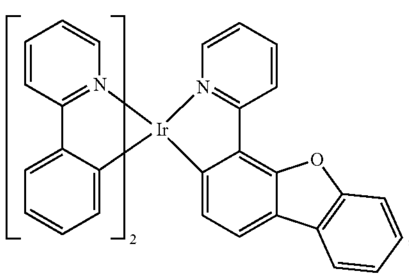
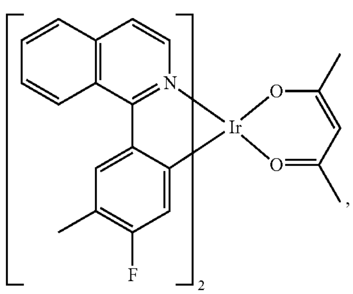
-continued
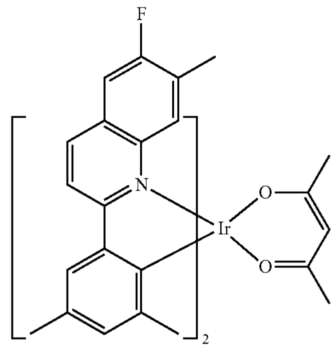
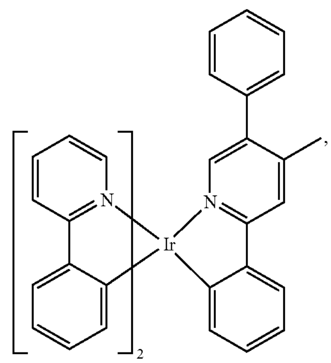
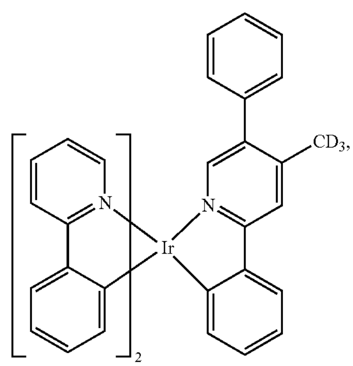
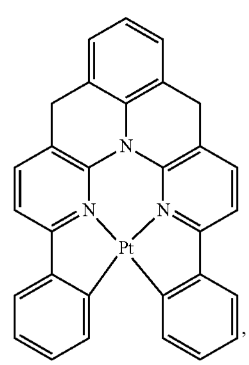

-continued
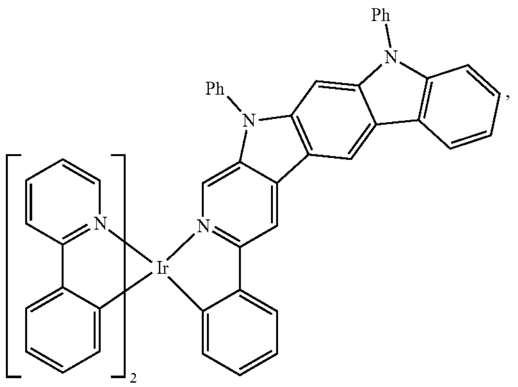
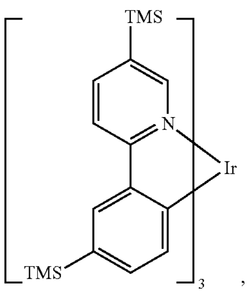
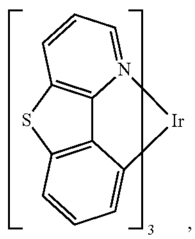
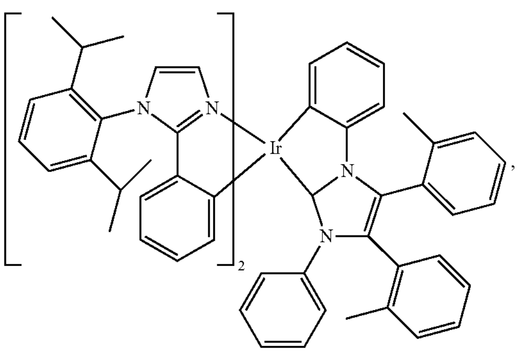
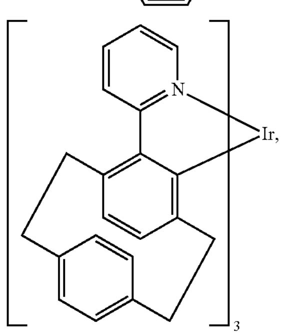
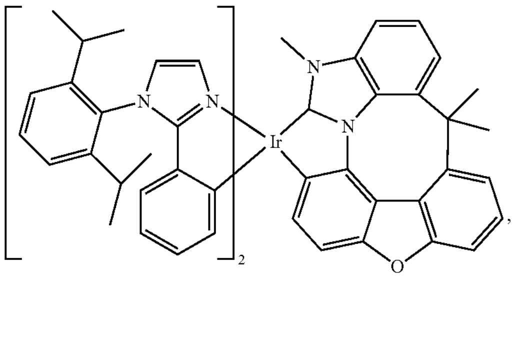
-continued
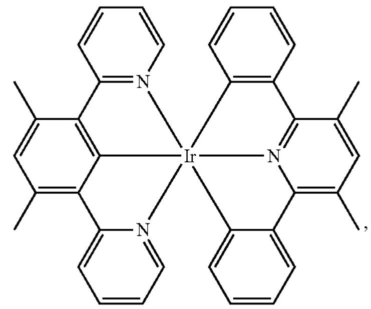
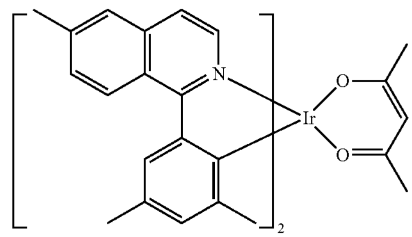
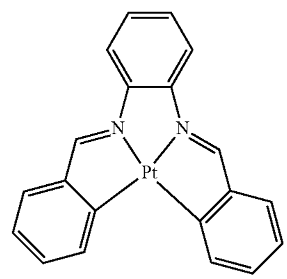
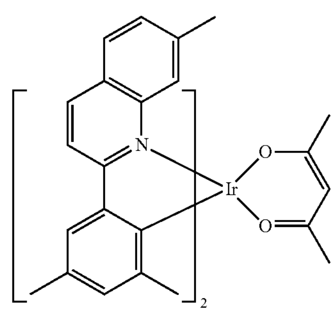
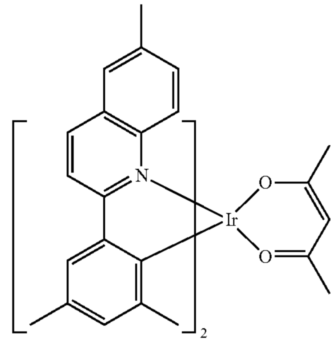

-continued
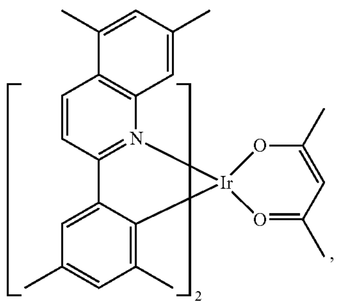
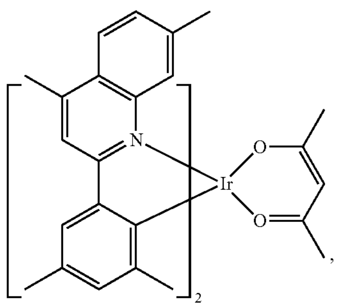
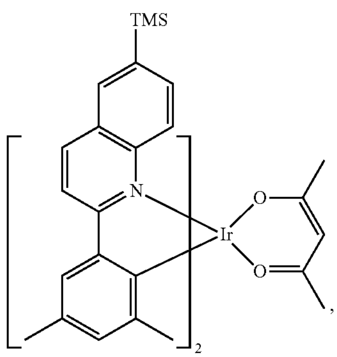
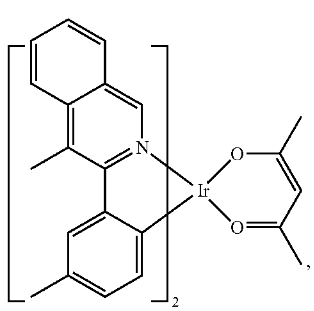
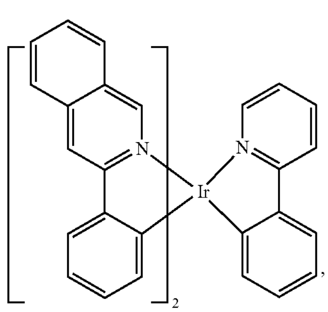
-continued
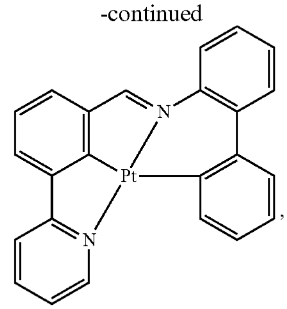
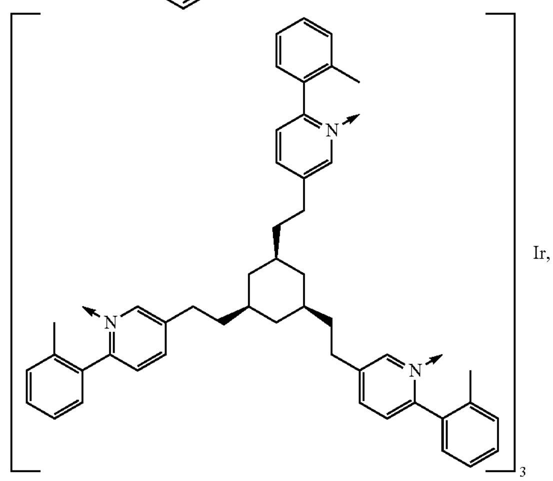
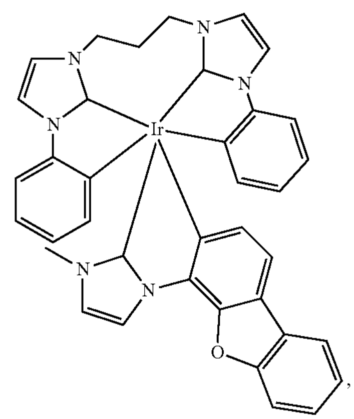
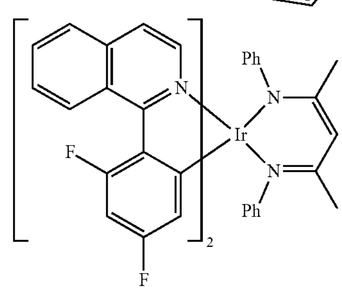
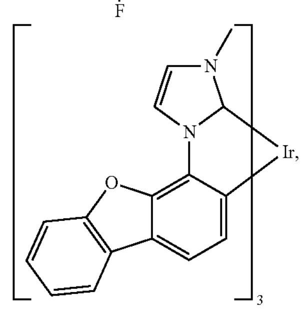

-continued
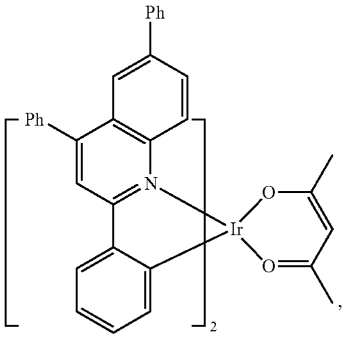
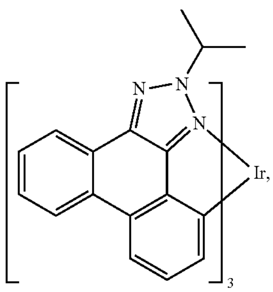
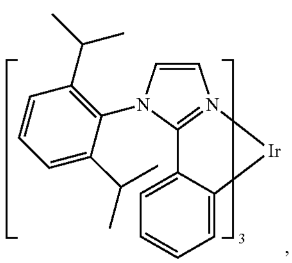
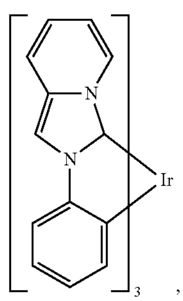
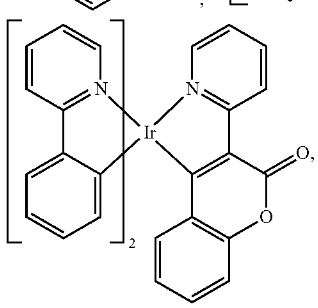
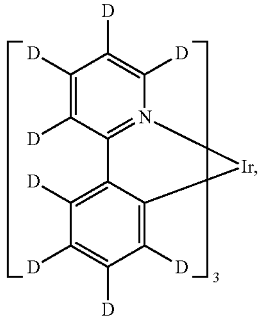
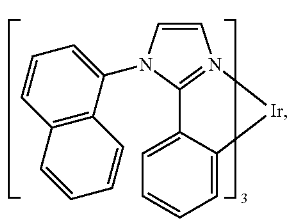
-continued
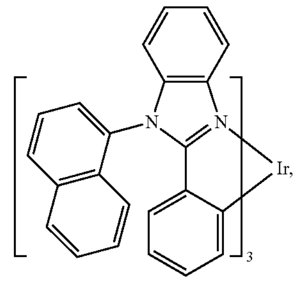
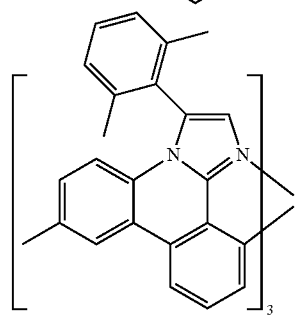
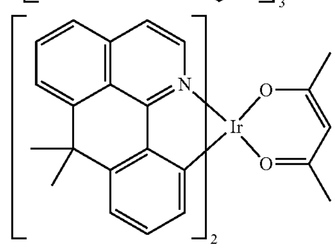
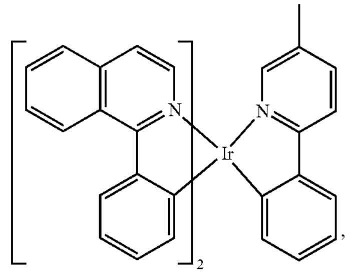
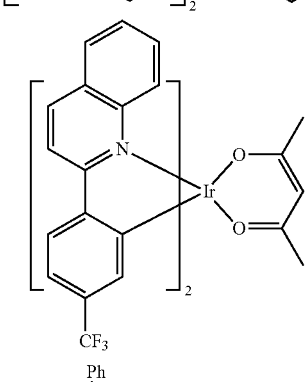
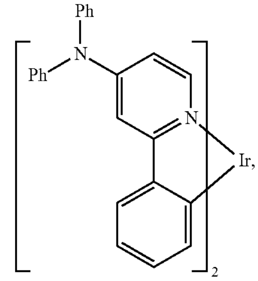
and -continued

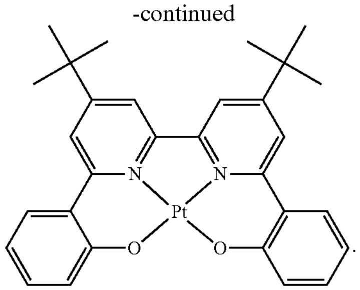

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

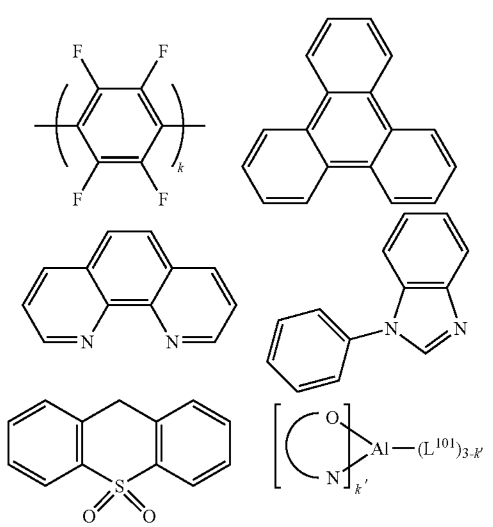

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

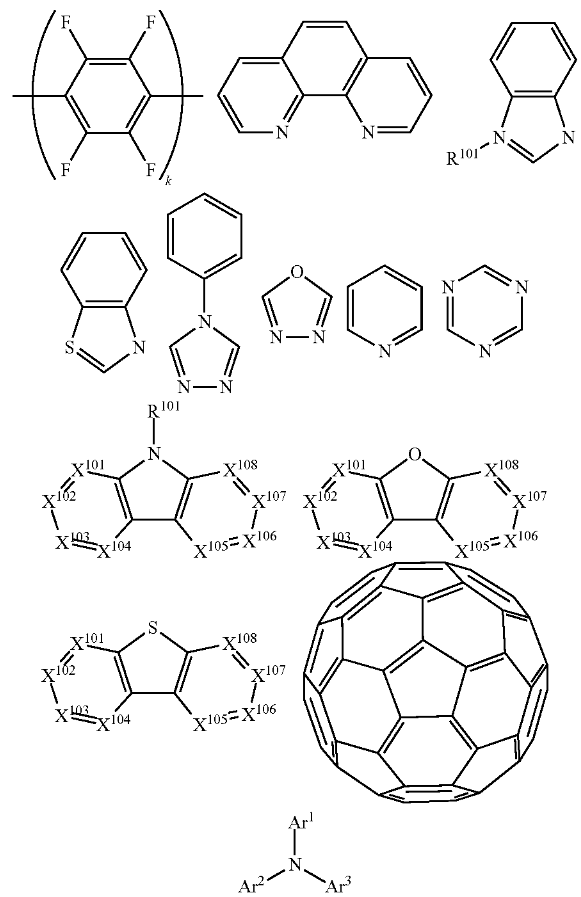

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

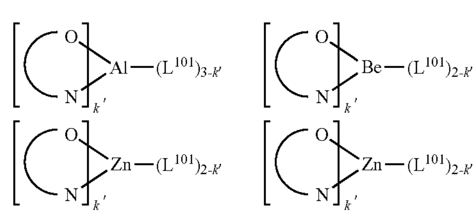

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,
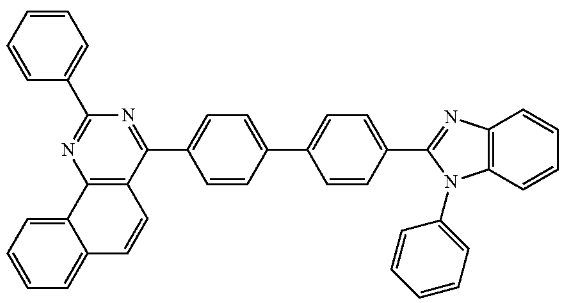
,
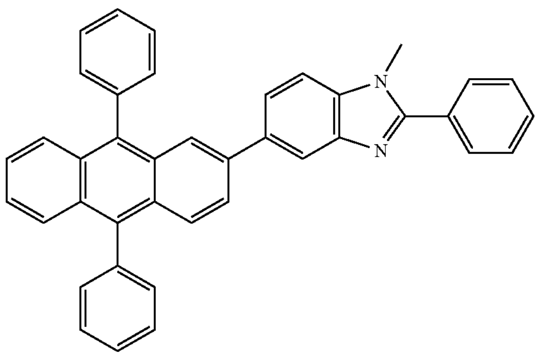
,
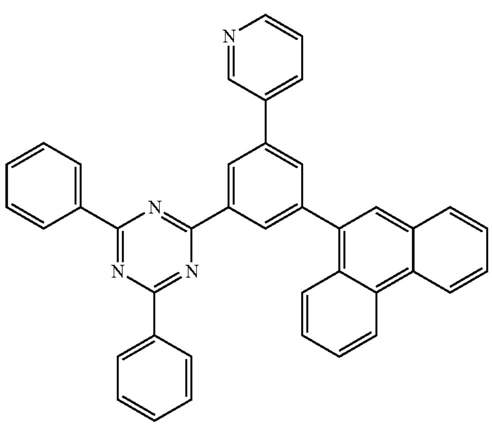
,
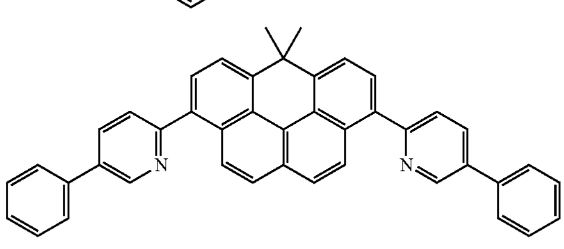
,
-continued
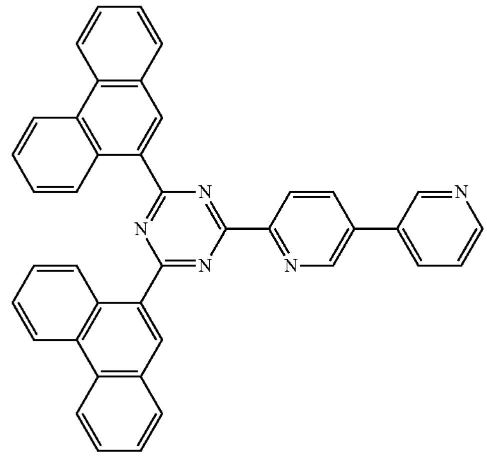
,
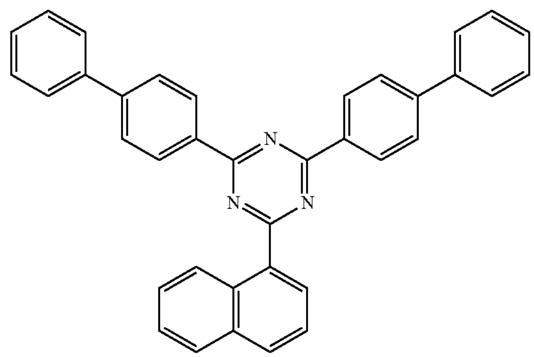
,
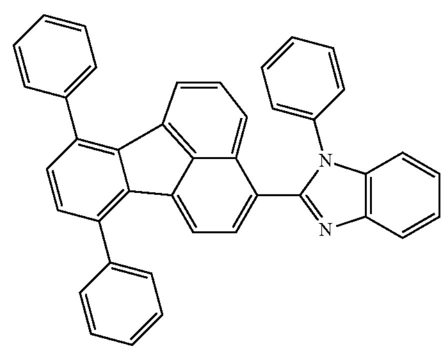
,
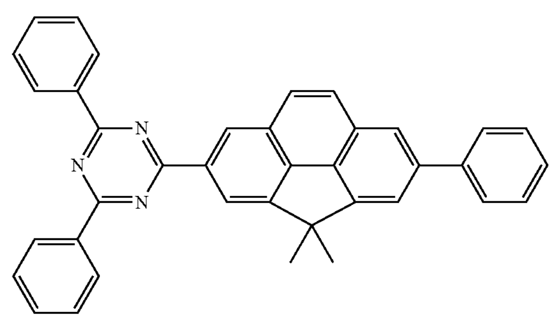
, -continued
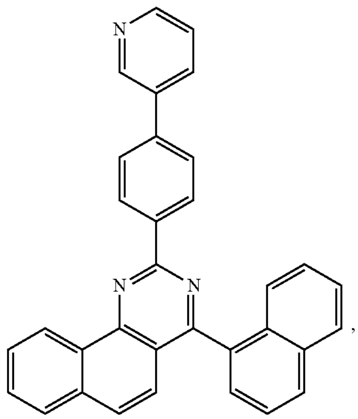
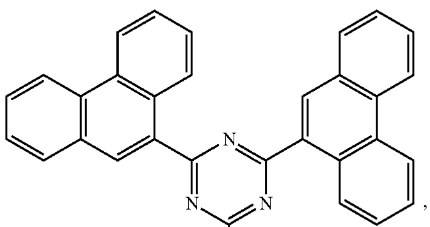
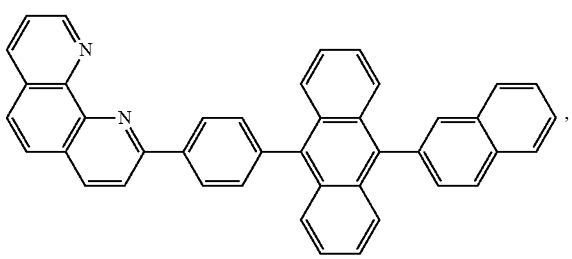
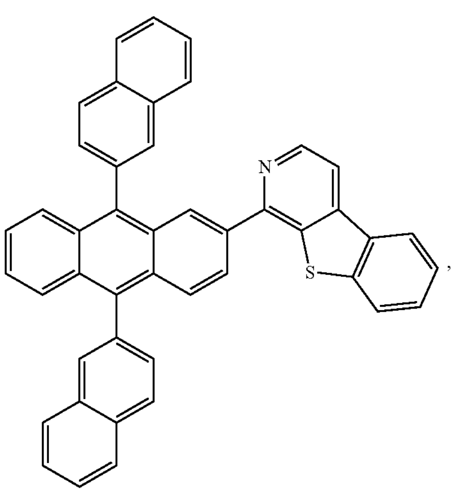
-continued
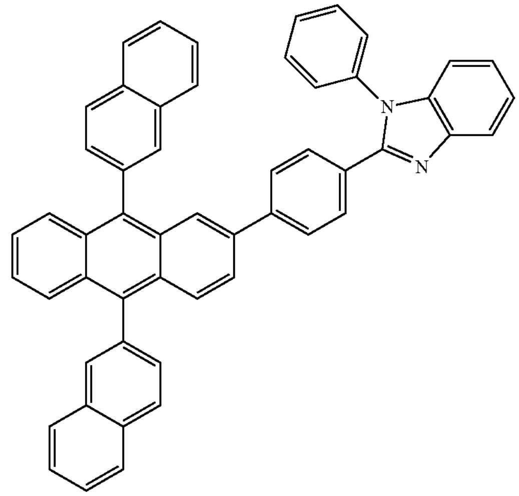
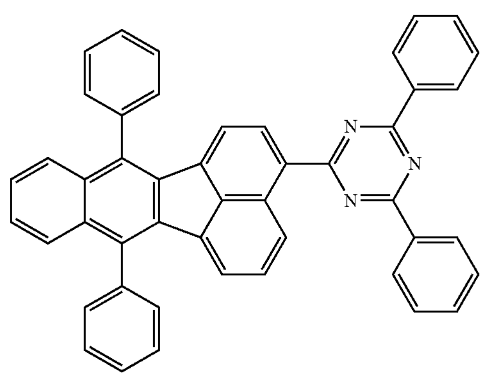
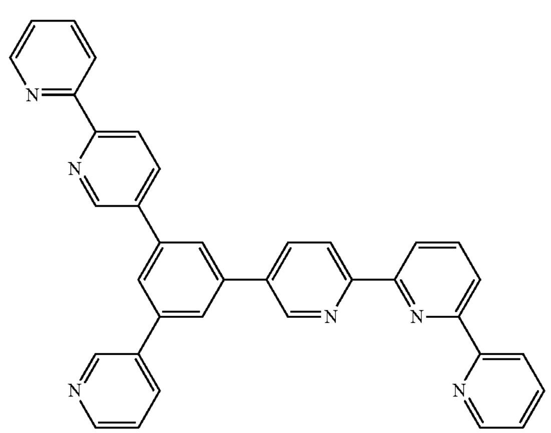

-continued
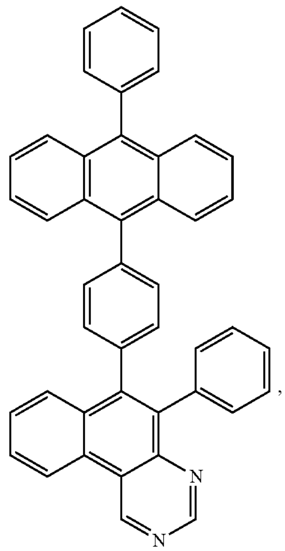
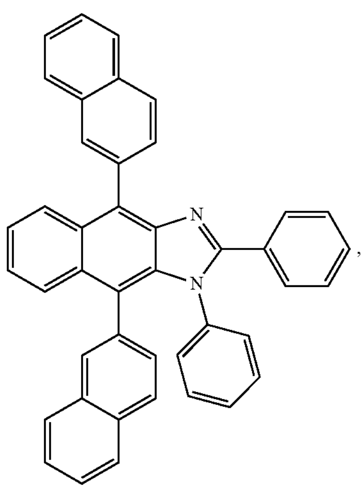
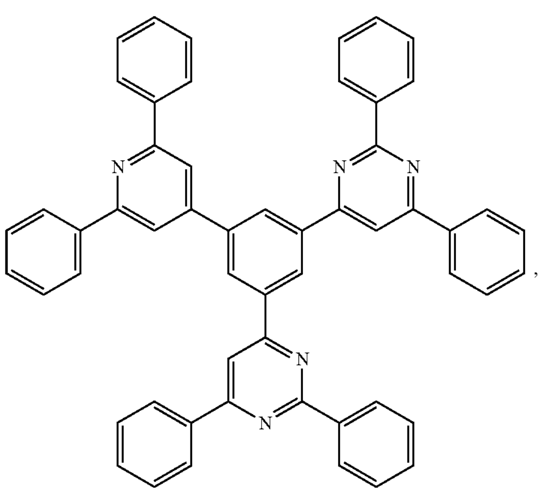
-continued
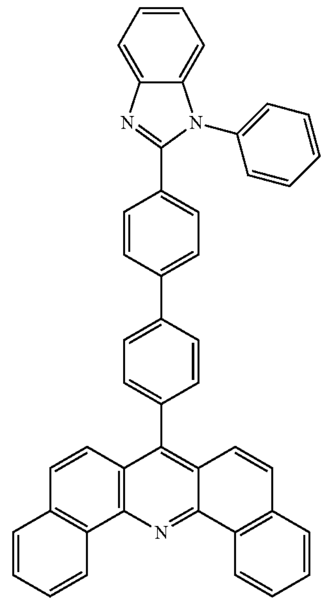
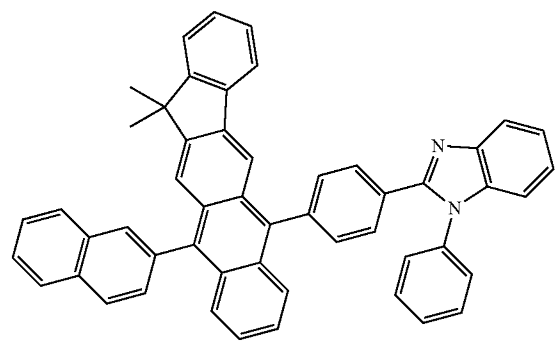
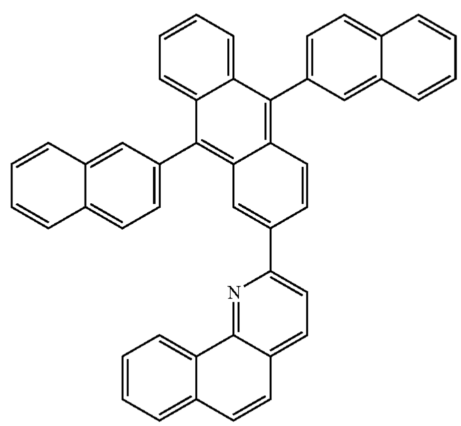
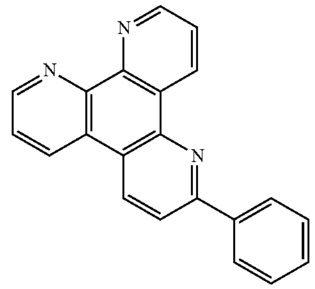

-continued
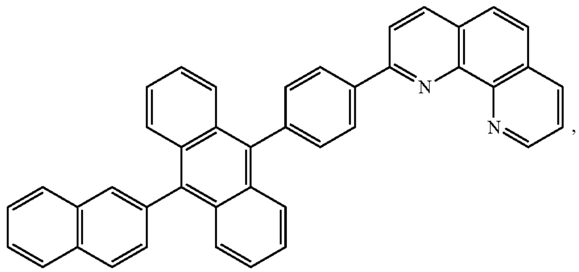
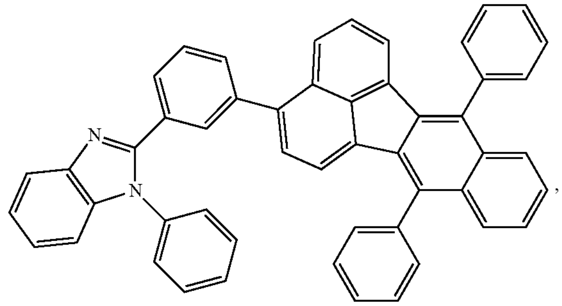
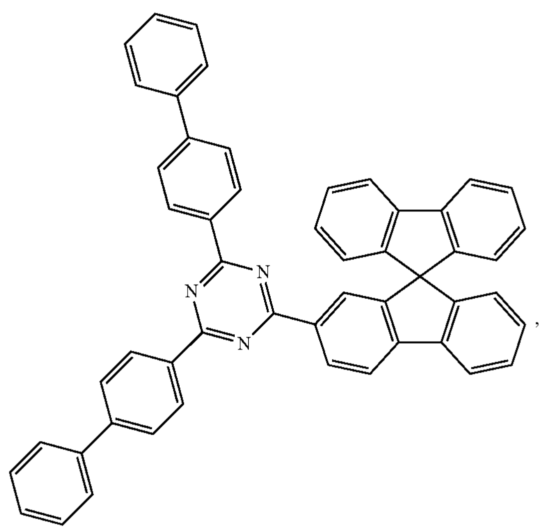
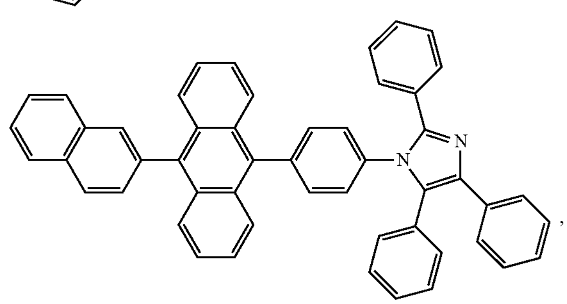
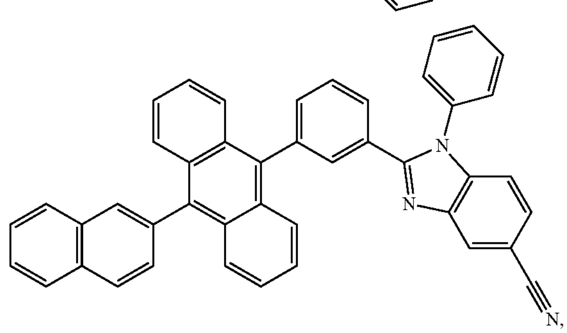
-continued
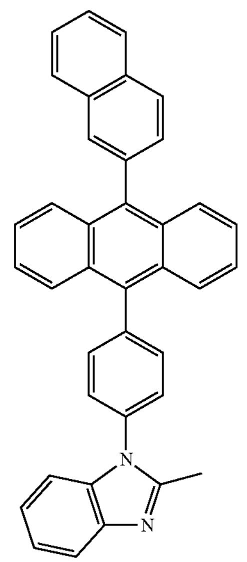
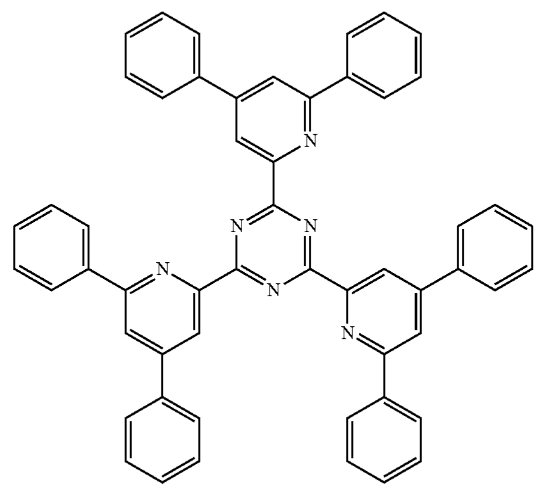
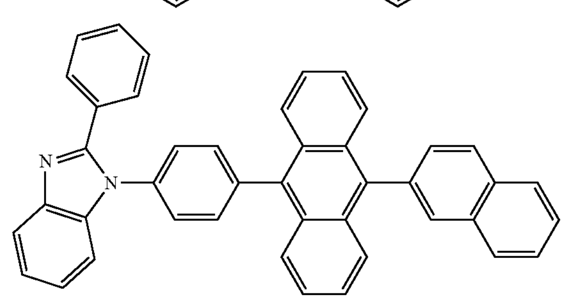
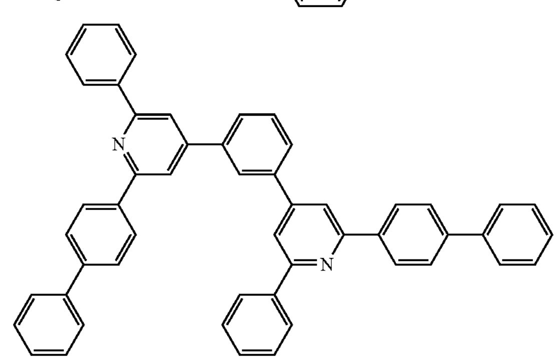

-continued

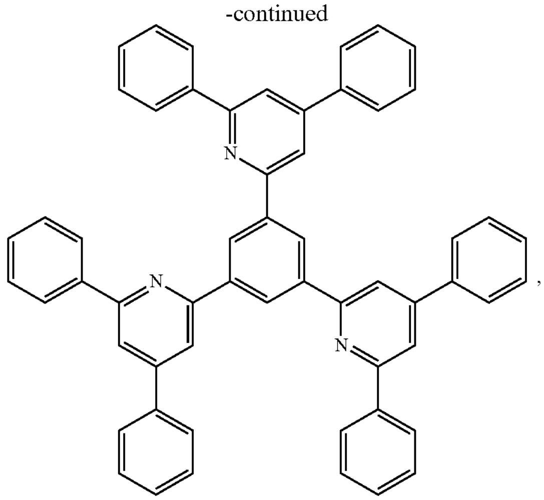

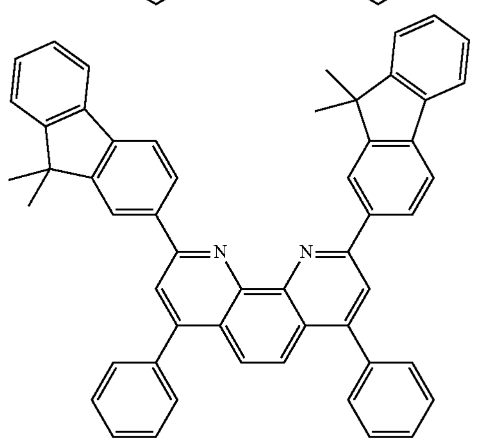

, and

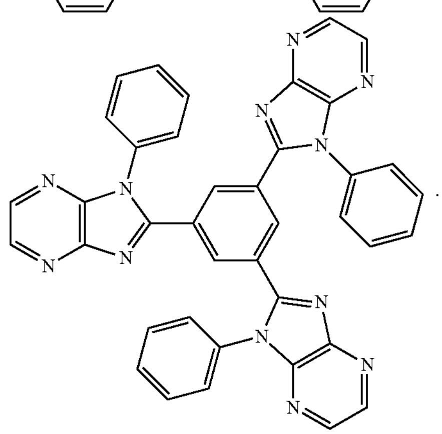

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

All reactions were carried out under nitrogen protection unless specified otherwise. All solvents for reactions were anhydrous and used as received from the commercial sources.

Synthesis of Comparative Compound 1 (CC1)

Synthesis of 2-(4-Cyclohexylnaphthalen-2-yl)pyridine

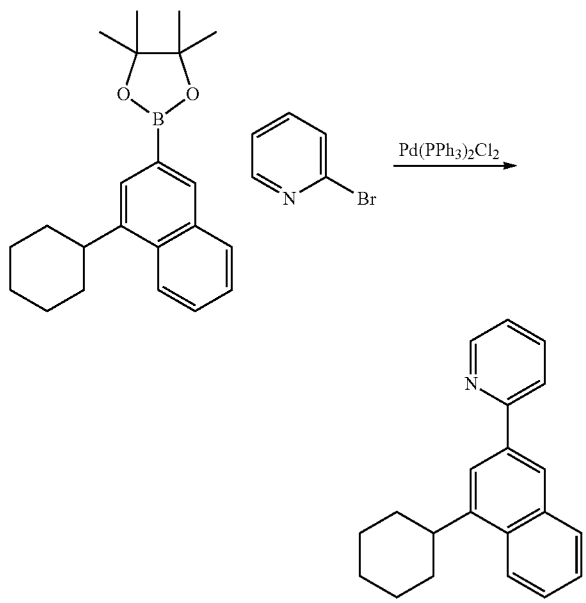

A mixture of 2-bromo-pyridine (2.8 g, 17.72 mmol), 2-(4-cyclohexylnaphthalen-2-yl)-4,4,5,5-tetramethyl-1,3,2-dioxaborolane (7.44 g, 22.12 mmol) and 2M aqueous potassium carbonate (17.5 mL, 35 mmol) in 1,4-dioxane (80 ml) was sparged with nitrogen for 10 minutes. Bis(triphenylphosphine)pallad-ium(II) dichloride (0.375 g, 0.534 mmol) was added and sparging continued for 10 more minutes. The reaction mixture was heated at reflux overnight (~16 hrs). The reaction mixture was then cooled to room temperature and diluted with water (50 mL) and ethyl acetate (100 mL). The layers were separated and the aqueous layer was extracted with ethyl acetate (2×100 mL). The combined organic layers were washed with brine (2×100 mL), dried over by sodium sulfate, filtered and concentrated under reduced pressure. The crude product was dissolved in 50% dichloromethane in hexane and passed through a pad of basic alumina (30 g), rinsing with 50% dichloromethane in hexane (50 mL). The product (4.4 g) was recrystallized from methanol to give 2-(4-cyclohexylnaphthalen-2-yl)pyridine (4.21 g, 83% yield) as a white solid.

Synthesis of CC1

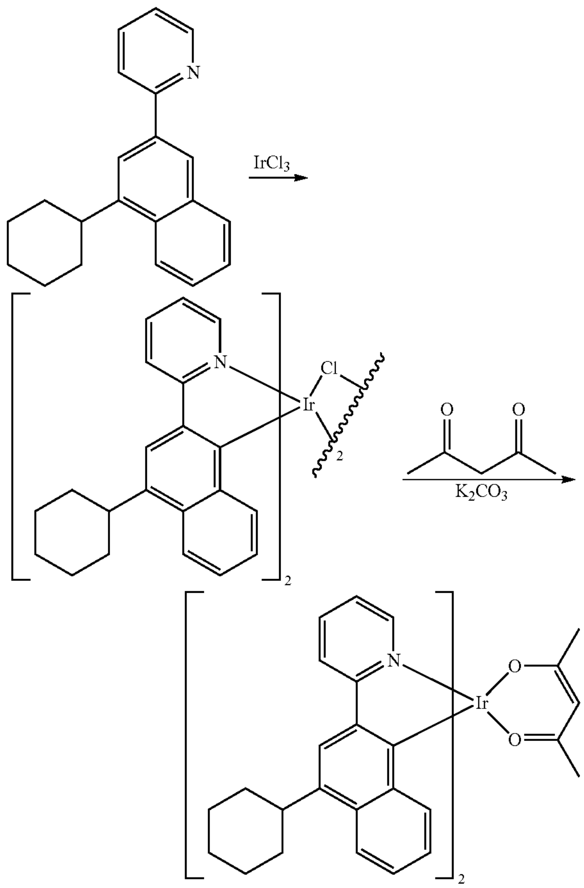

(A) A solution of 2-(4-cyclohexylnaphthalen-2-yl)pyridine (1.2 g, 4.2 mmol) in triethyl phosphate (16 mL) was sparged with nitrogen for 10 minutes. Iridium(III) chloride hydrate (862 mg, 2.33 mmol) was added and the reaction mixture stirred at 120° C. for 25 hours. The cooled reaction mixture was diluted with DIUF water (16 mL), filtered and the solid was washed with ethanol (3×10 mL). The solid was air-dried to give di-μ-chloro-tetrakis[(2-(4-cyclohexylnaphth-1'yl)-pyridin-1-yl)]diiridium(III) as an orange solid (2.11 g, >100% yield). (B) A suspension of di-μ-chloro-tetrakis[(2-(4-cyclohexylnaphth-1'yl)-pyridin-1-yl)] diiridium(III) (2.11 g, 1.16 mmol) and acetylacetone (630 mg, 6.3 mmol) in ethanol (25 mL) was sparged with nitrogen for 10 minutes. Powdered potassium carbonate (1.2 g, 8.4 mmol) was added and the reaction mixture stirred at room temperature in the dark for 5 hours. DIUF Water (25 mL) was added, the slurry was stirred for 1 hour, filtered, and the solid was washed with water (3×5 mL) and ethanol (3×5 mL) then air-dried. The orange solid (~2 g) was was loaded onto a column of silica gel (50 g), eluting with 1:1 dichloromethane and hexanes (250 mL). The cleanest product fractions were concentrated and the solid was dried in a vacuum oven at 50° C. to give the compound CC1, bis[(2-(4-cyclohexylnaphthyl-1'-yl)-pyridin-1-yl)]-(2,4-pen-tane-dionato-$k_2$O,O')iridium(III) (0.81 mg, 40% yield) as an orange solid.

Synthesis of Comparative Compound 2 (CC2)

Synthesis of 2-(4-cyclohexylnaphthalen-2-yl)-4-methylpyridine

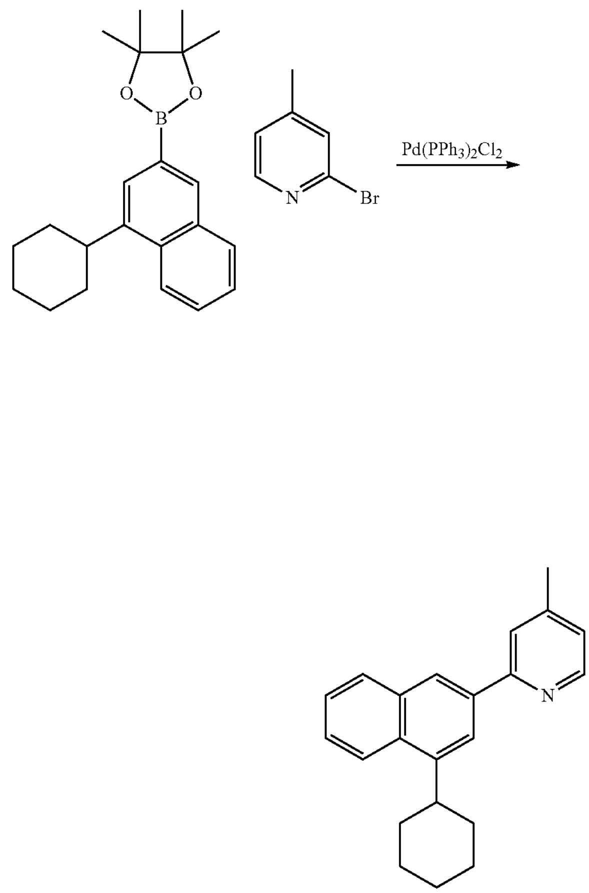

A mixture of 2-bromo-4-methylpyridine (3.8 g, 22.09 mmol), 2-(4-cyclohexylnaphthalen-2-yl)-4,4,5,5-tetramethyl-1,3,2-dioxaborolane (9.29 g, 27.6 mmol) and 2M aqueous potassium carbonate (17.5 mL, 35 mmol) in 1,4-dioxane (80 mL) was sparged with nitrogen for 10 minutes. Bis(triphenylphosphine) palladium(II) dichloride (0.543 g, 0.773 mmol) was added and sparging continued for 10 more minutes. The reaction mixture was heated at reflux overnight (~16 hours). The reaction mixture was cooled to room temperature and diluted with water (50 mL) and ethyl acetate (100 mL). The layers were separated and the aqueous layer was extracted with ethyl acetate (2×100 mL). The combined organic layers were washed with brine (2×100 mL), dried over by sodium sulfate, filtered and concentrated under reduced pressure. The crude product was dissolved in 50% dichloromethane in hexane and passed through a pad of basic alumina (30 g), rinsing with 50% dichloromethane in hexane (50 mL), and the filtrate was concentrated under reduced pressure. The crude product was purified with 120 g silica gel column, eluting with 33 to 66% dichloromethane in hexanes The product (4.4 g) was recrystallized from methanol to give 2-(4-cyclohexylnaphthalen-2-yl)-4-methylpyridine (6.2 g, 93% yield) as an off-white solid.

Synthesis of CC2

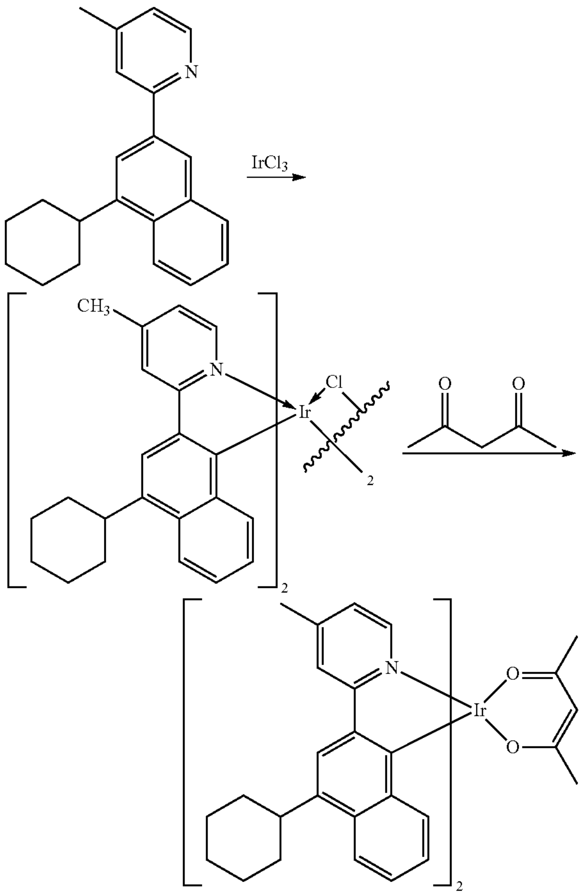

(A) A solution of 2-(4-cyclohexylnaphthalen-2-yl)-4-methylpyridine (3.32 g, 11.0 mmol) in 2-ethoxyethanol (120 mL) and DIUF water (30 mL) was sparged with nitrogen for 5 minutes. Iridium(III) chloride hydrate (1.58 g, 5.0 mmol) was added and sparging continued for an additional 5 minutes, then the reaction mixture was heated at 90° C. overnight (~16 hours). The reaction mixture was cooled to −50° C., filtered, washing the solids with water (2×40 mL). The solid was air-dried for 10 minutes to give di-μ-chloro-tetrakis[(2-(4-cyclohexylnaphthalen-2-yl)-4-methylpyridine-2-yl)]diiridium(III) (3.1 g, crude) as a orangish solid. (B) A solution of crude di-μ-chloro-tetrakis[(2-(4-cyclohexylnaphthalen-2-yl)-4-methylpyridine-2-yl)]-diiridium(III) (3.07 g, 3.7 mmol) and pentane-2,4-dione (0.74 g, 7.4 mmol) in 2-ethoxyethanol (60 mL) was sparged with nitrogen for 5 minutes, powdered potassium carbonate (1.02 g, 6.0 mmol) was added and sparging continued for 3 additional minutes. The reaction mixture was stirred at room temperature overnight (~16 hours) in a flask wrapped in aluminum foil to exclude light. DIUF water (60 mL) was added, the suspension was stirred for 30 minutes and the resulting red solid was filtered. The red solid was suspended in dichloromethane (10 mL), loaded directly onto a column of silica gel and the column eluted with 40% dichloro-methane in hexanes. Product fractions were concentrated under reduced pressure and the solid was dried at 50° C. under high vacuum to give the compound CC2, bis[(2-(4-cyclohexylnaphthalen-2-yl)-4-methylpyridine-2-yl)]-(pentane-2,4-dio-nato-$k_2$O,O') iridium(III) (0.95 g, 22% yield) as an orange solid.

Synthesis of Comparative Compound 3 (CC3)

Synthesis of 2-(4-Cyclohexylnaphthalen-2-yl)-4-(trifluoromethyl)pyridine

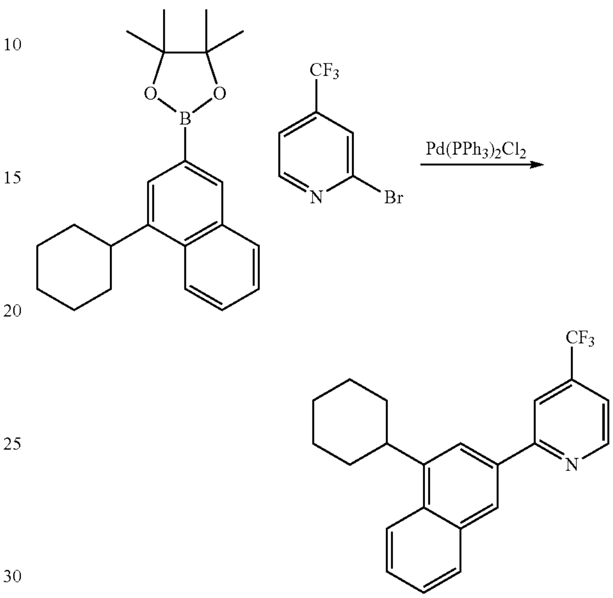

2.0M aq. potassium carbonate (23 mL, 44.2 mmol) was added to a solution of 2-bromo-4-(trifluoromethyl)pyridine (5.0 g, 22.1 mmol), (1-cyclohexylnaphalen-2-yl)-4,4,5,5-tetramethyl-1,3,2-dioxaborolane (9.3 g, 27.7 mmol) and trans-dichlorobis(triphenylphosphine)palladium(II) (470 mg, 0.66 mmol) in 1,4-dioxane (100 mL) and the reaction mixture was sparged with nitrogen for 10 minutes. The mixture was heated at reflux for 18 hours before it was cooled to room temperature, saturated brine (20 mL) was added and the layers were separated. The organic phase was dried over sodium sulfate, filtered and concentrated under reduced pressure. The crude material was chromatograph-ed on silica gel, eluting with 30% dichloromethane in heptanes then increasing to 100% dichloromethane to ensure complete elution of product. The product fractions were concentrated under reduced pressure to give 2-(4-cyclo-hexylnaphthalen-2-yl)-4-(trifluoromethyl)pyridine (5.8 g, 75% yield) as a white solid.

Synthesis of CC3

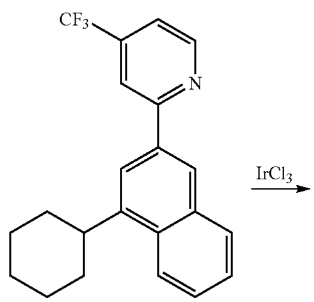

-continued

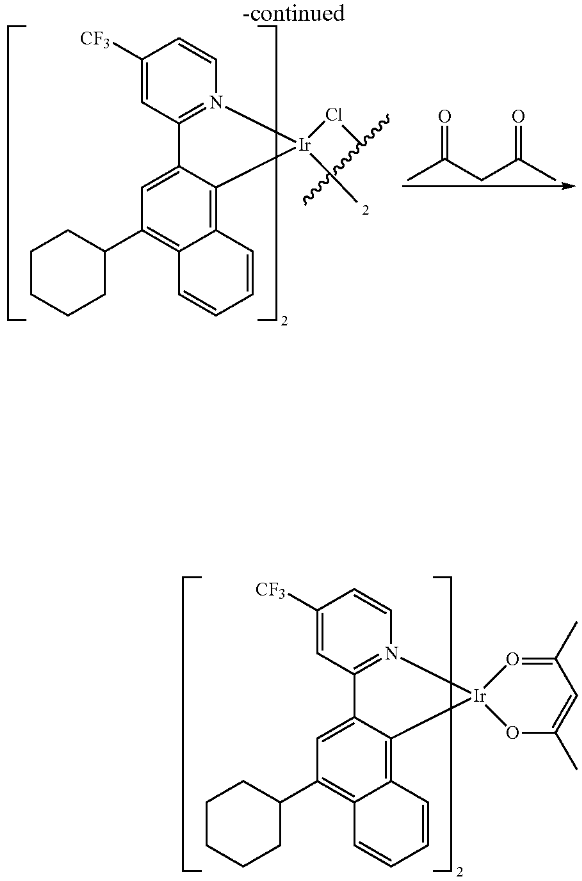

(A) A solution of 2-(4-cyclohexylnaph-thalen-2-yl)-4-(trifluoromethyl)pyridine (3.91 g, 11.0 mmol) in 2-ethoxyethanol (120 mL) and DIUF water (30 mL) was sparged with nitrogen for 5 minutes. Iridium(III) chloride hydrate (1.58 g, 5.0 mmol) was added, sparging continued for 5 minutes, then the reaction mixture heated at 90° C. for 7 hours. The reaction mixture was cooled to −50° C., filtered, the solids washed with water (30 mL) then air-dried for 10 minutes to give the compound CC3, di-μ-chloro-tetrakis[(2-(4-cyclohexylnaphthalen-2-yl)-4-(trifluoromethyl) pyridine-2-yl)]diiridium(III) (5.5 g, crude) as a reddish solid. (B) A solution of crude di-μ-chloro-tetrakis[(2-(4-cyclohexylnaphthalen-2-yl)-4-(trifluoromethyl) pyridine-2-yl)]diiridium(III) (2.81 g, 3.0 mmol) and pentane-2,4-dione (0.6 g, 6.0 mmol) in 2-ethoxyethanol (60 mL) was sparged with nitrogen for 5 minutes. Powdered potassium carbonate (0.829 g, 6.0 mmol) was added and sparging continued for 3 additional minutes. The reaction mixture was stirred at room temperature overnight. DIUF water (60 mL) was added, the suspension stirred for 30 minutes and the solid filtered. The sticky solid was slurried in methanol (40 mL) for 10 minutes, filtered and the solid washed methanol (40 mL). The red solid was loaded onto a column of silica gel and the column eluted with 30% dichloromethane in hexanes. Product fractions were concentrated under reduced pressure and the solid was dried at 50° C. under high vacuum to give the compound CC3, bis[(2-(4-cyclohexyl-naphthalen-2-yl)-4-(trifluoromethyl)pyridine-2-yl)]-(pentane-2,4-dionato-k$_2$O,O')iridium (III) (1.4 g, 47% overall yield) as a red solid.

Synthesis of Comparative Compound 4 (CC4)

Synthesis of 4-(tert-Butyl)-2-(4-cyclohexylnaphthalen-2-yl)pyridine

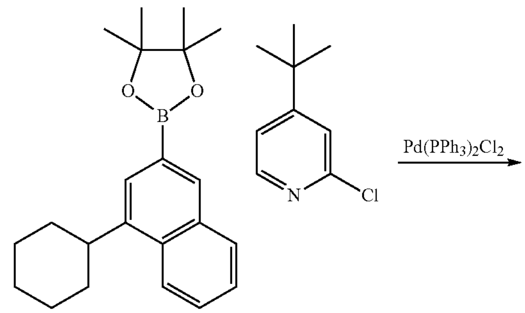

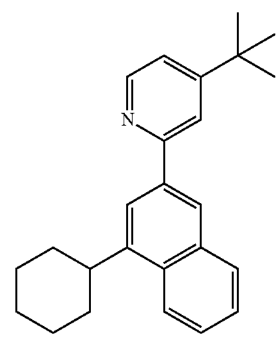

A mixture of 4-(tert-butyl)-2-chloropyridine (1.45 g, 8.55 mmol), 2-(4-cyclohexyl-naphthalen-2-yl)-4,4,5,5-tetramethyl-1,3,2-dioxaborolane (3.65 g, 10.85 mmol), and 2M aq. potassium carbonate (7.5 mL, 15 mmol) in 1,4-dioxane (40 mL) was sparged with nitrogen for 10 minutes. Bis(triphenyl-phosphine)palladium(II) dichloride (0.240 g, 0.342 mmol) was added and sparging continued for 10 additional minutes, and the reaction mixture was heated at reflux for 18 hours. The reaction mixture was cooled to room temperature and diluted with water (5 mL) and ethyl acetate (60 mL). The layers were separated and the aqueous layer extracted with ethyl acetate (2×60 mL). The combined organic layers were washed with saturated brine (2×60 mL), dried over sodium sulfate, filtered and concentrate under reduced pressure. The impure product (6.74 g) was chromatograph-ed on silica gel, eluting with 33-66% dichloromethane in hexane. Product fractions were concentrated under reduced pressure and the solid recrystallized from methanol to give 4-(tert-butyl)-2-(4-cyclohexylnaphthalen-2-yl)pyridine (2.6 g, 89% yield).

Synthesis of CC4

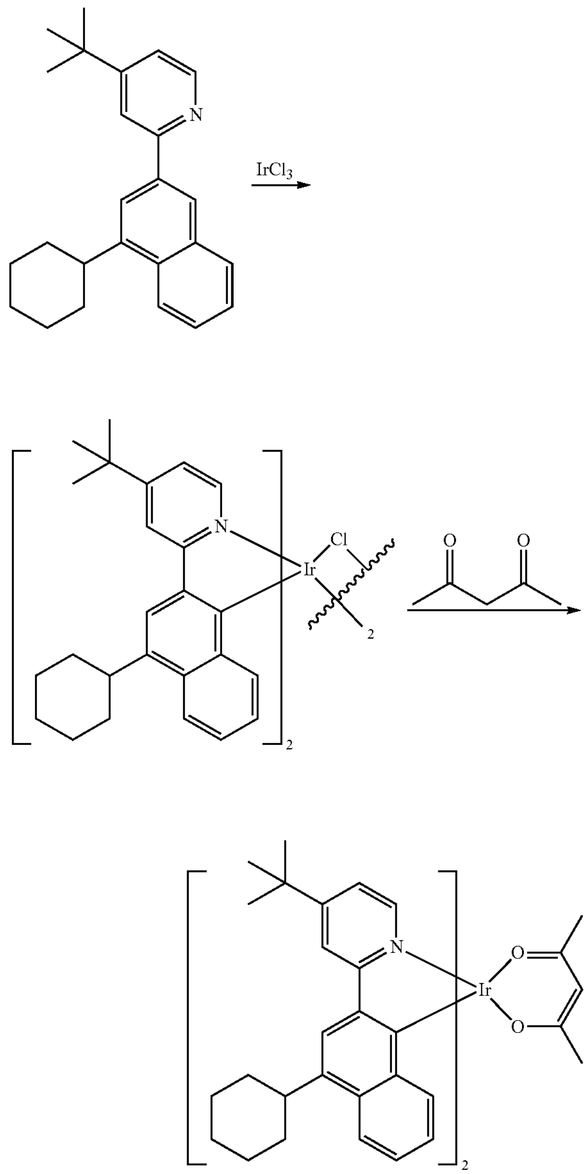

A mixture of 4-(tert-butyl)-2-(4-cyclohexylnaphthalen-2-yl)pyridine (1.0 g, 145.8 mmol) and triethyl phosphate (6 mL) was sparged with nitrogen for 10 minutes. Iridium(III) chloride hydrate (0.46 g, 1.46 mmol) was added and sparging continued for 5 additional minutes. The reaction mixture was heated at 125° C. for 16 hours. The reaction mixture was cooled to room temperature and diluted with methanol (6 mL). Powdered potassium carbonate (0.6 g, 4.37 mmol) and acetylacetone (0.29 g, 2.91 mmol) were added and the reaction mixture stirred at 40° C. for 1 hour. Water (15 mL) was added, the suspension stirred for 30 minutes, filtered and the solid washed with water (3×2 mL) and methanol (3×2 mL). The orange solid was chromatograph-ed on silica gel, eluting with 0-50% dichloromethane in heptane over 45 minutes. Product fractions were concentrated under reduced pressure the residue (0.68 g) triturated with hot hexanes to give the compound CC4, bis[(2-(4-cyclohexylnaphthalen-2-yl)-4-tert-butylpyridin-2-yl)]-(2,4-pentanedionato-$k_2$O,O) iridium(III) (0.55 g, 39% yield) as an orange solid.

Synthesis of Compound C88,222

Synthesis of 2-(4-cyclohexyl-naphthalen-2-yl)-4-(3,3,3-trifluoro-2,2-dimethylpropyl)pyridine

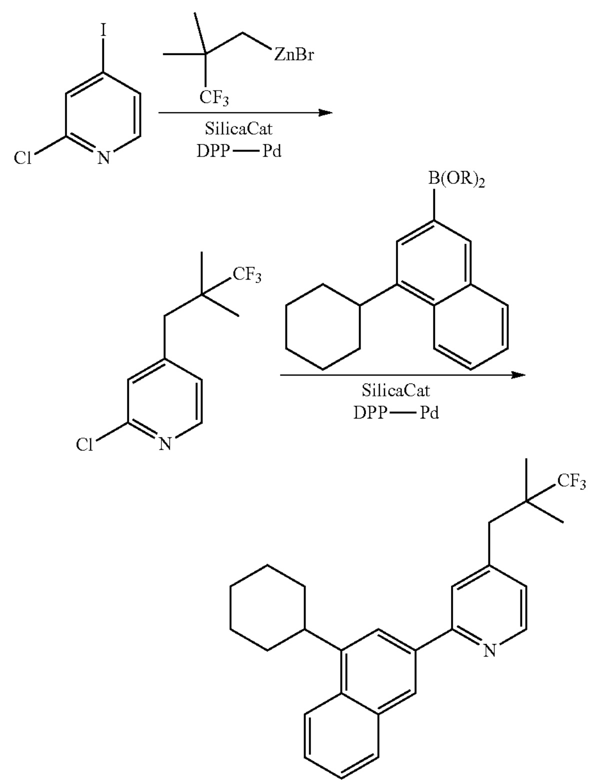

(A) A 2 L, four-neck flask was flushed with nitrogen and charged with 2-chloro-4-iodo-pyridine (25.2 g, 105 mmol) in anhydrous tetrahydrofuran (500 mL) while sparging was continued during the addition. Palladium(II) acetate (0.71 g, 3.1 mmol) and 2-dicyclohexylphosphino-2',6'-dimethoxy-biphenyl (SPhos) (2.6 g, 6.3 mmol) were added, the mixture was cooled to −1° C., then sparging was discontinued. 0.8M (3,3,3-trifluoro-2,2-dimethylpropyl)zinc(II) bromide in tetrahydrofuran (155 mL, 124 mmol) was added dropwise to the reaction mixture over 30 minutes while maintaining the temperature at below 2° C. The reaction mixture was cooled in an ice bath and 25% sodium hydroxide (200 mL) added dropwise. The layers were separated and the aqueous phase extracted with methyl tert-butyl ether. The combined organic phases were washed with brine, dried over sodium sulfate, filtered and concentrated under reduced pressure giving a yellow-brown oil. The crude product (33.5 g) was chromatographed on silica gel, eluting with 0-10% ethyl acetate in heptanes, to give 2-chloro-4-(3,3,3-trifluoro-2,2-dimethylpropyl)pyridine (23.0 g, 92% yield) as a yellow oil. (B) A 500 mL four-neck flask was charged with 2-chloro-4-(3,3,3-trifluoro-2,2-dimethylpropyl)pyridine (4.75 g, 20 mmol), 2-(4-cyclohexylnaphthalen-2-yl)-4,4,5,5-tetramethyl-1,3,2-dioxaborolane (7.4 g, 22 mmol), 2M aq. potassium carbonate (20 mL, 40 mmol) and ethanol (300 mL) and the mixture was sparged with nitrogen for 10 minutes. SilicaCat DPP-Pd (2.0 g, 0.6 mmol) was added and sparging continued for additional 5 minutes. The reaction mixture was heated at reflux for 19 hours. The reaction mixture was cooled to room temperature, filtered and the solids washed with water (50 mL) and ethanol (100 mL). The solids were dissolved in dichloromethane (30 mL), adsorbed onto silica gel (50 g) and purified by chromatography, eluting with 0-5% ethyl acetate in heptanes, to give 2-(4-cyclohexylnaphthalen-2-yl)-4-(3,3,3-trifluoro-2,2-dimethyl-propyl)pyridine (7.0 g, 85% yield) as a white solid.

Synthesis of Compound C88,222

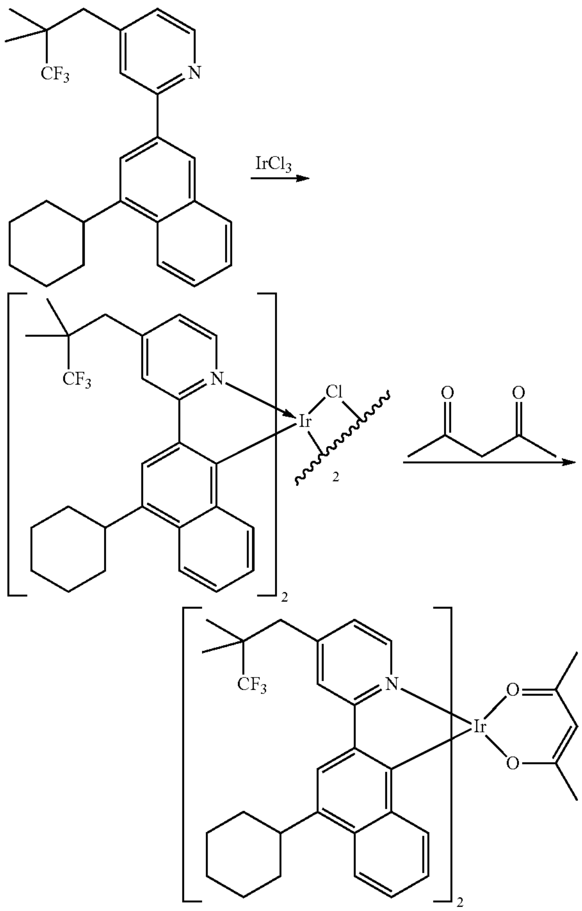

(C) A mixture of 2-(4-cyclohexylnaphthalen-2-yl)-4-(3,3,3-trifluoro-2,2-dimethylpropyl)pyridine (4.07 g, 9.9 mmol), 2-ethoxyethanol (120 mL) and DIUF water (30 mL) was sparged with nitrogen for 5 minutes. Iridium(III) chloride hydrate (1.42 g, 4.5 mmol) was added, sparging continued for 5 minutes and the reaction mixture was heated at 90° C. for 48 hours. The reaction mixture was cooled to ~60° C., filtered under reduced pressure and the solids washed with water (2×30 mL). The solid was air-dried for 5 minutes to give di-μ-chloro-tetrakis[(4-(4-cyclo-hexylnaphthalen-2-yl)-4-(3,3,3-trifluoro-2,2-dimethylpropyl)pyridin-2-yl]-diirid-ium(III) (4.0 g) as an orange solid. (D) A solution of di-μ-chloro-tetrakis[(4-(4-cyclohexylnaphthalen-2-yl)-4-(3,3,3-tri-fluoro-2,2-dimethylpropyl)pyridin-2-yl]diiridium (III) (4.08 g, 3.9 mmol) and pentane-2,4-dione (0.78 g, 7.8 mmol) in 2-ethoxyethanol (100 mL) was sparged with nitrogen for 5 minutes. Powdered potassium carbonate (1.08 g, 7.8 mmol) was added and sparging continued for additional 5 minutes. The mixture was stirred at 50° C. for 24 hours. DIUF water (100 mL) was added, the suspension was stirred for 30 minutes, filtered and the slightly sticky solid washed with water (30 mL). The solid was slurried in methanol (50 mL) for 10 minutes, filtered and the solid washed with methanol (50 mL). The red solid was dissolved/suspended in 30% dichloromethane in hexanes (20 mL) and stirred at 35° C. for 30 minutes. The slurry was loaded directly onto a column of silica gel, eluting with 30-40% dichloromethane in hexanes. Product containing fractions were concentrated under reduced pressure and dried at 50° C. in a vacuum oven to give the compound C88,222, [(2-(4-cyclohexyl-naphthalen-2-yl)-4-(3,3,3-tri-fluoro-2,2-dimethylpropyl)pyridin-2-yl]-(2,4-pentanedionato-$k_2$O,O) iridium(III) (1.8 g, 36% yield over 2 steps) as a red solid.

Device Examples

All example devices were fabricated by high vacuum (<$10^{-7}$ Torr) thermal evaporation. The anode electrode was 1150 Å of indium tin oxide (ITO). The cathode consisted of 10 Å of Liq (8-hydroxyquinoline lithium) followed by 1,000 Å of Al. All devices were encapsulated with a glass lid sealed with an epoxy resin in a nitrogen glove box (<1 ppm of $H_2O$ and $O_2$) immediately after fabrication, and a moisture getter was incorporated inside the package. The organic stack of the device examples consisted of sequentially, from the ITO surface, 100 Å of LG101 (purchased from LG chem) as the hole injection layer (HIL); 400 Å of HTM as a hole transporting layer (HTL); 300 Å of an emissive layer (EML) containing Compound H as a host, a stability dopant (SD) (18%), and Comparative Compound 1, 2, 3, and 4 (CC1, CC2, CC3, CC4) or Compound C88,222 as the emitter (3%); 100 Å of Compound H as a blocking layer; and 350 Å of Liq (8-hydroxyquinoline lithium) doped with 40% of ETM as the ETL. The emitter was selected to provide the desired color, efficiency and lifetime. The stability dopant (SD) was added to the electron-transporting host to help transport positive charge in the emissive layer. The Comparative Example devices were fabricated similarly to the device examples except that Comparative Compounds were used as the emitters in the EML. Table 1 below provides the materials used for the device layers and the layer thickness.

TABLE 1

Device layer materials and thicknesses

| Layer | Material | Thickness [Å] |
|---|---|---|
| Anode | ITO | 1150 |
| HIL | HATCN | 100 |
| HTL | HTM | 450 |
| EML | Compound H: SD 18%: Emitter 3% | 400 |
| ETL | Liq: ETM 40% | 350 |
| EIL | Liq | 10 |
| Cathode | Al | 1000 |

The device performance data are summarized in Table 2 below. The maximum wavelength of emission ($\lambda_{max}$) is very comparable for all comparative compounds (589, 584, 584 nm) and Compound C88,222 (589 nm). The exception is Compound CC3 where a CF3 pendant group was added on the pyridine (631 nm), showing that electron-withdrawing groups on the pyridine lead to bathochromic shift of the emission from an orange color to a deep red color (much lower energy). Since device performance can only be compared with the similar emitting color, it is not suitable to compare CC3 with others tested here except the large color change. The line shape of the emission (FHWM) is similar going from comparative compounds with similar emitting colors to Compound C88,222. The EQE of Compound C88,222 (1.00) was much higher than the EQE of all Comparative Compounds with similar emitting colors (CC1—0.74, CC2—0.81, CC4—0.81). The addition of flexible branched side chains on pyridine units can be responsible this increase in efficiency. Finally, the device lifetime ($LT_{95\%}$ at 80 mA/$cm^2$) was also better in the case of Compound C88,222 (1.00) compared to the Comparative Compounds with similar emitting colors (CC1—0.28, CC2—0.44, CC4—0.34).

TABLE 2

Performance of the devices made with Comparative and Inventive Compounds.

| Device Example | Emitter | 1931 CIE X | 1931 CIE y | λ max [nm] | FWHM [nm] | At 10 mA/cm$^2$ Voltage [au] | At 10 mA/cm$^2$ EQE [au] | At 80 mA/cm$^2$ $LT_{95\%}$ [au] |
|---|---|---|---|---|---|---|---|---|
| Example 1 | Compound C88, 222 | 0.58 | 0.42 | 589 | 1.00 | 1.00 | 1.00 | 1.00 |
| CE1 | Comparative Compound 1 | 0.58 | 0.42 | 589 | 1.03 | 1.03 | 0.74 | 0.28 |
| CE2 | Comparative Compound 2 | 0.57 | 0.43 | 584 | 1.03 | 1.03 | 0.81 | 0.44 |
| CE3 | Comparative Compound 3 | 0.66 | 0.34 | 631 | 1.26 | 1.00 | 0.65 | 1.14 |
| CE4 | Comparative Compound 4 | 0.57 | 0.43 | 584 | 1.06 | 1.03 | 0.81 | 0.34 |

The chemical structures for the materials used in the experimental OLED devices are shown below:

Compound H

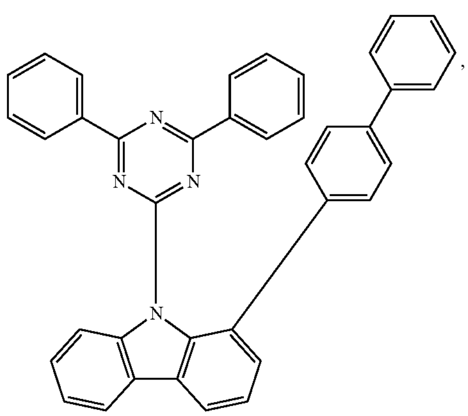

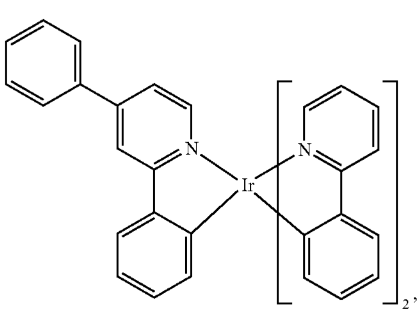

SD

-continued

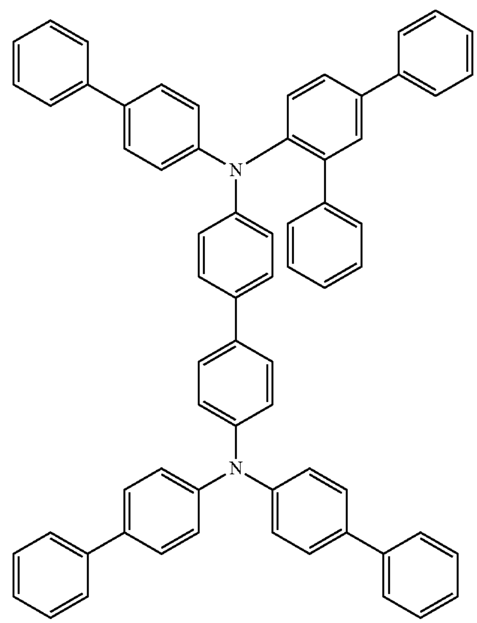

HTM

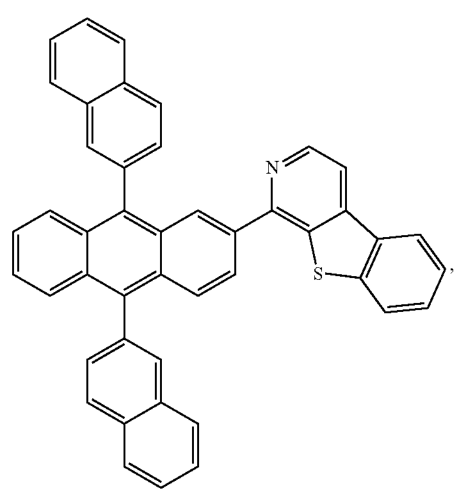

ETM

-continued

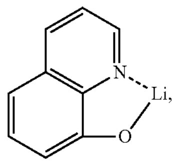

Liq

Compound C88,222

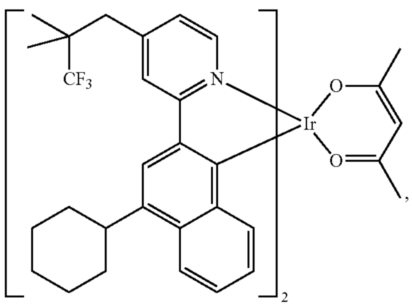

Comparative Compound 1

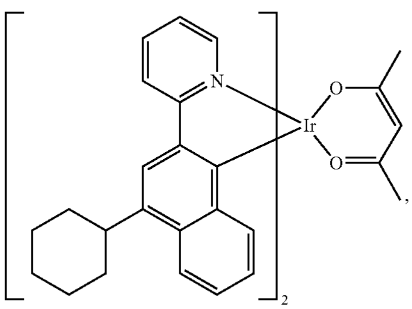

Comparative Compound 2

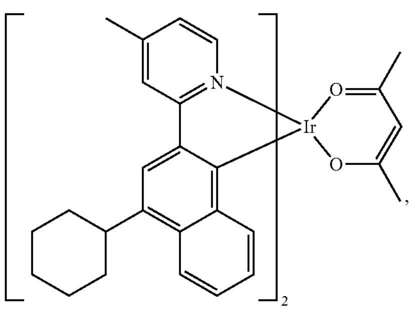

Comparative Compound 3

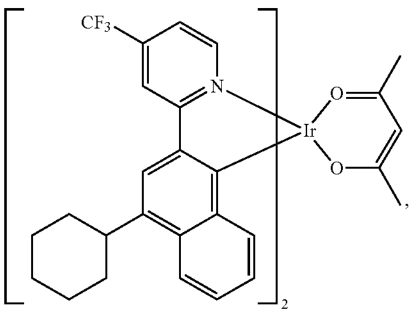

-continued

Comparative Compound 4

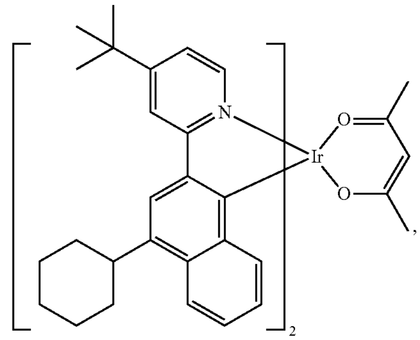

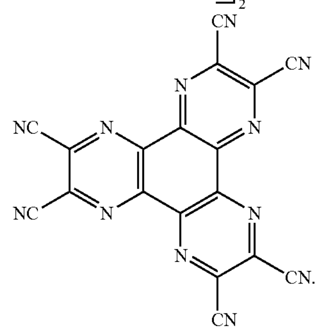

HATCN

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having a formula of $M(L_A)_2(L_B)$, wherein a ligand $L_A$ has the structure of Formula I

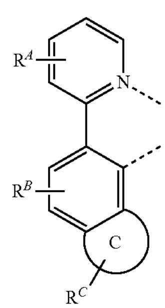

wherein ring C is benzene;

wherein $R^A$ bonds para to the nitrogen of pyridine;

$R^B$ bonds meta relative to the bond to the pyridine and is selected from the group consisting of isopropyl, t-butyl, and cyclohexane;

when $R^B$ is isopropyl, $R^A$ is selected from the group consisting of

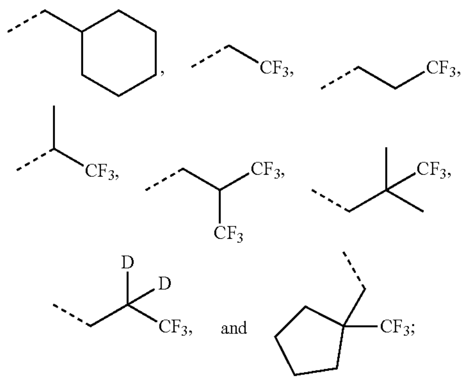

when $R^B$ is t-butyl, $R^A$ is selected from the group consisting of

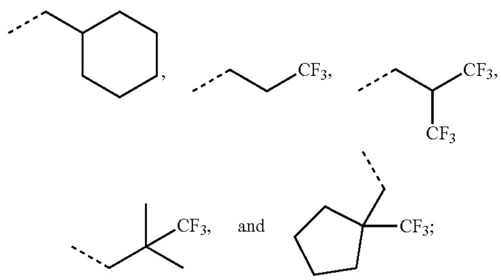

when $R^B$ is cyclohexane, $R^A$ is selected from the group consisting of

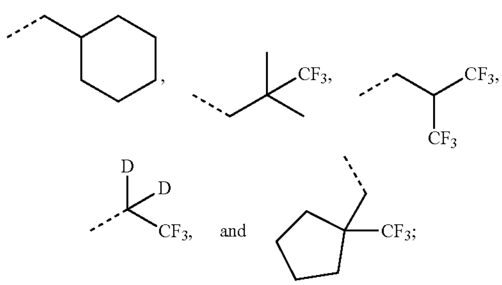

$R^C$ is hydrogen;
M is Ir;
$L_B$ is

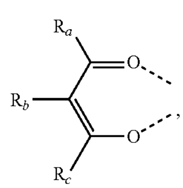

wherein $R_a$ and $R_c$ are methyl and $R_b$ is hydrogen.

2. The compound of claim 1, wherein $R^B$ is a tert-butyl group.

3. The compound of claim 1, wherein $R^B$ is a cyclohexane.

4. The compound of claim 1, wherein $R^B$ is an isopropyl group.

5. A formulation comprising the compound according to claim 1.

6. A chemical structure selected from the group consisting of a monomer, a polymer, a macromolecule, and a supra-molecule, wherein the chemical structure comprises the compound of claim 1 or a monovalent or polyvalent variant thereof.

7. The compound of claim 1, wherein the ligand $L_A$ is selected from the group consisting of $L_{A6}$ through $L_{A8}$, $L_{A38}$ through $L_{A40}$, and $L_{A72}$ based on a structure of Formula II

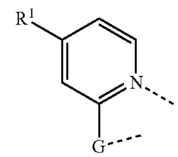

in which $R^1$ and G are defined as:

| Ligand | $R^1$ | G |
|---|---|---|
| $L_{A6}$ | $R^{A3}$ | $R^{C2}$ |
| $L_{A7}$ | $R^{A34}$ | $R^{C2}$ |
| $L_{A8}$ | $R^{A57}$ | $R^{C2}$ |
| $L_{A38}$ | $R^{A3}$ | $R^{C5}$ |
| $L_{A39}$ | $R^{A34}$ | $R^{C5}$ |
| $L_{A40}$ | $R^{A57}$ | $R^{C5}$ |
| $L_{A72}$ | $R^{A57}$ | $R^{C6}$ |

wherein $R^{A3}$, $R^{A34}$ and $R^A$ have the following structures:

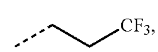

$R^{A3}$

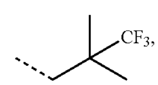

$R^{A34}$

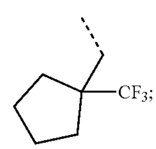

$R^{A57}$ and wherein $R^{C2}$, $R^{C5}$, and $R^{C6}$ have the following structures:

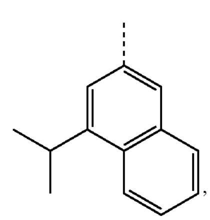

$R^{C2}$

-continued

RC5

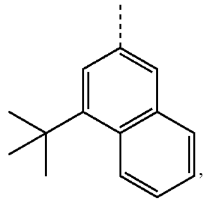

RC8

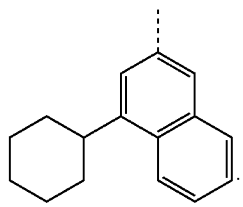

8. An organic light emitting device (OLED) comprising:
an anode;
a cathode; and
an organic layer, disposed between the anode and the cathode, a compound having a formula of $M(L_A)_2(L_B)$, wherein a ligand $L_A$ has the structure of Formula I

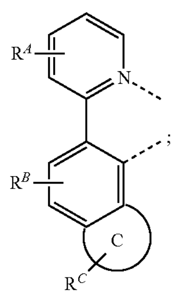

wherein ring C is benzene;
wherein $R^A$ bonds para to the nitrogen of pyridine;
$R^B$ bonds meta relative to the bond to the pyridine and is selected from the group consisting of isopropyl, t-butyl, and cyclohexane;
when $R^B$ is isopropyl, $R^A$ is selected from the group consisting of

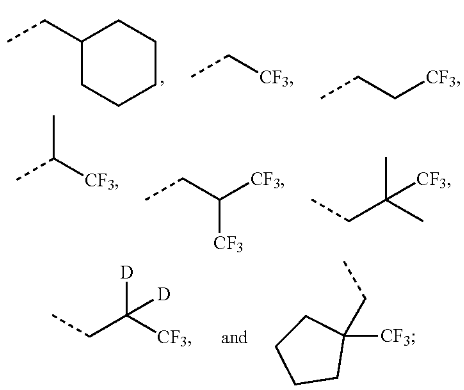

when $R^B$ is t-butyl, $R^A$ is selected from the group consisting of

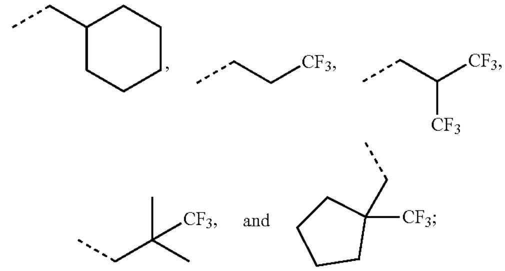

when $R^B$ is cyclohexane, $R^A$ is selected from the group consisting of

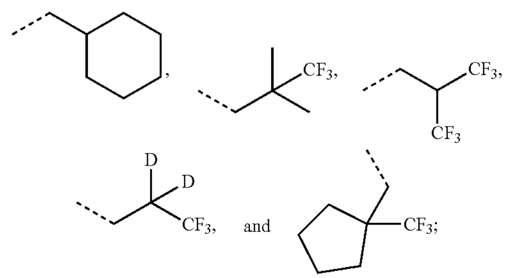

$R^C$ is hydrogen;
M is Ir;
$L_B$ is

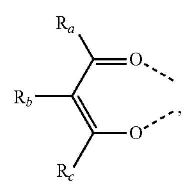

wherein $R_a$ and $R_c$ are methyl and $R_b$ is hydrogen.

9. The OLED of claim 8, wherein the organic layer is an emissive layer and the compound is an emissive dopant or a non-emissive dopant.

10. The OLED of claim 8, wherein the organic layer further comprises a host, wherein host comprises at least one chemical group selected from the group consisting of metal complex, triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

11. The OLED of claim 10, wherein the host is selected from the group consisting of:

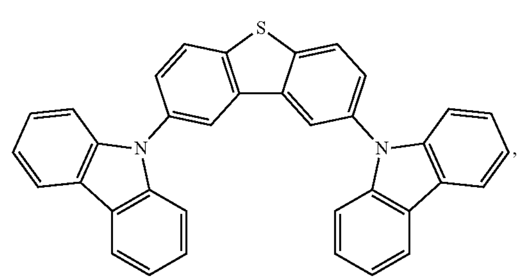

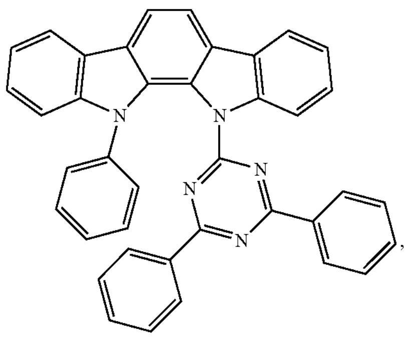
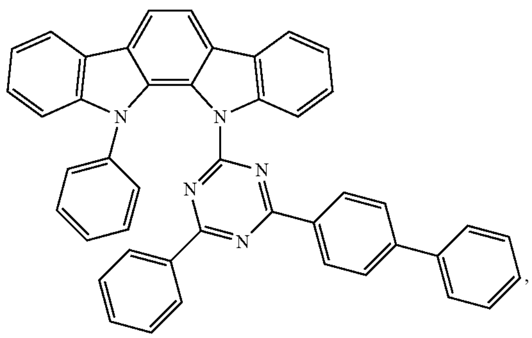
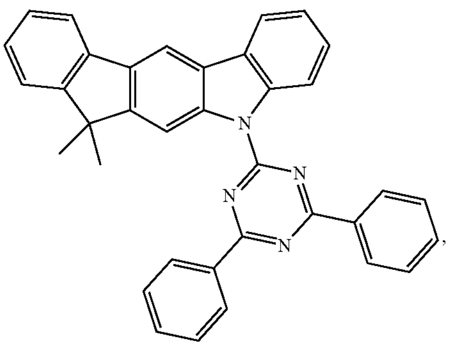
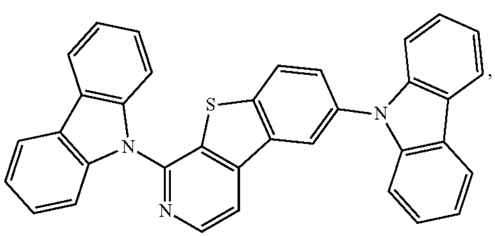
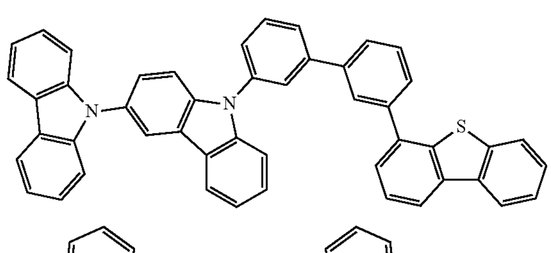
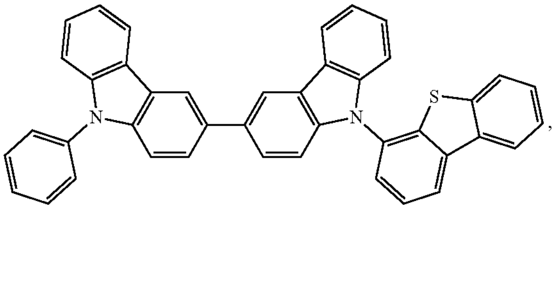
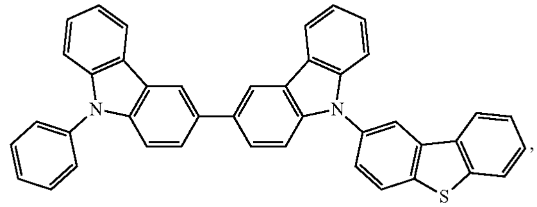
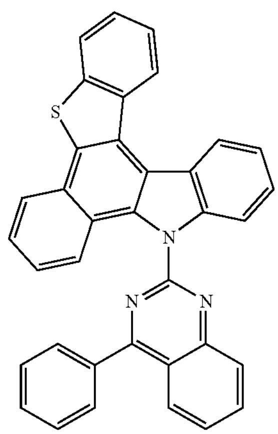
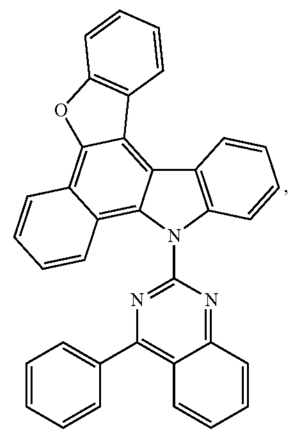
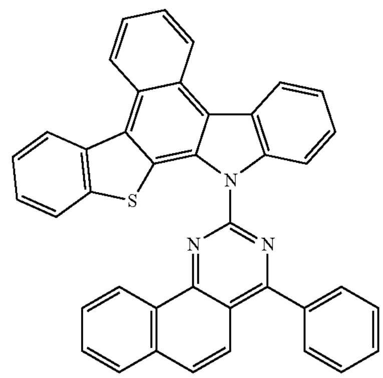
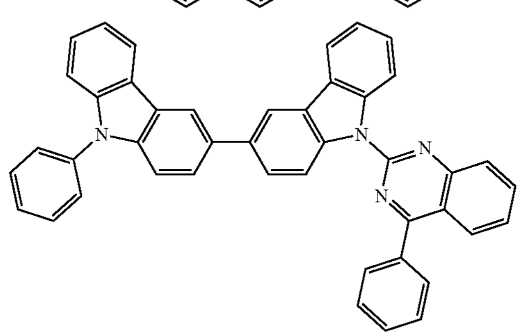
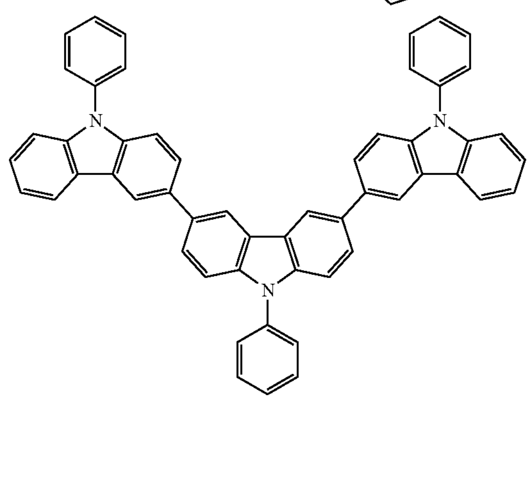

-continued
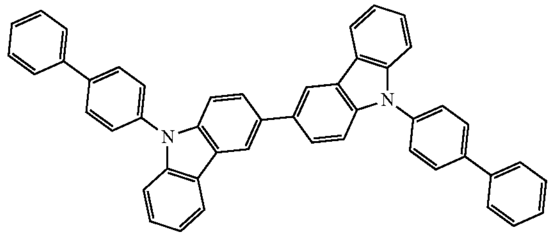
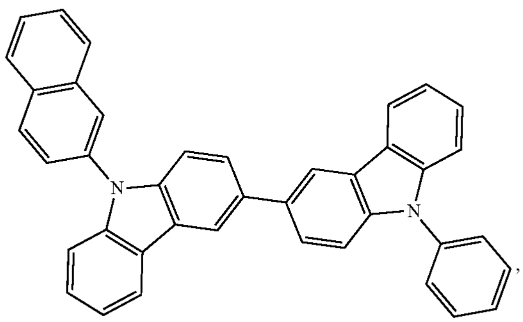
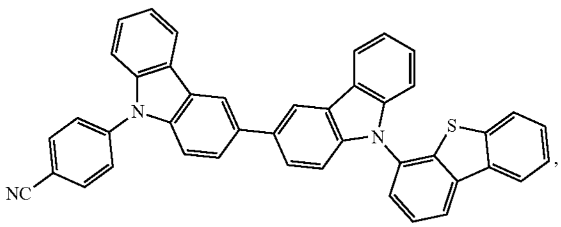
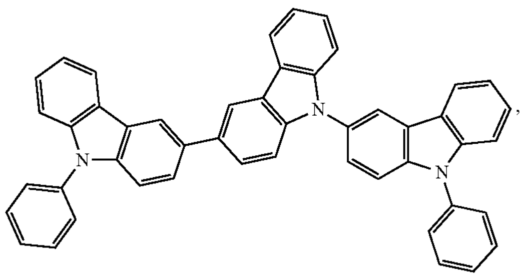
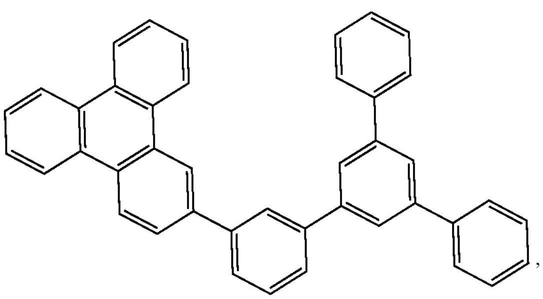
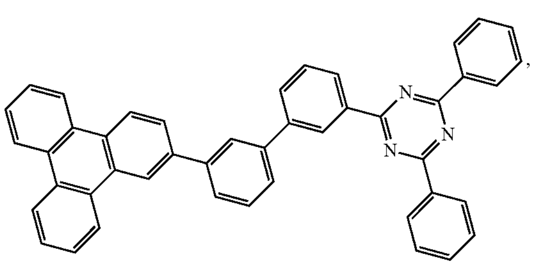
-continued
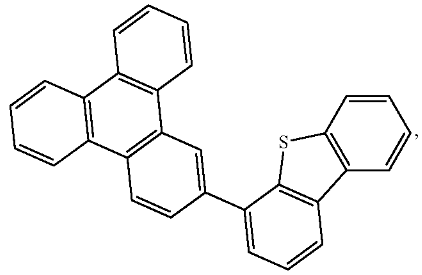
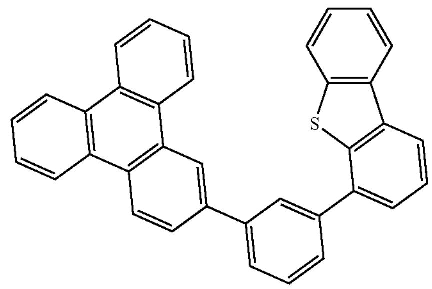
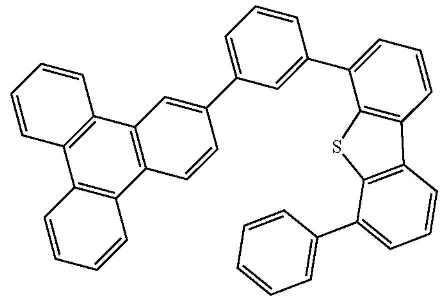
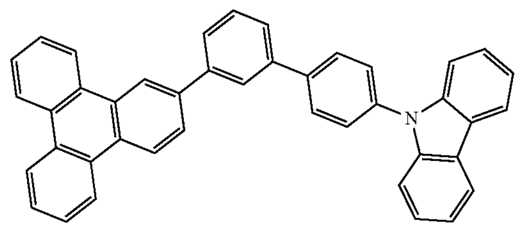
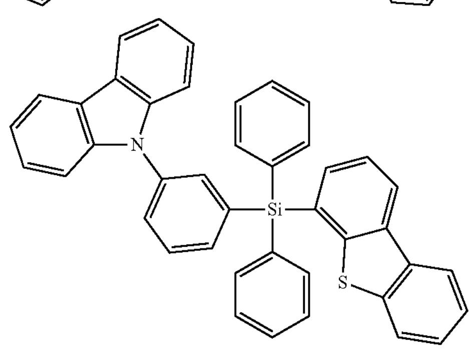
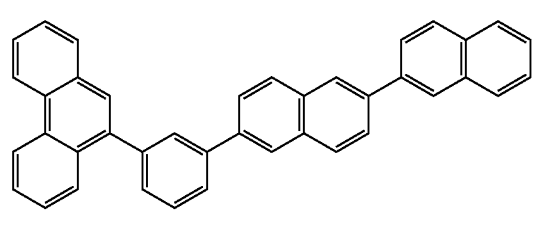
and combinations thereof.

12. A consumer product comprising an organic light-emitting device (OLED) comprising:

an anode;

a cathode; and an organic layer, disposed between the anode and the cathode, comprising a compound having a formula of $M(L_A)_2(L_B)$, wherein a ligand $L_A$ has the structure of Formula I

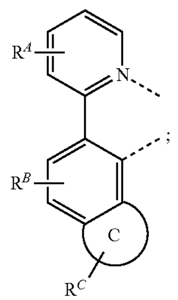

wherein ring C is benzene;

wherein $R^A$ bonds para to the nitrogen of pyridine;

$R^B$ bonds meta relative to the bond to the pyridine and is selected from the group consisting of isopropyl, t-butyl, and cyclohexane;

when $R^B$ is isopropyl, $R^A$ is selected from the group consisting of

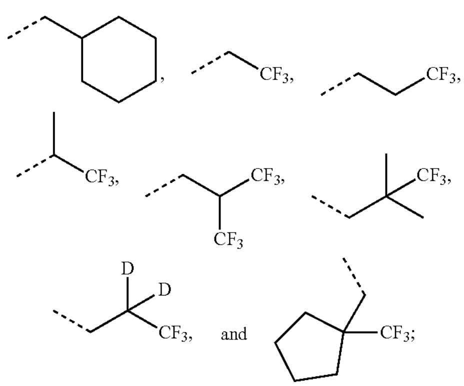

when $R^A$ is t-butyl, $R^B$ is selected from the group consisting of

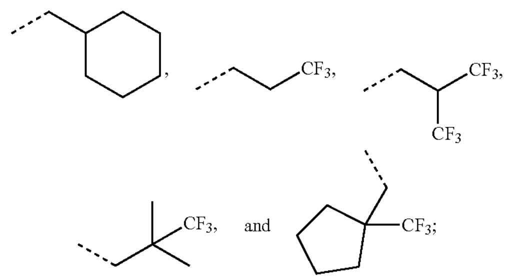

when $R^B$ is cyclohexane, $R^A$ is selected from the group consisting of

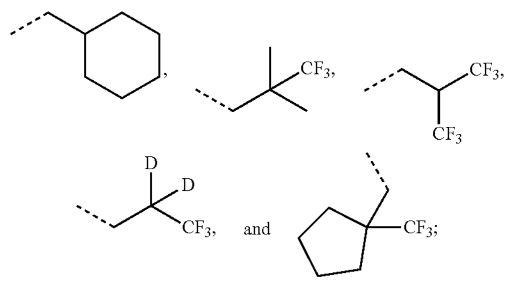

$R^C$ is hydrogen;

M is Ir;

$L_B$ is

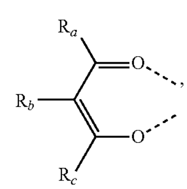

wherein $R_a$ and $R_c$ are methyl and $R_b$ is hydrogen.

* * * * *